(12) United States Patent
Yahagi et al.

(10) Patent No.: US 8,883,396 B2
(45) Date of Patent: Nov. 11, 2014

(54) RESIST COMPOSITION AND METHOD OF FORMING RESIST PATTERN

(71) Applicant: Tokyo Ohka Kogyo Co., Ltd., Kawasaki (JP)

(72) Inventors: Masahito Yahagi, Kawasaki (JP); Jun Iwashita, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/664,651

(22) Filed: Oct. 31, 2012

(65) Prior Publication Data
US 2013/0137048 A1   May 30, 2013

(30) Foreign Application Priority Data

Nov. 2, 2011   (JP) .................. 2011-241592

(51) Int. Cl.
G03F 7/004 (2006.01)
G03F 7/028 (2006.01)
G03F 7/32 (2006.01)
G03F 7/40 (2006.01)

(52) U.S. Cl.
USPC ........ 430/270.1; 430/322; 430/329; 430/331; 430/434; 430/435; 430/913; 430/914

(58) Field of Classification Search
USPC .............................. 430/270.1, 913
See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 6,949,325 B2 | 9/2005 | Li et al. | |
| 7,482,108 B2 * | 1/2009 | Matsumaru et al. | 430/270.1 |
| 8,039,198 B2 * | 10/2011 | Tachibana et al. | 430/270.1 |
| 8,048,610 B2 * | 11/2011 | Ohsawa et al. | 430/270.1 |
| 8,062,828 B2 * | 11/2011 | Ohsawa et al. | 430/270.1 |
| 8,105,748 B2 * | 1/2012 | Ohashi et al. | 430/270.1 |
| 2001/0049073 A1 | 12/2001 | Hada et al. | |
| 2004/0110085 A1 | 6/2004 | Iwai et al. | |
| 2006/0121390 A1 | 6/2006 | Gonsalves | |
| 2007/0231708 A1 | 10/2007 | Matsumaru et al. | |
| 2009/0269694 A1 | 10/2009 | Shimizu et al. | |
| 2010/0143845 A1 | 6/2010 | Iwashita et al. | |
| 2010/0233624 A1 * | 9/2010 | Kakinoya et al. | 430/285.1 |
| 2010/0255420 A1 * | 10/2010 | Sakakibara et al. | 430/285.1 |
| 2011/0177453 A1 | 7/2011 | Masubuchi et al. | |
| 2011/0244392 A1 * | 10/2011 | Hirano et al. | 430/270.1 |
| 2012/0003590 A1 | 1/2012 | Hirano et al. | |
| 2012/0082939 A1 | 4/2012 | Kawabata et al. | |
| 2012/0100487 A1 * | 4/2012 | Hirano et al. | 430/325 |
| 2012/0135350 A1 * | 5/2012 | Kobayashi et al. | 430/285.1 |
| 2012/0282551 A1 | 11/2012 | Matsuzawa et al. | |
| 2012/0328993 A1 | 12/2012 | Utsumi et al. | |
| 2013/0157201 A1 | 6/2013 | Takaki et al. | |

FOREIGN PATENT DOCUMENTS

| | | |
|---|---|---|
| EP | 2112554 A2 * | 10/2009 |
| JP | A-09-208554 | 8/1997 |
| JP | A-10-221852 | 8/1998 |
| JP | A-11-035551 | 2/1999 |
| JP | A-11-035552 | 2/1999 |
| JP | A-11-035573 | 2/1999 |
| JP | A-2000-206694 | 7/2000 |
| JP | A-2003-241385 | 8/2003 |
| JP | A-2005-336452 | 12/2005 |
| JP | A-2006-045311 | 2/2006 |
| JP | A-2006-169319 | 6/2006 |
| JP | A-2006-259582 | 9/2006 |
| JP | A-2006-317803 | 11/2006 |
| JP | A-2009-025723 | 2/2009 |
| JP | A-11-322707 | 11/2009 |
| JP | A-2009-265332 | 11/2009 |
| JP | A-2010-095643 | 4/2010 |
| JP | A-2010-128369 | 6/2010 |
| JP | A-2011-118310 | 6/2011 |
| JP | A-2011-158879 | 8/2011 |
| WO | WO 2004/074242 A2 | 9/2004 |

OTHER PUBLICATIONS

Office Action issued on Nov. 20, 2013 in U.S. Appl. No. 13/653,930.
Office Action mailed on May 20, 2014 in U.S. Appl. No. 13/653,930.

* cited by examiner

*Primary Examiner* — Amanda C. Walke
(74) *Attorney, Agent, or Firm* — Knobbe Martens Olson & Bear LLP

(57) ABSTRACT

A resist composition containing a base component (A) which generates an acid upon exposure and exhibits changed solubility in a developing solution by the action of acid, wherein the base component (A) contains a copolymer (A1) having a structural unit (a0) containing a group represented by the following general formula (a0-1) or (a0-2), a structural unit (a11) containing an acid-decomposable group which exhibits increased polarity by the action of acid and contains a polycyclic group, and a structural unit (a12) containing an acid-decomposable group which exhibits increased polarity by the action of acid and contains a monocyclic group. Each of the groups —$R^3$—$S^+(R^4)(R^5)$ and $M^{m+}$ in the formula has only one aromatic ring as a whole or has no aromatic ring.

[Chemical Formula 1]

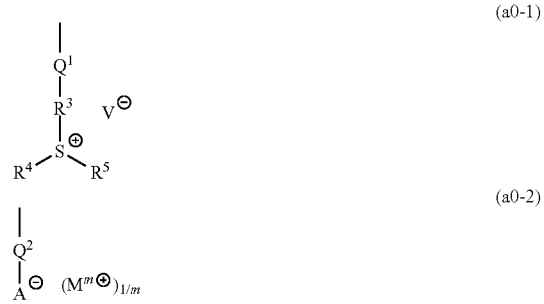

5 Claims, No Drawings

RESIST COMPOSITION AND METHOD OF FORMING RESIST PATTERN

TECHNICAL FIELD

The present invention relates to a resist composition and a method of forming a resist pattern.

Priority is claimed on Japanese Patent Application No. 2011-241592, filed on Nov. 2, 2011, the content of which is incorporated herein by reference.

BACKGROUND ART

In lithography techniques, for example, a resist film composed of a resist material is formed on a substrate, and the resist film is subjected to selective exposure, followed by development, thereby forming a resist pattern having a predetermined shape on the resist film. A resist material in which the exposed portions of the resist film become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a shorter wavelength (higher energy) than these excimer lasers, such as extreme ultraviolet radiation (EUV), electron beam (EB), and X ray.

Resist materials for use with these types of exposure light sources require lithography properties such as a high resolution capable of reproducing patterns of minute dimensions, and a high level of sensitivity to these types of exposure light sources.

As a resist material satisfying these requirements, a chemically amplified resist composition which contains a base component of which the solubility in a developing solution changes by the action of acid and an acid-generator component which generates an acid upon exposure is used in the related art. For example, when the above developing solution is an alkali developing solution (alkali developing process), as a chemically amplified positive resist composition, a resist composition containing a resin component (base resin) of which the solubility in the alkali developing solution increases by the action of acid and an acid-generator component is generally used. If a resist film formed of such a resist composition is selectively exposed for forming a resist pattern, an acid is generated by the acid-generator component in the exposed portion, and the solubility of the base resin in the alkali developing solution increases by the action of acid, whereby the exposed portion becomes soluble in the alkali developing solution. Accordingly, by performing alkali developing, the unexposed portions remain as a pattern, resulting in the formation of a positive-type pattern.

The base resin used exhibits increased polarity under the action of acid, thereby exhibiting increased solubility in an alkali developing solution, whereas the solubility in an organic solvent is decreased. Accordingly, if a solvent developing process that uses a developing solution containing an organic solvent (an organic developing solution) is employed instead of an alkali developing process, then within the exposed portions of the resist film, the solubility in the organic developing solution decreases relatively, meaning that during the solvent developing process, the unexposed portions of the resist film are dissolved in the organic developing solution and removed, whereas the exposed portions remain as a pattern, resulting in the formation of a negative-type resist pattern. This type of solvent developing process that results in the formation of a negative-type resist pattern is also referred to as a negative tone development process (for example, see Patent Document 1).

Currently, as the base resin of the chemically amplified resist composition used for ArF excimer laser lithography or the like, an acrylic resin or the like that contains structural units derived from (meth)acrylate esters within the main chain is generally used since this resin exhibits excellent transparency around 193 nm (for example, see Patent Document 2). Here, the term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position. The term "(meth)acrylic acid" is a generic term that includes either or both of acrylic acid having a hydrogen atom bonded to the α-position and methacrylic acid having a methyl group bonded to the α-position.

In recent years, as the base resin, a resin having an acid-generating group which generates an acid upon exposure has been proposed. For example, a resin component containing an acid-generating group which generates an acid upon exposure and an acid-decomposable group which exhibits changed polarity by the action of acid in the structure has been proposed (for example, see Patent Documents 3 to 5). The resin component functions not only as an acid generator but also as a base component, and enables a chemically amplified resist composition to be constituted only with a single component. In other words, when this type of resin component is subjected to exposure, acid is generated from the acid-generating group within the structure, and the action of that acid causes decomposition of the acid-decomposable group, thereby forming a polar group such as a carboxyl group that causes an increase in the polarity. Accordingly, when a resin film (resist film) formed of the resin component is selectively exposed, the polarity of the exposed portion increases. Therefore, if developing is performed using an alkali developing solution, the exposed portion is dissolved and removed, whereby a positive resist pattern is formed.

As resist patterns are increasingly miniaturized, for the resist materials, further improvement is required not only in sensitivity or resolution but also in various lithography properties such as exposure latitude, mask reproducibility, and a pattern shape (roughness, rectangularity of a cross-sectional shape, and the like). For example, roughness on the side wall surfaces of a pattern can cause various defects such as non-uniformity of the line width of line and space patterns, or distortions around the holes in hole patterns. There is a concern that shape defects of a resist pattern may negatively affect the formation of a fine semiconductor element, and the like. Consequently, as the pattern becomes finer, improving the shape defects becomes more important.

Regarding such requirements, for example, Patent Documents 6 to 8 propose using a polymeric compound containing plural kinds of acid-decomposable groups as a base resin so as to improve the lithography properties and the pattern shape.

DOCUMENTS OF RELATED ART

Patent Documents

[Patent Document 1]
Japanese Unexamined Patent Application, First Publication No. 2009-025723
[Patent Document 2]
Japanese Unexamined Patent Application, First Publication No. 2003-241385
[Patent Document 3]
Japanese Unexamined Patent Application, First Publication No. Hei 10-221852
[Patent Document 4]
Japanese Unexamined Patent Application, First Publication No. 2006-045311
[Patent Document 5]
Japanese Unexamined Patent Application, First Publication No. 2010-095643
[Patent Document 6]
Japanese Unexamined Patent Application, First Publication No. 2006-169319
[Patent Document 7]
Japanese Unexamined Patent Application, First Publication No. 2009-265332
[Patent Document 8]
Japanese Unexamined Patent Application, First Publication No. 2010-128369

SUMMARY OF THE INVENTION

However, the resist materials in the related art still leave room for improving the shape of a resist pattern to be formed. In addition, in forming a resist pattern, after exposure, Post Exposure Bake (PEB) is performed in general before developing is performed. However, the resist materials in the related art exhibit insufficient thermal stability, and have a problem in that the size of a resist pattern to be formed varies with the variation of the PEB temperature.

Accordingly, a resist composition is required which can form a high-resolution pattern with an excellent shape and of which the pattern size is less influenced by the PEB temperature.

The above requirements are markedly necessary particularly in the use of EUV lithography or EB (electron beam) lithography.

Currently, in the EUV lithography or EB lithography, as resist materials, chemically amplified resists that have been proposed for a KrF excimer laser, an ArF excimer laser, and the like are used, since the resists exhibit excellent sensitivity to EUV or EB and have excellent lithography properties such as resolution that enables the formation of a target fine resist pattern. Particularly, a chemically amplified resist containing an acrylic resin as a base resin is considered to have excellent lithography properties as above.

However, when the chemically amplified resist proposed for the KrF excimer laser, ArF excimer laser, and the like is used for the EUV lithography or EB lithography, problems such as a decrease in contrast or thickness loss of an unexposed portion easily arise.

For example, in the EUV lithography, so-called OoB (Out of Band) light which is light of a wavelength out of the EUV region and included in light generated from a light source of an EUV exposure apparatus is a problem. The OoB light enters an unexposed portion of a resist film together with a flare generated at the same time (that is, the OoB light cancels the selectivity with respect to the exposure area at the time of the EUV light irradiation), and the acid-generator component is decomposed and generates an acid in the unexposed portion. Consequently, a decrease in contrast, thickness loss, roughening (roughening of the top surface or side wall of the pattern), and the like of the resist pattern are caused. The problems caused by the OoB light tend to markedly arise particularly when a chemically amplified resist for a lithography process in which exposure is performed using light of a wavelength in a DUV region, such as the ArF excimer laser light is used. That is, in the chemically amplified resist, generally, an acid is generated when the resist is irradiated with light of a wavelength of the DUV region, whereby the solubility thereof in a developing solution changes. The OoB light includes EUV of around 13.5 nm, DUV of 150 nm to 300 nm, and light of a wavelength of the infrared region, and an onium salt-based acid generator widely used in the related art easily generates an acid by absorbing light of a wavelength in the DUV region. Therefore, a portion supposed to be an unexposed portion in EUV exposure is also exposed to light, whereby the decrease in contrast, thickness loss of a pattern, and the like are caused. The decrease in contrast or the thickness loss is a cause of a decrease in resolution or deterioration in pattern shape, and causes a concern that the resist pattern may not secure a sufficient height and may not sufficiently function as an etching mask in forming a semiconductor element.

In the EB lithography, depending on electron beam irradiation conditions such as an acceleration voltage, electrons are diffused (scattered) onto the surface of the resist film, whereby the same problems as in the OoB light in the EUV lithography arise in some cases.

Moreover, in the EUV lithography or EB lithography, there is a problem in that outgas, which is formed as the decomposition (deprotection) reaction of an acid-decomposable group contained in the base component proceeds, contaminates the exposure apparatus, so this problem is also required to be solved.

The present invention has been made in consideration of the above circumstances, and an object thereof is to provide a resist composition which can form a high-resolution pattern with an excellent shape and of which the pattern size is less influenced by the PEB temperature, and to provide a method of forming a resist pattern using the resist composition.

That is, a first aspect of the present invention is a resist composition containing a base component (A) which generates an acid upon exposure and exhibits changed solubility in a developing solution by the action of acid, wherein the base component (A) contains a copolymer (A1) having a structural unit (a0) containing a group represented by the following general formula (a0-1) or (a0-2), a structural unit (a11) containing an acid-decomposable group which exhibits increased polarity by the action of acid and contains a polycyclic group, and a structural unit (a12) containing an acid-decomposable group which exhibits increased polarity by the action of acid and contains a monocyclic group.

[Chemical Formula 1]

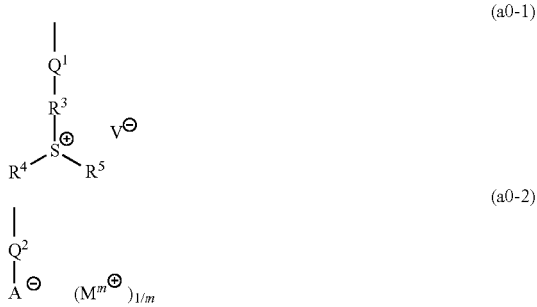

In the formula, each of $Q^1$ and $Q^2$ independently represents a single bond or a divalent linking group; each of $R^3$, $R^4$, and $R^5$ independently represents an organic group; $R^4$ and $R^5$ may be bonded to each other to form a ring with the sulfur atom in the formula, provided that the group —$R^3$—$S^+(R^4)(R^5)$ in the formula has only one aromatic ring as a whole or has no aromatic ring; $V^-$ represents a counteranion; $A^-$ represents an organic group containing an anion; $M^{m+}$ represents an m-valent organic cation; and m represents an integer of 1 to 3, provided that $M^{m+}$ has only one aromatic ring or has no aromatic ring.

A second aspect of the present invention is a method of forming a resist pattern, including: forming a resist film on a substrate by using the resist composition according to the first aspect; exposing the resist film; and developing the resist film to form a resist pattern.

In the present specification and Claims, the term "exposure" has a definition including general radiation irradiation.

The term "aliphatic" is a relative concept used in relation to the term "aromatic", and defines a group or compound that has no aromaticity.

The term "alkyl group" includes a linear, branched or cyclic, monovalent saturated hydrocarbon, unless otherwise specified. The same applies for the alkyl group within an alkoxy group.

The term "alkylene group" includes linear, branched or cyclic, divalent saturated hydrocarbon, unless otherwise specified.

A "halogenated alkyl group" is a group in which a portion or all of hydrogen atoms of an alkyl group have been substituted with halogen atoms. A "halogenated alkylene group" is a group in which a portion or all of hydrogen atoms of an alkylene group have been substituted with halogen atoms. Examples of the halogen atom include a fluorine atom, a chlorine atom, a bromine atom, and an iodine atom.

A "fluorinated alkyl group" is a group in which a portion or all of hydrogen atoms of an alkyl group have been substituted with fluorine atoms. A "fluorinated alkylene group" is a group in which a portion or all of hydrogen atoms of an alkylene group have been substituted with fluorine atoms.

A "structural unit" refers to a monomer unit constituting a resin (a polymeric compound, a polymer, and a copolymer).

According to the present invention, it is possible to provide a resist composition which can form a high-resolution pattern with an excellent shape and of which pattern size is less influenced by the PEB temperature, and a method of forming a resist pattern using the resist composition.

MODE FOR CARRYING OUT THE INVENTION

The resist composition of the present invention contains a base component (A) (hereinafter, referred to as a "component (A)") which generates an acid upon exposure and exhibits changed solubility in a developing solution by the action of acid.

Though the details will be described later, since the resist composition of the present invention contains a copolymer (A1) containing an acid-decomposable group which exhibits increased polarity by the action of acid, the resist composition has a property in which the polarity increases upon exposure. If a resist film is formed of the resist composition, and selective exposure is performed on the resist film, an acid is generated from the component (A) in an exposed portion, and the acid increases the polarity of the component (A). As a result, the solubility of the exposed portion in the developing solution changes. On the other hand, the solubility of an unexposed portion in a developing solution does not change. Accordingly, when the resist film is developed, if the developing solution is an alkali developing solution, the exposed portion is dissolved and removed, whereby a positive resist pattern is formed. If the developing solution is an organic developing solution, the unexposed portion is dissolved and removed, whereby a negative resist pattern is formed.

That is, in a case of applying an alkali developing process, the component (A) is substantially insoluble in an alkali developing solution before exposure, and when an acid is generated from the component (A) upon exposure, the polarity of the component increases by the action of the acid, whereby the solubility of the component in an alkali developing solution increases. Accordingly, during resist pattern formation, by conducting selective exposure of a resist film formed by applying the resist composition to a substrate, the exposed portions change from being substantially insoluble in the alkali developing solution to being soluble, while the unexposed portions remain substantially insoluble in the alkali developing solution, meaning alkali developing can be used to form a positive-type resist pattern.

In addition, in a case of applying a solvent developing process, the component (A) exhibits high solubility in an organic developing solution before exposure, and when an acid is generated from the component (A) upon exposure, the polarity of the component increases by the action of the acid, whereby the solubility of the component in an organic developing solution decreases. Accordingly, during resist pattern formation, by conducting selective exposure of a resist film formed by applying the resist composition to a substrate, the exposed portions change from being soluble in the organic developing solution to being substantially insoluble, while the unexposed portions remain soluble in the organic developing solution, meaning developing with the organic developing solution can be used to achieve contrast between the exposed portions and the unexposed portions, thereby enabling formation of a negative-type resist pattern.

In the present specification, a resist composition forming a positive resist pattern by the dissolution and removal of an exposed portion is called a positive resist composition, and a resist composition forming a negative resist pattern by the dissolution and removal of an unexposed portion is called a negative resist composition. The resist composition of the present invention may be a positive or negative resist composition.

Further, the resist composition of the present invention may be used within either an alkali developing process in which an alkali developing solution is used for the developing treatment during formation of the resist pattern, or a solvent developing process in which a developing solution containing an organic solvent (an organic developing solution) is used for the developing treatment. The resist composition of the present invention is preferably used for forming a positive resist pattern by an alkali developing process.

<Component (A)>

The component (A) is a base component which generates an acid upon exposure and exhibits changed solubility in a developing solution by the action of acid.

The term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a non-polymer having a molecular weight in the range of 500 to less than 4,000 is referred to as a low molecular weight compound.

As a polymer, any of those which have a molecular weight of 1,000 or more is generally used. In the present specification and Claims, a resin or a polymeric compound refers to a polymer having a molecular weight of 1000 or more. In the case of a polymer, as a "molecular weight", a weight average molecular weight in terms of a polystyrene equivalent value determined by GPC (Gel Permeation Chromatography) is used.

As the component (A), at least the copolymer (A1) is used. As the component (A), a resin or a low-molecular weight compound other than the copolymer (A1) may be used concurrently. When the component (A) is a resin, the resin may include a moiety generating an acid (acid-generating moiety) upon exposure, within a side chain or at the terminal of a main chain. The copolymer (A1) having a structural unit (a0) described later at least has the acid-generating moiety within a side chain.

[Copolymer (A1)]

The component (A) contains the copolymer (A1) (hereinafter, referred to as a component (A1)) having a structural unit (a0) containing a group represented by the following general formula (a0-1) or (a0-2), a structural unit (a11) containing an acid-decomposable group which exhibits increased polarity by the action of acid and contains a polycyclic group, and a structural unit (a12) containing an acid-decomposable group which exhibits increased polarity by the action of acid and contains a monocyclic group.

[Chemical Formula 2]

In the formula, each of $Q^1$ and $Q^2$ independently represents a single bond or a divalent linking group. Each of $R^3$, $R^4$, and $R^5$ independently represents an organic group, and $R^4$ and $R^5$ may be bonded to each other to form a ring with a sulfur atom in the formula. Here, the group $—R^3—S^+(R^4)(R^5)$ in the formula has only one aromatic ring as a whole or has no aromatic ring. $V^-$ represents a counteranion. $A^-$ represents an organic group containing an anion. $M^{m+}$ represents an m-valent organic cation, and m represents an integer of 1 to 3. Here, $M^{m+}$ has only one aromatic ring or has no aromatic ring.

(Structural Unit Having a Group Represented by Formula (a0-1))

In Formula (a0-1), $Q^1$ represents a single bond or a divalent linking group.

Though not particularly limited, preferable examples of the divalent linking group represented by $Q^1$ include a divalent hydrocarbon group which may have a substituent, a divalent linking group containing a hetero atom, and the like.

(Divalent Hydrocarbon Group which May have a Substituent)

The hydrocarbon group as a divalent linking group may be an aliphatic hydrocarbon group or an aromatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably has 1 to 8 carbon atoms, and even more preferably has 1 to 5 carbon atoms.

As the linear aliphatic hydrocarbon group, a linear alkylene group is preferable. Specific examples thereof include a methylene group [—CH$_2$—], an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, branched alkylene groups are preferred, and specific examples include various alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group within the alkylalkylene group, a linear alkyl group of 1 to 5 carbon atoms is preferable.

The linear or branched aliphatic hydrocarbon group may or may not have a substituent (a group or an atom other than a hydrogen atom) substituting a hydrogen atom. Examples of the substituent include a fluorine atom, a fluorinated alkyl group having 1 to 5 carbon atoms that has been substituted with a fluorine atom, an oxo group (=O), and the like.

Examples of the aliphatic hydrocarbon group containing a ring within the structure include a cyclic aliphatic hydrocarbon group (a group in which two hydrogen atoms have been removed from an aliphatic hydrocarbon ring) which may contain a substituent containing a hetero atom within the ring structure, a group in which the cyclic aliphatic hydrocarbon group is bonded to the terminal of a linear or branched aliphatic hydrocarbon group, a group in which the cyclic aliphatic hydrocarbon group intervenes in the linear or branched aliphatic hydrocarbon group, and the like. As examples of the linear or branched aliphatic hydrocarbon group, the same groups as those described above can be given.

The cyclic aliphatic hydrocarbon group preferably has 3 to 20 carbon atoms, and more preferably 3 to 12 carbon atoms.

The cyclic aliphatic hydrocarbon group may be polycyclic or monocyclic. As a monocyclic aliphatic hydrocarbon group, a group in which two hydrogen atoms have been removed from a monocycloalkane is preferable. The monocycloalkane preferably has 3 to 6 carbon atoms, and specific examples thereof include cyclopentane and cyclohexane. As a polycyclic aliphatic hydrocarbon group, a group in which two hydrogen atoms have been removed from a polycycloalkane is preferable. The polycycloalkane preferably has 7 to 12 carbon atoms, and specific examples thereof include adamantane, norbornane, isobornane, tricyclodecane, tetracyclodecane, and the like.

The cyclic aliphatic hydrocarbon group may or may not have a substituent (a group or an atom other than a hydrogen atom) substituting a hydrogen atom. Examples of the substituent include an alkyl group, an alkoxy group, a halogen atom, a halogenated alkyl group, a hydroxyl group, an oxo group (=O), and the like.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent include a fluorine atom, a chlorine atom, a bromine atom, an iodine atom, and the like, and among these, a fluorine atom is preferable.

An example of the halogenated alkyl group as the substituent includes a group in which part or all of the hydrogen atoms within the aforementioned alkyl group have been substituted with the aforementioned halogen atoms.

In the cyclic aliphatic hydrocarbon group, a portion of carbon atoms constituting the ring structure may be substituted with substituents containing a hetero atom. As the substituents containing a hetero atom, —O—, —C(=O)—O—, —S—, —S(=O)$_2$—, and —S(=O)$_2$—O— are preferable.

The aromatic hydrocarbon group as a divalent hydrocarbon group is a divalent hydrocarbon group having at least one aromatic ring, and may have a substituent. The aromatic ring is not particularly limited as long as it is a ring of cyclic conjugation that has 4n+2 π it electrons, and the aromatic ring may be monocyclic or polycyclic. The aromatic ring preferably has 5 to 30 carbon atoms, more preferably has 5 to 20 carbon atoms, even more preferably has 6 to 15 carbon atoms, and particularly preferably has 6 to 12 carbon atoms. Here, the number of carbon atoms within a substituent(s) is not included in the number of carbon atoms of the aromatic hydrocarbon group. Specific examples of the aromatic ring include aromatic hydrocarbon rings such as benzene, naphthalene, anthracene, and phenanthrene; aromatic heterocyclic ringaromatic heterocyclic rings in which a portion of carbon atoms constituting the aromatic hydrocarbon rings has been substituted with hetero atoms; and the like. As examples of the hetero atom of the aromatic heterocyclic ringaromatic heterocyclic ring, an oxygen atom, a sulfur atom and a nitrogen atom can be given. Specific examples of the aromatic heterocyclic ringaromatic heterocyclic rings include a pyridine ring, a thiophene ring, and the like.

Specific examples of the aromatic hydrocarbon group as a divalent hydrocarbon group include groups in which two hydrogen atoms have been removed from the aromatic hydrocarbon ring or the aromatic heterocyclic ringaromatic heterocyclic ring (an arylene group or a heteroarylene group); groups in which two hydrogen atoms have been removed from an aromatic compound (for example, biphenyl or fluorene) containing two or more aromatic rings; groups in which one hydrogen atom of a group (an aryl group or a heteroaryl group) in which one hydrogen atom has been removed from the aromatic hydrocarbon ring or the aromatic heterocyclic ringaromatic heterocyclic ring has been substituted with an alkylene group (for example, groups in which one more hydrogen atom has been removed from an aryl group in an arylalkyl group such as a benzyl group, a phenethyl group, a 1-naphthylmethyl group, a 2-naphthylmethyl group, a 1-naphthylethyl group, or a 2-naphthylethyl group); and the like. The alkylene group bonded to the aryl group or the heteroaryl group preferably has 1 to 4 carbon atoms, more preferably has 1 to 2 carbon atoms, and particularly preferably has 1 carbon atom.

The aromatic hydrocarbon group may or may not have a substituent. For example, a hydrogen atom bonded to the aromatic ring that the aromatic group has may be substituted with a substituent.

Examples of the substituent include an alkyl group, an alkoxy group, a halogen atom, a halogenated alkyl group, a hydroxyl group, an oxo group (=O), and the like.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent include a fluorine atom, a chlorine atom, a bromine atom, an iodine atom, and the like, and among these, a fluorine atom is preferable.

An example of the halogenated alkyl group as the substituent includes a group in which part or all of the hydrogen atoms within the aforementioned alkyl group have been substituted with the aforementioned halogen atoms.

When $Q^1$ has an aromatic ring, $Q^1$ preferably has only one aromatic ring as a whole. In addition, when $Q^1$ has an aromatic ring, $R^3$, $R^4$, and $R^5$ preferably have no aromatic ring.

{Divalent Linking Group Containing Hetero Atom}

The hetero atom in the divalent linking group containing a hetero atom is an atom other than a carbon atom and a hydrogen atom, and examples thereof include an oxygen atom, a nitrogen atom, a sulfur atom, a halogen atom, and the like.

Specific examples of the divalent linking group containing a hetero atom include non-hydrocarbon linking group such as —O—, —C(=O)—, —C(=O)—O—, —O—C(=O)—O—, —S—, —S(=O)$_2$—, —S(=O)$_2$—O—, —NH—, —NH—C(=O)—, —NH—C(=NH)—, and =N—, a combination of at least one kind of these non-hydrocarbon linking groups with a divalent hydrocarbon group, and the like. Examples of the divalent hydrocarbon group include the same ones as the above divalent hydrocarbon group which may have a substituent, and among these, a linear or branched aliphatic hydrocarbon group is preferable.

Among these, each H in —NH— within —C(=O)—NH—, —NH— and —NH—C(=NH)— may be substituted with a substituent such as an alkyl group or an acyl group. The substituent preferably has 1 to 10 carbon atoms, more preferably has 1 to 8 carbon atoms, and particularly preferably has 1 to 5 carbon atoms.

As $Q^1$, a single bond, —C(=O)—O-$Q^{11}$- or —C(=O)—N($R^b$)-$Q^{11}$- is preferable. $Q^{11}$ represents a single bond or a divalent linking group, and $R^b$ represents a hydrogen atom or an alkyl group having 1 to 5 carbon atoms.

Examples of the divalent linking group represented by $Q^{11}$ include the same ones as described above. Among these, a linear or branched alkylene group, a divalent aliphatic cyclic group, or a divalent linking group containing a hetero atom is preferable.

As the divalent linking group containing a hetero atom and represented by $Q^{11}$, a combination of at least one kind of non-hydrocarbon linking group with a divalent hydrocarbon group is preferable. Examples thereof include —$Y^{21}$—O—$Y^{22}$—, —[$Y^{21}$—C(=O)—O]$_{m'}$—$Y^{22}$—, $Y^{21}$—O—C(=O)—$Y^{22}$— (here, each of $Y^{21}$ and $Y^{22}$ independently represents a divalent hydrocarbon group which may have a substituent, O represents an oxygen atom, and m' represents in integer of 0 to 3), and the like.

In the above —$Y^{21}$—O—$Y^{22}$—, —[$Y^{21}$—C(=O)—O]$_{m'}$—$Y^{22}$—, and —$Y^{21}$—O—C(=O)—$Y^{22}$—, each of $Y^{21}$ and $Y^{22}$ independently represents a divalent hydrocarbon group which may have a substituent. Examples of the divalent hydrocarbon group include the same ones as exemplified as the "divalent hydrocarbon group which may have a substituent" described above.

As $Y^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As $Y^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In —[$Y^{21}$—C(=O)—O]$_{m'}$—$Y^{22}$—, m' represents an integer of 0 to 3, and preferably is an integer of 0 to 2, more preferably 0 or 1, and particularly preferably 1. That is, —[$Y^{21}$—C(=O)—O]$_{m'}$—$Y^{22}$— is particularly preferably —$Y^{21}$—C(=O)—O—$Y^{22}$—. Among these, —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

In Formula (a0-1), each of $R^3$, $R^4$, and $R^5$ independently represents an organic group, and $R^4$ and $R^5$ may be bonded to each other to form a ring with a sulfur atom in the formula.

The organic group represented by $R^3$ to $R^5$ is a group containing a carbon atom, and may have an atom other than a carbon atom (for example, a hydrogen atom, an oxygen atom, a nitrogen atom, a sulfur atom, a halogen atom (a fluorine atom, a chlorine atom, or the like)).

Examples of the organic group include a hydrocarbon group in which a portion or all of hydrogen atoms may be substituted with a substituent or a linking group is inserted between carbon atoms. Examples of the linking group include the same ones as the above divalent linking group containing a hetero atom. The organic group may or may not have an aromatic group.

Here, the group —$R^3$—$S^+$($R^4$)($R^5$) in the formula has only one aromatic ring as a whole or has no aromatic ring. That is, when $R^4$ and $R^5$ are not bonded to each other to form a ring with a sulfur atom in the formula, only one of $R^3$, $R^4$, and $R^5$ is an organic group having one aromatic ring. The other two groups are organic groups having no aromatic ring, or all of $R^3$, $R^4$, and $R^5$ are organic groups having no aromatic ring. When $R^4$ and $R^5$ are bonded to each other to form one aromatic ring with a sulfur atom in the formula, $R^3$ is an organic group having no aromatic ring.

When $R^4$ and $R^5$ are bonded to each other to form a ring with a sulfur atom in the formula, and the ring is an aliphatic ring (ring not having aromaticity), $R^3$ is an organic group having one aromatic ring or an organic group having no aromatic ring. When the ring that $R^4$ and $R^5$ form with a sulfur atom in the formula by being bonded to each other is a ring having two or more aromatic rings, the structural unit does not correspond to the structural unit (a0).

An aromatic ring absorbs OoB light of the DUV wavelength. In the entire group —$R^3$—$S^+$($R^4$)($R^5$) constituted with $S^+$ and with $R^3$, $R^4$, and $R^5$ directly bonded thereto, if the number of aromatic rings is set to 1 or less, the influence of the OoB light can be suppressed.

The aromatic ring is not particularly limited as long as it is a ring of cyclic conjugation having 4n+2 π electrons, and examples thereof include the same ones as the aromatic ring exemplified in the description for divalent hydrocarbon group described above. Specific examples thereof include aromatic hydrocarbon rings such as benzene, naphthalene, anthracene, and phenanthrene; aromatic heterocyclic ringaromatic heterocyclic rings in which a portion of carbon atoms constituting the aromatic hydrocarbon rings has been substituted with hetero atoms; and the like. Examples of the hetero atom within the aromatic heterocyclic ringaromatic heterocyclic rings include an oxygen atom, a sulfur atom and a nitrogen atom. Specific examples of the aromatic heterocyclic ring include a pyridine ring, a thiophene ring, and the like.

The aromatic ring may be bonded to a substituent. Examples of the substituent include the same ones as exemplified as the substituent that the aromatic hydrocarbon group may have, in the description for the divalent hydrocarbon group described above.

Specific examples of the organic group represented by $R^3$ include an alkylene group which may have a substituent, an arylene group which may have a substituent, and the like. Among these, an alkylene group which may have a substituent is preferable.

Examples of the alkylene group which may have a substituent and is represented by $R^3$ include an unsubstituted alkylene group, a substituted alkylene group in which a portion or all of hydrogen atoms of the unsubstituted alkylene group have been substituted with a substituent, and the like.

The unsubstituted alkylene group may be linear, branched, or cyclic. In view of excellent resolution, an alkylene group having 1 to 10 carbon atoms is preferable, and an alkylene group having 1 to 5 carbon atoms is more preferable. Specific examples thereof include a methylene group, an ethylene group, an n-propylene group, an isopropylene group, an n-butylene group, an isobutylene group, an n-pentylene group, a cyclopentylene group, a hexylene group, a cyclohexylene group, a nonylene group, a decylene group, and the like.

Examples of the substituent that the substituted alkylene group has include a halogen atom, an oxo group (=O), a cyano group, an alkyl group, an alkoxyalkyloxy group, an alkoxycarbonylalkyloxy group, —C(=O)—O—$R^{7"}$, —O—C(=O)—$R^{8"}$, —O—$R^{9"}$, an aryl group, and the like. Each of $R^{7"}$, $R^{8"}$, and $R^{9"}$ independently represents a hydrogen atom or a hydrocarbon group.

Among these, examples of halogen atoms as the substituent include a fluorine atom, a chlorine atom, an iodine atom, a bromine atom, and the like, and among these, a fluorine atom is preferable.

The alkyl group as the substituent in the substituted alkylene group may be linear, branched, or cyclic, and preferably has 1 to 30 carbon atoms.

Among these, the linear alkyl group preferably has 1 to 20 carbon atoms, more preferably has 1 to 15 carbon atoms, and most preferably has 1 to 10 carbon atoms. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably has 3 to 15 carbon atoms, and most preferably has 3 to 10 carbon atoms. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The cyclic alkyl group may be monocyclic or polycyclic. The cyclic alkyl group preferably has 3 to 30 carbon atoms, more preferably 5 to 30, still more preferably 5 to 20, still more preferably 6 to 15, and most preferably 6 to 12. Specific examples thereof include groups in which one or more hydrogen atoms have been removed from a monocycloalkane; groups in which one or more hydrogen atoms have been removed from a polycycloalkane such as a bicycloalkane, a tricycloalkane, and a tetracycloalkane; and the like. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

The cyclic alkyl group is preferably polycyclic. The cyclic alkyl group is preferably a group in which one or more hydrogen atoms have been removed from a polycycloalkane, and a group in which one or more hydrogen atoms have been removed from adamantine is most preferable.

The alkyl group as the substituent is preferably an alkyl group of 1 to 5 carbon atoms, and a methyl group, an ethyl group, a propyl group, an n-butyl group or a tert-butyl group is particularly desirable.

Examples of the alkoxyalkyloxy group as a substituent in the substituted alkylene group include a group represented by —O—C($R^{47}$)($R^{48}$)—O—$R^{49}$. In the formula, $R^{47}$ and $R^{48}$ each independently represents a hydrogen atom or a linear or branched alkyl group; and $R^{49}$ represents an alkyl group.

The alkyl group for $R^{47}$ and $R^{48}$ preferably has 1 to 5 carbon atoms, and may be either linear or branched. As the alkyl group, an ethyl group or a methyl group is preferable, and a methyl group is most preferable.

It is preferable that at least one of $R^{47}$ and $R^{48}$ represent a hydrogen atom. It is particularly desirable that at least one of $R^{47}$ and $R^{48}$ represent a hydrogen atom, and the other represent a hydrogen atom or a methyl group.

The alkyl group for $R^{49}$ preferably has 1 to 15 carbon atoms, and may be linear, branched or cyclic.

The linear or branched alkyl group represented by $R^{49}$ preferably has 1 to 5 carbon atoms, and examples thereof include a methyl group, an ethyl group, a propyl group, an n-butyl group, a tert-butyl group, and the like.

The cyclic alkyl group for $R^{49}$ preferably has 4 to 15 carbon atoms, more preferably 4 to 12, and most preferably 5 to 10. Specific examples thereof include groups in which one or more hydrogen atoms have been removed from a monocycloalkane or a polycycloalkane such as a bicycloalkane, tricycloalkane or tetracycloalkane, and which may or may not be substituted with an alkyl group of 1 to 5 carbon atoms, a fluorine atom or a fluorinated alkyl group. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

Examples of the alkoxycarbonylalkyloxy group as a substituent in the substituted alkylene group include a group represented by —O—$R^{50}$—C(=O)—O—$R^{56}$. In this formula, $R^{50}$ represents a linear or branched alkylene group, and $R^{56}$ represents a tertiary alkyl group.

The linear or branched alkylene group for $R^{50}$ preferably has 1 to 5 carbon atoms, and examples include a methylene group, ethylene group, trimethylene group, tetramethylene group and 1,1-dimethylethylene group.

Examples of the tertiary alkyl group represented by $R^{56}$ include a 2-methyl-2-adamantyl group, a 2-(2-propyl)-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group; a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group; a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group, a tert-hexyl group, and the like.

Moreover, groups in which $R^{56}$ in the above general formula —O—$R^{50}$—C(=O)—O—$R^{56}$ has been substituted with $R^{56'}$ may also be used. $R^{56'}$ represents a hydrogen atom, an alkyl group, a fluorinated alkyl group, or an aliphatic cyclic group which may contain a hetero atom.

Examples of the alkyl group for $R^{56'}$ include the same groups as those described above for the alkyl group for $R^{49}$.

Examples of the fluorinated alkyl group for $R^{56'}$ include groups in which part or all of the hydrogen atoms within an aforementioned alkyl group for $R^{49}$ have each been substituted with a fluorine atom.

Examples of the aliphatic cyclic group which may contain a hetero atom for $R^{56'}$ include aliphatic cyclic groups that do not contain a hetero atom, aliphatic cyclic groups containing a hetero atom within the ring structure, and groups in which one or more hydrogen atoms within an aliphatic cyclic group have been substituted with a hetero atom.

For $R^{56'}$, examples of the aliphatic cyclic groups that do not contain a hetero atom include groups in which one or more hydrogen atoms have been removed from a monocycloalkane or a polycycloalkane such as a bicycloalkane, tricycloalkane or tetracycloalkane. Examples of the monocycloalkane include cyclopentane and cyclohexane. Examples of the polycycloalkane include adamantane, norbornane, isobornane, tricyclodecane and tetracyclododecane. Among these, groups in which one or more hydrogen atoms have been removed from adamantane are preferable.

For $R^{56'}$, specific examples of the aliphatic cyclic group containing a hetero atom within the ring structure include the groups represented by the Formulae (L1) to (L5) and (S1) to (S4) described later.

For $R^{56'}$, specific examples of the groups in which a hydrogen atom in the aliphatic cyclic group has been substituted with a hetero atom include groups in which a hydrogen atom in the aliphatic cyclic group has been substituted with an oxo group (=O).

$R^{7''}$ in —C(=O)—O—$R^{7''}$ represents a hydrogen atom or a hydrocarbon group.

The hydrocarbon group represented by $R^{7''}$ may be an aliphatic hydrocarbon group or an aromatic hydrocarbon group. The aliphatic hydrocarbon group may be any one of a saturated hydrocarbon group and an aliphatic unsaturated hydrocarbon group.

The saturated hydrocarbon group represented by $R^{7''}$ may be linear, branched, or cyclic, and may be a combination of these.

The linear or branched saturated hydrocarbon group preferably has 1 to 25 carbon atoms, more preferably has 1 to 15 carbon atoms, and even more preferably has 4 to 10 carbon atoms.

Examples of the linear saturated hydrocarbon group include a methyl group, ethyl group, propyl group, butyl group, pentyl group, hexyl group, heptyl group, octyl group, nonyl group and decyl group.

Examples of the branched saturated hydrocarbon group include the tertiary alkyl group exemplified in the description for $R^{56}$ above. In addition, examples of the branched saturated hydrocarbon group other than the tertiary alkyl group include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, a 4-methylpentyl group, and the like.

The linear or branched saturated hydrocarbon group may have a substituent. Examples of the substituent include an alkoxy group, a halogen atom, a halogenated alkyl group, a hydroxyl group, an oxo group (=O), a cyano group, a carboxyl group, and the like.

The alkoxy group as the substituent for the linear or branched saturated hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the linear or branched saturated hydrocarbon group include a fluorine atom, chlorine atom, bromine atom and iodine atom, and a fluorine atom is preferable.

Examples of the halogenated alkyl group as the substituent for the linear or branched saturated hydrocarbon group include groups in which part or all of the hydrogen atoms within an aforementioned linear or branched saturated hydrocarbon group have each been substituted with an aforementioned halogen atom.

The cyclic saturated hydrocarbon group represented by $R^{7''}$ preferably has 3 to 20 carbon atoms. The cyclic saturated hydrocarbon group may be a polycyclic or monocyclic group, and examples thereof include groups in which one hydrogen atom has been removed from a monocycloalkane; groups in which one hydrogen atom has been removed from a polycycloalkane such as a bicycloalkane, a tricycloalkane, and a tetracycloalkane; and the like. More specific examples include groups in which one hydrogen atom has been removed from a monocycloalkane such as cyclopentane, cyclohexane, cycloheptane or cyclooctane, and groups in which one hydrogen atom has been removed from a polycycloalkane such as adamantane, norbornane, isobornane, tricyclodecane or tetracyclododecane.

The cyclic saturated hydrocarbon group may have a substituent. For example, part of the carbon atoms that constitute a ring within the cyclic saturated hydrocarbon group may be substituted with a hetero atom, or a hydrogen atom bonded to a ring within the cyclic saturated hydrocarbon may be substituted with a substituent.

Examples of the former case include groups in which one or more hydrogen atoms have been removed from a heterocycloalkane in which part of the carbon atoms that constitute the ring(s) of an aforementioned monocycloalkane or a polycycloalkane have been substituted with a hetero atom such as an oxygen atom, sulfur atom or nitrogen atom. Further, the ring structure may include an ester linkage (—C(=O)—O—). Specific examples include lactone-containing monocyclic groups such as groups in which one hydrogen atom has been removed from γ-butyrolactone, and lactone-containing polycyclic groups in which one hydrogen atom has been removed from a lactone ring-containing bicycloalkane, tricycloalkane or tetracycloalkane.

Examples of the substituents in the latter examples include the same ones as exemplified as the substituents that the linear or branched alkyl group described above may have, an alkyl group having 1 to 5 carbon atoms, and the like.

The saturated hydrocarbon group represented by $R^{7''}$ may be a combination of a linear or branched saturated hydrocarbon group with a cyclic saturated hydrocarbon group.

Examples of the combination of a linear or branched saturated hydrocarbon group with a cyclic saturated hydrocarbon group include groups in which a cyclic saturated hydrocarbon group as a substituent is bonded to a linear or branched saturated hydrocarbon group (for example, a 1-(1-adamantyl)methyl group), groups in which a linear or branched saturated hydrocarbon group as a substituent is bonded to a cyclic saturated hydrocarbon group, and the like.

The aliphatic unsaturated hydrocarbon group represented by $R^{7''}$ is preferably linear or branched. Examples of the linear aliphatic unsaturated hydrocarbon group include a vinyl group, a propenyl group (allyl group), a butynyl group, and the like. Examples of the branched aliphatic unsaturated hydrocarbon group include a 1-methylpropenyl group, a 2-methylpropenyl group, and the like. These linear or branched aliphatic unsaturated hydrocarbon groups may have a substituent. Examples of the substituent include the same substituents as those described above for the linear or branched saturated hydrocarbon group.

The aromatic hydrocarbon group represented by $R^{7''}$ is a monovalent hydrocarbon group having at least one aromatic ring, and may have a substituent.

The aromatic ring is not particularly limited as long as it is a ring of cyclic conjugation having $4n+2$ π electrons, and may be monocyclic or polycyclic. The aromatic ring preferably has 5 to 30 carbon atoms, more preferably has 5 to 20 carbon atoms, even more preferably has 6 to 15 carbon atoms, and particularly preferably has 6 to 12 carbon atoms. Here, the number of carbon atoms within substituents is not included in the number of carbon atoms of the aromatic hydrocarbon group. Specific examples of the aromatic ring include aromatic hydrocarbon rings such as benzene, naphthalene, anthracene, and phenanthrene; aromatic heterocyclic rings in which a portion of carbon atoms constituting the aromatic hydrocarbon ring has been substituted with hetero atoms; and the like. Examples of the hetero atom in the aromatic heterocyclic rings include an oxygen atom, a sulfur atom and a nitrogen atom. Specific examples of the aromatic heterocyclic ring include a pyridine ring, a thiophene ring, and the like.

Specific examples of the aromatic hydrocarbon group include groups in which one hydrogen atom has been removed from the aromatic hydrocarbon ring or the aromatic heterocyclic ring (an aryl group or a heteroaryl group); groups in which one hydrogen atom of the aromatic hydrocarbon ring or the aromatic heterocyclic ring has been substituted with an alkylene group (for example, arylalkyl groups such as a benzyl group, a phenethyl group, a 1-naphthylmethyl group, a 2-naphthylmethyl group, a 1-naphthylethyl group, and a 2-naphthylethyl group, or heteroarylalkyl groups); and the like. The alkylene group substituting the hydrogen atom of the aromatic hydrocarbon ring or the aromatic heterocyclic ring preferably has 1 to 4 carbon atoms, more preferably has 1 to 2 carbon atoms, and particularly preferably has 1 carbon atom.

The aromatic hydrocarbon group may or may not have a substituent. Here, in the present invention, in order that $R^3$, $R^4$, and $R^5$ have 1 or less aromatic ring as a whole, —C(=O)—O—$R^{7\prime\prime\prime}$ becomes the substituent in the substituted alkylene group, and when $R^{7\prime\prime\prime}$ is an aromatic hydrocarbon group, a non-aromatic substituent becomes the substituent that the aromatic hydrocarbon group has. The term "non-aromatic" means that a group does not have aromaticity. The non-aromatic substituent just needs not to include an aromatic group (aromatic hydrocarbon group or the like) within the structure, and examples thereof include an alkyl group, an alkoxy group, a halogen atom, a halogenated alkyl group, an hydroxyl group, an oxo group (=O), and the like.

The alkyl group for the substituent is preferably an alkyl group of 1 to 5 carbon atoms, and is most preferably a methyl group, ethyl group, propyl group, n-butyl group or tert-butyl group.

The alkoxy group for the substituent is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Preferable examples of the halogen atom as the above substituent include a fluorine atom, a chlorine atom, a bromine atom, an iodine atom, or the like, and among these, a fluorine atom is preferable.

Examples of the halogenated alkyl group for the substituent include groups in which part or all of the hydrogen atoms of an aforementioned alkyl group have each been substituted with an aforementioned halogen atom.

Among the above, as $R^{7\prime\prime\prime}$, a hydrogen atom, a saturated hydrocarbon group or an aliphatic unsaturated hydrocarbon group is preferable, since these have excellent lithography properties and form an excellent resist pattern shape. Among these, a hydrogen atom, a linear or branched saturated hydrocarbon group having 1 to 15 carbon atoms, or a cyclic saturated hydrocarbon group having 3 to 20 carbon atoms is more preferable.

$R^{8\prime\prime\prime}$ in —O—C(=O)—$R^{8\prime\prime\prime}$ represents a hydrogen atom or a hydrocarbon group.

Examples of $R^{8\prime\prime\prime}$ include the same ones as $R^{7\prime\prime\prime}$ above. Among these, a hydrogen atom and a saturated hydrocarbon group or an aliphatic unsaturated hydrocarbon group are preferable, since these have excellent lithography properties and form an excellent resist pattern shape. Among these, a hydrogen atom, a linear or branched saturated hydrocarbon group having 1 to 15 carbon atoms, or a cyclic saturated hydrocarbon group having 3 to 20 carbon atoms is more preferable.

$R^{9\prime\prime\prime}$ in —O—$R^{9\prime\prime\prime}$ represents a hydrogen atom or a hydrocarbon group.

Examples of $R^{9\prime\prime\prime}$ include the same ones as $R^{7\prime\prime\prime}$ above. Among these, a hydrogen atom, a saturated hydrocarbon group or an aliphatic unsaturated hydrocarbon group is preferable, since these have excellent lithography properties and form an excellent resist pattern shape. Among these, a hydrogen atom, a linear or branched saturated hydrocarbon group having 1 to 15 carbon atoms, or a cyclic saturated hydrocarbon group having 3 to 20 carbon atoms is more preferable.

As —O—$R^{9\prime\prime\prime}$ as the non-aromatic substituent described above, a hydroxyl group and an alkoxy group having 1 to 5 carbon atoms are preferable, and a methoxy group, an ethoxy group, an n-propoxy group, an iso-propoxy group, an n-butoxy group, and a tert-butoxy group, are most preferable.

As the aryl group as the substituent in the substituted alkylene group described above, an aryl group having 6 to 10 carbon atoms is preferable since this can be synthesized at a low cost. Specific examples include a phenyl group and a naphthyl group. Here, in the present invention, in order that $R^3$, $R^4$, and $R^5$ have 1 or less aromatic ring as a whole, $R^3$ represents a substituted alkylene group, and when the substituted alkylene group has an aryl group as a substituent, the substituted alkylene group can have one aryl group as a substituent.

The aryl group as a substituent may have a substituent. Here, in the present invention, in order that $R^3$, $R^4$, and $R^5$ have 1 or less aromatic ring as a whole, a non-aromatic substituent becomes a substituent that the aryl group as a substituent has. The non-aromatic substituent just needs not to contain an aromatic group (aromatic hydrocarbon group or the like) within the structure, and examples thereof include the same ones as exemplified as the non-aromatic substituent that the aromatic hydrocarbon group represented by $R^{7\prime\prime\prime}$ may have.

In Formula (a0-1), examples of the arylene group which may have a substituent and represented by $R^3$ include an unsubstituted arylene group having 6 to 20 carbon atoms; a substituted arylene group in which a portion or all of hydrogen atoms of the unsubstituted arylene group have been substituted with a substituent; and the like.

As the unsubstituted arylene group, an arylene group having 6 to 10 carbon atoms is preferable since this can by synthesized at a low cost. Specific examples thereof include a phenylene group, a naphthylene group, and the like.

Examples of the substituent in the substituted arylene group include the same ones as exemplified as the substituents in the substituted alkylene group described above. Here, in the present invention, in order that $R^3$, $R^4$, and $R^5$ have one or less aromatic ring as a whole, when $R^3$ represents a substituted arylene group, a non-aromatic substituent becomes a substituent that the substituted arylene group has. The non-aromatic substituent just needs not to contain an aromatic group (aromatic hydrocarbon group or the like) within the structure. Specifically, among those exemplified as substituents in the substituted alkylene group described above, a halogen atom, an oxo group (=O), a cyano group, an alkyl group, an alkoxyalkyloxy group, an alkoxycarbonylalkyloxy group, —C(=O)—O—$R^{7\prime\prime\prime}$, —O—C(=O)—$R^{8\prime\prime\prime}$, —O—$R^{9\prime\prime\prime}$ (here, each of $R^{7\prime\prime\prime}$, $R^{8\prime\prime\prime}$, and $R^{9\prime\prime\prime}$ independently represents a hydrogen atom, a saturated hydrocarbon group, or an aliphatic unsaturated hydrocarbon group), and the like are exemplified.

In Formula (a0-1), the organic group represented by $R^4$ and $R^5$ is not particularly limited, but examples thereof include an aryl group which may have a substituent, an alkyl group which may have a substituent, an alkenyl group which may have a substituent, and the like. Among these, an alkyl group which may have a substituent is preferable.

Examples of the aryl group which may have a substituent and be represented by $R^4$ and $R^5$ include an unsubstituted aryl group having 6 to 20 carbon atoms; a substituted aryl group in which a portion or all of hydrogen atoms of the unsubstituted aryl group have been substituted with a substituent; and the like.

As the unsubstituted aryl group, an aryl group having 6 to 10 carbon atoms is preferable, since this group cay be synthesized at a low cost. Specific examples include a phenyl group and a naphthyl group.

Examples of the substituent in the substituted aryl group include non-aromatic substituents. Examples of the non-aromatic substituents include the same ones as the non-aromatic substituents exemplified as the substituents that the above substituted arylene group may have.

Examples of the alkyl group represented by $R^4$ and $R^5$ include an unsubstituted alkyl group, a substituted alkyl group in which a portion or all of hydrogen atoms of the unsubstituted alkyl group have been substituted with a substituent; and the like.

The unsubstituted alkyl group may be linear, branched, or cyclic. In view of excellent resolution, an alkyl group having 1 to 10 carbon atoms is preferable, and an alkyl group having 1 to 5 carbon atoms is more preferable. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, a decyl group, and the like.

Examples of substituents in the substituted alkyl group include the same ones as exemplified as the substituents that the substituted alkylene group represented by $R^3$ may have.

Examples of the alkenyl group represented by $R^4$ and $R^5$ include an unsubstituted alkenyl group, a substituted alkenyl group in which a portion or all of hydrogen atoms of the unsubstituted alkenyl group have been substituted with a substituent; and the like.

The unsubstituted alkenyl group is preferably linear or branched, and preferably has 2 to 10 carbon atoms, more preferably has 2 to 5 carbon atoms, and even more preferably has 2 to 4 carbon atoms. Specific examples include a vinyl group, propenyl group (allyl group), butynyl group, 1-methylpropenyl group and 2-methylpropenyl group.

Examples of the substituent in the substituted alkenyl group include the same ones as exemplified as the substituents that the substituted alkylene group represented by $R^3$ may have.

In Formula (a0-1), $R^4$ and $R^5$ may be bonded to each other to form a ring with a sulfur atom in the formula. The ring may be saturated or unsaturated. In addition, the ring may be monocyclic or polycyclic. For example, if $R^4$ and $R^5$ are bonded to each other when either or both of $R^4$ and $R^5$ forming the ring are a cyclic group (a cyclic alkyl or aryl group), a polycyclic ring (condensed ring) is formed.

As the formed ring, a single ring containing a sulfur atom in the formula within the ring skeleton thereof is preferably constituted with 3 to 10 members, and particularly preferably constituted with 5 to 7 members, including the sulfur atom.

The ring may have hetero atoms other then the sulfur atom to which $R^4$ and $R^5$ are bonded, as atoms constituting the ring skeleton. Examples of the hetero atoms include a sulfur atom, an oxygen atom, a nitrogen atom, and the like.

Specific examples of the formed ring include a thiophene ring, a thiazole ring, a benzothiophene ring, a tetrahydrothiophenium ring, a tetrahydrothiopyranium ring, and the like.

In Formula (a0-1), $V^-$ represents a counteranion.

The counteranion represented by $V^-$ is not particularly limited, and for example, those known in the related art as anion moieties of onium salt acid-generators can be used appropriately.

Examples of $V^-$ include anions represented by general formula "$R^{4'''}SO_3^-$".

In the general formula "$R^{4'''}SO_3^-$", $R^{4'''}$ represents an alkyl group which may have a substituent, a halogenated alkyl group, an aryl group, or an alkenyl group.

The alkyl group represented by $R^{4'''}$ may be linear, branched, or cyclic.

The linear or branched alkyl group represented by $R^{4'''}$ preferably has 1 to 10 carbon atoms, more preferably has 1 to 8 carbon atoms, and most preferably has 1 to 4 carbon atoms.

The cyclic alkyl group for the aforementioned $R^{4'''}$ preferably has 4 to 15 carbon atoms, more preferably 4 to 10 carbon atoms, and most preferably 6 to 10 carbon atoms.

When $R^{4'''}$ represents an alkyl group, examples of "$R^{4'''}SO_3^-$" include alkylsulfonates, such as methanesulfonate, n-propanesulfonate, n-butanesulfonate, n-octanesulfonate, 1-adamantanesulfonate, 2-norbornanesulfonate and d-camphor-10-sulfonate.

The halogenated alkyl group for the aforementioned $R^{4'''}$ is an alkyl group in which part or all of the hydrogen atoms thereof have been substituted with a halogen atom. The alkyl group preferably has 1 to 5 carbon atoms, and is preferably a linear or branched alkyl group, and more preferably a methyl group, an ethyl group, a propyl group, an isopropyl group, an n-butyl group, a tert-butyl group, a tert-pentyl group or an isopentyl group. Examples of the halogen atom which substitutes the hydrogen atoms include a fluorine atom, a chlorine atom, an iodine atom and a bromine atom. In the halogenated alkyl group, it is preferable that 50 to 100% of all hydrogen atoms within the alkyl group (prior to halogenation) have been substituted with a halogen atom, and it is preferable that all hydrogen atoms have been substituted with a halogen atom.

As the halogenated alkyl group, a fluorinated alkyl group is preferable. The fluorinated alkyl group preferably has 1 to 10 carbon atoms, more preferably 1 to 8 carbon atoms, and most preferably 1 to 4 carbon atoms.

Further, the fluorination ratio of the fluorinated alkyl group is preferably from 10 to 100%, more preferably from 50 to 100%, and it is most preferable that all hydrogen atoms be substituted with fluorine atoms because the acid strength increases.

Specific examples of such fluorinated alkyl groups include a trifluoromethyl group, a heptafluoro-n-propyl group and a nonafluoro-n-butyl group.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4'''}$ may have one substituent, or two or more substituents.

Examples of the substituent include a halogen atom, a hetero atom, an alkyl group, and a group represented by the formula $X^3$-Q'- (in the formula, Q' represents a divalent linking group containing an oxygen atom; and $X^3$ represents a hydrocarbon group of 3 to 30 carbon atoms which may have a substituent).

Examples of halogen atoms and alkyl groups include the same halogen atoms and alkyl groups as those described above with respect to the halogenated alkyl group for $R^{4'''}$.

Examples of hetero atoms include an oxygen atom, a nitrogen atom, and a sulfur atom.

In the group represented by formula $X^3$-Q'-, Q' represents a divalent linking group containing an oxygen atom.

Q' may contain an atom other than an oxygen atom. Examples of atoms other than oxygen include a carbon atom, a hydrogen atom, a sulfur atom and a nitrogen atom.

Examples of the divalent linking group containing an oxygen atom include non-hydrocarbon oxygen atom-containing linking groups such as an oxygen atom (ether bond: —O—), an ester bond (—C(=O)—O—), an amide bond (—C(=O)—NH—), a carbonyl bond (—C(=O)—), and a carbonate bond (—O—C(=O)—O—); a combination of the non-hydrocarbon oxygen atom-containing linking group with an alkylene group; and the like. Furthermore, the combinations may have a sulfonyl group (—SO$_2$—) bonded thereto.

Specific examples of such combinations include —R$^{91}$—O—, —R$^{92}$—O—C(=O)—, —C(=O)—O—R$^{93}$—O—C(=O)—, —SO$_2$—O—R$^{94}$—O—C(=O)—, and —R$^{95}$—SO$_2$—O—R$^{94}$—O—C(=O)— (in the formula, R$^{91}$ to R$^{95}$ independently represents an alkylene group).

The alkylene group for R$^{91}$ to R$^{95}$ is preferably a linear or branched alkylene group, and preferably has 1 to 12 carbon atoms, more preferably 1 to 5, and most preferably 1 to 3.

Specific examples of alkylene groups include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

As Q', a divalent linking group containing an ester bond or an ether bond is preferable, and —R$^{91}$—O—, —R$^{92}$—O—C(=O)— or —C(=O)—O—R$^{93}$—O—C(=O)— is more preferable.

In the group represented by $X^3$-Q'-, the hydrocarbon group represented by $X^3$ may be an aromatic hydrocarbon group or an aliphatic hydrocarbon group.

The aromatic hydrocarbon group is a hydrocarbon group having at least one aromatic ring.

The aromatic ring is not particularly limited as long as it is a ring of cyclic conjugation having 4n+2 π electrons, and may be monocyclic or polycyclic. The aromatic ring preferably has 5 to 30 carbon atoms, more preferably has 5 to 20 carbon atoms, even more preferably has 6 to 15 carbon atoms, and particularly preferably has 6 to 12 carbon atoms. Here, the number of carbon atoms within substituents is not included in the number of carbon atoms of the aromatic hydrocarbon group. Specific examples of the aromatic ring include aromatic hydrocarbon rings such as benzene, naphthalene, anthracene, and phenanthrene; aromatic heterocyclic rings in which a portion of carbon atoms constituting the aromatic hydrocarbon rings has been substituted with a hetero atom; and the like. Examples of the hetero atom in the aromatic heterocyclic rings include an oxygen atom, a sulfur atom and a nitrogen atom. Specific examples of the aromatic heterocyclic ring include a pyridine ring, a thiophene ring, and the like.

Specific examples of the aromatic hydrocarbon group as the divalent hydrocarbon group include groups in which one hydrogen atom has been removed from the aromatic hydrocarbon ring or the aromatic heterocyclic ring (an aryl group or a heteroaryl group); groups in which one hydrogen atom has been removed from an aromatic compound (for example, biphenyl, fluorene, and the like) containing two or more aromatic rings; group in which one hydrogen atom of the aromatic hydrocarbon ring or the aromatic heterocyclic ring has been substituted with an alkylene group (for example, arylalkyl groups such as a benzyl group, a phenethyl group, a 1-naphthylmethyl group, a 2-naphthylmethyl group, a 1-naphthylethyl group, and a 2-naphthylethyl group, or hetero aryl alkyl groups); and the like. The alkylene group substituting a hydrogen atom of the aromatic hydrocarbon ring or the aromatic heterocyclic ring preferably has 1 to 4 carbon atoms, more preferably has 1 to 2 carbon atoms, and particularly preferably has 1 carbon atom.

The aromatic hydrocarbon group may have a substituent. For example, the hydrogen atom bonded to the aromatic ring that the aromatic hydrocarbon group has may be substituted with a substituent. Examples of the substituent include an alkyl group, alkoxy group, halogen atom, halogenated alkyl group, hydroxyl group and oxygen atom (=O).

The alkyl group as the substituent for the aromatic hydrocarbon group is preferably an alkyl group of 1 to 5 carbon atoms, and a methyl group, ethyl group, propyl group, n-butyl group or tert-butyl group is the most desirable.

The alkoxy group as the substituent for the aromatic hydrocarbon group is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom as the substituent for the aromatic hydrocarbon group include a fluorine atom, chlorine atom, bromine atom and iodine atom, and a fluorine atom is preferable.

Examples of the halogenated alkyl group as the substituent for the aromatic hydrocarbon group include groups in which part or all of the hydrogen atoms within an aforementioned alkyl group have each been substituted with an aforementioned halogen atom.

When $X^3$ is an aromatic ring, $X^3$ preferably has only one aromatic ring as a whole. In addition, when $X^3$ has an aromatic ring, $R^3$, $R^4$, and $R^5$ preferably do not have any aromatic ring.

The aliphatic hydrocarbon group represented by $X^3$ may be a saturated or unsaturated aliphatic hydrocarbon group. Further, the aliphatic hydrocarbon group may be linear, branched or cyclic.

In the aliphatic hydrocarbon group represented by $X^3$, a portion of carbon atoms constituting the aliphatic hydrocarbon group may be substituted with a substituent containing a hetero atom, and a portion or all of hydrogen atoms constituting the aliphatic hydrocarbon group may be substituted with a substituent containing a hetero atom.

The "hetero atom" in $X^3$ is not particularly limited as long as it is an atom other than a carbon atom and a hydrogen atom, and examples thereof include a halogen atom, an oxygen atom, a sulfur atom, a nitrogen atom, and the like. Examples of the halogen atom include a fluorine atom, chlorine atom, iodine atom and bromine atom.

The substituent containing a hetero atom may consist solely of the hetero atom, or may be a group that also contains a group or atom other than the hetero atom.

Specific examples of the substituent for substituting part of the carbon atoms include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituents in the ring structure.

Examples of the substituent for substituting part or all of the hydrogen atoms include an alkoxy group, halogen atom, halogenated alkyl group, hydroxyl group, oxygen atom (=O) and cyano group.

The alkoxy group is preferably an alkoxy group of 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom include a fluorine atom, chlorine atom, bromine atom and iodine atom, and a fluorine atom is preferable.

Examples of the halogenated alkyl group include groups in which part or all of the hydrogen atoms within an alkyl group of 1 to 5 carbon atoms (such as a methyl group, ethyl group, propyl group, n-butyl group or tert-butyl group) have each been substituted with an aforementioned halogen atom.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably contains 1 to 20 carbon atoms, more preferably 1 to 15 carbon atoms, and most preferably 1 to 10 carbon atoms. Specific examples include a methyl group, ethyl group, propyl group, butyl group, pentyl group, hexyl group, heptyl group, octyl group, nonyl group, decyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group and docosyl group.

The branched saturated hydrocarbon group (alkyl group) preferably contains 3 to 20 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The unsaturated hydrocarbon group preferably contains 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (allyl group) and a butynyl group. Examples of branched monovalent unsaturated hydrocarbon groups include a 1-methylpropenyl group and a 2-methylpropenyl group.

Among the above examples, a propenyl group is particularly desirable as the unsaturated hydrocarbon group.

The aliphatic cyclic group may be either a monocyclic group or a polycyclic group. The aliphatic cyclic group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples of the aliphatic cyclic group include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent in the ring structure, the aliphatic cyclic group is preferably a polycyclic group, more preferably a group in which one or more hydrogen atoms have been removed from a polycycloalkane, and most preferably a group in which one or more hydrogen atoms have been removed from adamantane.

When the aliphatic cyclic group contains a hetero atom-containing substituent in the ring structure, the hetero atom-containing substituent is preferably —O—, —C(=O)—O—, —S—, —S(=O)$_2$— or —S(=O)$_2$—O—. Specific examples of such aliphatic cyclic groups include the groups represented by formulas (L1) to (L6) and (S1) to (S4) shown below.

[Chemical Formula 3]

(L1)

(L2)

(L3)

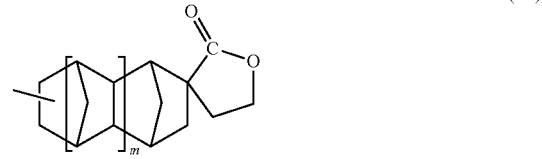

(L4)

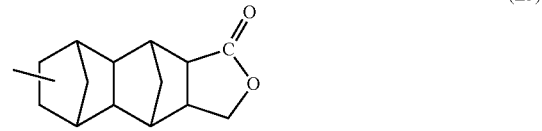

(L5)

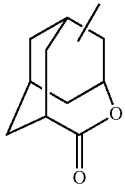
(L6)

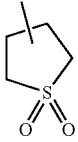
(S1)

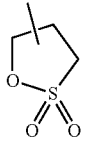
(S2)

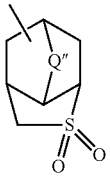
(S3)

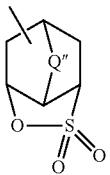
(S4)

In the formula, Q″ represents an alkylene group having 1 to 5 carbon atoms, —O—, —S—, —O—R$^{94\prime}$—, or —S—R$^{95\prime}$—, each of R$^{94\prime}$ and R$^{95\prime}$ independently represents an alkylene group having 1 to 5 carbon atoms, and m represents an integer of 0 or 1.

In the formula, examples of each of the alkylene groups represented by Q″, R$^{94\prime}$, and R$^{95\prime}$ include the same ones as the alkylene group represented by R$^{91}$ to R$^{95}$ above.

In these aliphatic cyclic groups, part of the hydrogen atoms bonded to the carbon atoms that constitute the ring structure may each be substituted with a substituent. Examples of this substituent include an alkyl group, alkoxy group, halogen atom, halogenated alkyl group, hydroxyl group and oxygen atom (═O).

As the alkyl group, an alkyl group of 1 to 5 carbon atoms is preferable, and a methyl group, ethyl group, propyl group, n-butyl group or tert-butyl group is particularly desirable.

Examples of each of the alkoxy group and the halogen atom include the same ones as exemplified as substituents substituting a portion or all of hydrogen atoms constituting the aliphatic hydrocarbon group represented by X$^3$.

In the present invention, X$^3$ is preferably a cyclic group which may have a substituent. This cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent or a phenyl group which may have a substituent is preferable.

As the aliphatic cyclic group which may have a substituent, a polycyclic aliphatic cyclic group which may have a substituent is preferable. As this polycyclic aliphatic cyclic group, groups in which one or more hydrogen atoms have been removed from an aforementioned polycycloalkane, and groups represented by the above formulas (L2) to (L6), and (S3) and (S4) are preferable.

Among the above, as R$^{4\prime\prime\prime}$, a halogenated alkyl group or a group having X$^3$-Q′- as a substituent is preferable.

When having X$^3$-Q′- as a substituent, R$^{4\prime\prime\prime}$ is preferably a group represented by X$^3$-Q′-Y$^5$— [in the formula, Q′ and X$^3$ have the same definition as above, and Y$^5$ represents an alkylene group having 1 to 4 carbon atoms that may have a substituent or a fluorinated alkylene group having 1 to 4 carbon atoms that may have a substituent].

In the group represented by X$^3$-Q′-Y′—, examples of the alkylene group represented by Y$^5$ include the same ones as the alkylene group having 1 to 4 carbon atoms among the alkylene groups exemplified for Q′ above.

Examples of the fluorinated alkylene group for Y$^5$ include groups in which part or all of the hydrogen atoms of an above-mentioned alkylene group have each been substituted with a fluorine atom.

Specific examples of Y′ include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, —C(CF$_3$)(CF$_2$CF$_3$)—; —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, —C(CF$_3$)$_2$CH$_2$—; —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH(CH$_3$)CH$_2$CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)— and —C(CH$_3$)(CH$_2$CH$_3$)—.

Y$^5$ is preferably a fluorinated alkylene group, and particularly preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CH$_2$CF$_2$—, —CH$_2$CH$_2$CF$_2$—, —CH$_2$CF$_2$CF$_2$—, —CH$_2$CH$_2$CH$_2$CF$_2$—, —CH$_2$CH$_2$CF$_2$CF$_2$— and —CH$_2$CF$_2$CF$_2$CF$_2$—.

Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

The alkylene group or fluorinated alkylene group may have a substituent. The expression that the alkylene group or fluorinated alkylene group "may have a substituent" means that part or all of the hydrogen atoms or fluorine atoms in the alkylene group or fluorinated alkylene group may each be substituted, either with an atom other than a hydrogen atom or fluorine atom, or with a group.

Examples of substituents with which the alkylene group or fluorinated alkylene group may be substituted include alkyl groups of 1 to 4 carbon atoms, alkoxy groups of 1 to 4 carbon atoms, and a hydroxyl group.

Specific examples of $R^{4"}$—$SO_3^-$ in which $R^{4"}$ is represented by $X^3$-$Q'$-$Y^5$—include anions represented by one of the following Formulae (b1) to (b9).

[Chemical Formula 4]

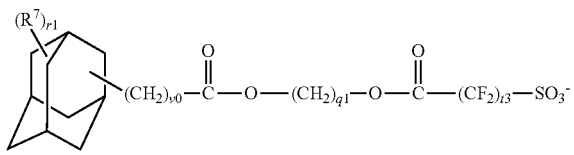
(b1)

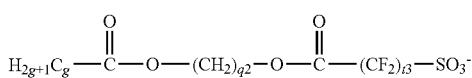
(b2)

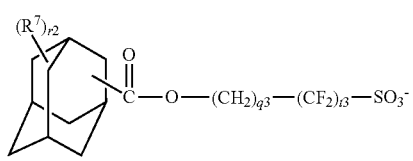
(b3)

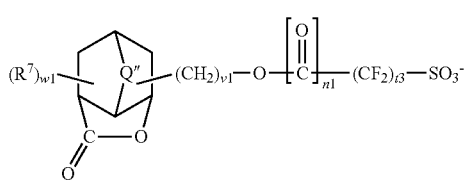
(b4)

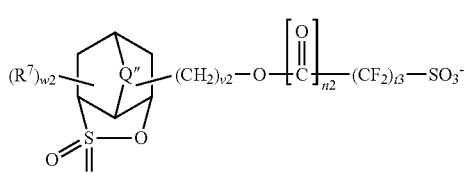
(b5)

[Chemical Formula 5]

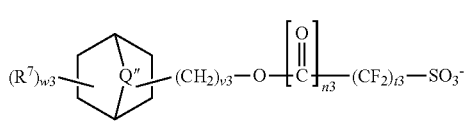
(b6)

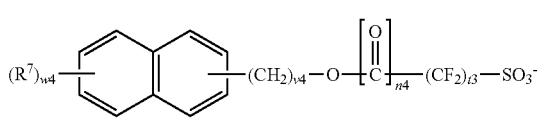
(b7)

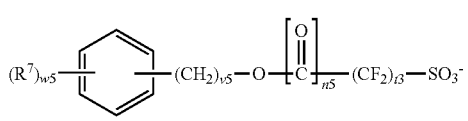
(b8)

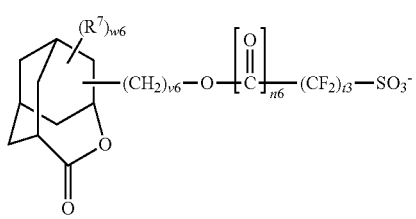
(b9)

In the formula, each of q1 and q2 independently represents an integer of 1 to 5, q3 represents an integer of 1 to 12, t3 represents an integer of 1 to 3, each of r1 and r2 independently represents an integer of 0 to 3, g represents an integer of 1 to 20, $R^7$ represents a substituent, each of n1 to n6 independently represents 0 or 1, each of v0 to v6 independently represents an integer of 0 to 3, each of w1 to w6 independently represents an integer of 0 to 3, and Q" has the same definition as above.

Examples of the substituent represented by $R^7$ include those exemplified in the description for the above $X^3$ as the substituents that may substitute a portion of hydrogen atoms bonded to carbon atoms constituting a ring structure of the aliphatic cyclic group, and the same ones as exemplified as the substituents that may substitute hydrogen atoms bonded to an aromatic ring that the aromatic hydrocarbon group has.

If there are two or more of the $R^7$ group, as indicated by the values r1, r2, and w1 to w6, then the two or more of the $R^7$ groups may be the same or different from each other.

In addition, examples of $V^-$ in Formula (a0-1) include the anion represented by the following general formula (b-3) and the anion represented by the following general formula (b-4).

[Chemical Formula 6]

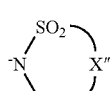
(b-3)

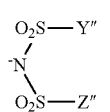
(b-4)

In the formulae, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

In Formula (b-3), X" represents a linear or branched alkylene group in which at least one hydrogen atom has been substituted with a fluorine atom, and the alkylene group preferably has 2 to 6 carbon atoms, more preferably has 3 to 5 carbon atoms, and most preferably has 3 carbon atoms.

In Formula (b-4), each of Y" and Z" independently represents a linear or branched alkyl group in which at least one hydrogen atom has been substituted with a fluorine atom, and the alkyl group preferably has 1 to 10 carbon atoms, more preferably has 1 to 7 carbon atoms, and most preferably has 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms be as large as possible because the acid strength increases and the transparency to high energy radiation of 200 nm or less or electron beam is improved.

The amount of fluorine atoms within the alkylene group or alkyl group, i.e., fluorination ratio, is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

As V⁻ in Formula (a0-1), the anion represented by general formula "R⁴'''SO₃⁻" (particularly, the anions represented by the Formulae (b1) to (b9) in which R⁴''' is a group represented by X³-Q'-Y⁵—) is preferable.

A structural unit having the group represented by the general formula (a0-1) (hereinafter, referred to as a "structural unit (a0-1)") is not particularly limited, as long as it has a group represented by the general formula (a0-1) in the structure, but the structural unit is preferably a structural unit derived from a compound having an ethylenic double bond.

Herein, the "structural unit derived from a compound having an ethylenic double bond" refers to a structural unit having a structure in which an ethylenic double bond in a compound having the ethylenic double bond has been cleaved and become a single bond.

Examples of the compound having an ethylenic double bond include acrylic acid or an ester thereof in which a hydrogen atom bonded to a carbon atom on the α-position may be substituted with a substituent, an acrylamide or a derivative thereof in which a hydrogen atom bonded to a carbon atom on the α-position may be substituted with a substituent, a vinyl aromatic compound in which a hydrogen atom bonded to a carbon atom on the α-position may be substituted with a substituent, cycloolefin or a derivative thereof, a vinyl sulfonic acid ester, and the like.

Among these, acrylic acid or an ester thereof in which a hydrogen atom bonded to a carbon atom on the α-position may be substituted with a substituent, an acrylamide or a derivative thereof in which a hydrogen atom bonded to a carbon atom on the α-position may be substituted with a substituent, and a vinyl aromatic compound in which a hydrogen atom bonded to a carbon atom on the α-position may be substituted with a substituent are preferable.

An "acrylate ester" refers to a compound in which the terminal hydrogen atom of the carboxyl group of acrylic acid ($CH_2$=CH—COOH) has been substituted with an organic group.

In the present specification, the acrylic acid and acrylate esteracrylate ester in which a hydrogen atom bonded to a carbon atom on the α-position has been substituted with a substituent are called an α-substituted acrylic acid and an α-substituted acrylate ester respectively in some cases. In addition, the acrylic acid and α-substituted acrylic acid are collectively called "(α-substituted) acrylic acid", and the α-substituted acrylate esters are collectively called an "(α-substituted) acrylate ester" in some cases.

Examples of the substituent bonded to a carbon atom on the α-position of the α-substituted acrylic acid or an ester thereof include a halogen atom, an alkyl group having 1 to 5 carbon atoms, a halogenated alkyl group having 1 to 5 carbon atoms, a hydroxyalkyl group, and the like. The "α-position (the carbon atom on the α-position)" refers to the carbon atom having the carbonyl group bonded thereto, unless specified otherwise.

Examples of the halogen atom as the substituent of the α-position include a fluorine atom, a chlorine atom, a bromine atom, an iodine atom, and the like.

Specific examples of the alkyl group having 1 to 5 carbon atoms as the substituent of the α-position include linear or branched alkyl groups such as a methyl group, an ethyl group, a propyl group, an isopropyl group, an n-butyl group, an isobutyl group, a tert-butyl group, a pentyl group, an isopentyl group, and a neopentyl group.

Specific examples of the halogenated alkyl group having 1 to 5 carbon atoms as the substituent of the α-position include groups in which a portion or all of hydrogen atoms of the alkyl group having 1 to 5 carbon atoms have been substituted with halogen atoms. Examples of the halogen atom include a fluorine atom, chlorine atom, bromine atom and iodine atom, and a fluorine atom is particularly desirable.

As the hydroxyalkyl group as the substituent of the α-position, a hydroxyalkyl group having 1 to 5 carbon atoms is preferable, and specific examples thereof include groups in which a portion or all of hydrogen atoms of the alkyl group having 1 to 5 carbon atoms have been substituted with hydroxyl groups.

In the present invention, as the substituent bonded to the carbon atom on the α-position of the (α-substituted) acrylic acid or an ester thereof, a hydrogen atom, an alkyl group having 1 to 5 carbon atoms, or a halogenated alkyl group having 1 to 5 carbon atoms is preferable, and a hydrogen atom, an alkyl group having 1 to 5 carbon atoms, or a fluorinated alkyl group having 1 to 5 carbon atoms is more preferable. The substituent is most preferably a hydrogen atom or a methyl group since these can be easily obtained industrially.

An "organic group" is a group containing a carbon atom, and may contain an atom other than a carbon atom (for examples, a hydrogen atom, an oxygen atom, a nitrogen atom, a sulfur atom, or a halogen atom (a fluorine atom, a chlorine atom, or the like)).

The organic group that the (α-substituted) acrylate ester has is not particularly limited, and examples thereof include the aromatic group and the polarity-converting group described above, characteristic groups such as an acid-decomposable group described later, a characteristic group-containing group that contains the characteristics groups within the structure, and the like. Examples of the characteristic group-containing group include groups in which a divalent linking group is bonded to the characteristic group, and the like. Examples of the divalent linking group include the same ones as the divalent linking group represented by $Q^1$ in the Formula (a0-1).

Examples of the "acrylamide or a derivative thereof" include an acrylamide in which a hydrogen atom bonded to a carbon atom on the α-position may be substituted with a substituent (hereinafter, referred to as (α-substituted) acrylamide in some cases), a compound in which either or both of hydrogen atoms at the terminal of an amino group of the (α-substituted) acrylamide have each been substituted with a substituent, and the like.

Examples of the substituent which may be bonded to a carbon atom of the α-position of the acrylamide or a derivative thereof include the same ones as exemplified as the substituents bonded to a carbon atom of the α-position of the α-substituted acrylate ester described above.

As the substituent that substitutes either or both of hydrogen atoms at the terminal of an amino group of the (α-substituted) acrylamide, an organic group is preferable. The organic group is not particularly limited, and examples thereof include the same ones as the organic groups that the above (α-substituted) acrylate ester has.

Examples of the compound in which either or both of hydrogen atoms at the terminal of an amino group of the (α-substituted) acrylamide have been substituted with a substituent include compounds in which —C(=O)—O— bonded to a carbon atom of the α-position in the above (α-substituted) acrylate ester has been substituted with —C(=O)—N($R^b$)— [in the formula, $R^b$ represents a hydrogen atom or an alkyl group having 1 to 5 carbon atoms].

In the formula, the alkyl group represented by $R^b$ is preferably linear or branched.

The "vinyl aromatic compound" refers to a compound having an aromatic ring and one vinyl group bonded to the aromatic ring, and examples thereof include styrene or a derivative thereof, vinyl naphthalene or a derivative thereof, and the like.

Examples of the substituent that may be bonded to a carbon atom on the α-position (carbon atoms bonded to the aromatic ring among carbon atoms of the vinyl group) of the vinyl aromatic compound include the same ones as exemplified as substituents bonded to a carbon atom on the α-position of the above α-substituted acrylate ester.

Hereinafter, the vinyl aromatic compound in which a hydrogen atom bonded to a carbon atom on the α-position has been substituted with a substituent is referred to as an (α-substituted) vinyl aromatic compound in some cases.

Examples of the "styrene or a derivative thereof" include styrene in which a hydrogen atom bonded to a carbon atom on the α-position may be substituted with a substituent, and a hydrogen atom bonded to a benzene ring may be substituted with a substituent other than a hydroxyl group (hereinafter, referred to as (α-substituted) styrene in some cases), hydroxystyrene in which a hydrogen atom bonded to a carbon atom on the α-position may be substituted with a substituent, and a hydrogen atom bonded to a benzene ring may be substituted with a substituent other than a hydroxyl group (hereinafter, referred to as (α-substituted) hydroxystyrene in some cases), a compound in which a hydrogen atom of a hydroxyl group of the (α-substituted) hydroxystyrene has been substituted with an organic group, vinyl benzoate in which a hydrogen atom bonded to a carbon atom on the α-position may be substituted with a substituent, and a hydrogen atom bonded to a benzene ring may be substituted with a substituent other than a hydroxyl group or a carboxyl group (hereinafter, referred to as (α-substituted) vinyl benzoate), a compound in which a hydrogen atom of a carboxyl group of the (α-substituted) vinyl benzoate has been substituted with an organic group, and the like.

The hydroxystyrene is a compound in which one vinyl group and at least one hydroxyl group are bonded to a benzene ring. The number of the hydroxyl groups bonded to the benzene ring is preferably 1 to 3, and particularly preferably 1. The bonding position of the hydroxyl group in the benzene ring is not particularly limited. When the number of the hydroxyl groups is 1, the bonding position is preferably a para 4 position of the bonding position of the vinyl group. When the number of the hydroxyl groups is an integer of 2 or greater, any bonding positions can be combined.

The vinyl benzoate is a compound in which one vinyl group is bonded to a benzene ring of benzoic acid.

The bonding position of the vinyl group in the benzene ring is not particularly limited.

The substituent other than a hydroxyl group and a carboxyl group that may be bonded to a benzene ring of styrene or a derivative thereof is not particularly limited, and examples thereof include a halogen atom, an alkyl group having 1 to 5 carbon atoms, a halogenated alkyl group having 1 to 5 carbon atoms, and the like. Examples of the halogen atom include a fluorine atom, a chlorine atom, a bromine atom, an iodine atom, and the like, and among these, a fluorine atom is particularly preferable.

The organic group in the compound in which a hydrogen atom of a hydroxyl group of the (α-substituted) hydroxystyrene has been substituted with an organic group is not particularly limited, and examples thereof include the organic group exemplified as an organic group that the above (α-substituted) acrylate ester has.

The organic group in the compound in which a hydrogen atom of a carboxyl group of the (α-substituted) vinyl benzoate has been substituted with an organic group is not particularly limited, and examples thereof include the organic group exemplified as an organic group that the above (α-substituted) acrylate ester has.

Examples of the "vinyl naphthalene or a derivative thereof" include vinyl naphthalene in which a hydrogen atom bonded to a carbon atom on the α-position may be substituted with a substituent, and a hydrogen atom bonded to a naphthalene ring may be substituted with a substituent other than a hydroxyl group (hereinafter, referred to as (α-substituted) vinyl naphthalene in some cases), vinyl (hydroxynaphthalene) in which a hydrogen atom bonded to a carbon atom on the α-position may be substituted with a substituent, and a hydrogen atom bonded to a naphthalene ring may be substituted with a substituent other than a hydroxyl group (hereinafter, referred to as (α-substituted) vinyl (hydroxynaphthalene) in some cases), a compound in which a hydrogen atom of a hydroxyl group of the (α-substituted) vinyl (hydroxynaphthalene) has been substituted with a substituent, and the like.

The vinyl (hydroxynaphthalene) is a compound in which one vinyl group and at least one hydroxyl group are bonded to a naphthalene ring. The vinyl group may be bonded to the 1-position or 2-position of the naphthalene ring. The number of the hydroxyl groups bonded to a naphthalene ring is preferably 1 to 3, and particularly preferably 1. The bonding position of the hydroxyl group in a naphthalene ring is not particularly limited. When the vinyl group is bonded to the 1-position or 2-position of a naphthalene ring, the hydroxyl group is preferably bonded to any one of 5- to 8-positions of a naphthalene ring. Particularly, when the number of the hydroxyl groups is 1, the hydroxyl group is preferably bonded to any one of 5- to 7-positions of a naphthalene ring, and preferably bonded to 5- or 6-position. When the number of the hydroxyl groups is an integer of 2 or greater, any of the bonding positions can be combined with each other.

Examples of the substituent that may be bonded to a naphthalene ring of vinyl naphthalene or a derivative thereof include the same ones as exemplified as the substituents that may be bonded to a benzene ring of the above (α-substituted) styrene.

The organic group in the compound in which a hydrogen atom of a hydroxyl group of the (α-substituted) vinyl (hydroxynaphthalene) has been substituted with an organic group is not particularly limited, and examples thereof include the same ones as the organic group that the above (α-substituted) acrylate ester has.

Specific examples of the structural unit derived from the (α-substituted) acrylic acid or an ester thereof include the structural unit represented by the following general formula (U-1).

Specific examples of structural units derived from the structural unit derived from the (α-substituted) acrylamide or a derivative thereof include the structural units represented by the following general formula (U-2).

Among the (α-substituted) vinyl aromatic compounds, specific examples of the structural unit derived from the (α-substituted) styrene or a derivative thereof include the structural units represented by the following general formula (U-3). In addition, specific examples of the structural unit derived from the (α-substituted) vinyl naphthalene or a derivative thereof include the structural units represented by the following general formula (U-4).

[Chemical Formula 7]

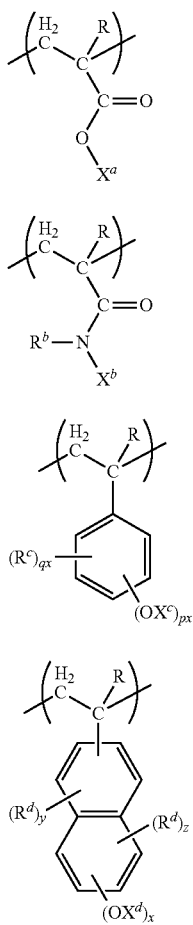

In the formula, R represents a hydrogen atom, an alkyl group having 1 to 5 carbon atoms, or a halogenated alkyl group having 1 to 5 carbon atoms. Each of $X^a$ to $X^d$ independently represents a hydrogen atom or an organic group. $R^b$ represents a hydrogen atom or an alkyl group having 1 to 5 carbon atoms. Each of $R^c$ and $R^d$ independently represents a halogen atom, $—COOX^e$ ($X^e$ represents a hydrogen atom or an organic group), an alkyl group having 1 to 5 carbon atoms, or a halogenated alkyl group having 1 to 5 carbon atoms. px represents an integer of 0 to 3, qx represents an integer of 0 to 5, and px+qx is 0 to 5. When qx is an integer of 2 or greater, plural $R^c$s may be the same as or different from each other. x represents an integer of 0 to 3, y represents an integer of 0 to 3, z represents an integer of 0 to 4, and x+y+z is 0 to 7. When y+z is an integer of 2 or greater, plural $R^d$s may be the same as or different from each other.

As the structural unit (a0-1), a structural unit which is derived from acrylate ester in which a hydrogen atom bonded to a carbon atom on the α-position may be substituted with a substituent, and contains the group represented by the general formula (a0-1) is particularly preferable. Examples of such a structural unit include the structural unit represented by the following general formula (a0-11).

[Chemical Formula 8]

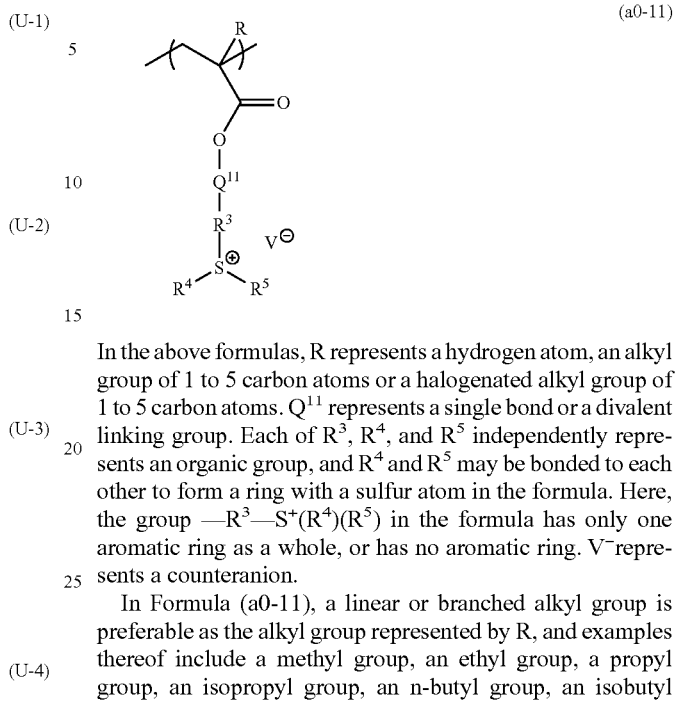

In the above formulas, R represents a hydrogen atom, an alkyl group of 1 to 5 carbon atoms or a halogenated alkyl group of 1 to 5 carbon atoms. $Q^{11}$ represents a single bond or a divalent linking group. Each of $R^3$, $R^4$, and $R^5$ independently represents an organic group, and $R^4$ and $R^5$ may be bonded to each other to form a ring with a sulfur atom in the formula. Here, the group $—R^3—S^+(R^4)(R^5)$ in the formula has only one aromatic ring as a whole, or has no aromatic ring. $V^-$ represents a counteranion.

In Formula (a0-11), a linear or branched alkyl group is preferable as the alkyl group represented by R, and examples thereof include a methyl group, an ethyl group, a propyl group, an isopropyl group, an n-butyl group, an isobutyl group, a tert-butyl group, a pentyl group, an isopentyl group, a neopentyl group, and the like.

Examples of the halogenated alkyl group represented by R include groups in which a portion or all of hydrogen atoms of the alkyl group represented by R have been substituted with halogen atoms. Examples of the halogen atom include a fluorine atom, chlorine atom, bromine atom and iodine atom, and a fluorine atom is particularly desirable.

As R, a hydrogen atom, an alkyl group having 1 to 5 carbon atoms, or a fluorinated alkyl group having 1 to 5 carbon atoms is preferable, and among these, a hydrogen atom or a methyl group is particularly preferable.

In Formula (a0-11), each of $R^3$ to $R^5$ and $V^-$ has the same definition as $R^3$ to $R^5$ and $V^-$ in the Formula (a0-1).

$Q^{11}$ in Formula (a0-11) has the same definition as $Q^{11}$ in $—C(=O)—O-Q^{11}$ exemplified in the description for $Q^1$ in the Formula (a0-1).

(Structural Unit Having Group Represented by Formula (a0-2))

In the Formula (a0-2), $Q^2$ represents a single bond or a divalent linking group. Examples of the divalent linking group represented by $Q^2$ include the same ones as the divalent linking group represented by $Q^1$ in the Formula (a0-1).

$Q^2$ may or may not have an aromatic ring. Here, in Formula (a0-2), $M^{m+}$ has only one aromatic ring or has no aromatic ring. $Q^2$ preferably has only one aromatic ring or has no aromatic ring. When $Q^2$ has an aromatic ring, $M^{m+}$ preferably does not have any aromatic ring.

As $Q^2$, among the divalent linking groups described above, a linear or branched alkylene group, an ester bond "$—C(=O)—O—$", a combination of these, or a single bond is preferable.

In Formula (a0-2), $A^-$ represents an organic group containing an anion.

$A^-$ is not particularly limited as long as it has a moiety which generates an acid upon exposure and becomes an acid anion. $A^-$ is preferably a group that can generate a sulfonate anion, a carboanion, a carboxylate anion, a sulfonylimide anion, a bis(alkylsulfonyl)imide anion, or a tris(alkylsulfonyl)methide anion.

Among these, as $A^-$, groups represented by the following Formulae (a0-2-an1) to (a0-2-an4) are preferable.

[Chemical Formula 9]

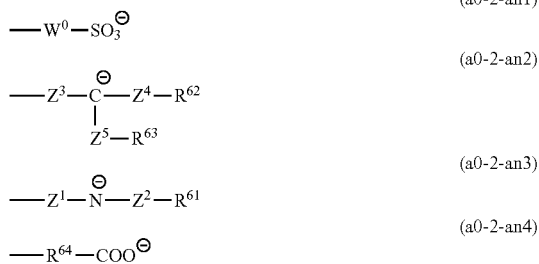

In the formula, $W^0$ represents a hydrocarbon group having 1 to 30 carbon atoms that may have a substituent, $Z^3$ represents —C(=O)—O—, —SO$_2$—, or a hydrocarbon group which may have a substituent, each of $Z^4$ and $Z^5$ independently represents —C(=O)— or —SO$_2$—, each of $R^{62}$ and $R^{63}$ independently represents a hydrocarbon group which may have a fluorine atom, $Z^1$ represents —C(=O)—, —SO$_2$—, —C(=O)—O—, or a single bond, and $Z^2$ represents —C(=O)— or —SO$_2$—, $R^{61}$ represents a hydrocarbon group which may have a fluorine atom, and $R^{64}$ represents a hydrocarbon group which may have a fluorine atom.

In Formula (a0-2-an1), $W^0$ represents a hydrocarbon group having 1 to 30 carbon atoms that may have a substituent.

The hydrocarbon group having 1 to 30 carbon atoms that may have a substituent and represented by $W^0$ may be an aliphatic hydrocarbon group or an aromatic hydrocarbon group, and examples thereof include the same ones as the aliphatic hydrocarbon group and the aromatic hydrocarbon group described for the divalent linking group represented by $Q^1$ in the Formula (a0-1).

Preferable examples of $W^0$ include a group represented by —[C($R^{f1}$)($R^{f2}$)]$_{p0}$—. In the Formula, each of $R^{f1}$ and $R^{f2}$ independently represents a hydrogen atom, an alkyl group, a fluorine atom, or a fluorinated alkyl group, at least one of $R^{f1}$ and $R^{f2}$ represents a fluorine atom or a fluorinated alkyl group, and p0 represents an integer of 1 to 8.

When $W^0$ is a group represented by —[C($R^{f1}$)($R^{f2}$)]$_{p0}$—, the Formula (a0-2-an1) is represented the following Formula (a0-2-an1-1).

[Chemical Formula 10]

In the Formula, each of $R^{f1}$ and $R^{f2}$ independently represents a hydrogen atom, an alkyl group, a fluorine atom, or a fluorinated alkyl group, at least one of $R^{f1}$ and $R^{f2}$ represents a fluorine atom or a fluorinated alkyl group, and p0 represents an integer of 1 to 8.

In Formulae —[C($R^{f1}$)($R^{f2}$)]$_{p0}$— and (a0-2-an1-1), each of $R^{f1}$ and $R^{f2}$ independently represents a hydrogen atom, an alkyl group, a fluorine atom, or a fluorinated alkyl group, and at least one of $R^{f1}$ and $R^{f2}$ represents a fluorine atom or a fluorinated alkyl group.

The alkyl group for $R^{f1}$ and $R^{f2}$ is preferably an alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group.

The fluorinated alkyl group for $R^{f1}$ and $R^{f2}$ is preferably a group in which part or all of the hydrogen atoms within an aforementioned alkyl group for $R^{f1}$ and $R^{f2}$ have each been substituted with a fluorine atom.

Each of $R^{f1}$ and $R^{f2}$ is preferably a fluorine atom or a fluorinated alkyl group.

In Formulae —[C($R^{f1}$)($R^{f2}$)]$_{p0}$— and (a0-2-an1-1), p0 represents an integer of 1 to 8, preferably represents an integer of 1 to 4, and more preferably represents 1 or 2.

Other preferable examples of $W^0$ include aliphatic cyclic groups or aromatic hydrocarbon groups which may have a substituent. Among these, groups (which may have a substituent) in which two or more hydrogen atoms have been removed from adamantane, norbornane, isobornane, tricyclodecane, tetracyclododecane, camphor, benzene, and the like are preferable.

In Formula (a0-2-an2), $Z^3$ represents —C(=O)—O—, —SO$_2$—, or a hydrocarbon group which may have a substituent. Examples of the hydrocarbon group which may have a substituent and is represented by $Z^3$ include the same ones as the "divalent hydrocarbon group which may have a substituent" exemplified in the description for the divalent linking group represented by $Q^1$ in the Formula (a0-1). Among these, $Z^3$ is preferably —SO$_2$—.

In Formula (a0-2-an2), each of $Z^4$ and $Z^5$ independently represents —C(=O)— or —SO$_2$—. It is preferable that at least one of $Z^4$ and $Z^5$ be —SO$_2$—, and it is more preferable that both of them be —SO$_2$—.

Each of $R^{62}$ and $R^{63}$ independently represents a hydrocarbon group which may have a fluorine atom, and examples thereof include the same ones as the hydrocarbon group which may have a fluorine atom and is represented by $R^{61}$ described later.

In Formula (a0-2-an3), $Z^1$ represents —C(=O)—, —SO$_2$—, —C(=O)—O—, or a single bond. When $Z^1$ represents a single bond, $N^-$ in the formula preferably is not directly bonded to —C(=O)— in the side (that is, the left end in the formula) opposite to the side where $N^-$ is bonded to $Z^2$.

In Formula (a0-2-an3), $Z^2$ represents —C(=O)— or —SO$_2$—, and preferably represents —SO$_2$—.

$R^{61}$ represents a hydrocarbon group which may have a fluorine atom. Examples of the hydrocarbon group for $R^{61}$ include alkyl groups, monovalent alicyclic hydrocarbon groups, aryl groups and aralkyl groups.

The alkyl group for $R^{61}$ preferably contains 1 to 8 carbon atoms, more preferably 1 to 6 carbon atoms, and still more preferably 1 to 4 carbon atoms, and may be either a linear group or a branched group. Specific examples of preferred alkyl groups include a methyl group, ethyl group, propyl group, butyl group, hexyl group and octyl group.

The monovalent alicyclic hydrocarbon group for $R^{61}$ preferably contains 3 to 20 carbon atoms and more preferably 3 to 12 carbon atoms, and may be either a polycyclic group or a monocyclic group. The monocyclic alicyclic hydrocarbon group is preferably a group in which one or more hydrogen atoms have been removed from a monocycloalkane. The monocycloalkane preferably contains 3 to 6 carbon atoms, and specific examples include cyclobutane, cyclopentane and cyclohexane. The polycyclic alicyclic hydrocarbon group is preferably a group in which one or more hydrogen atoms have been removed from a polycycloalkane, wherein the polycycloalkane preferably contains 7 to 12 carbon atoms, and specific examples include adamantane, norbornane, isobornane, tricyclodecane and tetracyclododecane.

The aryl group for $R^{61}$ preferably has 6 to 18 carbon atoms, more preferably has 6 to 10 carbon atoms, and particularly preferably represents a phenyl group.

The aralkyl group for $R^{61}$ is preferably a group in which an alkylene group of 1 to 8 carbon atoms is bonded to an aforementioned "aryl group for $R^{61}$". An aralkyl group in which an alkylene group of 1 to 6 carbon atoms is bonded to an aforementioned "aryl group for $R^{61}$" is more preferred, and an aralkyl group in which an alkylene group of 1 to 4 carbon atoms is bonded to an aforementioned "aryl group for $R^{61}$" is particularly desirable.

In the hydrocarbon group for $R^{61}$, it is preferable that part or all of the hydrogen atoms within the hydrocarbon group be each substituted with a fluorine atom, and hydrocarbon groups in which 30 to 100% of the hydrocarbon group hydrogen atoms are substituted with fluorine atoms are more preferred. Among such groups, perfluoroalkyl groups in which all of the hydrogen atoms within an aforementioned alkyl group have been substituted with fluorine atoms are particularly desirable.

In Formula (a0-2-an4), $R^{64}$ represents a hydrocarbon group which may have a fluorine atom. Examples of the hydrocarbon group for $R^{64}$ include alkylene groups, divalent alicyclic hydrocarbon groups, groups in which one or more hydrogen atoms have been removed from an aryl group, and groups in which one or more hydrogen atoms have been removed from an aralkyl group.

Specific examples of the hydrocarbon group for $R^{64}$ include groups in which one or more hydrogen atoms have been removed from the hydrocarbon group described above for $R^{61}$ (such as an alkyl group, monovalent alicyclic hydrocarbon group, aryl group or aralkyl group).

In the hydrocarbon group for $R^{64}$, it is preferable that part or all of the hydrogen atoms within the hydrocarbon group be each substituted with a fluorine atom, and groups in which 30 to 100% of the hydrocarbon group hydrogen atoms are substituted with fluorine atoms are more preferred.

Among the above, for example, when $A^-$ represents a group having a fluorine atom (particularly, the group represented by Formula (a0-2-an1-1)) among the groups represented by Formula (a0-2-an1), or has the group represented by (a0-2-an1) or the group represented by Formula (a0-2-an3) in which $Z^1$ and $Z^2$ represent —$SO_2$—, it is possible to cause the structural unit (a0) to generate a relatively strong acid such as a fluorinated alkyl sulfonate anion, a carboanion, or sulfonylimide anion upon exposure.

On the other hand, when $A^-$ does not have a fluorine atom among the groups represented by Formula (a0-2-an1), or has the group represented by Formula (a0-2-an4) or the group represented by Formula (a0-2-an3) in which $Z^1$ and $Z^2$ represent —C(=O)—, it is possible to cause the structural unit (a0) to generate a relatively weak acid such as an alkyl sulfonate anion, an aryl sulfonate anion, a carboxylate anion, or an imide anion upon exposure.

As described above, it is possible to cause the structural unit (a0) to generate an acid having a desired acid strength. Therefore, it is possible to appropriately determine the function of the acid generated from the structural unit (a0) in a resist composition, and to select $A^-$ according to the desired function.

For example, when the structural unit (a0) plays the same role as that of the acid generator generally used in a resist composition, it is preferable to select $A^-$ generating a strong acid.

Moreover, for example, when the structural unit (A) performs the same function as that of a quencher generally used in a resist composition (a quencher trapping a strong acid by performing salt exchange with the strong acid generated from an acid-generator component), it is preferable to select $A^-$ generating a weak acid.

In addition, the strong or weak acid is determined in the relationship with activation energy of the acid-decomposable group decomposed by the action of acid contained in the structural units (a11) and (a12) described later, or in the relationship with the acid strength of the acid generator used concurrently. Accordingly, the "relatively weak acid" described above is not necessarily usable as a quencher.

In Formula (a0-2), $M^{m+}$ represents an m-valent organic cation, and m represents an integer of 1 to 3. Here, $M^{m+}$ has only one aromatic ring or has no aromatic ring.

The organic cation represented by $M^{m+}$ is not particularly limited as long as it has only one aromatic ring or has no aromatic ring, and for example, a photodecomposable base used for a quencher of a resist composition in the related art, an organic cation known as a cation moiety of an onium acid generator of a resist composition, or the like can be used. As such an organic cation, for example, the cation represented by the following general formula (m-1) or (m-2) can be used.

[Chemical Formula 11]

In the Formula, each of $R^{101\prime\prime}$ to $R^{103\prime\prime}$ independently represents an aryl group, an alkyl group, or an alkenyl group which may have a substituent. Here, $R^{101\prime\prime}$ to $R^{103\prime\prime}$ have only one aromatic ring as a whole or has no aromatic ring. Two of $R^{101\prime\prime}$ to $R^{103\prime\prime}$ may be bonded to each other to form a ring with a sulfur atom in the formula. Each of $R^{105\prime\prime}$ and $R^{106\prime\prime}$ independently represents an aryl group, an alkyl group, or an alkenyl group which may have a substituent. Here, $R^{105\prime\prime}$ and $R^{106\prime\prime}$ have only one aromatic ring as a whole or has no aromatic ring.

In the Formulae (m-1) and (m-2), examples of each of the aryl group which may have a substituent, alkyl group which may have a substituent, and alkenyl group which may have a substituent for $R^{101\prime\prime}$ to $R^{103\prime\prime}$ and $R^{105\prime\prime}$ and $R^{106\prime\prime}$ include the same ones as the aryl group, alkyl group, and alkenyl group exemplified in the description for $R^4$ and $R^5$ in the general formula (a0-1).

Among $R^{101\prime\prime}$ to $R^{103\prime\prime}$ in the Formula (m-1), examples of the ring formed when two of $R^{101\prime\prime}$ to $R^{103\prime\prime}$ are bonded to each other to form a ring with a sulfur atom in the formula include the same ones as exemplified as the ring that the $R^4$ and $R^5$ in the general formula (a0-1) form by being bonded to each other with a sulfur atom in the formula.

As $M^{m+}$, the cation represented by the general formula (m-1) is preferable, and the cation represented by the following general formula (m-11), (m-12), (m-13), or (m-14) is more preferable.

[Chemical Formula 12]

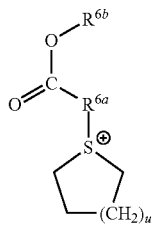
(m-11)

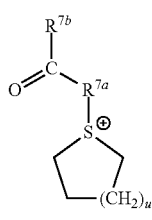
(m-12)

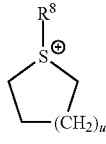
(m-13)

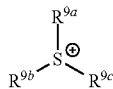
(m-14)

In the formula, u represents an integer of 1 to 3. $R^{6a}$ represents an alkylene group which may have a substituent, $R^{6b}$ represents a hydrogen atom, an alkyl group which may have a substituent, or a phenyl group or a naphthyl group which may have a non-aromatic substituent. Here, $R^{6a}$ and $R^{6b}$ have only one aromatic ring as a whole, or has no aromatic ring. $R^{7a}$ represents an alkylene group which may have a substituent, and $R^{7b}$ represents an alkyl group which may have a substituent, or a phenyl group or a naphthyl group which may have a substituent. Here, $R^{7a}$ and $R^{7b}$ have only one aromatic ring as a whole, or has no aromatic ring. $R^8$ represents an alkyl group which may have a substituent, or a phenyl group or a naphthyl group which may have a non-aromatic substituent. Here, $R^8$ has only one aromatic ring or has no aromatic ring. Each of $R^{9a}$ and $R^{9c}$ independently represents an alkyl group which may have a substituent, or a phenyl group or a naphthyl group which may have a non-aromatic substituent. Here, $R^{9a}$ to $R^{9c}$ have only one aromatic ring as a whole, or has no aromatic ring.

In the formula, u represents an integer of 1 to 3, and most preferably represents 1 or 2.

In the formula, the alkylene group represented by $R^{6a}$ and $R^{7a}$ is preferably a linear or branched alkylene group. The alkylene group preferably has 1 to 12 carbon atoms, more preferably has 1 to 5 carbon atoms, even more preferably has 1 to 3 carbon atoms, and particularly preferably has 1 or 2 carbon atoms.

Examples of the substituent that the alkylene group may have include the same ones (a halogen atom, an oxo group (=O), a cyano group, an alkyl group, an alkoxyalkyloxy group, an alkoxycarbonylalkyloxy group, —C(=O)—O—$R^{7''}$, —O—C(=O)—$R^{8''}$, —O—$R^{9''}$, an aryl group, and the like) as exemplified as the substituents in the substituted alkylene group in the above description for $R^3$.

In the formula, examples of the alkyl group which may have a substituent and is represented by $R^{6b}$, $R^{7b}$, $R^8$, and $R^{9a}$ to $R^{9c}$ include the same ones as the substituted alkyl group exemplified in the description for $R^4$ and $R^5$ in the general formula (a0-1).

Examples of the non-aromatic substituent that the phenyl group or naphthyl group represented by $R^{6b}$, $R^{7b}$, $R^8$, and $R^{9a}$ to $R^{9c}$ may have include the same ones as exemplified as the non-aromatic substituent that the substituted aryl group exemplified in the description for $R^4$ and $R^5$ in the general formula (a0-1) may have.

Specific examples of preferable cations among the cations represented by the general formula (m-1) include the cations represented by the following Formulae (m1-1-1) to (m1-1-10).

[Chemical Formula 13]

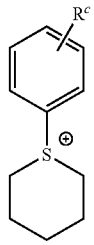
(m1-1-1)

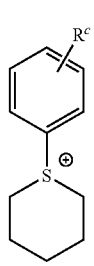
(m1-1-2)

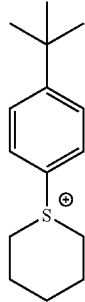
(m1-1-3)

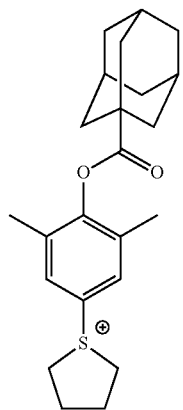

(m1-1-4)

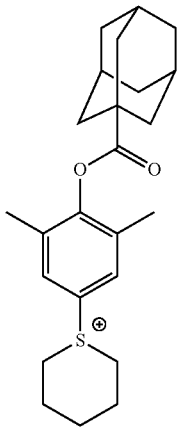

(m1-1-5)

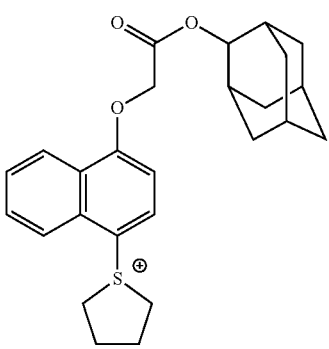

(m1-1-6)

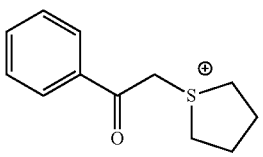

(m1-1-7)

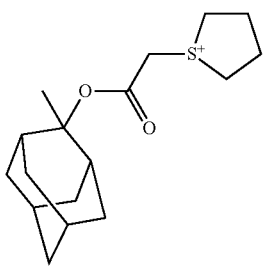

(m1-1-8)

(m1-1-9)

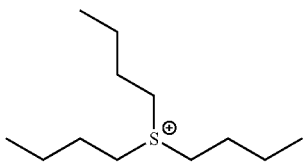

(m1-1-10)

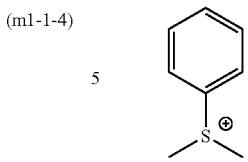

In Formula (m1-1-1), $R^c$ represents a non-aromatic substituent. Examples of the substituent include the same ones as the non-aromatic substituent exemplified in the description for the substituted aryl group described above.

A structural unit having the group represented by the general formula (a0-2) (hereinafter, referred to as a "structural unit (a0-2)") is not particularly limited as long as it has the group represented by the general formula (a0-2) within the structure. However, it is preferably a structural unit which is derived from a compound having an ethylenic double bond and has a group represented by the general formula (a0-2), and is particularly preferably the structural unit represented by the following general formula (a0-21).

[Chemical Formula 14]

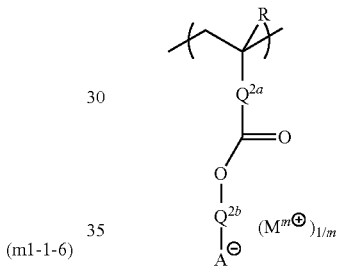

(a0-21)

In the formula, R represents a hydrogen atom, an alkyl group having 1 to 5 carbon atoms, or a halogenated alkyl group having 1 to 5 carbon atoms. $Q^{2a}$ represents a single bond or a divalent linking group. $Q^{2b}$ represents a single bond or a divalent linking group. $A^-$ represents an organic group containing an anion. $M^{m+}$ represents an m-valent organic cation, and m represents an integer of 1 to 3. Here, $M^{m+}$ has only one aromatic ring or has no aromatic ring.

In Formula (a0-21), R is the same as R in the Formula (a0-11).

Each of $A^-$ and $(M^{m+})_{1/m}$ is the same as $A^-$ and $(M^{m+})_{1/m}$ in the Formula (a0-2).

Examples of the divalent linking group represented by $Q^{2a}$ include the same ones as the divalent linking group represented by $Q^1$ in the Formula (a0-1).

Among these, as $Q^{2a}$, a single bond, —C(=O)-$Q^{22}$-N($R''$)—, or -$Q^{23}$-CF($R^{q1}$)— is preferable.

In —C(=O)-$Q^{22}$-N($R''$)—, $Q^{22}$ represents a divalent linking group, and $R''$ represents a hydrogen atom or an alkyl group having 1 to 5 carbon atoms.

In -$Q^{23}$-CF($R^{q1}$)—, $Q^{23}$ represents a group containing —O—, —CH$_2$—O—, or —C(=O)—O—, and $R^{q1}$ represents a fluorine atom or a fluorinated alkyl group.

In —C(=O)-$Q^{22}$-N($R''$)—, examples of the divalent linking group represented by $Q^{22}$ include the same ones as the divalent linking group represented by $Q^1$ in the Formula (a0-1), and among these, a linear or branched alkylene group, a cyclic aliphatic hydrocarbon group, or a divalent aromatic hydrocarbon group is preferable, a linear alkylene group is particularly preferable, and a methylene group or an ethylene group is most preferable.

Examples of the alkyl group having 1 to 5 carbon atoms and represented by R″ include the same ones as the alkyl group having 1 to 5 carbon atoms and represented by R, and among these, a hydrogen atom or a methyl group is preferable as R″.

Specific examples of $Q^{23}$ in -$Q^{23}$-CF($R^{q1}$)— include a group including —O—, —CH$_2$—O—, or —C(=O)—O—; a group including —O—, —CH$_2$—O—, or —C(=O)—O— with a divalent hydrocarbon group which may have a substituent; and the like.

Examples of the divalent hydrocarbon group which may have a substituent include the same ones as the divalent hydrocarbon group which may have a substituent and is exemplified for the divalent linking group represented by $Q^1$ in the Formula (a0-1). Among these, as the "divalent hydrocarbon group" represented by $Q^{23}$, an aliphatic hydrocarbon group is preferable, and a linear or branched alkylene group is more preferable.

As $Q^{23}$, a group including —C(=O)—O— and a divalent hydrocarbon group which may have a substituent is preferable, a group including —C(=O)—O— and an aliphatic hydrocarbon group is more preferable, and a group including —C(=O)—O— and a linear or branched alkylene group is even more preferable.

Specific examples of preferable groups as $Q^{23}$ particularly include the groups represented by the following general formula ($Q^{23}$-1).

[Chemical Formula 15]

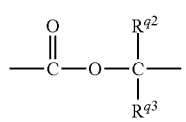

($Q^{23}$-1)

In Formula ($Q^{23}$-1), each of $R^{q2}$ and $R^{q3}$ independently represents a hydrogen atom, an alkyl group or a fluorinated alkyl group, wherein $R^{q2}$ and $R^{q3}$ may be bonded to each other to form a ring.

In the Formula ($Q^{23}$-1), the alkyl group represented by $R^{q2}$ and $R^{q3}$ is preferably linear, branched, or cyclic, and more preferably linear or branched.

In the case of a linear or branched alkyl group, a group of 1 to 5 carbon atoms is preferred, a methyl group or ethyl group is more preferred, and an ethyl group is particularly desirable.

In the case of a cyclic alkyl group, the cycloalkyl group preferably contains 4 to carbon atoms, more preferably 4 to 12 carbon atoms, and most preferably 5 to 10 carbon atoms. Examples of the cyclic alkyl group include groups in which one or more hydrogen atoms have been removed from a monocycloalkane, or a polycycloalkane such as a bicycloalkane, tricycloalkane or tetracycloalkane. Specific examples of such groups include groups in which one or more hydrogen atoms have been removed from either a monocycloalkane such as cyclopentane or cyclohexane, or a polycycloalkane such as adamantane, norbornane, isobornane, tricyclodecane or tetracyclododecane. Among these, a group in which one or more hydrogen atoms have been removed from adamantane is preferred.

The fluorinated alkyl group for $R^{q2}$ and $R^{q3}$ is a group in which part or all of the hydrogen atoms within an alkyl group have each been substituted with a fluorine atom.

In the fluorinated alkyl group, the alkyl group in a state prior to the fluorine atom substitution may be linear, branched or cyclic, and specific examples include the same groups as those described above for the "alkyl group for $R^{q2}$ and $R^{q3}$".

$R^{q2}$ and $R^{q3}$ may be bonded to each other to form a ring, and examples of the ring composed of $R^{q2}$, $R^{q3}$ and the carbon atom to which $R^{q2}$ and $R^{q3}$ are bonded include rings in which two hydrogen atoms have been removed from one of the monocycloalkanes or polycycloalkanes described above in relation to the cyclic alkyl group. The ring is preferably a 4- to 10-membered ring, and more preferably a 5- to 7-membered ring.

Of the various possibilities described above, each of $R^{q}2$ and $R^{q}3$ is preferably a hydrogen atom or an alkyl group.

In -$Q^{23}$-CF($R^{q1}$)—, for the fluorinated alkyl group represented by $R^{q1}$, the alkyl group in a state of not being substituted with a fluorine atom is preferably linear, branched, or cyclic.

In the case of a linear or branched alkyl group, the alkyl group preferably contains 1 to 5 carbon atoms, more preferably 1 to 3 carbon atoms, and still more preferably 1 or 2 carbon atoms.

In the case of a cyclic alkyl group, the cycloalkyl group preferably contains 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane, or a polycycloalkane such as a bicycloalkane, tricycloalkane or tetracycloalkane. Specific examples of such groups include groups in which one or more hydrogen atoms have been removed from either a monocycloalkane such as cyclopentane or cyclohexane, or a polycycloalkane such as adamantane, norbornane, isobornane, tricyclodecane or tetracyclododecane.

In the fluorinated alkyl group, the ratio of the number of fluorine atoms relative to the combined total of all the fluorine atoms and hydrogen atoms within the fluorinated alkyl group (namely, the fluorination ratio (%)) is preferably within a range from 30 to 100%, and more preferably from 50 to 100%. A higher fluorination ratio enhances the hydrophobicity of the resist film.

Among the above possibilities, $R^{q1}$ is most preferably a fluorine atom.

In Formula (a0-21), examples of the divalent linking group represented by $Q^{2b}$ include the same ones as the divalent linking group represented by $Q^1$ in the Formula (a0-1). Among these, as $Q^{2b}$, a linear or branched alkylene group, a cyclic aliphatic hydrocarbon group, an aromatic hydrocarbon group, or a divalent linking group containing a hetero atom is preferable; a linear or branched alkylene group, a combination of a linear or branched alkylene group with a divalent linking group containing a hetero atom, a combination of a cyclic aliphatic hydrocarbon group with a divalent linking group containing a hetero atom, or a combination of an aromatic hydrocarbon group with a divalent linking group containing a hetero atom is more preferable; a linear or branched alkylene group, a combination of a linear or branched alkylene group with an ester bond "—C(=O)—O—", or a combination of a divalent aliphatic hydrocarbon group with an ester bond "—C(=O)—O—" is particularly preferable; and a linear or branched alkylene group, or a combination of a linear or branched alkylene group with an ester bond "—C(=O)—O—" is most preferable.

As the structural unit (a0-2), at least one kind selected from the group consisting of structural units represented by the following Formulae (a0-2-11) to (a0-2-13), (a0-2-21) to (a0-2-25), (a0-2-31) to (a0-2-32), and (a0-2-41) to (a0-2-44) is preferable.

Among these, as the structural units represented by the following Formulae (a0-2-11) to (a0-2-13), the structural units respectively represented by the following Formulae (a0-2-11-1) to (a0-2-13-1) are preferable.

[Chemical Formula 16]
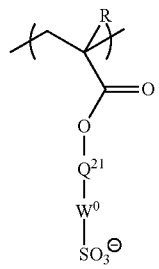
(a0-2-11)
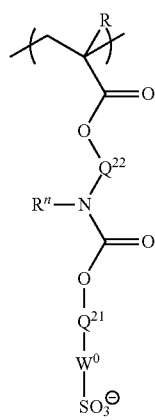
(a0-2-12)
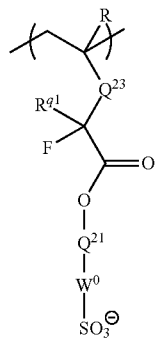
(a0-2-13)
In the formula, R, $Q^{22}$ and $Q^{23}$, $W^0$, $R^{q1}$, $R^n$, and $(M^{m+})_{1/m}$ are the same as above, and each $Q^{21}$ independently represents a single bond or a divalent linking group.
[Chemical Formula 17]
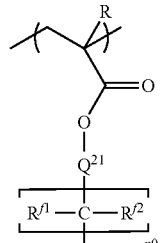
(a0-2-11-1)
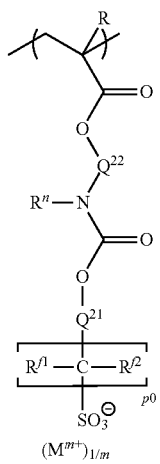
(a0-2-12-1)
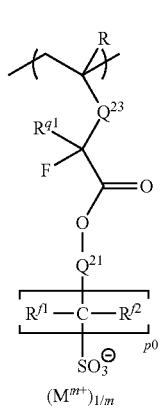
(a0-2-13-1)
In the formula, R, $Q^{21}$ to $Q^{23}$, $R^{f1}$, $R^{f2}$, p0, $R^n$, $R^{q1}$, and $(M^{m+})_{1/m}$ are the same as above.
[Chemical Formula 18]
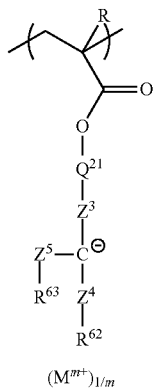
(a0-2-21)

(a0-2-22)
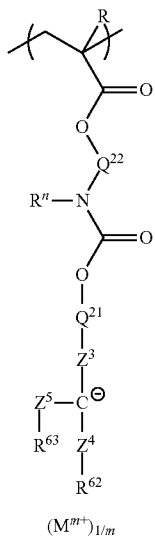
(a0-2-23)
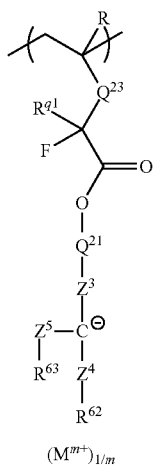
(a0-2-24)
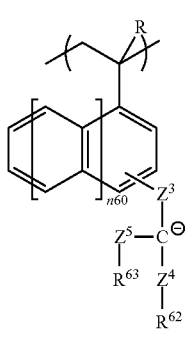
(a0-2-25)
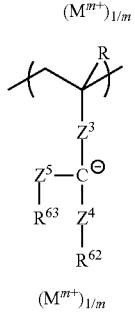
In the formula, R, $Q^{21}$ to $Q^{23}$, $Z^3$ to $Z^5$, $R^{62}$ and $R^{63}$, $R^n$, $R^{q1}$, and $(M^{m+})_{1/m}$ are the same as above. n60 represents an integer of 0 to 3.
[Chemical Formula 19]
(a0-2-31)
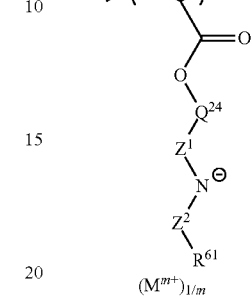
(a0-2-32)
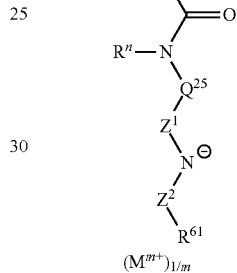
In the formula, R, $Z^1$ and $Z^2$, $R^{61}$, $R^n$, and $(M^{m+})_{1/m}$ are the same as above, and each of $Q^{24}$ and $Q^{25}$ independently represents a single bond or a divalent linking group.
[Chemical Formula 20]
(a0-2-41)
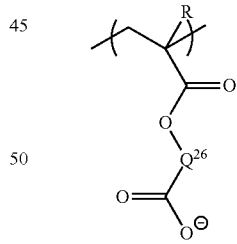
(a0-2-42)
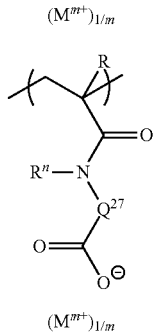

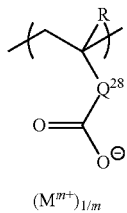

(a0-2-43)

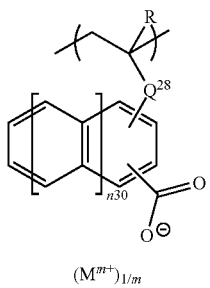

(a0-2-44)

In the Formula, R, R″, and $(M^{m+})_{1/m}$ are the same as above, and each of $Q^{26}$ to $Q^{28}$ independently represents a single bond or a divalent linking group. n30 represents an integer of 0 to 3.

In Formulae (a0-2-11) to (a0-2-13), each of R and $(M^{m+})_{1/m}$ is the same as R and $(M^{m+})_{1/m}$ in the Formula (a0-21).

$W^0$ is the same as $W^0$ in the Formula (a0-2-an1).

Each of $Q^{22}$ and R″ has the same definition as that of $Q^{22}$ and R″ in —C(=O)-$Q^{22}$-N(R″)— exemplified as the divalent linking group represented by $Q^{2a}$ in the general formula (a0-21).

Each of $Q^{23}$ and $R^{q1}$ is the same as $Q^{22}$ and $R^{q1}$ in -$Q^{23}$-CF($R^{q1}$)— exemplified as the divalent linking group represented by $Q^{2a}$ in the general formula (a0-21).

$Q^{21}$ represents a single bond or a divalent linking group. Examples of $Q^{21}$ include the same ones as $Q^{2b}$ in the general formula (a0-21).

Each of R, $Q^{21}$ to $Q^{23}$, R″, $R^{q1}$, and $(M^{m+})_{1/m}$ in Formulae (a0-2-11-1) to (a0-2-13-1) is the same as R, $Q^{21}$ to $Q^{23}$, R″, $R^{q1}$, and $(M^{m+})_{1/m}$ in the Formulae (a0-2-11) to (a0-2-13).

Each of $R^{f1}$, $R^{f2}$, and p0 is the same as $R^{f1}$, $R^{f2}$, and p0 in the Formula (a0-2-an1-1).

Each of R, $Q^{21}$ to $Q^{23}$, R″, $R^{q1}$, and $(M^{m+})_{1/m}$ in Formulae (a0-2-21) to (a0-2-25) is the same as R, $Q^{21}$ to $Q^{23}$, R″, $R^{q1}$, and $(M^{m+})_{1/m}$ in the Formulae (a0-2-11) to (a0-2-13).

Each of $Z^3$ to $Z^5$ and $R^{62}$ and $R^{63}$ is the same as $Z^3$ to $Z^5$ and $R^{62}$ and $R^{63}$ in the Formula (a0-2-an2).

n60 represents an integer of 0 to 3, and preferably represents 0 or 1.

Each of R, R″, and $(M^{m+})_{1/m}$ in Formulae (a0-2-31) to (a0-2-32) is the same as R, R″, and $(M^{m+})_{1/m}$ in the Formulae (a0-2-11) to (a0-2-13).

Each of $Z^1$ and $Z^2$ and $R^{61}$ is the same as $Z^1$ and $Z^2$ and $R^{61}$ in the Formula (a0-2-an3).

Each of $Q^{24}$ and $Q^{25}$ independently represents a single bond or a divalent linking group.

Examples of the divalent linking group represented by $Q^{24}$ and $Q^{25}$ include the same ones as the divalent linking group represented by $Q^1$ in the Formula (a0-1). In addition, as described above, when $Z^1$ represents a single bond, the terminal of $Q^{24}$ and $Q^{25}$ bonded to $Z^1$ preferably is not —C(=O)—. As the divalent linking group represented by $Q^{24}$ and $Q^{25}$, a linear or branched alkylene group, a cyclic aliphatic hydrocarbon group, or a divalent linking group containing a hetero atom is particularly preferable. Among these, a linear or branched alkylene group and a cyclic aliphatic hydrocarbon group are preferable, and a linear alkylene group and a cyclic aliphatic hydrocarbon group are more preferable.

In Formulae (a0-2-41) to (a0-2-44), each of R, R″, and $(M^{m+})_{1/m}$ is the same as R, R″, and $(M^{m+})_{1/m}$ in the Formulae (a0-2-11) to (a0-2-13).

Each of $Q^{26}$ to $Q^{28}$ independently represents a single bond or a divalent linking group. $Q^{26}$ to $Q^{28}$ are the same as $Q^{24}$ and $Q^{25}$ described above.

n30 represents an integer of 0 to 3, and preferably represents 0 or 1.

Hereinafter, specific examples of the structural unit (a0-2) will be described. In each of the following formulae, $R^\alpha$ represents a hydrogen atom, a methyl group, or a trifluoromethyl group, and $(M^{m+})_{1/m}$ is the same as described above.

[Chemical Formula 21]

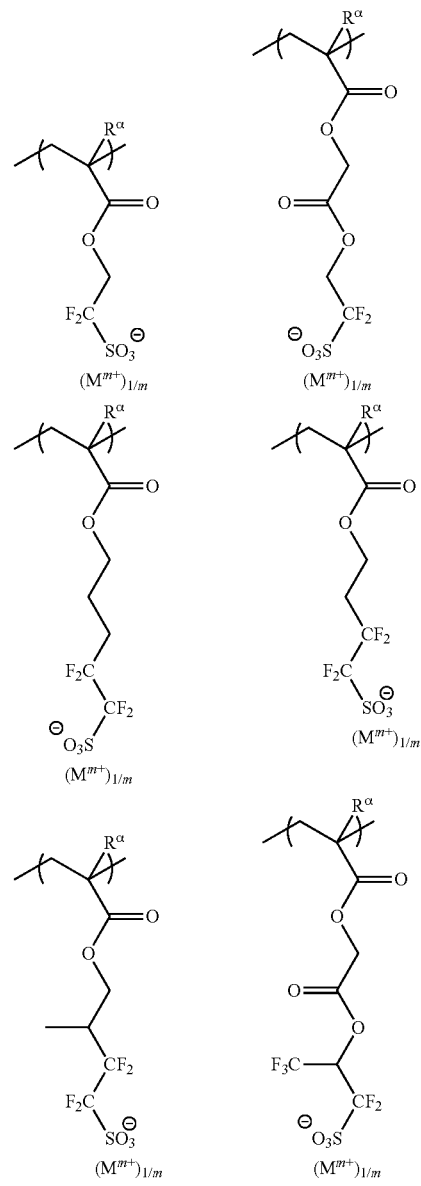

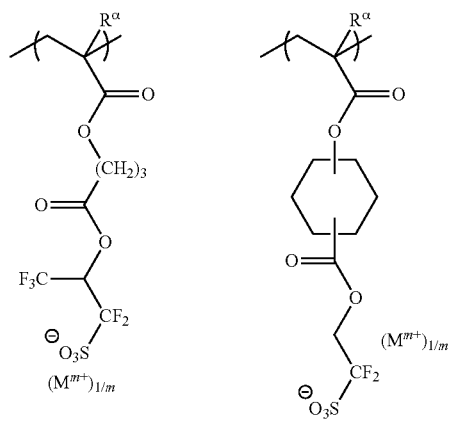
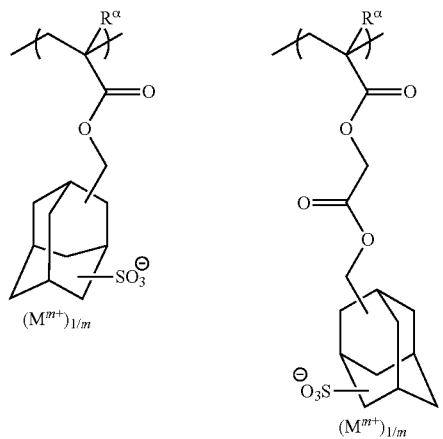
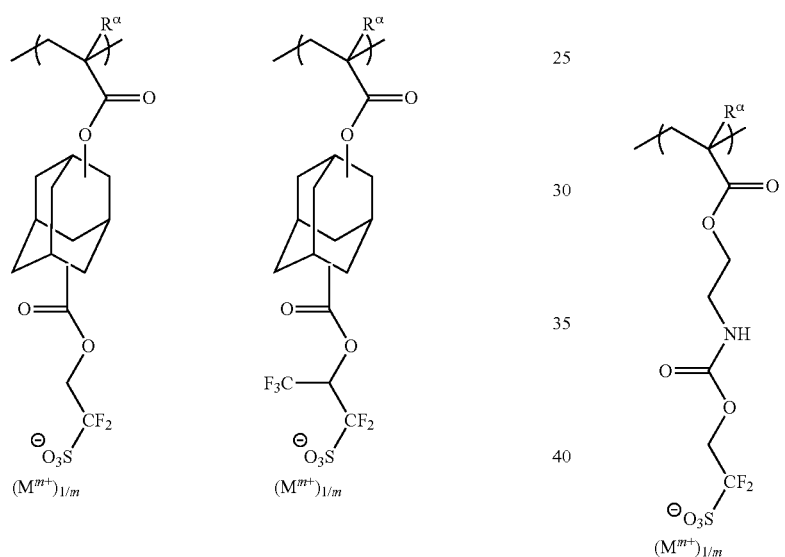
[Chemical Formula 22]
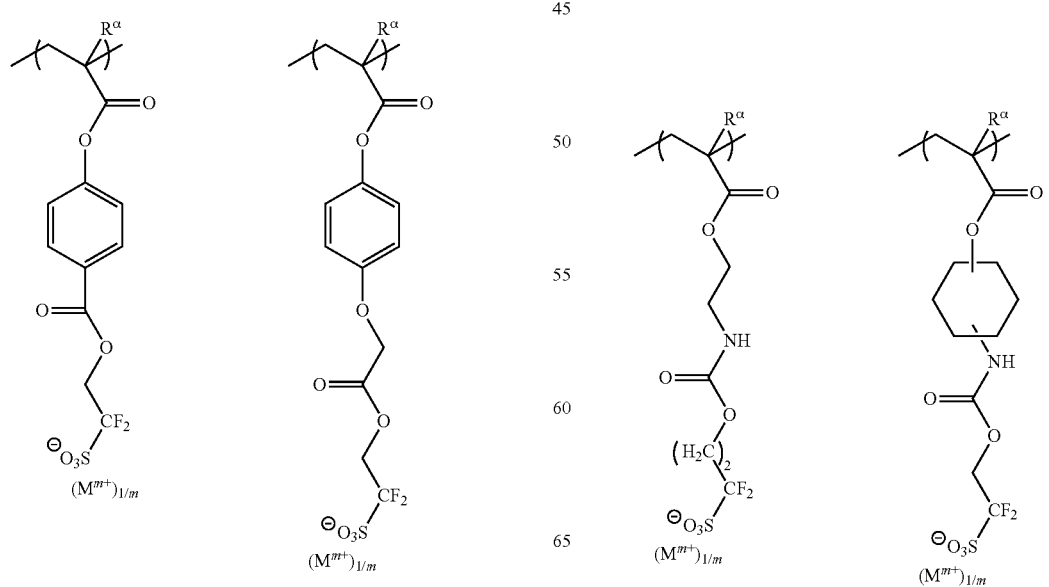

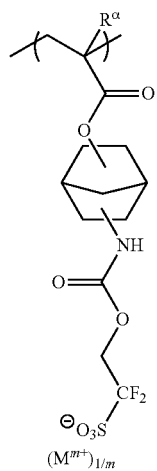
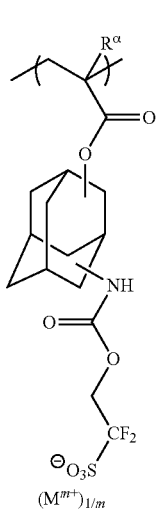
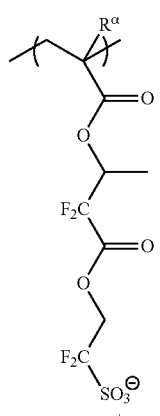
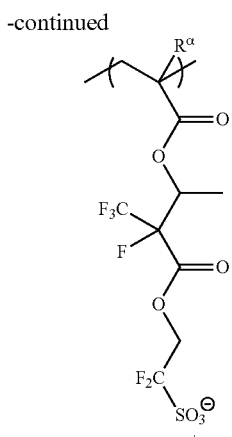
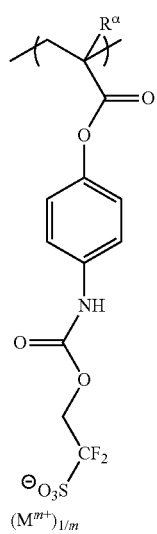
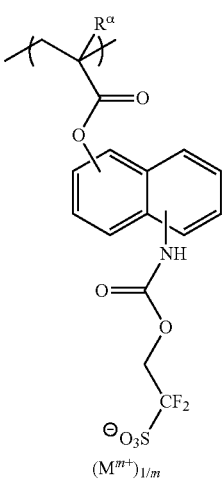
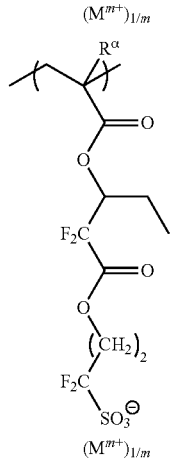
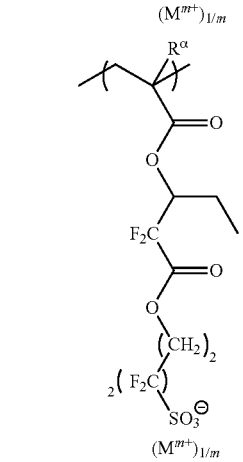
[Chemical Formula 23]
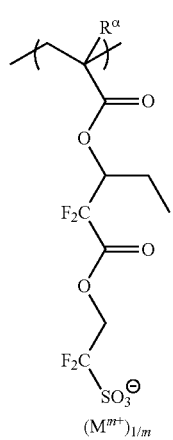
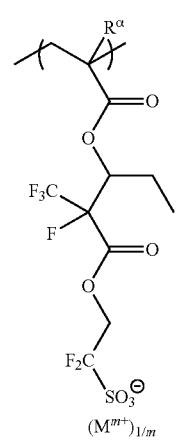
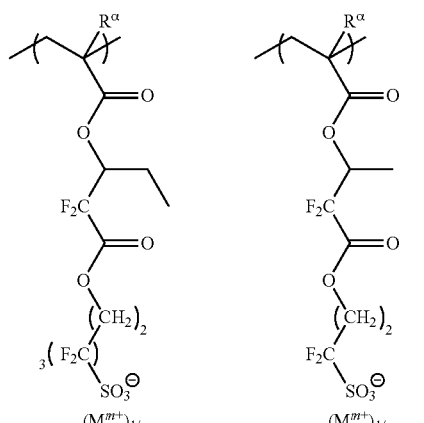
[Chemical Formula 24]
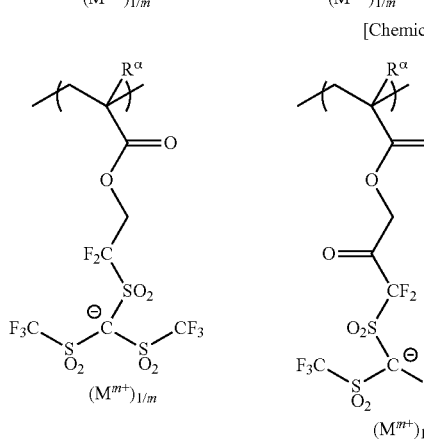

-continued
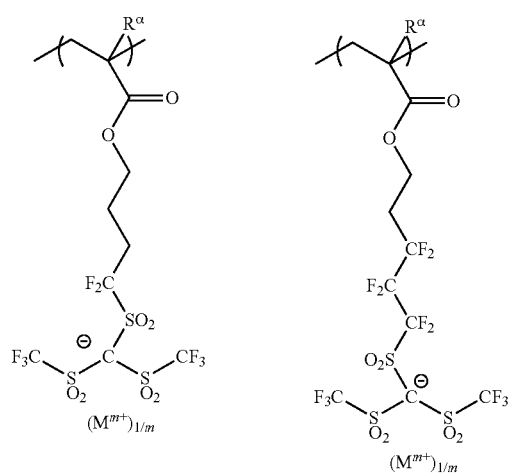
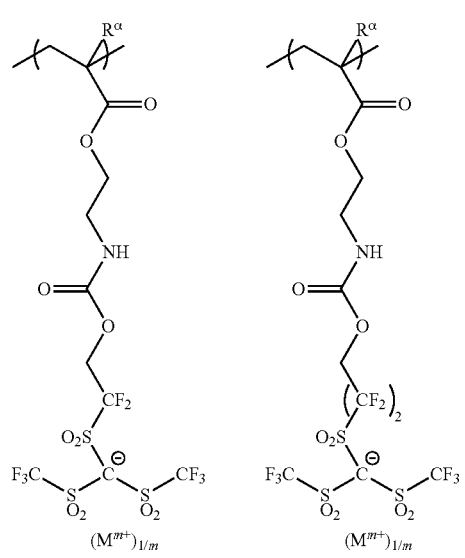
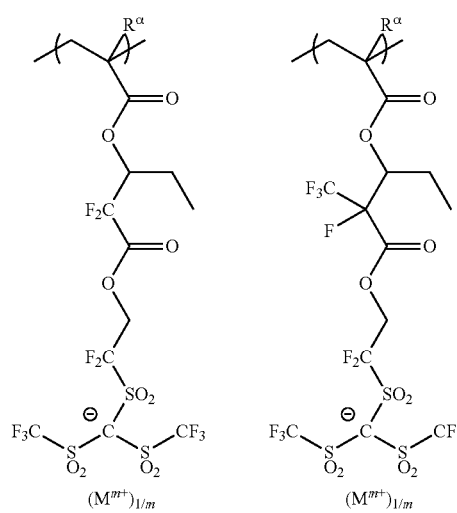
[Chemical Formula 25]
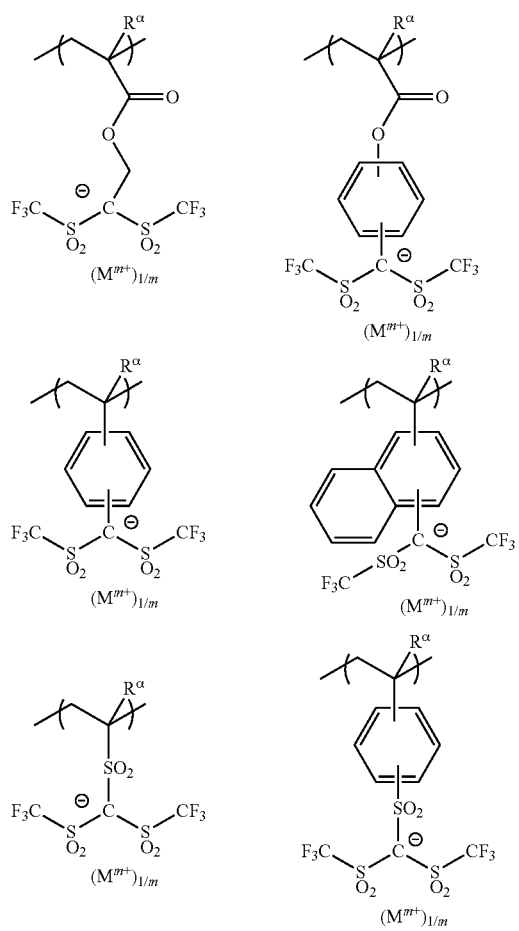
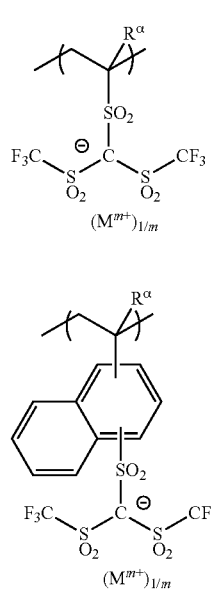
[Chemical Formula 26]
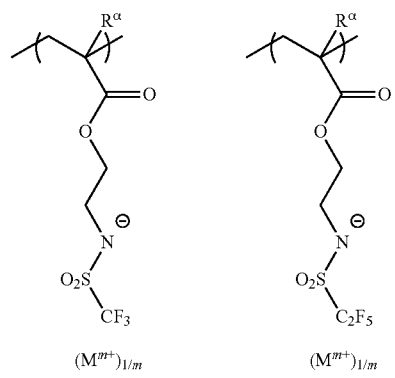

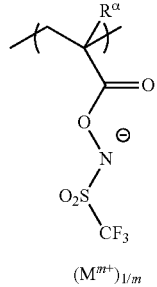
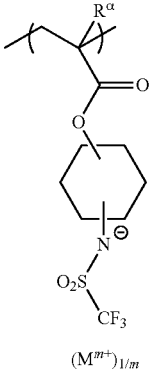
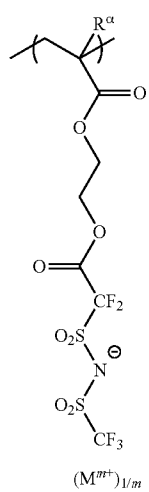
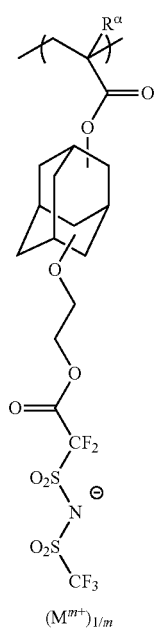
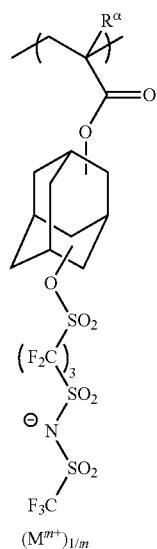
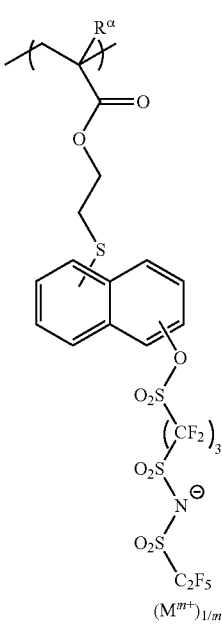
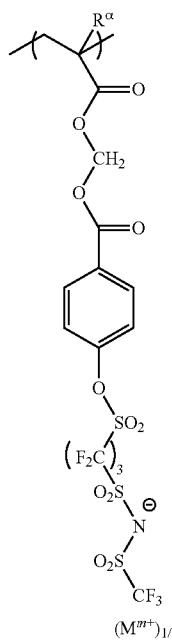
[Chemical Formula 27]
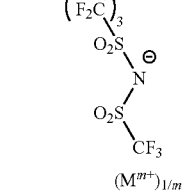
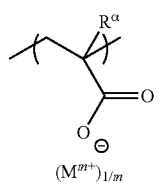
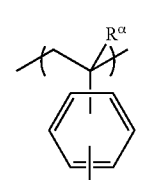
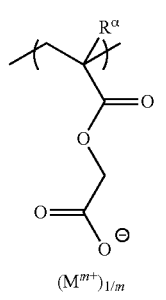
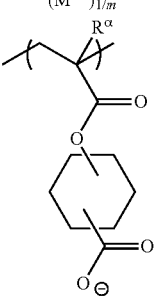
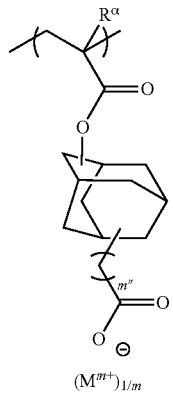
One kind or two or more kinds of the structural unit (a0) may be contained in the component (A1).

A proportion of the structural unit (a0) in the component (A1) is preferably 1 mol % to 50 mol %, more preferably 1 mol % to 45 mol %, even more preferably 3 mol % to 40 mol %, and particularly preferably 5 mol % to 35 mol %, based on all structural units constituting the polymer. If the proportion is 1 mol % or more, an effect of improving the pattern shape (roughness, rectangularity, or the like) or lithography properties such as exposure latitude and resolution is obtained sufficiently. On the other hand, when the amount of the structural unit (a0) is not more than the upper limit of the above range, a good balance can be more easily achieved with the other structural units. Moreover, sufficient solubility in a resist solvent (the component (S) described later) can be secured.

(Structural Unit (a11))

The structural unit (a11) is a structural unit containing an acid-decomposable group which exhibits increased polarity by the action of acid and contains a polycyclic group.

The "acid-decomposable group" is a group having acid decomposability in which at least a portion of bonds in the structure of the acid-decomposable group can be cleaved by the action of acid which is generated upon exposure from the component (A) or the acid-generator component (B) added arbitrarily.

Examples of acid-decomposable groups which exhibit increased polarity under the action of acid include groups which are decomposed by the action of acid to form a polar group.

Examples of polar groups constituting the acid-decomposable group include a carboxyl group, a hydroxyl group, an amino group, a sulfo group (—$SO_3H$), and the like. Among these, a carboxyl group or a hydroxyl group is preferable, and a carboxyl group is particularly preferable.

More specific examples of the acid-decomposable group which exhibits increased polarity by the action of acid and contains a polycyclic group include groups obtained by protecting the above polar groups with an acid-dissociable group containing a polycyclic group (hereinafter, referred to as a polycyclic group-containing acid-dissociable group) (for example, groups obtained by substituting a hydrogen atom in the polar group with the polycyclic group-containing acid-dissociable group).

The "acid-dissociable group" is a group having acid dissociability in which at least a bond between the acid-dissociable group and atoms adjacent to the acid-dissociable group can be cleaved by the action of acid which is generated upon exposure from the component (A) or the acid-generator component (B) added arbitrarily. The acid-dissociable group constituting the acid-decomposable group needs to be a group having polarity lower than that of the polar group generated by the dissociation of the acid-dissociable group. In this way, when the acid-dissociable group is dissociated by the action of acid, a polar group having a polarity higher than that of the acid-dissociable group is generated, whereby the polarity of the component (A) increases. When the polarity of the component (A) increases, the solubility of the exposed portion in an alkali developing solution increases in the case of the alkali developing process, and the solubility of the exposed portion in an organic developing solution decreases in the case of the solvent developing process.

The polycyclic group-containing acid-dissociable group is not particularly limited as long as it contains a polycyclic group within the structure, and those having been proposed so far as the acid-dissociable group of a base resin for a chemically amplified resist can be used. Generally, groups forming a tertiary alkyl ester with a carboxyl group in (meth)acrylic acid or the like, acetal-type acid-dissociable groups such as alkoxyalkyl groups, and the like are widely known.

Herein, the "tertiary alkyl ester" refers to a structure in which a hydrogen atom of a carboxyl group is substituted with a tertiary alkyl group to form an ester, and an oxygen atom of the terminal of a carbonyloxy group (—C(═O)—O—) thereof is bonded to a tertiary carbon atom of the tertiary alkyl group. In this tertiary alkyl ester, the action of acid causes cleavage of the bond between the oxygen atom and the tertiary carbon atom, thereby forming a carboxyl group.

The tertiary alkyl group may have a substituent.

Hereafter, for the sake of simplicity, groups that exhibit acid dissociability as a result of the formation of a tertiary alkyl ester with a carboxyl group are referred to as "tertiary alkyl ester-type acid-dissociable groups".

The polycyclic group that the tertiary alkyl ester-type acid-dissociable group containing a polycyclic group (hereinafter, referred to as a polycyclic group-containing tertiary alkyl ester-type acid-dissociable group) has may be an aliphatic polycyclic group or an aromatic polycyclic group.

The aliphatic polycyclic group refers to a polycyclic group not having aromaticity. The aliphatic polycyclic group may or may not have a substituent. Examples of the substituent include an alkyl group having 1 to 5 carbon atoms, an alkoxy group having 1 to 5 carbon atoms, a fluorine atom, a fluorinated alkyl group having 1 to carbon atoms, an oxygen atom (═O), and the like.

The basic ring structure of the aliphatic polycyclic group excluding the substituent is not limited to a group including carbon and hydrogen (hydrocarbon group), but is preferably a hydrocarbon group. Further, the "hydrocarbon group" may be either saturated or unsaturated, but is preferably saturated.

The aliphatic polycyclic group preferably has 7 to 30 carbon atoms, more preferably has 10 to 30 carbon atoms, even more preferably has 10 to 20 carbon atoms, particularly preferably has 10 to 15 carbon atoms, and most preferably has 10 to 12 carbon atoms. As the polycyclic aliphatic group, a group in which one or more hydrogen atoms have been removed from a polycycloalkane is preferable. The polycycloalkane preferably has 7 to 12 carbon atoms, and specific examples thereof include adamantane, norbornane, isobornane, tricyclodecane, tetracyclodecane, and the like. In addition, a portion of carbon atoms constituting the ring of these aliphatic cyclic groups may be substituted with an ether group (—O—).

The aliphatic polycyclic group may or may not have a substituent. Examples of the substituent include an alkyl group having 1 to 5 carbon atoms, an alkoxy group having 1 to 5 carbon atoms, a fluorine atom, a fluorinated alkyl group having 1 to 5 carbon atoms, an oxygen atom (═O), and the like.

The aromatic polycyclic group is a monovalent hydrocarbon group having at least one polycyclic aromatic ring, and may have a substituent. The polycyclic aromatic ring preferably has 7 to 30 carbon atoms, more preferably has 10 to 20 carbon atoms, even more preferably has 10 to 15 carbon atoms, and particularly preferably has 10 to 12 carbon atoms. Here, the number of carbon atoms within substituents is not included in the number of carbon atoms of the aromatic hydrocarbon group. Specific examples of the polycyclic aromatic ring include aromatic hydrocarbon rings such as naphthalene, anthracene, and phenanthrene; aromatic heterocyclic rings in which a portion of carbon atoms constituting the aromatic hydrocarbon ring has been substituted with hetero atoms; and the like. Examples of the hetero atom in the aromatic heterocyclic rings include an oxygen atom, a sulfur atom and a nitrogen atom.

As the aromatic polycyclic group, a 1-naphthyl group and a 2-naphthyl group are preferable.

The aromatic polycyclic group may or may not have a substituent. Examples of the substituent include an alkyl group having 1 to 5 carbon atoms, an alkoxy group having 1 to 5 carbon atoms, a fluorine atom, a fluorinated alkyl group having 1 to 5 carbon atoms, an oxo group (=O), and the like.

Examples of the polycyclic group-containing tertiary alkyl ester-type acid-dissociable group include (p-i) a group in which a substituent (an atom or a group other than a hydrogen atom) is bonded to a carbon atom bonded to an atom (for example, —O— in —C(=O)—O—) adjacent to the acid-dissociable group on the ring skeleton of a monovalent aliphatic polycyclic group so as to form a tertiary carbon atom;

(p-ii) a group which has a monovalent aliphatic polycyclic group or an aromatic polycyclic group and branched alkylene having a tertiary carbon atom bonded to the above group; and the like.

In the group of (p-i), examples of the substituent which is bonded to a carbon atom bonded to an atom adjacent to the acid-dissociable group on the ring skeleton of an aliphatic polycyclic group include an alkyl group.

Examples of the alkyl group include the same ones as $R^{14}$ in Formulae (p1-1) to (p1-8) described later.

Specific examples of the group of (p-i) include the groups represented by the following general formulae (p1-1) to (p1-8), and the like.

Specific examples of the group of (p-ii) include the groups represented by the following general formulae (p2-1) to (p2-5), and the like.

[Chemical Formula 28]

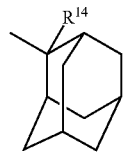
(p1-1)

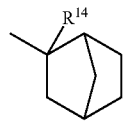
(p1-2)

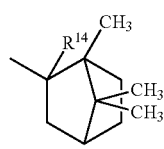
(p1-3)

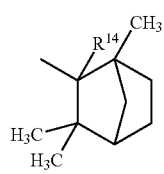
(p1-4)

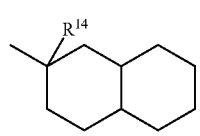
(p1-5)

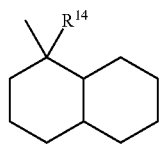
(p1-6)

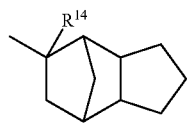
(p1-7)

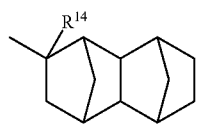
(p1-8)

In the formula, $R^{14}$ represents a chain-like or cyclic alkyl group, and g represents an integer of 0 to 8.

[Chemical Formula 29]

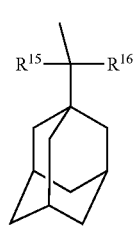
(p2-1)

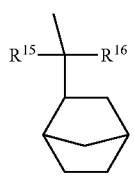
(p2-2)

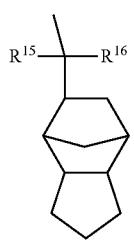
(p2-3)

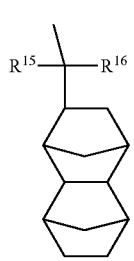
(p2-4)

-continued (p2-5)

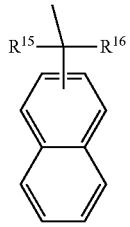

In the formula, each of $R^{15}$ and $R^{16}$ independently represents a chain-like or cyclic alkyl group.

In Formulae (p1-1) to (p1-8), the alkyl group represented by $R^{14}$ may be chain-like or cyclic. The chain-like alkyl group may be linear or branched. The cyclic alkyl group may be monocyclic or polycyclic.

The linear alkyl group represented by $R^{14}$ preferably has 1 to 5 carbon atoms, more preferably has 1 to 4 carbon atoms, and even more preferably has 1 or 2 carbon atoms. Specific examples include a methyl group, ethyl group, n-propyl group, n-butyl group and n-pentyl group. Among these, a methyl group, ethyl group or n-butyl group is preferable, and a methyl group or ethyl group is more preferable.

The branched alkyl group represented by $R^{14}$ preferably has 3 to 10 carbon atoms, and more preferably has 3 to 5 carbon atoms. Specific examples thereof include an isopropyl group, an isobutyl group, a tert-butyl group, an isopentyl group, a neopentyl group, and the like. Among these, an isopropyl group or a tert-butyl group is preferable.

The cyclic alkyl group represented by $R^{14}$ preferably has 3 to 15 carbon atoms, more preferably has 4 to 12 carbon atoms, and most preferably has 5 to 10 carbon atoms. Specific examples thereof include groups in which one or more hydrogen atoms have been removed from a monocycloalkane or a polycycloalkane such as a bicycloalkane, a tricycloalkane, or a tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

In Formulae (p2-1) to (p2-5), examples of the alkyl group represented by $R^{15}$ and $R^{16}$ include the same ones as the alkyl group represented by $R^{14}$. Among these, a linear alkyl group is preferable, and a methyl group or an ethyl group is more preferable.

In the Formulae (p1-1) to (p1-8) and (p2-1) to (p2-4), a portion of carbon atoms constituting a ring may be substituted with an ethereal oxygen atom (—O—).

In addition, in Formulae (p1-1) to (p1-8) and (p2-1) to (p2-5), hydrogen atoms bonded to carbon atoms constituting a ring may be substituted with a substituent. Examples of the substituent include an alkyl group of 1 to 5 carbon atoms, a fluorine atom and a fluorinated alkyl group.

An "acetal-type acid-dissociable group" generally substitutes a hydrogen atom at the terminal of an OH-containing polar group such as a carboxyl group or hydroxyl group, so as to be bonded with an oxygen atom. When acid is generated upon exposure, the generated acid acts to break the bond between the acetal-type acid-dissociable group and the oxygen atom to which the acetal-type acid-dissociable group is bonded, thereby forming an OH-containing polar group such as a carboxyl group or hydroxyl group.

Examples of the acetal-type acid-dissociable group containing a polycyclic group (hereinafter, referred to as a polycyclic group-containing acetal-type acid-dissociable group) include the group represented by the following general formula (3p-1).

[Chemical Formula 30]

(3p-1)

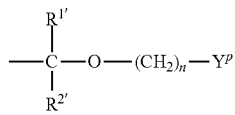

In the formula, each of $R^{1'}$ and $R^{2'}$ independently represents a hydrogen atom or an alkyl group having 1 to 5 carbon atoms, n represents an integer of 0 to 3, and $Y^p$ represents an aliphatic polycyclic group.

In Formula (3p-1), n is preferably an integer of 0 to 2, more preferably 0 or 1, and most preferably 0.

As the alkyl group for $R^{1'}$ and $R^{2'}$, the same alkyl groups as those described above for the alkyl groups as the substituent which may be bonded to the carbon atom on the α-position of the aforementioned α-position substituted acrylate ester can be used, although a methyl group or ethyl group is preferable, and a methyl group is particularly desirable.

In Formula (3p-1), at least one of $R^{1'}$ and $R^{2'}$ is preferably a hydrogen atom.

The aliphatic polycyclic group represented by $Y^p$ can be used by being appropriately selected from many aliphatic polycyclic groups that have been proposed for the ArF resist in the related art, and examples thereof include the same ones as the aliphatic polycyclic groups exemplified in the description for the above polycyclic group-containing tertiary alkyl ester-type acid-dissociable group.

Examples of the polycyclic group-containing acetal-type acid-dissociable group also include the group represented by the following general formula (3p-2).

[Chemical Formula 31]

(3p-2)

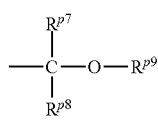

In the formula, each of $R^{p7}$ and $R^{p8}$ independently represents a linear or branched alkyl group or a hydrogen atom, $R^{p9}$ represents an aliphatic polycyclic group. Alternatively, $R^{p7}$ represents a linear or branched alkyl group, $R^{p8}$ represents a linear or branched alkyl group or a hydrogen atom, $R^{p9}$ represents an aliphatic cyclic group, and $R^{p7}$ and $R^{p9}$ are bonded to each other to form a polycyclic group.

The alkyl group represented by $R^{p7}$ and $R^{p8}$ preferably has 1 to 15 carbon atoms, and may be linear or branched. The alkyl group is preferably an ethyl group or a methyl group, and most preferably a methyl group.

It is particularly preferable that one of $R^{p7}$ and $R^{p8}$ be a hydrogen atom, and the other be a methyl group.

$R^{p9}$ is a linear, branched, or cyclic alkyl group, and preferably has 1 to 15 carbon atoms. $R^{p9}$ may be linear, branched, or cyclic.

The aliphatic polycyclic group represented by $R^{p9}$ can be used by being appropriately selected from many aliphatic polycyclic groups that have been proposed for the ArF resist in the related art, and examples thereof include the same ones as the aliphatic polycyclic group exemplified in the description for the above tertiary alkyl ester-type acid-dissociable group. Specific examples thereof include groups in which one or more hydrogen atoms have been removed from a polycycloalkane (a bicycloalkane, a tricycloalkane, a tetracycloalkane, or the like) which may or may not be substituted with a fluorine atom or a fluorinated alkyl group, and the like. Among these, a group in which one or more hydrogen atoms have been removed from adamantane is preferable.

In the Formula (3p-2), $R^{p7}$ represents a linear or branched alkyl group, $R^{p9}$ represents an aliphatic cyclic group, and $R^{p7}$ and $R^{p9}$ may be bonded to each other. In this case, the aliphatic cyclic group represented by $R^{p9}$ may be monocyclic or polycyclic, and a polycyclic group is formed by $R^{p7}$, $R^{p9}$, the oxygen atom having $R^{p9}$ bonded thereto and the carbon atom having the oxygen atom and $R^{p7}$ bonded thereto.

The structural unit (a11) is not particularly limited in terms of the structure of other moieties, as long as the structural unit has an acid-decomposable group containing a polycyclic group. Examples of the structural unit (a11) include a structural unit (a11-1) that is derived from an acrylate ester in which a hydrogen atom bonded to a carbon atom on the α-position may be substituted with a substituent, and contains an acid-decomposable group containing a polycyclic group, a structural unit (a11-2) in which a hydrogen atom bonded to a carbon atom on the α-position may be substituted with a substituent, and a hydrogen atom of a hydroxyl group of a structural unit derived from hydroxystyrene in which a hydrogen atom bonded to a benzene ring may be substituted with a substituent other than a hydroxyl group may be substituted with an acid-dissociable group containing a polycyclic group or with a substituent containing the acid-dissociable group containing a polycyclic group, a structural unit (a11-3) in which a hydrogen atom bonded to a carbon atom of the α-position may be substituted with a substituent, and a hydrogen atom of a hydroxyl group of a structural unit derived from vinyl (hydroxynaphthalene) in which a hydrogen atom bonded to a naphthalene ring may be substituted with a substituent other than a hydroxyl group is substituted with an acid-dissociable group containing a polycyclic group or with a substituent containing the acid-dissociable group containing a polycyclic group, and the like. In view of line edge roughness, the structural unit (a11-1) is preferable. In the respect that the EUV wavelength is easily absorbed, and the influence of the OoB light on the acid-generating component can be diminished, the structural units (a11-2) and (a11-3) are preferable.

{Structural Unit (a11-1)}

Examples of the structural unit (a11-1) include the structural unit represented by the following general formula (a11-01), the structural unit represented by the following general formula (a11-02), and the like.

[Chemical Formula 32]

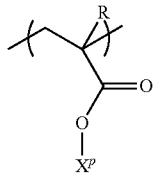
(a11-01)

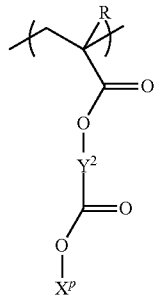
(a11-02)

In the formula, R represents a hydrogen atom, an alkyl group having 1 to 5 carbon atoms, or a halogenated alkyl group having 1 to 5 carbon atoms; $X^p$ represents an acid-dissociable group containing a polycyclic group; and $Y^2$ represents a divalent linking group.

In general formulae (a11-01) and (a11-02), examples of each of the alkyl group and halogenated alkyl group represented by R include the same ones as the alkyl group and halogenated alkyl group exemplified as the substituent on the α-position in the description for the above α-substituted acrylate ester. R is preferably a hydrogen atom, an alkyl group of 1 to 5 carbon atoms or a fluorinated alkyl group of 1 to 5 carbon atoms, and most preferably a hydrogen atom or a methyl group.

The acid-dissociable group represented by $X^p$ is not particularly limited as long as it contains a polycyclic group, and examples thereof include the polycyclic group-containing tertiary alkyl ester-type acid-dissociable group, the polycyclic group-containing acetal-type acid-dissociable group, and the like described above. Among these, the polycyclic group-containing tertiary alkyl ester-type acid-dissociable group is preferable.

The divalent linking group for $Y^2$ is not particularly limited, and preferable examples thereof include a divalent hydrocarbon group which may have a substituent and a divalent linking group containing a hetero atom. Examples of each of the divalent hydrocarbon group which may have a substituent and the divalent linking group containing a hetero atom include the same ones as the divalent linking group represented by $Q^1$ in the Formula (a0-1).

As $Y^2$, particularly, a linear or branched alkylene group, a divalent aliphatic hydrocarbon group, or a divalent linking group containing a hetero atom is preferable.

When $Y^2$ is a linear or branched alkylene group, the alkylene group preferably has 1 to 10 carbon atoms, more preferably has 1 to 6 carbon atoms, particularly preferably has 1 to 4 carbon atoms, and most preferably has 1 to 3 carbon atoms. Specific examples thereof include the same ones as the linear alkylene group and the branched alkylene group exemplified as the linear or branched aliphatic hydrocarbon group in the description for the above divalent linking group represented by $Q^1$.

When $Y^2$ is a divalent aliphatic hydrocarbon group, examples of the aliphatic hydrocarbon group include the same ones as the aliphatic hydrocarbon group exemplified as the "aliphatic hydrocarbon group containing a ring within the structure" in the description for the divalent linking group represented by $Q^1$ in the Formula (a0-1).

As the aliphatic hydrocarbon group, groups in which two or more hydrogen atoms have been removed from cyclopentane, cyclohexane, norbornane, isobornane, adamantane, tricyclodecane, or tetracyclodecane are particularly preferable.

When $Y^2$ is a divalent linking group containing a hetero atom, examples of groups preferable as the linking group include —O—, —C(=O)—O—, —C(=O)—, —O—C(=O)—O—, —C(=O)—NH—, —NH— (H may be substituted with a substituent such as an alkyl group or an acyl group), —S—, —S(=O)$_2$—, —S(=O)$_2$—O—, a group represented by general formula —$Y^{21}$—O—$Y^{22}$— [$Y^{21}$—C(=O)—O]$_{m'}$—$Y^{22}$—, or —$Y^{21}$—O—C(=O)—$Y^{22}$— (in the formula, each of $Y^{21}$ and $Y^{22}$ independently represents a divalent hydrocarbon group which may have a substituent, O represents an oxygen atom, and m' represents an integer of 0 to 3), and the like.

When $Y^2$ represents —NH—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In the group represented by the formula —$Y^{21}$—O—$Y^{22}$—, —[$Y^{21}$—C(=O)—O]$_{m'}$—$Y^{22}$— or —$Y^{21}$—O—C(=O)—$Y^{22}$—, each of $Y^{21}$ and $Y^{22}$ independently represents a divalent hydrocarbon group which may have a substituent. As the divalent hydrocarbon group, the same groups as those described above for the "divalent hydrocarbon group which may have a substituent" for $Y^2$ can be mentioned.

As $Y^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As $Y^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to carbon atoms, more preferably a linear alkyl group of 1 to 3 carbon atoms, and most preferably a methyl group.

In the group represented by the formula —[$Y^{21}$—C(=O)—O]$_{m'}$—$Y^{22}$—, m' represents an integer of 0 to 3, preferably an integer of 0 to 2, more preferably 0 or 1, and most preferably 1. Namely, it is particularly desirable that the group represented by the formula —[$Y^{21}$—C(=O)—O]$_{m'}$—$Y^{22}$— is a group represented by the formula —$Y^{21}$—C(=O)—O—$Y^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As the divalent linking group containing a hetero atom and represented by $Y^2$, organic groups including a combination of at least one kind of non-hydrocarbon group with a divalent hydrocarbon group are preferable. Among these, linear groups having an oxygen atom as a hetero atom, for example, groups containing an ether bond or an ester bond, are preferable, a group represented by the Formula —$Y^{21}$—O—$Y^{22}$—, —[$Y^{21}$—C(=O)—O]$_{m'}$—$Y^{22}$—, or —$Y^{21}$—O—C(=O)—$Y^{22}$— is more preferable, and a group represented by the Formula —[$Y^{21}$—C(=O)—O]$_{m'}$—$Y^{22}$— or —$Y^{21}$—O—C(=O)—$Y^{22}$— is preferable.

As $Y^2$, a linear or branched alkylene group or a divalent linking group containing a hetero atom is preferable among the above, and a linear or branched alkylene group, a group represented by the Formula —$Y^{21}$—O—$Y^{22}$—, the group represented by the Formula —[$Y^{21}$—C(=O)—O]$_{m'}$—$Y^{22}$—, or the group represented by the Formula —$Y^{21}$—O—C(=O)—$Y^{22}$— is more preferable.

More specific examples of the structural unit (a11-1) include the structural units represented by the following general formulae (a11-11) to (a11-14).

[Chemical Formula 33]

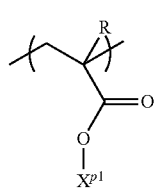
(a11-11)

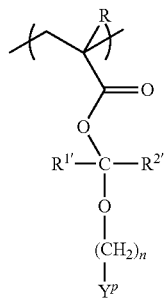
(a11-12)

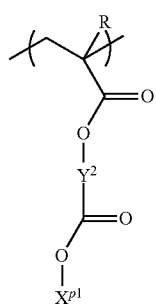
(a11-13)

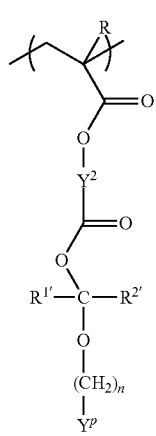
(a11-14)

In the formula, each of R, $R^{1'}$, $R^{2'}$, n, $Y^p$, and $Y^2$ is the same as the above, and $X^{p1}$ represents a polycyclic group-containing tertiary alkyl ester-type acid-dissociable group.

In the formula, examples of $X^{p1}$ include the same ones as the polycyclic group-containing tertiary alkyl ester-type acid-dissociable group described above.

Examples of each of $R^{1'}$, $R^{2'}$, n, and $Y^p$ include the same ones as $R^{1'}$, $R^{2'}$, n, and $Y^p$ in general formula (3p-1) exemplified in the description for the above "polycyclic group-containing acetal-type acid-dissociable group".

Examples of $Y^2$ include the same ones as $Y^2$ in the general formula (a11-02).

Specific examples of the structural units represented by the general formulae (a11-11) to (a11-14) will be shown below.
In the formulas shown below, $R^\alpha$ represents a hydrogen atom, a methyl group or a trifluoromethyl group.
[Chemical Formula 34]
(a11-11-1)
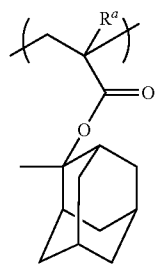
(a11-11-2)
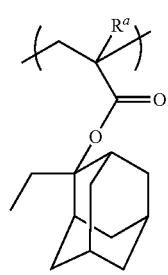
(a11-11-3)
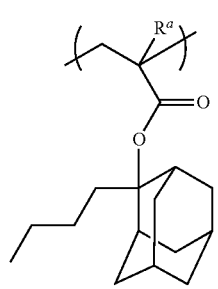
(a11-11-4)
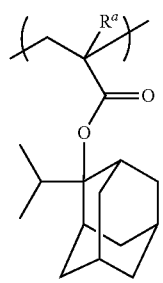
(a11-11-5)
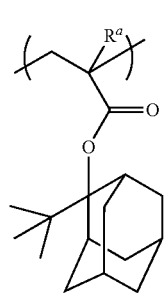
-continued
(a11-11-6)
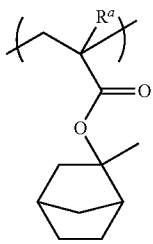
(a11-11-7)
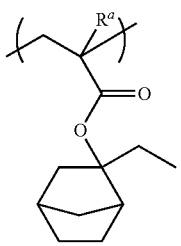
(a11-11-8)
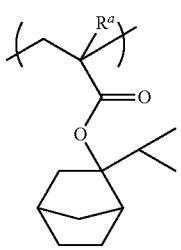
(a11-11-9)
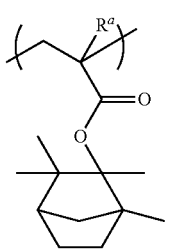
(a11-11-10)
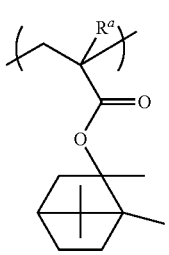
(a11-11-11)

(a11-11-12)
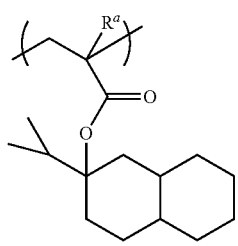
(a11-11-13)
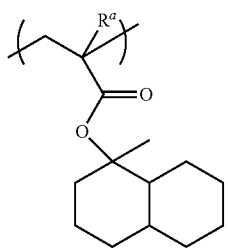
(a11-11-14)
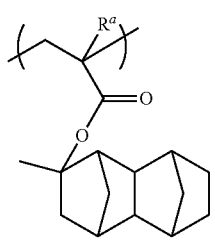
(a11-11-15)
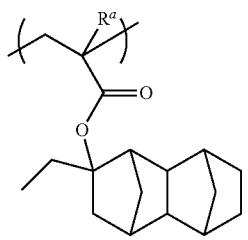
(a11-11-16)
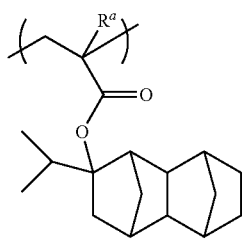
(a11-11-17)
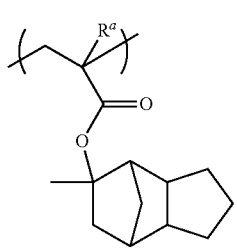
(a11-11-18)
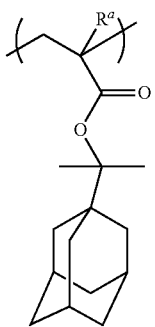
(a11-11-19)
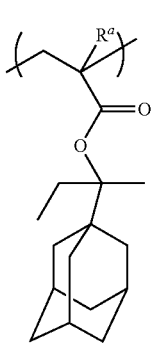
(a11-11-20)
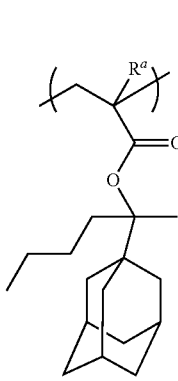
(a11-11-21)
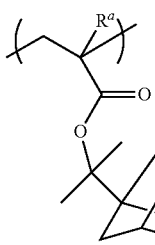
(a11-11-22)
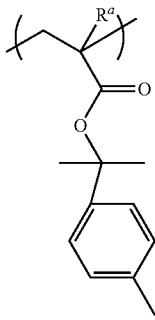

[Chemical Formula 35]
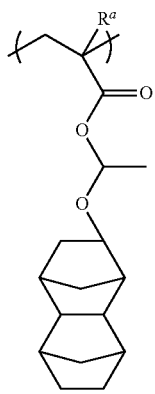 (a11-12-1)
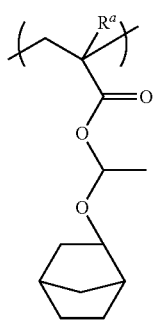 (a11-12-2)
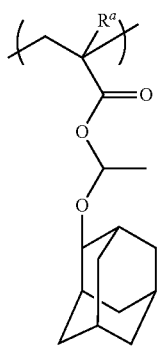 (a11-12-3)
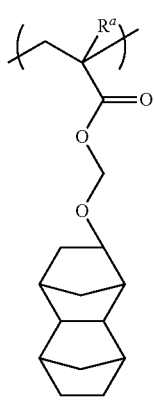 (a11-12-4)
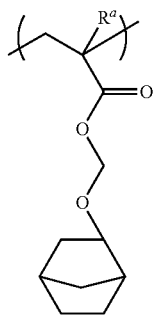 (a11-12-5)
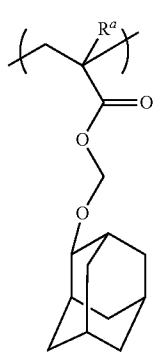 (a11-12-6)
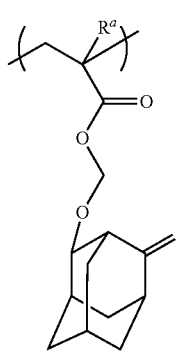 (a11-12-7)
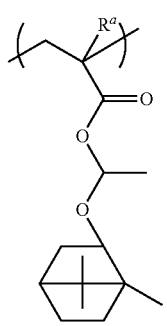 (a11-12-8)
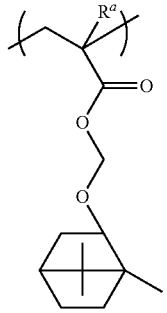 (a11-12-9)

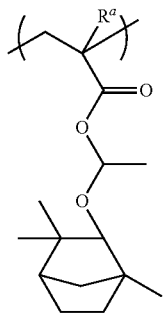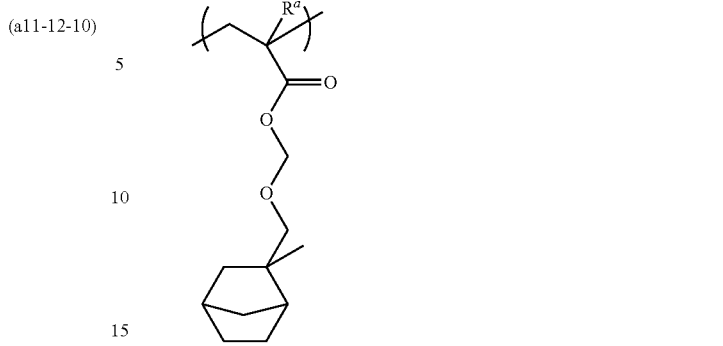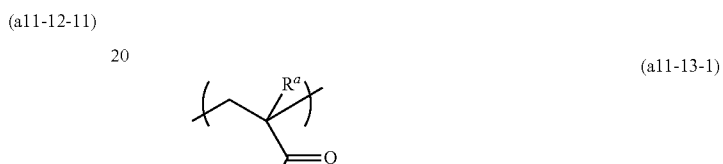

(a11-13-4)
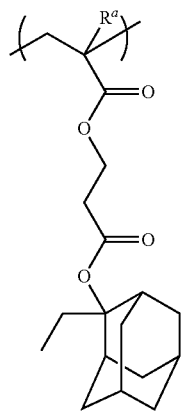
(a11-13-5)
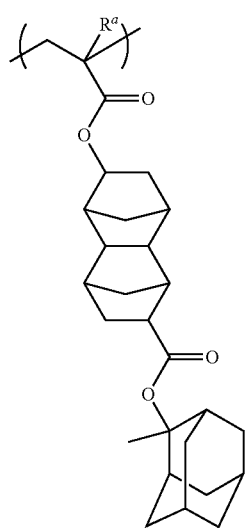
(a11-13-6)
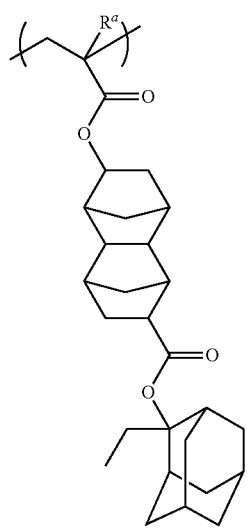
(a11-13-7)
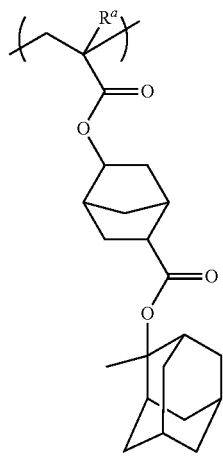
(a11-13-8)
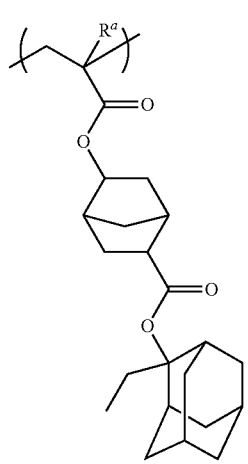
(a11-13-9)
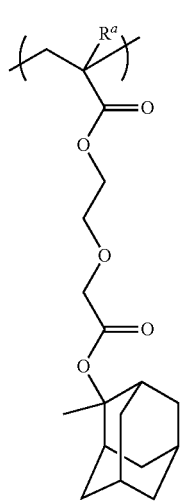

(a11-13-10)
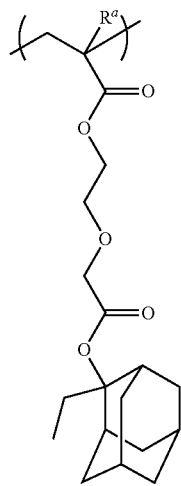
(a11-13-11)
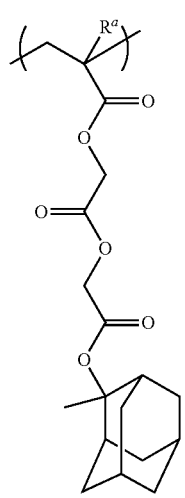
(a11-13-12)
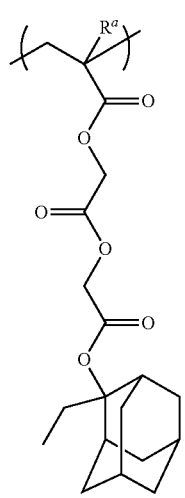
[Chemical Formula 37]
(a11-14-1)
(a11-14-2)
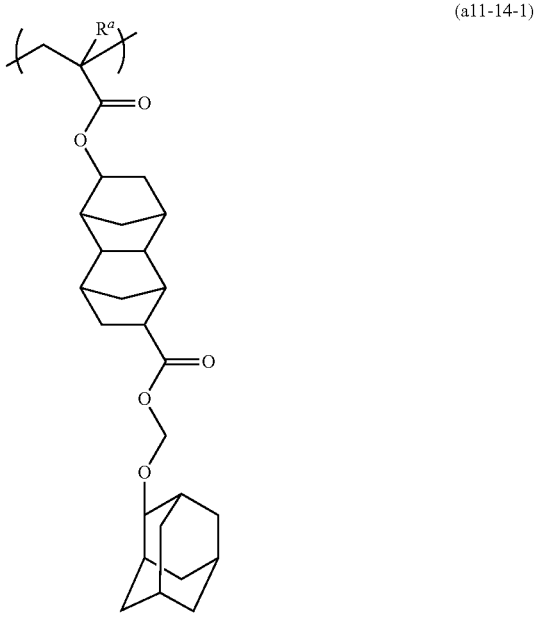
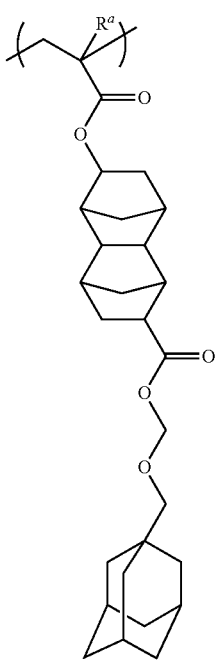

(a11-14-3)
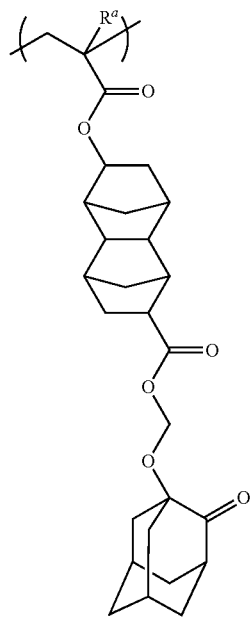
(a11-14-5)
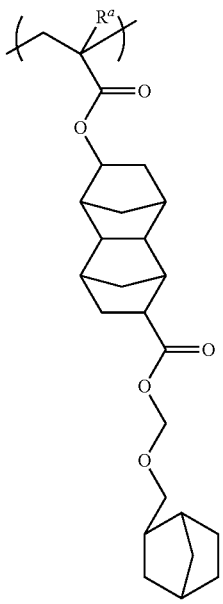
(a11-14-4)
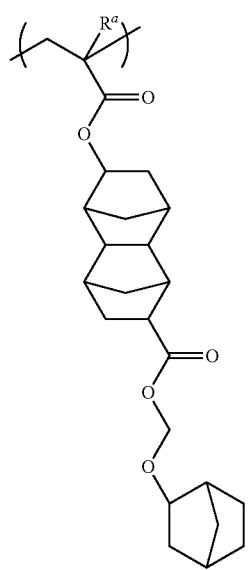
(a11-14-6)
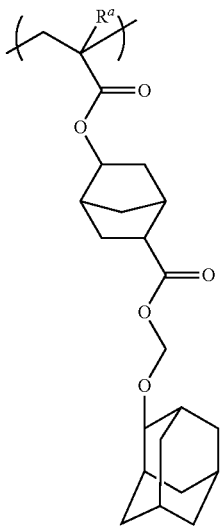

-continued (a11-14-7)

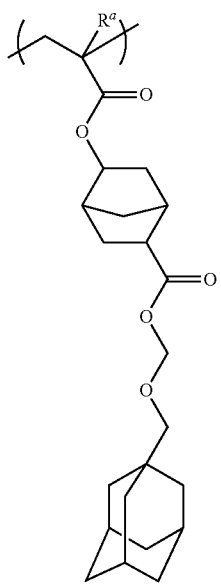

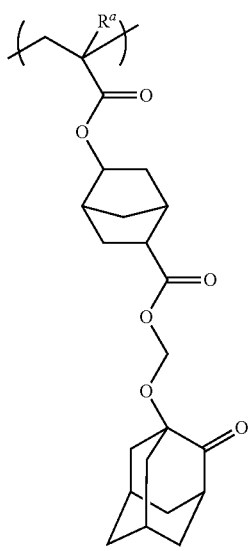

(a11-14-8)

One kind or two or more kinds of the structural unit (a11) may be contained in the component (A1).

In the present invention, as the structural unit (a11), the component (A1) preferably contains at least one kind selected from the group consisting of the structural unit represented by the following general formula (a11-01-1), the structural unit represented by the following general formula (a11-01-2), and the structural unit represented by the following general formula (a11-02).

[Chemical Formula 38]

(a11-01-1)

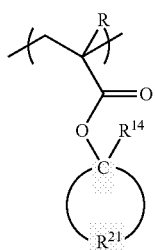

-continued (a11-01-2)

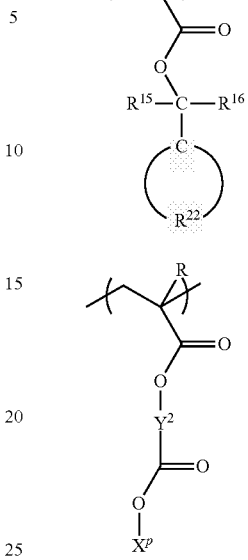

(a11-02)

In the formula, R represents a hydrogen atom, an alkyl group having 1 to 5 carbon atoms, or a halogenated alkyl group having 1 to 5 carbon atoms. $R^{14}$ represents a chain-like or cyclic alkyl group, and $R^{21}$ represents a group forming an aliphatic polycyclic group with a carbon atom to which $R^{21}$ is bonded. Each of $R^{15}$ and $R^{16}$ independently represents a chain-like or cyclic alkyl group, and $R^{22}$ represents a group forming a polycyclic group with a carbon atom to which $R^{22}$ is bonded. $Y^2$ represents a divalent linking group, and $X^p$ represents an acid-dissociable group containing a polycyclic group.

In Formula (a11-01-1), the description for R is the same as that for R in the Formula (a11-01).

$R^{14}$ is the same as $R^{14}$ in the Formulae (p1-1) to (p1-8), and is preferably a methyl group, an ethyl group, an isopropyl group, or a tert-butyl group.

Examples of the aliphatic polycyclic group that $R^{21}$ forms with a carbon atom to which $R^{21}$ is bonded include the same ones as the aliphatic polycyclic group exemplified in the description for the above polycyclic group-containing tertiary alkyl ester-type acid-dissociable group. As the aliphatic polycyclic group, a 2-adamantyl group is most preferable.

Specific examples of the structural unit represented by Formula (a11-01-1) include the structural units represented by the Formulae (a11-11-1) to (a11-11-17). Among these, the structural units represented by Formulae (a11-11-1) to (a1-11-5) are preferable.

In Formula (a11-01-2), the description for R is the same as that for R in the Formula (a11-01).

Each of $R^{15}$ and $R^{16}$ is the same as $R^{15}$ and $R^{16}$ in the Formula (p2-1) to (p2-5), and preferably a methyl group or an ethyl group.

The polycyclic group that $R^{22}$ forms with a carbon atom to which $R^{22}$ is bonded may be an aliphatic polycyclic group or an aromatic polycyclic group. Examples of each of the aliphatic polycyclic group and aromatic polycyclic group include the same ones as the aliphatic polycyclic group and aromatic polycyclic group exemplified in the description for the above polycyclic group-containing tertiary alkyl ester-type acid-dissociable group. As the polycyclic group, a 1-adamantyl group is most preferable.

Specific examples of the structural unit represented by Formula (a11-01-2) include the structural units represented by the Formulae (a11-11-18) to (a1-11-22). Among these, the structural units represented by Formulae (a11-11-18) to (a1-11-20) are preferable.

The description for Formula (a11-02) is the same as above.

Examples of the structural unit represented by Formula (a11-02) include the structural unit represented by the Formula (a11-13) or (a11-14), and the structural unit represented by Formula (a11-13) is preferable.

As the structural unit represented by Formula (a11-02), groups in which $Y^2$ in the formula is a group represented by the Formula $-Y^{21}-O-Y^{22}-$, $-[Y^{21}-C(=O)-O]_m-Y^{22}-$, or $-Y^{21}-O-C(=O)-Y^{22}-$ are preferable. Examples of preferable ones as such a structural unit include the structural unit represented by the following general formula (a11-13-01); the structural unit represented by the following general formula (a11-13-02); and the like.

[Chemical Formula 39]

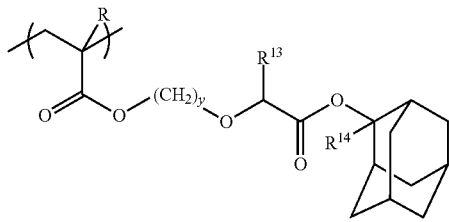

(a11-13-01)

In the formula, each of R and $R^{14}$ is the same as above, $R^{13}$ represents a hydrogen atom or a methyl group, and y represents an integer of 1 to 10.

[Chemical Formula 40]

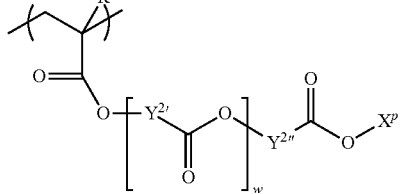

(a11-13-02)

In the formula, each of R and $X^p$ is the same as above, each of $Y^{2'}$ and $Y^{2''}$ independently represents a divalent linking group, and w represents an integer of 0 to 3.

In Formula (a11-13-01), $R^{13}$ is preferably a hydrogen atom.

y is preferably an integer of 1 to 8, more preferably an integer of 1 to 5, and most preferably 1 or 2.

n' is preferably 1 or 2, and most preferably 2.

Specific examples of the structural unit represented by Formula (a11-13-01) include the structural units represented by the Formulae (a11-13-9) and (a11-13-10).

In Formula (a11-13-02), examples of the acid-dissociable group containing a polycyclic group and represented by $X^p$ include the same ones as above. The acid-dissociable group is preferably a polycyclic group-containing tertiary alkyl ester-type acid-dissociable group and more preferably the (p-i) group in which a substituent is bonded to a carbon atom bonded to an atom adjacent to the acid-dissociable group on the ring skeleton of a monovalent aliphatic polycyclic group so as to form a tertiary carbon atom. Among these, the group represented by the general formula (p1-1) is preferable.

Examples of the divalent linking group represented by $Y^{2'}$ and $Y^{2''}$ include the same ones as $Y^2$ in the general formula (a11-13).

As $Y^{2'}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As $Y^{2''}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

w represents an integer of 0 to 3, preferably an integer of 0 to 2, more preferably 0 or 1, and most preferably 1.

As the structural unit represented by Formula (a11-13-02), the structural unit represented by the following general formula (a11-13-02-1) is particularly preferable.

[Chemical Formula 41]

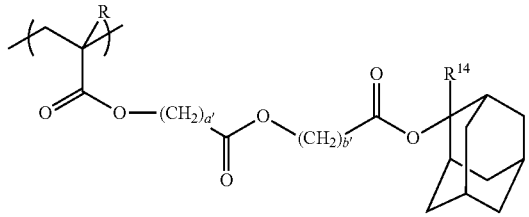

(a11-13-02-1)

In the formula, each of R and $R^{14}$ is the same as above, a' represents an integer of 1 to 10, and b' represents an integer of 1 to 10.

In Formula (a11-13-02-1), a' is preferably an integer of 1 to 10, more preferably an integer of 1 to 8, even more preferably an integer of 1 to 5, and particularly preferably 1 or 2.

b' is preferably an integer of 1 to 10, more preferably an integer of 1 to 8, even more preferably an integer of 1 to 5, and particularly preferably 1 or 2.

Specific examples of the structural unit represented by Formula (a11-13-02-1) include the structural units represented by the Formulae (a11-13-11) and (a11-13-12).

{Structural Unit (a11-2)}

The structural unit (a11-2) is a structural unit in which a hydrogen atom bonded to a carbon atom on the α-position may be substituted with a substituent, and a hydrogen atom of a hydroxyl group of a structural unit derived from hydroxystyrene in which a hydrogen atom bonded to a benzene ring may be substituted with a substituent other than a hydroxyl group is substituted with an acid-dissociable group containing a polycyclic group or with a substituent containing the acid-dissociable group containing a polycyclic group.

Examples of the "acid-dissociable group containing a polycyclic group" substituting a hydrogen atom of a hydroxyl group include the same ones as above. The acid-dissociable group containing a polycyclic group is preferably a polycyclic group-containing tertiary alkyl ester-type acid-dissociable group or a polycyclic group-containing acetal-type acid-dissociable group, and more preferably a polycyclic group-containing acetal-type acid-dissociable group.

Examples of the "substituent containing the acid-dissociable group containing a polycyclic group" include groups constituted with an acid-dissociable group containing a polycyclic group and a divalent linking group. Examples of the divalent linking group include the same ones as the divalent linking group represented by $Q^1$ in the Formula (a0-1), and a group in which a terminal structure of an acid-dissociable group side is a carbonyloxy group is particularly preferable. In this case, it is preferable that the acid-dissociable group be bonded to an oxygen atom (—O—) of the carbonyloxy group.

As the substituent containing an acid-dissociable group containing a polycyclic group, a group represented by $R^{11\prime}$—O—C(=O)— or a group represented by $R^{11\prime}$—O—C(=O)—$R^{12\prime}$— is preferable. In the formula, $R^{11\prime}$ represents an acid-dissociable group containing a polycyclic group, and $R^{12\prime}$ represents a linear or branched alkylene group.

The acid-dissociable group containing a polycyclic group and represented by $R^{11\prime}$ is preferably a polycyclic group-containing tertiary alkyl ester-type acid-dissociable group or a polycyclic group-containing acetal-type acid-dissociable group, and more preferably a polycyclic group-containing tertiary alkyl ester-type acid-dissociable group. Preferable examples of the polycyclic group-containing tertiary alkyl ester-type acid-dissociable group include the groups represented by the Formulae (p1-1) to (p1-8), the groups represented by the Formulae (p2-1) to (p2-5), and the like.

Examples of the alkylene group represented by $R^{12\prime}$ include a methylene group, an ethylene group, a trimethylene group, a tetramethylene group, a 1,1-dimethylethylene group, and the like. $R^{12\prime}$ is preferably a linear alkylene group.

Specific examples of the structural unit (a11-2) include structural units in which in the general formula (U-3), px in —(OX$^c$)$_{px}$ bonded to a benzene ring represents an integer of 1 to 3, and at least one of X$^c$s is an acid-dissociable group containing a polycyclic group or a substituent containing the acid-dissociable group containing a polycyclic group. When px is 2 or 3, plural X$^c$s may be the same as or different from each other. For example, one of X$^c$s may be an acid-dissociable group containing a polycyclic group or a substituent containing the acid-dissociable group containing a polycyclic group, and the remaining one or two X$^c$s may be a hydrogen atom.

{Structural Unit (a11-3)}

The structural unit (a11-3) is a structural unit in which a hydrogen atom bonded to a carbon atom on the α-position may be substituted with a substituent, and a hydrogen atom of a hydroxyl group of a structural unit derived from vinyl (hydroxynaphthalene) in which a hydrogen atom bonded to a naphthalene ring may be substituted with a substituent other than a hydroxyl group is substituted with an acid-dissociable group containing a polycyclic group or with a substituent containing the acid-dissociable group containing a polycyclic group.

In the structural unit (a11-3), examples of each of the "acid-dissociable group containing a polycyclic group" and the "substituent containing the acid-dissociable group containing a polycyclic group" substituting a hydrogen atom of a hydroxyl group include the same ones as exemplified in the description for the structural unit (a11-2).

Specific examples of the structural unit (a11-3) include structural units in which in the general formula (U-4), x in —(OX$^d$)$_x$ bonded to a benzene ring represents an integer of 1 to 3, and at least one of X$^d$s is an acid-dissociable group containing a polycyclic group or a substituent containing the acid-dissociable group containing a polycyclic group. When x is 2 or 3, plural X$^d$s may be the same as or different from each other. For examples, one of X$^d$s may be an acid-dissociable group containing a polycyclic group or a substituent containing the acid-dissociable group containing a polycyclic group, and the remaining one or two X$^d$s may be a hydrogen atom.

(Structural Unit (a12))

The structural unit (a12) is a structural unit containing an acid-decomposable group which exhibits increased polarity by the action of acid and contains a monocyclic group.

Specific examples of the acid-decomposable group which exhibits increased polarity by the action of acid and contains a monocyclic group include groups in which a polar group has been protected with an acid-dissociable group containing a monocyclic group (hereinafter, referred to as a monocyclic group-containing acid-dissociable group in some cases) (for example, groups in which a hydrogen atom of a polar group has been substituted with a monocyclic group-containing acid-dissociable group). In addition, the monocyclic group-containing acid-dissociable group does not contain a polycyclic group within the structure.

Examples of the polar group include the same ones as exemplified in the description for the structural unit (a11). The "acid-decomposable group" and "acid-dissociable group" have the same definition as above.

Examples of the monocyclic group-containing acid-dissociable group include groups in which the polycyclic group in the polycyclic group-containing acid-dissociable group described above has been substituted with a monocyclic group. The examples include a tertiary alkyl ester-type acid-dissociable group containing a monocyclic group (hereinafter, referred to as a monocyclic group-containing tertiary alkyl ester-type acid-dissociable group), an acetal-type acid-dissociable group containing a monocyclic group (hereinafter, referred to as a monocyclic group-containing acetal-type acid-dissociable group), and the like.

The monocyclic group that the monocyclic group-containing tertiary alkyl ester-type acid-dissociable group has may be an aliphatic monocyclic group or an aromatic monocyclic group.

The aliphatic monocyclic group refers to a monocyclic group not having aromaticity. The aliphatic monocyclic group may or may not have a substituent. Examples of the substituent include an alkyl group having 1 to 5 carbon atoms, an alkoxy group having 1 to 5 carbon atoms, a fluorine atom, a fluorinated alkyl group having 1 to carbon atoms, an oxygen atom (=O), and the like.

The basic ring structure of the aliphatic monocyclic group excluding the substituent is not limited to a group (hydrocarbon group) including carbon and hydrogen, but is preferably a hydrocarbon group. Further, the hydrocarbon group may be either saturated or unsaturated, but is preferably saturated.

The aliphatic monocyclic group preferably has 3 to 15 carbon atoms, more preferably has 5 to 13 carbon atoms, and even more preferably has 5 to 10 carbon atoms. As the aliphatic monocyclic group, groups in which one or more hydrogen atoms have been removed from monocycloalkane are preferable. The monocycloalkane preferably has 3 to 12 carbon atoms, and specific examples thereof include cyclobutane, cyclopentane, cyclohexane, cycloheptane, cyclooctane, and the like. In addition, a portion of carbon atoms constituting a ring of these aliphatic monocyclic rings may be substituted with an ether group (—O—).

The aliphatic monocyclic group may or may not have a substituent. Examples of the substituent include an alkyl group having 1 to 5 carbon atoms, an alkoxy group having 1 to 5 carbon atoms, a fluorine atom, a fluorinated alkyl group having 1 to 5 carbon atoms, an oxygen atom (═O), and the like.

The aromatic monocyclic group is a monovalent hydrocarbon group having at least one monocyclic aromatic ring, and may have a substituent. The monocyclic aromatic ring preferably has 5 to 13 carbon atoms, more preferably has 5 to 10 carbon atoms, and even more preferably has 6 to 10 carbon atoms. Here, the number of carbon atoms within substituents is not included in the number of carbon atoms of the aromatic hydrocarbon group. Specific examples of the monocyclic aromatic ring include aromatic hydrocarbon rings such as benzene; aromatic heterocyclic ringaromatic heterocyclic rings in which a portion of carbon atoms constituting the aromatic hydrocarbon ring has been substituted with a hetero atom; and the like. Examples of the hetero atom in the aromatic heterocyclic rings include an oxygen atom, a sulfur atom and a nitrogen atom. Specific examples of the monocyclic aromatic heterocyclic ringaromatic heterocyclic ring include a pyridine ring, a thiophene ring, and the like.

The aromatic monocyclic group is preferably a phenyl group.

The aromatic monocyclic group may or may not have a substituent. Examples of the substituent include an alkyl group having 1 to 5 carbon atoms, an alkoxy group having 1 to 5 carbon atoms, a fluorine atom, a fluorinated alkyl group having 1 to 5 carbon atoms, an oxo group (═O), and the like.

Examples of the monocyclic group-containing tertiary alkyl ester-type acid-dissociable group include (m-i) a group in which a substituent (an atom or a group other than a hydrogen atom) is bonded to a carbon atom bonded to an atom (for example, —O— in —C(═O)—O—) adjacent to the acid-dissociable group on the ring skeleton of the monovalent aliphatic monocyclic group so as to form a tertiary carbon atom;

(m-ii) a group having a monovalent aliphatic monocyclic group or an aromatic monocyclic group and branched alkylene having a tertiary carbon atom bonded to the above group; and the like.

In the group of (m-i), examples of the substituent bonded to a carbon atom bonded to an atom adjacent to the acid-dissociable group on the ring structure of the aliphatic monocyclic group include a chain-like or monocyclic alkyl group. Examples of such an alkyl group include the same ones as $R^{14'}$ in the Formula (m1-1) described later.

Specific examples of the group of (m-i) include the group represented by the following general formula (m1-1), and the like.

Specific examples of the group of (m-ii) include the groups represented by the following general formulae (m2-1) to (m2-3), and the like.

[Chemical Formula 42]

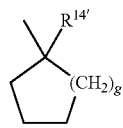

(m1-1)

-continued

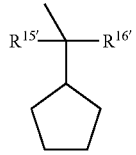

(m2-1)

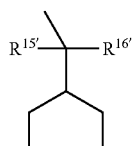

(m2-2)

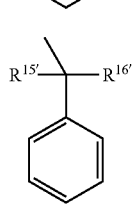

(m2-3)

In the formula, $R^{14'}$ represents a chain-like or monocyclic alkyl group, g represents an integer of 0 to 8, and each of $R^{15'}$ and $R^{16'}$ independently represents a chain-like or monocyclic alkyl group.

In Formula (m1-1), examples of the alkyl group represented by $R^{14'}$ include the same ones as the alkyl group represented by $R^{14}$ in the Formulae (p1-1) to (p1-8) (here, a polycyclic alkyl group is excluded).

g is preferably an integer of 0 to 3, more preferably an integer of 1 to 3, and even more preferably 1 or 2.

In Formulae (m2-1) to (m2-3), examples of each of the alkyl group represented by $R^{15'}$ and $R^{16'}$ include the same ones as the alkyl group represented by $R^{14'}$.

In the Formulae (m1-1), (m2-1), and (m2-2), a portion of carbon atoms constituting a ring may be substituted with an ethereal oxygen atom (—O—).

In addition, in Formulae (m1-1) and (m2-1) to (m2-3), hydrogen atoms bonded to carbon atoms constituting a ring may be substituted with a substituent. Examples of the substituent include an alkyl group of 1 to 5 carbon atoms, a fluorine atom and a fluorinated alkyl group.

Examples of the monocyclic group-containing acetal-type acid-dissociable group include the group represented by the following general formula (3m-1).

[Chemical Formula 43]

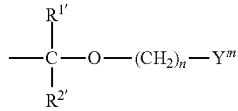

(3m-1)

In the formula, each of $R^{1'}$ and $R^{2'}$ independently represents a hydrogen atom or an alkyl group having 1 to 5 carbon atoms, n represents an integer of 0 to 3, and $Y^{m}$ represents an aliphatic monocyclic group.

In Formula (3m-1), each of n, $R^{1'}$, and $R^{2'}$ is the same as n, $R^{1'}$, and $R^{2'}$ in the general formula (3p-1).

The aliphatic monocyclic group represented by $Y^{m}$ can be used by being appropriately selected from many aliphatic monocyclic groups having been proposed for the ArF resist or the like in the related art. Examples thereof include the same ones as the aliphatic monocyclic group exemplified in the description for the above monocyclic group-containing tertiary alkyl ester-type acid-dissociable group.

Examples of the monocyclic group-containing acetal-type acid-dissociable group also include the group represented by the following general formula (3m-2).

[Chemical Formula 44]

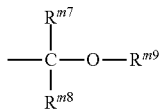

(3m-2)

In the formula, each of $R^{m7}$ and $R^{m8}$ independently represents a linear or branched alkyl group or a hydrogen atom, and $R^{m9}$ represents an aliphatic monocyclic group. Alternatively, $R^{m7}$ represents a linear or branched alkyl group, $R^{m8}$ represents a linear or branched alkyl group or a hydrogen atom, $R^{m9}$ represents a linear or branched alkyl group, and $R^{m7}$ and $R^{m9}$ are bonded to each other to form a monocyclic group.

The alkyl group represented by $R^{p7}$ and $R^{p8}$ preferably has 1 to 15 carbon atoms, and may be linear or branched. The alkyl group is preferably an ethyl group or a methyl group, and most preferably a methyl group.

Particularly, it is preferable that one of $R^{p7}$ and $R^{p8}$ be a hydrogen atom, and the other be a methyl group.

$R^{p9}$ represents a linear, branched, or cyclic alkyl group, and preferably has 1 to carbon atoms. $R^{p9}$ may be linear, branched, or cyclic.

The aliphatic monocyclic group represented by $R^{p9}$ can be used by being appropriately selected from many aliphatic monocyclic groups having been proposed for the ArF resist or the like in the related art. Examples thereof include the same ones as the aliphatic monocyclic group exemplified in the description for the above monocyclic group-containing tertiary alkyl ester-type acid-dissociable group. Specific examples thereof include groups in which one or more hydrogen atoms have been removed from a monocycloalkane which may or may not be substituted with a fluorine atom or a fluorinated alkyl group, and among these, groups in which one or more hydrogen atoms have been removed from cyclopentane, cyclohexane, cycloheptane, or cyclooctane are preferable.

In addition, in the Formula (3m-2), each of $R^{m7}$ and $R^{m9}$ independently represents a linear or branched alkyl group, and $R^{m7}$ and $R^{m9}$ may be bonded to each other. In this case, a monocyclic group is formed by $R^{m7}$, $R^{m9}$, an oxygen atom to which $R^{m9}$ is bonded, and a carbon atom to which the oxygen atom and $R^{m7}$ are bonded.

The structural unit (a12) is not particularly limited in terms of the structure of other moieties as long as the structural unit has an acid-decomposable group containing a monocyclic group. However, examples thereof include a structural unit (a12-1) which is derived from an acrylate ester in which a hydrogen atom bonded to a carbon atom on the α-position may be substituted with a substituent, and contains an acid-decomposable group containing a monocyclic group, a structural unit (a12-2) in which a hydrogen atom bonded to a carbon atom on the α-position may be substituted with a substituent, and a hydrogen atom of a hydroxyl group of a structural unit derived from hydroxystyrene in which a hydrogen atom bonded to a benzene ring may be substituted with a substituent other than a hydroxyl group is substituted with an acid-dissociable group containing a monocyclic group or with a substituent containing the acid-dissociable group containing a monocyclic group, a structural unit (a12-3) in which a hydrogen atom bonded to a carbon atom on the α-position may be substituted with a substituent, and a hydrogen atom of a hydroxyl group of a structural unit derived from vinyl (hydroxynaphthalene) in which a hydrogen atom bonded to a naphthalene ring may be substituted with a substituent other than a hydroxyl group is substituted with an acid-dissociable group containing a monocyclic group or with a substituent containing the acid-dissociable group containing a monocyclic group, and the like. In view of line edge roughness, the structural unit (a12-1) is preferable. In the respect that the EUV wavelength can be easily absorbed, and the influence of the OoB light on the acid-generating component can be further diminished, the structural units (a12-2) and (a12-3) are preferable.

{Structural Unit (a12-1)}

Examples of the structural unit (a12-1) include the structural unit represented by the following general formula (a12-01), the structural unit represented by the following general formula (a12-02), and the like.

[Chemical Formula 45]

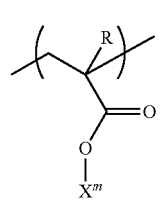

(a12-01)

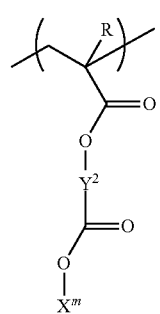

(a12-02)

In the formula, R represents a hydrogen atom, an alkyl group having 1 to 5 carbon atoms, or a halogenated alkyl group having 1 to 5 carbon atoms; $X^m$ represents an acid-dissociable group containing a monocyclic group; and $Y^2$ represents a divalent linking group.

In general formulae (a12-01) and (a12-02), examples of each of R and $Y^2$ include the same ones as R and $Y^2$ in the general formulae (a11-01) and (a11-02).

The acid-dissociable group represented by $X^m$ is not particularly limited as long as it contains a monocyclic group, and examples thereof include the monocyclic group-containing tertiary alkyl ester-type acid-dissociable group, the monocyclic group-containing acetal-type acid-dissociable group, and the like described above. Among these, the monocyclic group-containing tertiary alkyl ester-type acid-dissociable group is preferable.

More specific examples of the structural unit (a12-1) include the structural units represented by the following general formulae (a12-11) to (a12-14).

[Chemical Formula 46]

(a12-11)
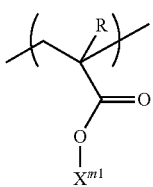

(a12-12)
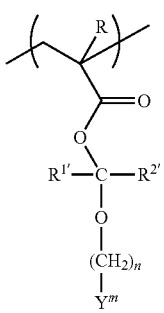

(a12-13)
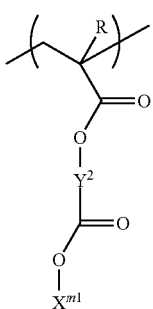

(a12-14)
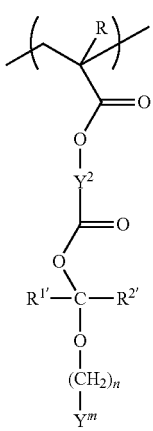

In the formula, each of R, $R^{1\prime}$, $R^{2\prime}$, n, $Y^m$, and $Y^2$ is the same as above, and $X^{m1}$ represents a monocyclic group-containing tertiary alkyl ester-type acid-dissociable group.

In the Formulae, examples of $X^{m1}$ include the same ones as the monocyclic group-containing tertiary alkyl ester-type acid-dissociable group described above.

Examples of each of $R^{1\prime}$, $R^{2\prime}$, n, and $Y^m$ include the same ones as $R^{1\prime}$, $R^{2\prime}$, n, and $Y^m$ in general formula (3m-1) exemplified in the description for the "monocyclic group-containing acetal-type acid-dissociable group" described above.

Examples of $Y^2$ include the same ones as $Y^2$ in the general formula (a12-02).

Specific examples of the structural units represented by the general formulae (a12-11) to (a12-14) will be shown below.

In the formulas shown below, $R^\alpha$ represents a hydrogen atom, a methyl group or a trifluoromethyl group.

[Chemical Formula 47]

(a12-11-1)
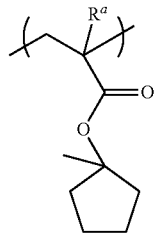

(a12-11-2)
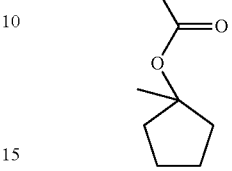

(a12-11-3)
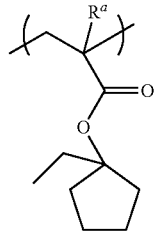

(a12-11-4)
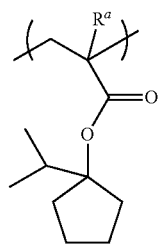

(a12-11-5)
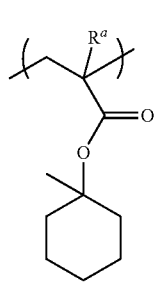

(a12-11-6)
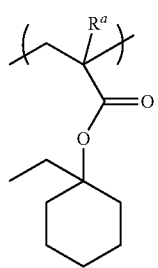

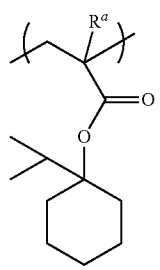 (a12-11-7)
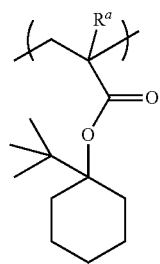 (a12-11-8)
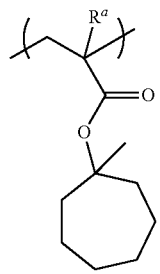 (a12-11-9)
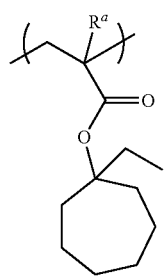 (a12-11-10)
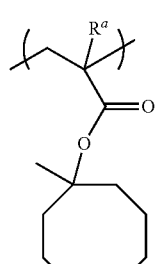 (a12-11-11)
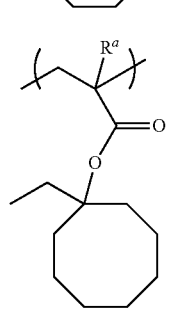 (a12-11-12)
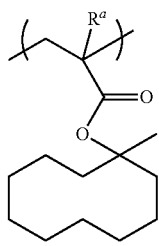 (a12-11-13)
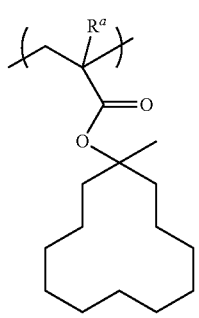 (a12-11-14)
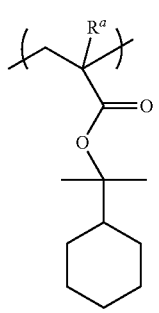 (a12-11-15)
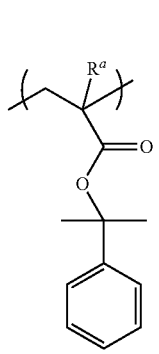 (a12-11-16)
[Chemical Formula 48]
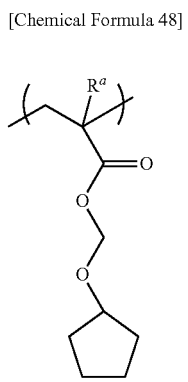 (a12-12-1)

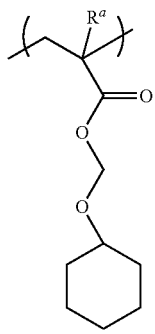 (a12-12-2)
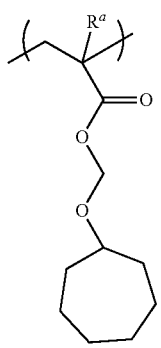 (a12-12-3)
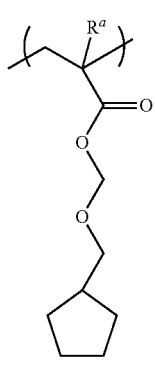 (a12-12-4)
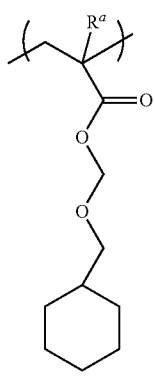 (a12-12-5)
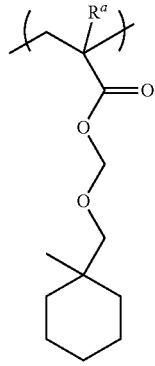 (a12-12-6)
[Chemical Formula 49]
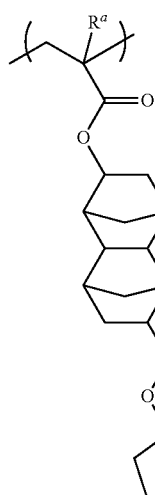 (a12-13-1)
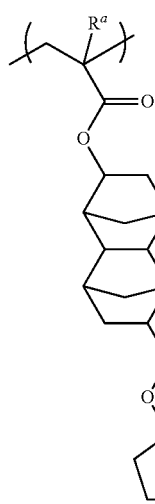 (a12-13-2)

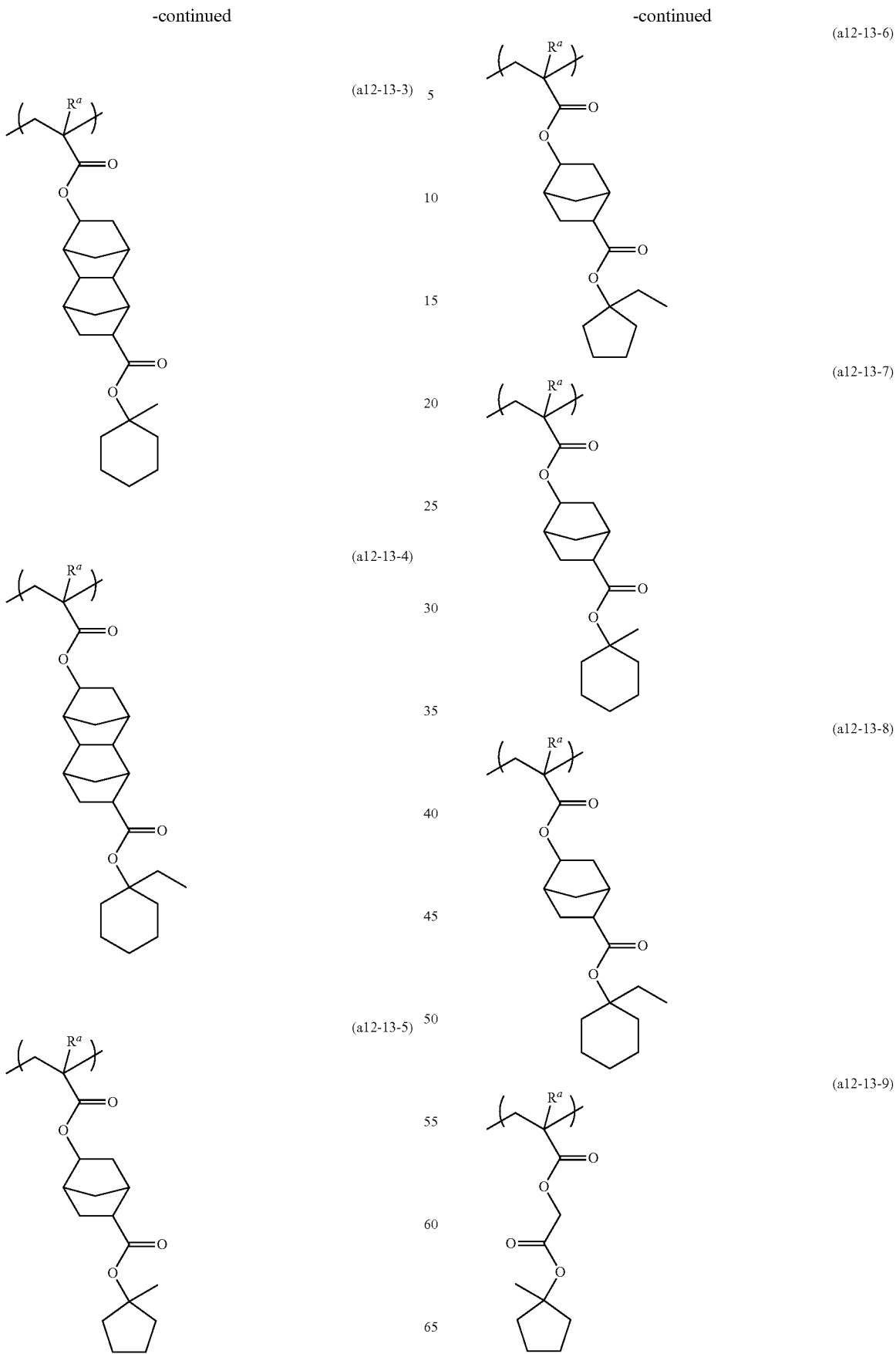

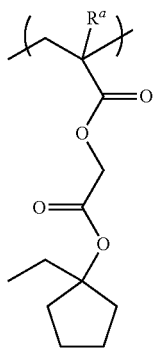
(a12-13-10)
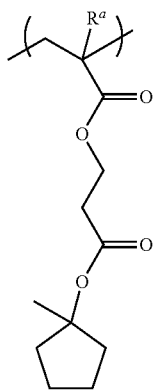
(a12-13-11)
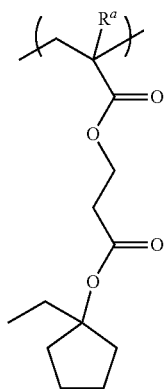
(a12-13-12)
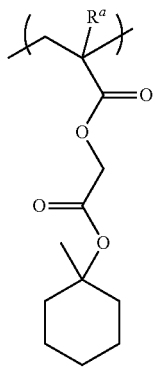
(a12-13-13)
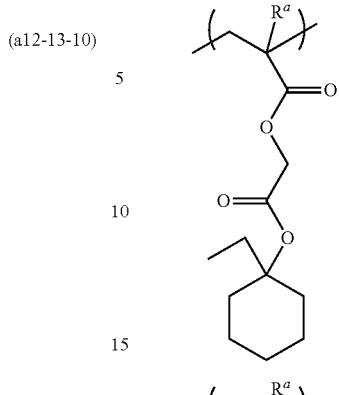
(a12-13-14)
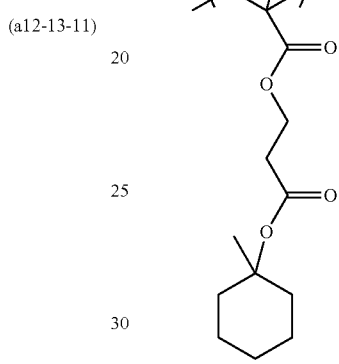
(a12-13-15)
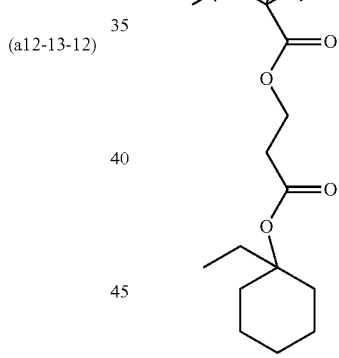
(a12-13-16)
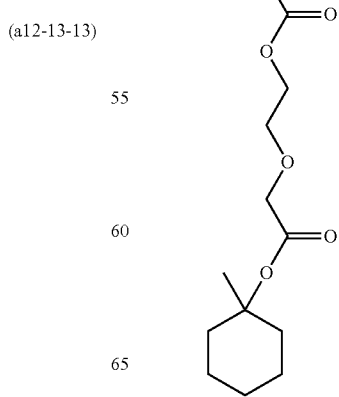
(a12-13-17)

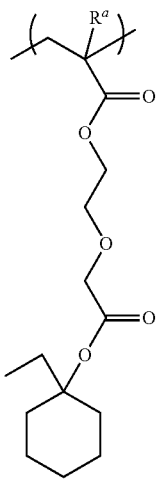
(a12-13-18)
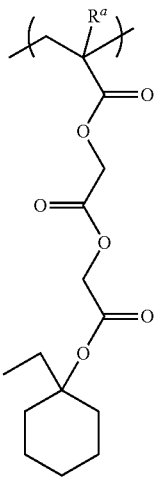
(a12-13-21)
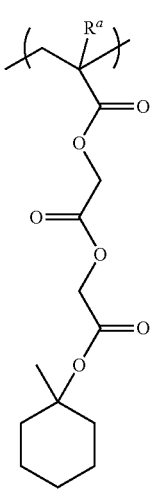
(a12-13-19)
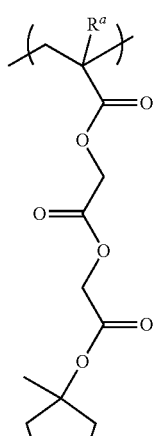
(a12-13-22)
[Chemical Formula 50]
(a12-13-20)
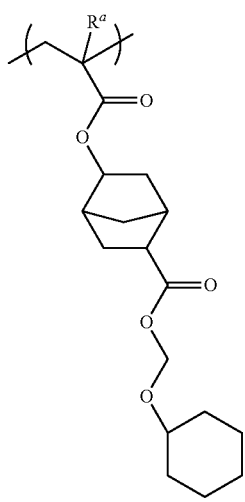
(a12-14-1)

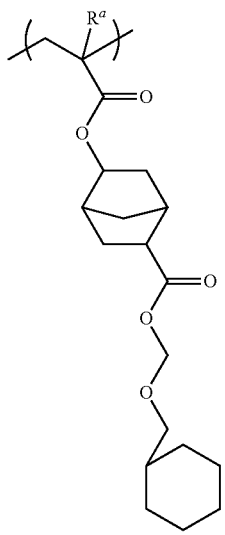
(a12-14-2)

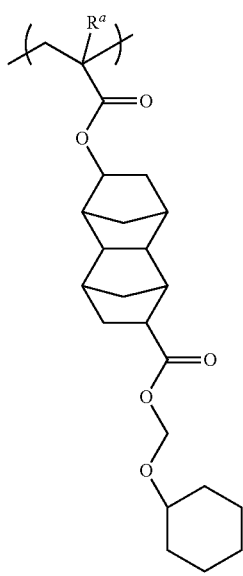
(a12-14-3)

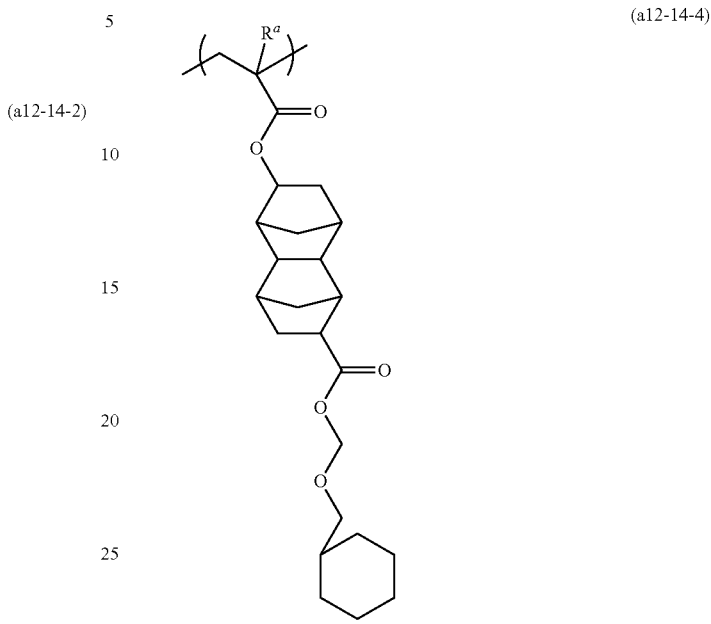
(a12-14-4)

One kind or two or more kinds of the structural unit (a12) may be contained in the component (A1).

In the present invention, the component (A1) preferably contains at least one kind selected from the group consisting of the structural unit represented by the following general formula (a12-01-1), the structural unit represented by the following general formula (a12-01-2) and the structural unit represented by the following general formula (a12-02), as the structural unit (a12).

[Chemical Formula 51]

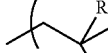
(a2-01-1)

(a12-01-2)

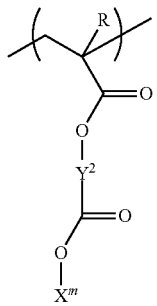

(a12-02)

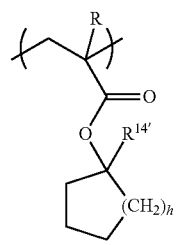

(a12-1-02)

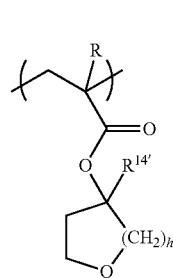

(a12-1-02′)

[Chemical Formula 52]

In the formula, R represents a hydrogen atom, an alkyl group having 1 to 5 carbon atoms, or a halogenated alkyl group having 1 to 5 carbon atoms. $R^{14t}$ represents a chain-like or monocyclic alkyl group, $R^{23}$ represents a group that forms an aliphatic monocyclic group with a carbon atom to which $R^{23}$ is bonded. Each of $R^{15t}$ and $R^{16t}$ independently represents a chain-like or monocyclic alkyl group, $R^{24}$ represents a group that forms a monocyclic group with a carbon atom to which $R^{24}$ is bonded. $Y^2$ represents a divalent linking group, and $X^m$ represents an acid-dissociable group containing a monocyclic group.

In Formula (a12-01-1), the description for R is the same as that for R in the Formula (a12-01).

$R^{14t}$ is the same as $R^{14t}$ in the Formula (m1-1), and preferably a methyl group, an ethyl group, an isopropyl group, or a tert-butyl group.

Examples of the aliphatic monocyclic group that $R^{23}$ forms with a carbon atom to which $R^{23}$ is bonded include the same ones as the aliphatic monocyclic group exemplified in the description for the above monocyclic group-containing tertiary alkyl ester-type acid-dissociable group. Specific examples include groups in which one or more hydrogen atoms have been removed from a monocycloalkane.

The monocycloalkane is preferably a 3- to 11-membered ring, more preferably a 3- to 8-membered ring, still more preferably a 4- to 6-membered ring, and most preferably a 5- or 6-membered ring.

Part of the carbon atoms that constitute the ring of the monocycloalkane may or may not be substituted with an ether group (—O—).

The monocycloalkane may have an alkyl group having 1 to 5 carbon atoms, a fluorine atom, or a fluorinated alkyl group having 1 to 5 carbon atoms, as a substituent.

Examples of $R^{23}$ constituting the aliphatic monocyclic group include a linear alkylene group in which an ether group (—O—) may be interposed between carbon atoms.

Specific examples of the structural unit represented by Formula (a12-01-1) include the structural units represented by the Formulae (a12-11-1) to (a12-11-14). Among these, the structural unit represented by the following (a12-1-02) including the structural units represented by Formulae (a12-11-1) and (a12-11-12) is preferable. In addition, the structural unit represented by the following (a12-1-02′) is also preferable.

In the formulas, h is preferably 1 or 2.

In the formula, each of R and $R^{14t}$ is the same as above, and h represents an integer of 1 to 4.

In Formula (a12-01-2), the description for R is the same as that for R in the Formula (a12-01).

Each of $R^{15t}$ and $R^{16t}$ is the same as $R^{15t}$- and $R^{16t}$ in the Formulae (m2-1) to (m2-3), and preferably a methyl group or an ethyl group.

The monocyclic group that $R^{24}$ forms with a carbon atom to which $R^{24}$ is bonded may be an aliphatic monocyclic group or an aromatic monocyclic group. Examples of each of the aliphatic monocyclic group and aromatic monocyclic group include the same ones as the aliphatic monocyclic group and aromatic monocyclic group exemplified in the description for the above monocyclic group-containing tertiary alkyl ester-type acid-dissociable group. The monocyclic group is most preferably a cyclohexyl group.

Specific examples of the structural unit represented by Formula (a12-01-2) include the structural units represented by the Formulae (a12-11-15) and (a12-11-16).

The description for Formula (a12-02) is the same as above.

Examples of the structural unit represented by Formula (a12-02) include the structural unit represented by the Formula (a12-13) or (a12-14), and the structural unit represented by Formula (a12-13) is preferable.

As the structural unit represented by Formula (a12-02), a group in which $Y^2$ in the formula is a group represented by the Formula —$Y^{21}$—O—$Y^{22}$—, a group represented by the Formula —[$Y^{21}$—C(=O)—O]$_m$—$Y^{22}$—, or a group represented by the Formula —$Y^{21}$—O—C(=O)—$Y^{22}$— is particularly preferable. Examples of preferable ones as such a structural unit include the structural unit represented by the following general formula (a12-13-01); the structural unit represented by the following general formula (a12-13-02); and the like.

[Chemical Formula 53]

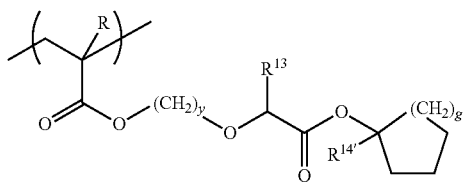

(a12-13-01)

In the formula, each of R, $R^{14'}$ and g is the same as above, $R^{13}$ represents a hydrogen atom or a methyl group, and y represents an integer of 1 to 10.

[Chemical Formula 54]

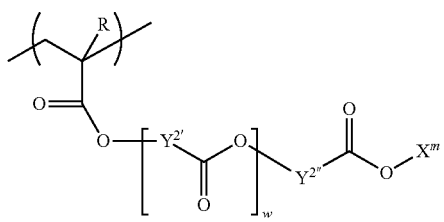

(a12-13-02)

In the formula, each of R and $X^m$ is the same as above, each of $Y^{2'}$ and $Y^{2''}$ independently represents a divalent linking group, and w represents an integer of 0 to 3.

In Formula (a12-13-01), each of $R^{14'}$ and g is the same as $R^{14'}$ and g in the Formula (m1-1).

$R^{13}$ is preferably a hydrogen atom.

y is preferably an integer of 1 to 8, more preferably an integer of 1 to 5, and most preferably 1 or 2.

Specific examples of the structural unit represented by Formula (a12-13-01) include the structural units represented by the Formulae (a12-13-17) to (a12-13-19), and the like.

In Formula (a12-13-02), examples of the acid-dissociable group containing a monocyclic group and represented by $X^m$ include the same ones as described above. The acid-dissociable group is preferably a monocyclic group-containing tertiary alkyl ester-type acid-dissociable group, and more preferably the (m-i) group in which a substituent is bonded to a carbon atom bonded to an atom adjacent to the acid-dissociable group on the ring skeleton of a monovalent aliphatic monocyclic group so as to form a tertiary carbon atom. Among these, the group represented by the general formula (m1-1) is preferable.

Examples of the divalent linking group represented by $Y^{2'}$ and $Y^{2''}$ include the same ones as $Y^2$ in the general formula (a12-13).

As $Y^{2'}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As $Y^{2''}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

w represents an integer of 0 to 3, preferably an integer of 0 to 2, more preferably 0 or 1, and most preferably 1.

As the structural unit represented by Formula (a12-13-02), the structural unit represented by the following general formula (a12-13-02-1) is particularly preferable.

[Chemical Formula 55]

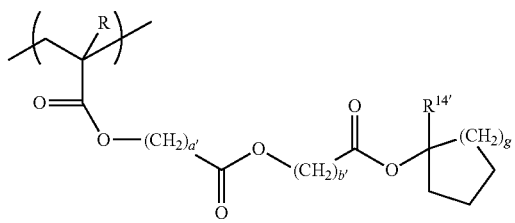

(a12-13-02-1)

In the formula, each of R, $R^{14'}$, and g is the same as above, a' represents an integer of 1 to 10, and b' represents an integer of 1 to 10.

In Formula (a12-13-02-1), a' is preferably an integer of 1 to 10, more preferably an integer of 1 to 8, even more preferably an integer of 1 to 5, and particularly preferably 1 or 2.

b' is preferably an integer of 1 to 10, more preferably an integer of 1 to 8, even more preferably an integer of 1 to 5, and particularly preferably 1 or 2.

Specific examples of the structural unit represented by Formula (a12-13-02-1) include the structural units represented by the Formulae (a12-13-20) to (a12-13-22).

{Structural Unit (a12-2)}

The structural unit (a12-2) is a structural unit in which a hydrogen atom bonded to a carbon atom on the α-position may be substituted with a substituent, and a hydrogen atom of a hydroxyl group of a structural unit derived from hydroxystyrene in which a hydrogen atom bonded to a benzene ring may be substituted with a substituent other than a hydroxyl group is substituted with an acid-dissociable group containing a monocyclic group or with a substituent containing the acid-dissociable group containing a monocyclic group.

Examples of the "acid-dissociable group containing a monocyclic group" substituting a hydrogen atom of a hydroxyl group include the same ones as above. The acid-dissociable group is preferably a monocyclic group-containing tertiary alkyl ester-type acid-dissociable group or a monocyclic group-containing acetal-type acid-dissociable group, and more preferably a monocyclic group-containing acetal-type acid-dissociable group.

Examples of the "substituent containing the acid-dissociable group containing a monocyclic group" include groups constituted with an acid-dissociable group containing a monocyclic group and a divalent linking group. Examples of the divalent linking group include the same ones as the divalent linking group represented by $Q^1$ in the Formula (a0-1), and particularly, a group in which the terminal structure of an acid-dissociable group side is a carbonyloxy group is preferable. In this case, an acid-dissociable group is preferably bonded to an oxygen atom (—O—) of the carbonyloxy group.

As the substituent containing the acid-dissociable group containing a monocyclic group, a group represented by $R^{11''}$—O—C(=O)— or a group represented by $R^{11''}$-O—C(=O)—$R^{12''}$— is preferable. In the formula, $R^{11''}$ represents an acid-dissociable group containing a monocyclic group, and $R^{12''}$ represents a linear or branched alkylene group.

The acid-dissociable group containing a monocyclic group and represented by $R^{11}$" is preferably a monocyclic group-containing tertiary alkyl ester-type acid-dissociable group or a monocyclic group-containing acetal-type acid-dissociable group, and more preferably a monocyclic group-containing tertiary alkyl ester-type acid-dissociable group. Preferable examples of the monocyclic group-containing tertiary alkyl ester-type acid-dissociable group include the group represented by the Formula (m1-1), the groups represented by Formulae (m2-1) to (m2-3), and the like.

Examples of the alkylene group represented by $R^2$ include a methylene group, an ethylene group, a trimethylene group, a tetramethylene group, a 1,1-dimethylethylene group, and the like. As $R^{12}$", a linear alkylene group is preferable.

Specific examples of the structural unit (a12-2) include a structural unit in which in the general formula (U-3), px of $-(OX^c)_{px}$ bonded to a benzene ring represents an integer of 1 to 3, and at least one of $X^c$s is an acid-dissociable group containing a monocyclic group or a substituent containing the acid-dissociable group containing a monocyclic group. When px is 2 or 3, plural $X^c$s may be the same as or different from each other. For example, one of $X^c$s may be an acid-dissociable group containing a monocyclic group or a substituent containing the acid-dissociable group containing a monocyclic group, and the remaining one or two of $X^c$s may be a hydrogen atom.

{Structural Unit (a12-3)}

The structural unit (a12-3) is a structural unit in which a hydrogen atom bonded to a carbon atom on the α-position may be substituted with a substituent, and a hydrogen atom of a hydroxyl group of a structural unit derived from vinyl (hydroxynaphthalene) in which a hydrogen atom bonded to a naphthalene ring may be substituted with a substituent other than a hydroxyl group is substituted with an acid-dissociable group containing a monocyclic group or with a substituent containing the acid-dissociable group containing a monocyclic group.

In the structural unit (a12-3), examples of the "acid-dissociable group containing a monocyclic group" or "substituent containing the acid-dissociable group containing a monocyclic group" substituting a hydrogen atom of a hydroxyl group include the same ones as exemplified in the description for the structural unit (a12-2).

Specific examples of the structural unit (a12-3) include a structural unit in which in the general formula (U-4), x of $-(OX^d)_x$ bonded to a benzene ring represents an integer of 1 to 3, and at least one of $X^d$s is an acid-dissociable group containing a monocyclic group or a substituent containing the acid-dissociable group containing a monocyclic group. When x is 2 or 3, plural $X^d$s may be the same as or different from each other. For example, one of $X^d$s may be an acid-dissociable group containing a monocyclic group or a substituent containing the acid-dissociable group containing a monocyclic group, and the remaining one or two of $X^d$s may be a hydrogen atom.

In the component (A1), a proportion of the sum of the structural unit (a11) (polycyclic ring) and the structural unit (a12) (monocyclic ring) is preferably 15 mol % to 70 mol %, more preferably 15 mol % to 60 mol %, and even more preferably 20 mol % to 55 mol %, based on all structural units constituting the component (A1). If the proportion is equal to or more than the lower limit, patterning can be easily performed when a resist composition is formed, and the lithography properties such as sensitivity, resolution, and pattern shape are improved. In addition, if the proportion is equal to or less than the upper limit, the above structural units can be balanced with other structural units.

In the component (A1), a copolymerization ratio between the structural unit (a11) and structural unit (a12) (molar ratio, (a11):(a12)) is preferably 99:1 to 1:99, more preferably 25:75 to 75:25, and even more preferably 35:65 to 65:35.

In the present invention, the structural unit (a11) containing a polycyclic group mainly contributes to the improvement of rectangularity of the cross-sectional shape of a pattern, decrease in outgas in the EUV lithography or EB lithography process, and the like. The structural unit (a12) containing a monocyclic group mainly contributes to the decrease in roughness and the improvement of stability of pattern size against the fluctuation of PEB temperature. If the structural units (a11) and (a12) are used concurrently, particularly, if these structural units are contained at the copolymerization ratio within the above range, the above effects are synergistically improved.

The component (A1) may have a structural unit other than the structural units (a0), (a11), and (a12). As such a structural unit, various structural units known in the related art as structural units used for resins for resists for an ArF excimer laser, a KrF excimer laser (preferably for an ArF excimer laser), and the like can be used. Examples thereof include a structural unit (a13) containing a chain-like acid-decomposable group which exhibits increased polarity by the action of acid; a structural unit (a2) containing a cyclic group which contains $-SO_2-$ or lactone; a structural unit (a3) containing a polar group; a structural unit (a4) containing an acid non-dissociable cyclic group; and the like.

(Structural Unit (a13))

The structural unit (a13) is a structural unit containing a chain-like acid-decomposable group which exhibits increased polarity by the action of acid.

More specific examples of the chain-like acid-decomposable group which exhibits increased polarity by the action of acid include groups in which a polar group has been protected with an acid-dissociable group having a chain shape (hereinafter, referred to as a chain-like acid-dissociable group) (for example, groups in which a hydrogen atom of a polar group has been substituted with the chain-like acid-dissociable group).

Examples of the polar group include the same ones as exemplified in the description for the structural unit (a11). The "acid-decomposable group" and "acid-dissociable group" have the same definition as above.

Examples of the chain-like acid-dissociable group include a chain like tertiary alkyl ester-type acid-dissociable group, a chain-like acetal-type acid-dissociable group, and the like.

Examples of the chain-like tertiary alkyl ester-type acid-dissociable group include an aliphatic branched acid-dissociable group.

The term "aliphatic branched" refers to a branched structure having no aromaticity. The "aliphatic branched, acid dissociable group" is not limited to be constituted of only carbon atoms and hydrogen atoms (not limited to hydrocarbon groups), but is preferably a hydrocarbon group. Further, the "hydrocarbon group" may be either saturated or unsaturated, but is preferably saturated.

As an example of the aliphatic branched, acid dissociable group, for example, a group represented by the formula $-C(R^{71})(R^{72})(R^{73})$ can be given (in the formula, each of $R^{71}$ to $R^{73}$ independently represents a linear alkyl group of 1 to 5 carbon atoms). The group represented by the formula $-C(R^{71})(R^{72})(R^{73})$ preferably has 4 to 8 carbon atoms, and specific examples include a tert-butyl group, a 2-methyl-2-butyl group, a 2-methyl-2-pentyl group and a 3-methyl-3-pentyl group. Among these, a tert-butyl group is particularly desirable.

In the aliphatic branched acid-dissociable group, a portion of hydrogen atoms may be substituted with a fluorine atom.

In this case, at least one of $R^{71}$, $R^{72}$, and $R^{73}$ of the group represented by $-C(R^{71})(R^{72})(R^{73})$ is preferably a fluorinated alkyl group, and two of them are preferably an alkyl group. As the fluorinated alkyl group, a group represented by $-(CH_2)_j-CF_3$ is preferable. j represents an integer of 0 to 3.

Examples of the chain-like acetal-type acid-dissociable group include those in which $Y^p$ (aliphatic polycyclic group) in general formula (3p-1) exemplified in the description for the structural unit (a11) has been substituted with a linear or branched alkyl group. The alkyl group preferably has 1 to 5 carbon atoms, and is particularly preferably a methyl group or an ethyl group.

Examples of the structural unit (a13) include those in which the acid-dissociable group containing a polycyclic group in the structural unit (a11) has been substituted with a chain-like acid-dissociable group. The examples include the following. In the formulas shown below, $R^\alpha$ represents a hydrogen atom, a methyl group or a trifluoromethyl group.

[Chemical Formula 56]

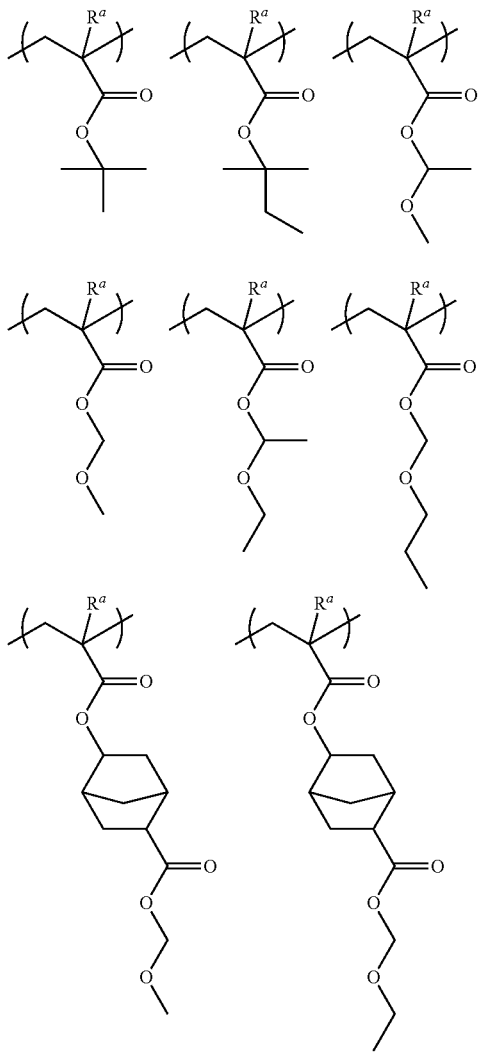

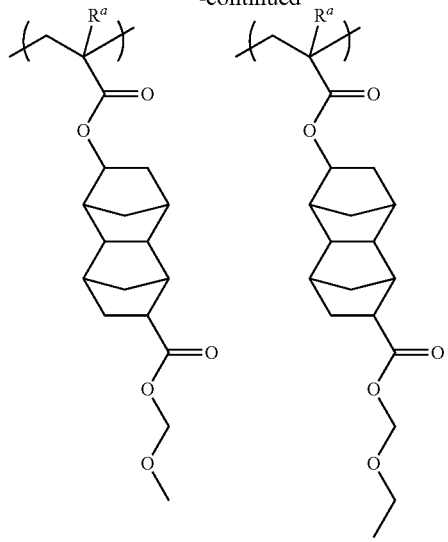

(Structural Unit (a2))

The component (A1) preferably further contains a structural unit (a2) containing a cyclic group containing $-SO_2-$ or a lactone, in addition to the structural units (a0), (a11), and (a12).

When the component (A1) is used for forming a resist film, the cyclic group containing $-SO_2-$ or the lactone cyclic group of the structural unit (a2) is effective for improving adhesiveness of the resist film with respect to a substrate. They are also effective in an alkali developing process, in the respect that they improve the affinity with a developing solution containing water, such as an alkali developing solution.

In addition, when the structural unit (a0), (a11), or (a12) contains the cyclic group containing $-SO_2-$ or the lactone-containing cyclic group within the structure thereof, such a structural unit corresponds to the structural unit (a2). However, such a structural unit is regarded as corresponding not to the structural unit (a2) but to the structural unit (a0), (a11), or (a12).

Here, an "$-SO_2-$ containing cyclic group" refers to a cyclic group having a ring containing $-SO_2-$ within the ring structure thereof, i.e., a cyclic group in which the sulfur atom (S) within $-SO_2-$ forms part of the ring skeleton of the cyclic group. The ring containing $-SO_2-$ within the ring skeleton thereof is counted as the first ring. A cyclic group in which the only ring structure is the ring that contains $-SO_2-$ in the ring skeleton thereof is referred to as a monocyclic group, and a group containing other ring structures is described as a polycyclic group regardless of the structure of the other rings. The $-SO_2-$ containing cyclic group may be either a monocyclic group or a polycyclic group.

As the $-SO_2-$ containing cyclic group, a cyclic group containing $-O-SO_2-$ within the ring skeleton thereof, i.e., a cyclic group containing a sultone ring in which $-O-S-$ within the $-O-SO_2-$ group forms part of the ring skeleton thereof is particularly desirable.

The $-SO_2-$ containing cyclic group preferably has 3 to 30 carbon atoms, more preferably 4 to 20, still more preferably 4 to 15, and most preferably 4 to 12. Herein, the number of carbon atoms refers to the number of carbon atoms constituting the ring skeleton, excluding the number of carbon atoms within a substituent.

The $-SO_2-$ containing cyclic group may be either a $-SO_2-$ containing aliphatic cyclic group or a $-SO_2-$ containing aromatic cyclic group. A —SO$_2$— containing aliphatic cyclic group is preferable.

Examples of the —SO$_2$— containing aliphatic cyclic group include aliphatic cyclic groups in which part of the carbon atoms constituting the ring skeleton has been substituted with a —SO$_2$— group or a —O—SO$_2$— group and has at least one hydrogen atom removed from the aliphatic hydrocarbon ring. Specific examples include an aliphatic hydrocarbon ring in which a —CH$_2$— group constituting the ring skeleton thereof has been substituted with a —SO$_2$— group and has at least one hydrogen atom removed therefrom; and an aliphatic hydrocarbon ring in which a —CH$_2$—CH$_2$— group constituting the ring skeleton has been substituted with a —O—SO$_2$— group and has at least one hydrogen atom removed therefrom.

The alicyclic hydrocarbon ring preferably has 3 to 20 carbon atoms, and more preferably has 3 to 12 carbon atoms.

The alicyclic hydrocarbon ring may be polycyclic or monocyclic. As the monocyclic ring, a group in which two hydrogen atoms have been removed from a monocycloalkane of 3 to 6 carbon atoms is preferable. Examples of the monocycloalkane include cyclopentane and cyclohexane. As the polycyclic alicyclic hydrocarbon ring, groups in which two hydrogen atoms have been removed from a polycycloalkane having 7 to 12 carbon atoms are preferable. Specific examples of the polycycloalkane include adamantane, norbornane, isobornane, tricyclodecane, tetracyclodecane, and the like.

The —SO$_2$— containing cyclic group may have a substituent. Examples of the substituent include an alkyl group, an alkoxy group, a halogen atom, a halogenated alkyl group, a hydroxy group, an oxygen atom (=O), —COOR", —OC(=O)R", a hydroxyalkyl group and a cyano group.

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear alkoxy group or a branched alkyl group. Specific examples of the alkoxy group include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

As examples of the halogenated lower alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR" group and the —OC(=O)R" group, R" represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxy group.

More specific examples of the —SO$_2$— containing cyclic group include groups represented by general formulas (3-1) to (3-4) shown below.

[Chemical Formula 57]

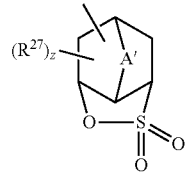

(3-1)

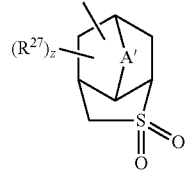

(3-2)

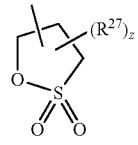

(3-3)

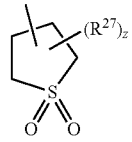

(3-4)

In the formulas, A' represents an oxygen atom, a sulfur atom or an alkylene group of 1 to carbon atoms which may contain an oxygen atom or a sulfur atom; z represents an integer of 0 to 2; and R$^{27}$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

In general formulas (3-1) to (3-4) above, A' represents an oxygen atom (—O—), a sulfur atom (—S—) or an alkylene group of 1 to 5 carbon atoms which may contain an oxygen atom or a sulfur atom.

As the alkylene group of 1 to 5 carbon atoms represented by A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$—, —CH$_2$—S—CH$_2$—.

As A', an alkylene group of 1 to 5 carbon atoms or —O— is preferable, more preferably an alkylene group of 1 to 5 carbon atoms, and most preferably a methylene group.

z represents an integer of 0 to 2, and is most preferably 0.

When z is 2, the plurality of R$^{27}$ may be the same or different from each other.

As the alkyl group, alkoxy group, halogenated alkyl group, —COOR", —OC(=O)R" and hydroxyalkyl group for R$^{27}$, the same alkyl groups, alkoxy groups, halogenated alkyl groups, —COOR", —OC(=O)R" and hydroxyalkyl groups as those described above as the substituent for the —SO$_2$— containing cyclic group can be mentioned.

Specific examples of the cyclic groups represented by general formulas (3-1) to (3-4) are shown below. In the formulas shown below, "Ac" represents an acetyl group.

[Chemical Formula 58]

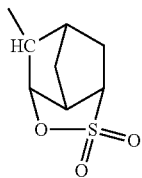
(3-1-1)

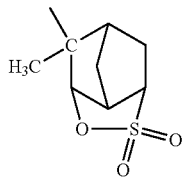
(3-1-2)

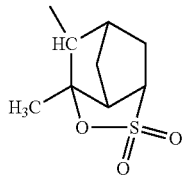
(3-1-3)

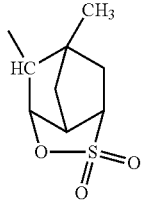
(3-1-4)

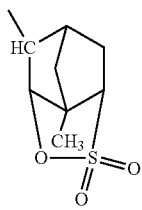
(3-1-5)

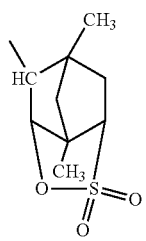
(3-1-6)

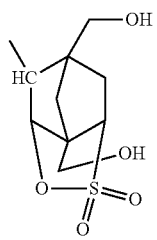
(3-1-7)

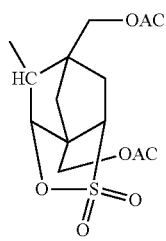
(3-1-8)

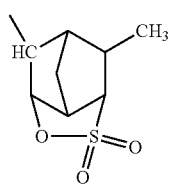
(3-1-9)

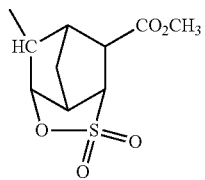
(3-1-10)

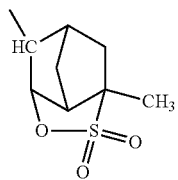
(3-1-11)

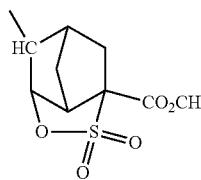
(3-1-12)

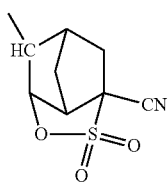 (3-1-13)
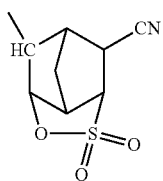 (3-1-14)
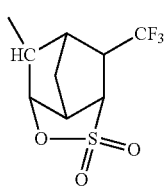 (3-1-15)
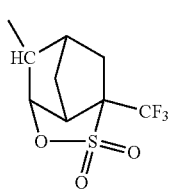 (3-1-16)
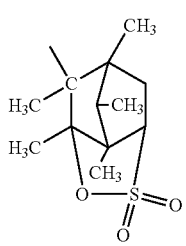 (3-1-17)
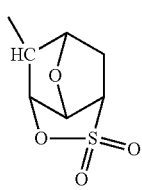 (3-1-18)
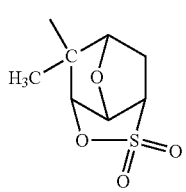 (3-1-19)
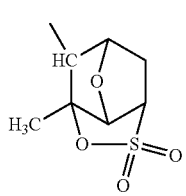 (3-1-20)
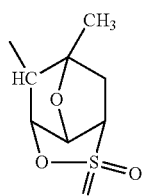 (3-1-21)
[Chemical Formula 59]
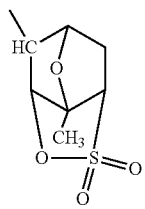 (3-1-22)
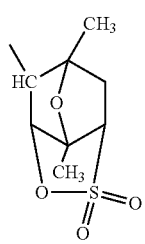 (3-1-23)
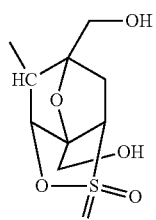 (3-1-24)
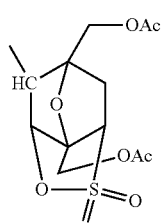 (3-1-25)
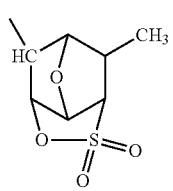 (3-1-26)
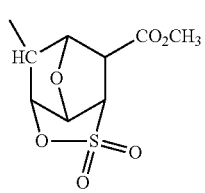 (3-1-27)

(3-1-28) 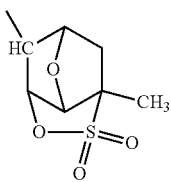

(3-1-29) 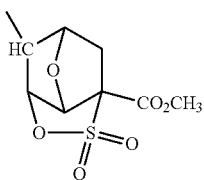

(3-1-30) 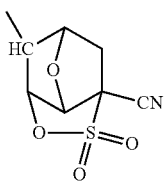

(3-1-31) 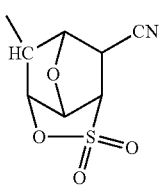

(3-1-32) 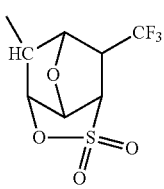

(3-1-33) 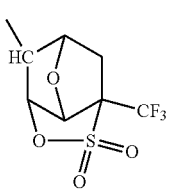

[Chemical Formula 60]

(3-2-1) 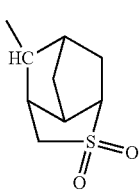

(3-2-2) 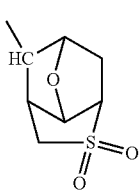

(3-3-1) 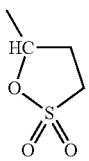

(3-4-1) 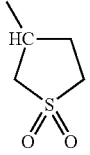

Of the groups shown above, the —SO$_2$-containing cyclic group is preferably a group represented by the general formula (3-1), (3-3) or (3-4), more preferably at least one group selected from the group consisting of groups represented by the above chemical formulas (3-1-1), (3-1-18), (3-3-1) and (3-4-1), and most preferably a group represented by the chemical formula (3-1-1).

The "lactone-containing cyclic group" refers to a cyclic group which contains a ring (lactone ring) containing —O—C(=O)— within the ring skeleton. The lactone ring is counted as the first ring, and a lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

As the lactone cyclic group in the structural unit (a2), any lactone cyclic group can be randomly used without particular limitation. Specific examples of lactone-containing monocyclic groups include groups in which one hydrogen atom has been removed from a 4- to 6-membered lactone ring, such as a group in which one hydrogen atom has been removed from β-propiolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

The structural unit (a2) is not particularly limited in terms of the structure of other moieties, as long as the structural unit has the —SO$_2$— containing cyclic group or a lactone-containing cyclic group. However, the structural unit is preferably at least one kind of structural unit selected from the group consisting of a structural unit (a2$^S$) which is derived from an acrylate ester in which a hydrogen atom bonded to a carbon atom on the α-position may be substituted with a substituent, and contains a —SO$_2$— containing cyclic group, and a structural unit (a2$^L$) which is derived from an acrylate ester in which a hydrogen atom bonded to a carbon atom on the α-position may be substituted with a substituent, and contains a lactone-containing cyclic group.

—Structural unit (a2$^S$):

More specific examples of the structural unit (a2$^S$) include structural units represented by a general formula (a2-0) shown below.

[Chemical Formula 61]

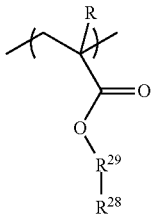

(a2-0)

In the formula, R represents a hydrogen atom, an alkyl group of 1 to 5 carbon atoms or a halogenated alkyl group of 1 to 5 carbon atoms; $R^{28}$ represents a —$SO_2$— containing cyclic group; and $R^{29}$ represents a single bond or a divalent linking group.

In genera formula (a2-0), R is the same as defined above.

$R^{28}$ is the same as defined for the aforementioned —$SO_2$— containing cyclic group.

$R^{29}$ may be either a single bond or a divalent linking group. In terms of the effects of the present invention, a divalent linking group is preferable.

Though not particularly limited, examples of the divalent linking group represented by $R^{29}$ include the same ones as the divalent linking group represented by $Q^1$ in the Formula (a0-1). Among these, an alkylene group or a divalent linking group containing an ester bond (—C(=O)—O—) is preferable.

The alkylene group is preferably a linear or branched alkylene group. Specific examples include the same groups as the linear alkylene groups and branched alkylene groups described above as the aliphatic hydrocarbon group for $Y^2$.

As the divalent linking group containing an ester linkage, a group represented by a general formula: —$R^3$)—C(=O)—O— (wherein $R^{30}$ represents a divalent linking group) is particularly desirable. That is, the structural unit (a2$^S$) is preferably a structural unit represented by a general formula (a2-0-1) shown below.

[Chemical Formula 62]

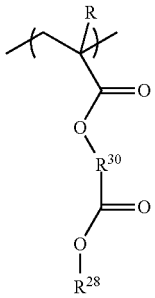

(a2-0-1)

In the formula, R and $R^{28}$ are each the same as defined above, and $R^{30}$ represents a divalent linking group.

Though not particularly limited, examples of $R^{30}$ include the same ones as the divalent linking group represented by $Q^1$ in the Formula (a0-1).

As the divalent linking group represented by $R^{30}$, a linear or branched alkylene group, an aliphatic hydrocarbon group containing a ring within the structure, or a divalent linking group containing a hetero atom is preferable, and a linear or branched alkylene group or a divalent linking group containing an oxygen atom as a hetero atom is preferable.

As the linear alkylene group, a methylene group or an ethylene group is preferable, and a methylene group is particularly desirable.

As the branched alkylene group, an alkylmethylene group or an alkylethylene group is preferable, and —$CH(CH_3)$—, —$C(CH_3)_2$— or —$C(CH_3)_2CH_2$— is particularly desirable.

As the divalent linking group containing an oxygen atom, a divalent linking group containing an ether bond or an ester bond is preferable, and —$Y^{21}$—O—$Y^{22}$—, —[$Y^{21}$—C(=O)—O]$_{m'}$—$Y^{22}$—, or —$Y^{21}$—O—C(=O)—$Y^{22}$— is more preferable. Each of $Y^{21}$ and $Y^{22}$ independently represents a divalent hydrocarbon group which may have a substituent, and m' represents an integer of 0 to 3. Among these, —$Y^{21}$—O—C(=O)—$Y^{22}$— is preferable, and a group represented by —$(CH_2)_c$—O—C(=O)—$(CH_2)_d$— is particularly preferable. c represents an integer of 1 to 5, and is preferably 1 or 2. d represents an integer of 1 to 5, and is preferably 1 or 2.

As the structural unit (a2$^S$), the structural unit represented by the following general formula (a2-0-11) or (a2-0-12) is preferable, and the structural unit represented by Formula (a2-0-12) is more preferable.

[Chemical Formula 63]

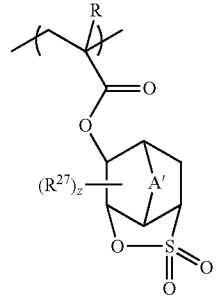

(a2-0-11)

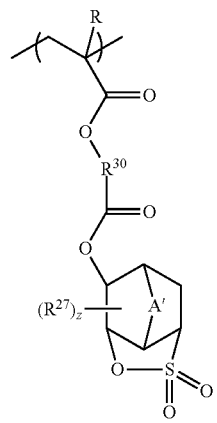

(a2-0-12)

In the formulas, R, A', $R^{27}$, z and $R^{30}$ are each the same as defined above.

In Formula (a2-0-11), A' preferably represents a methylene group, an oxygen atom (—O—), or a sulfur atom (—S—).

$R^{30}$ is preferably a linear or branched alkylene group, or a divalent linking group containing an oxygen atom. Examples of the linear or branched alkylene group and the divalent linking group containing an oxygen atom represented by $R^{30}$ include the same linear or branched alkylene groups and divalent linking groups containing an oxygen atom as those described above.

As the structural unit represented by Formula (a2-0-12), the structural unit represented by the following general formula (a2-0-12a) or (a2-0-12b) is particularly preferable.

[Chemical Formula 64]

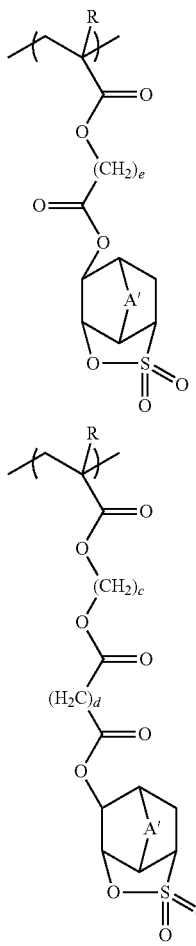

(a2-0-12a)

(a2-0-12b)

In the formula, each of R and A' is the same as above, and each of c to e independently represents an integer of 1 to 3.

—Structural unit (a2$^L$):

Examples of the structural unit (a2$^L$) include structural units represented by the aforementioned general formula (a2-0) in which the $R^{28}$ group has been substituted with a lactone-containing cyclic group. Specific examples include structural units represented by general formulas (a2-1) to (a2-5) shown below.

[Chemical Formula 65]

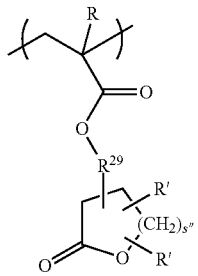

(a2-1)

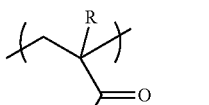

(a2-2)

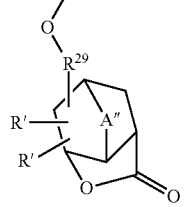

(a2-3)

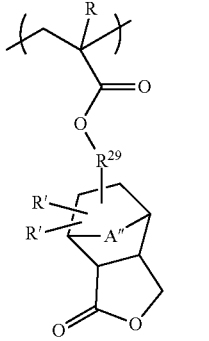

(a2-4)

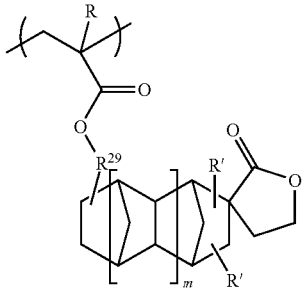

(a2-5)

In the formula, R represents a hydrogen atom, an alkyl group having 1 to 5 carbon atoms, or a halogenated alkyl group having 1 to 5 carbon atoms; each R' independently represents a hydrogen atom, an alkyl group, an alkoxy group, a halogenated alkyl group, a hydroxyl group, —COOR", —OC(=O)R", a hydroxyalkyl group, or a cyano group, and R" represents a hydrogen atom or an alkyl group; $R^{29}$ represents a single bond or a divalent linking group, and s" represents an integer of 0 to 2; A" represents an alkylene group having 1 to 5 carbon atoms that may contain an oxygen atom or a sulfur atom, an oxygen atom, or a sulfur atom; and m represents 0 or 1.

In the general formulas (a2-1) to (a2-5), R is the same as defined above.

Examples of each of the alkyl group, alkoxy group, halogenated alkyl group, —COOR", —OC(=O)R", and hydroxyalkyl group represented by R' include the same ones as the alkyl group, alkoxy group, halogenated alkyl group, —COOR", —OC(=O)R", and hydroxyalkyl group exemplified as the substituent that the —SO$_2$-containing cyclic group may have.

In terms of factors such as ease of industrial availability, R' is preferably a hydrogen atom.

The alkyl group for R" may be any of linear, branched or cyclic.

When R" is a linear or branched alkyl group, the alkyl group preferably contains 1 to 10 carbon atoms, and more preferably 1 to 5 carbon atoms.

When R" is a cyclic alkyl group (cycloalkyl group), the cycloalkyl group preferably contains 3 to 15 carbon atoms, more preferably 4 to 12 carbon atoms, and most preferably 5 to 10 carbon atoms. Examples of the cycloalkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

Examples of A" include the same groups as those described above for A' in the general formula (3-1). A" is preferably an alkylene group of 1 to 5 carbon atoms, an oxygen atom (—O—) or a sulfur atom (—S—), and is more preferably an alkylene group of 1 to 5 carbon atoms or —O—. As the alkylene group of 1 to 5 carbon atoms, a methylene group or a dimethylethylene group is preferable, and a methylene group is particularly desirable.

R$^{29}$ is the same as defined above for R$^{29}$ in the general formula (a2-0).

In the formula (a2-1), s" is preferably 1 or 2.

Specific examples of structural units represented by the general formulas (a2-1) to (a2-5) are shown below. In the formulas shown below, R$^{\alpha}$ represents a hydrogen atom, a methyl group or a trifluoromethyl group.

[Chemical Formula 66]

(a2-1-1)
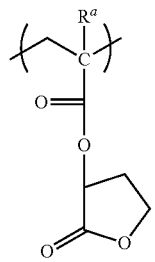

(a2-1-2)
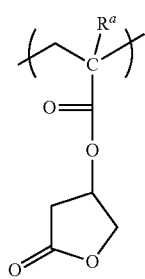

(a2-1-3)
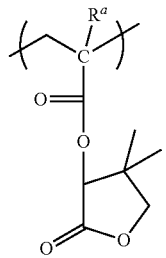

(a2-1-4)
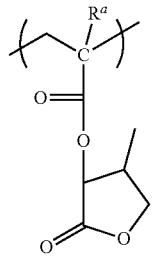

(a2-1-5)
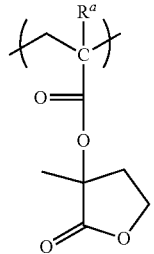

(a2-1-6)
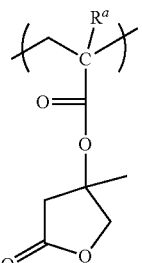

(a2-1-7)
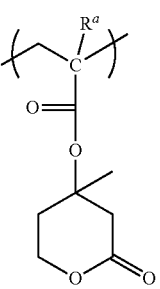

(a2-1-8) 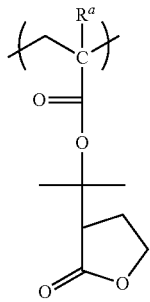
(a2-1-9) 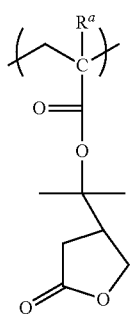
(a2-1-10) 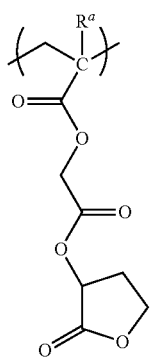
(a2-1-11) 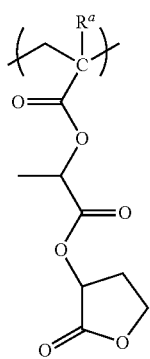
(a2-1-12) 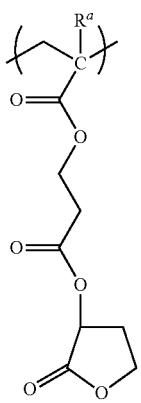
(a2-1-13) 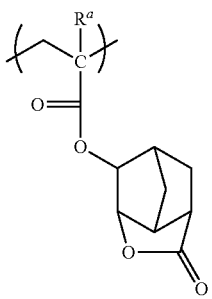
[Chemical Formula 67]
(a2-2-1) 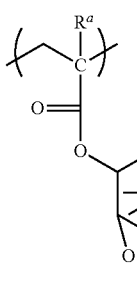
(a2-2-2)

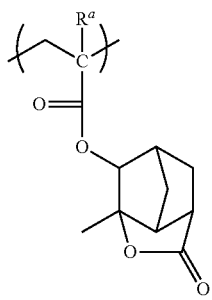 (a2-2-3)
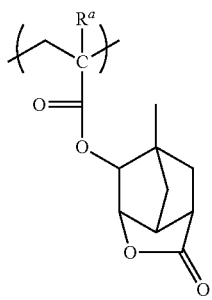 (a2-2-4)
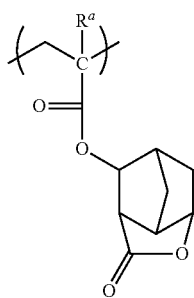 (a2-2-5)
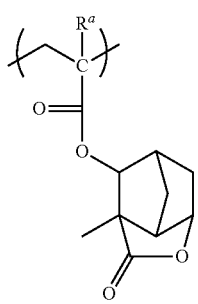 (a2-2-6)
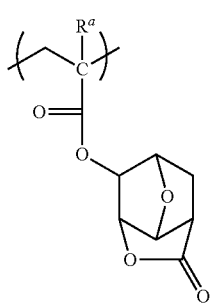 (a2-2-7)
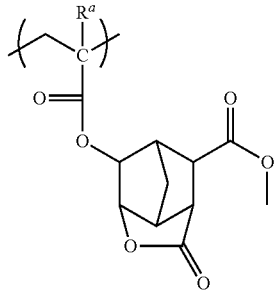 (a2-2-8)
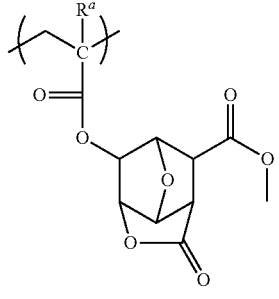 (a2-2-9)
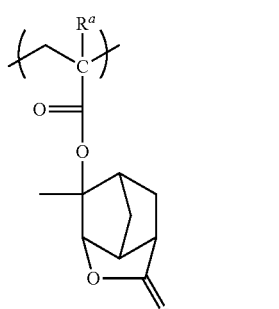 (a2-2-10)
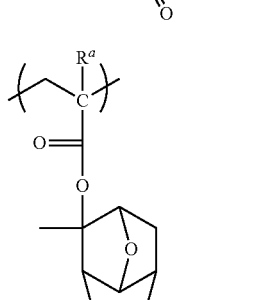 (a2-2-11)
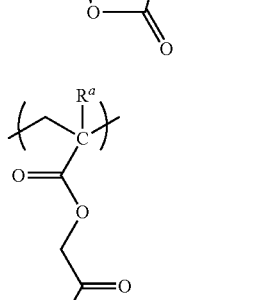 (a2-2-12)
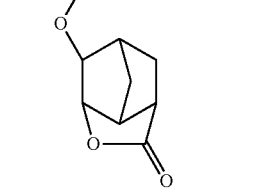

-continued
(a2-2-13)
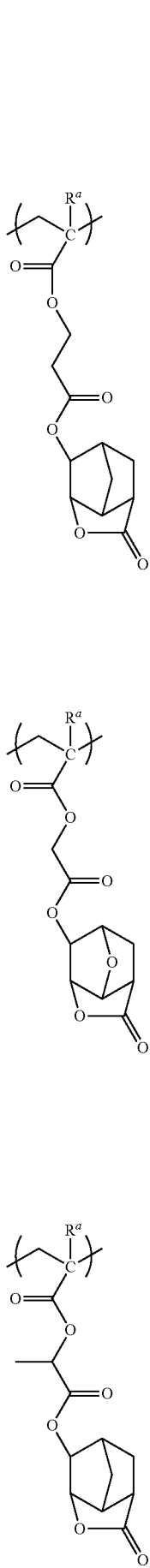
(a2-2-14)
(a2-2-15)
-continued
(a2-2-16)
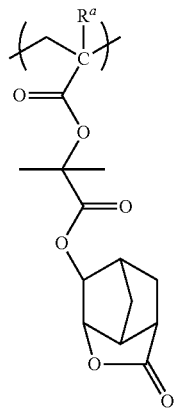
(a2-2-17)
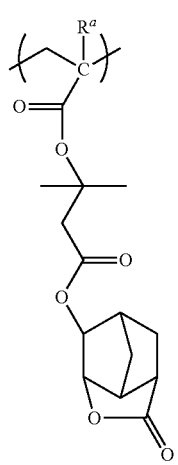
[Chemical Formula 68]
(a2-3-1)
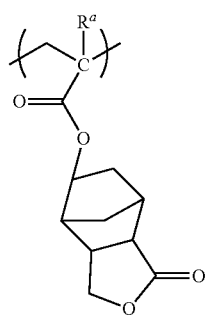
(a2-3-2)
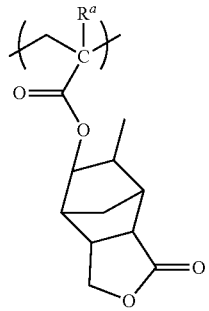

(a2-3-3)
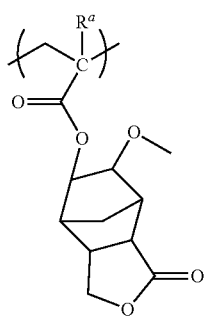
(a2-3-4)
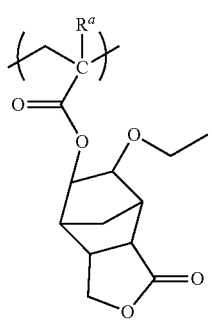
(a2-3-5)
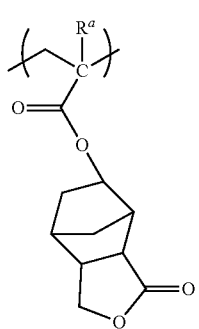
[Chemical Formula 69]
(a2-4-1)
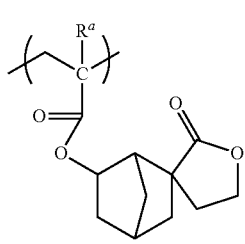
(a2-4-2)
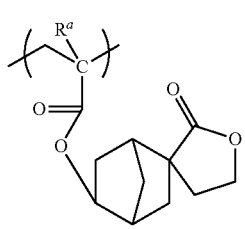
(a2-4-3)
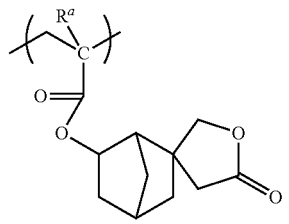
(a2-4-4)
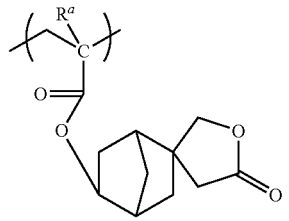
(a2-4-5)
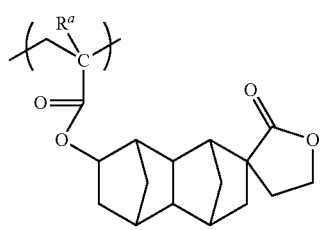
(a2-4-6)
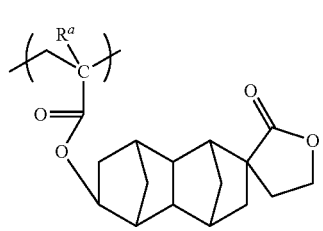
(a2-4-7)
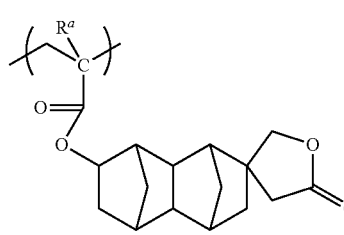
(a2-4-8)
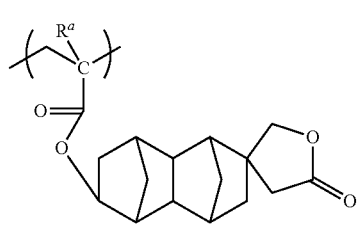
(a2-4-9)
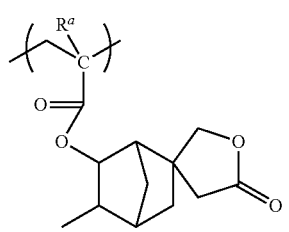

(a2-4-10)
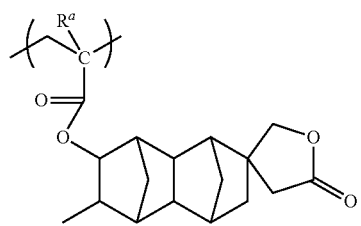
(a2-4-11)
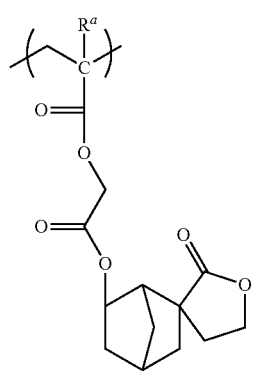
(a2-4-12)
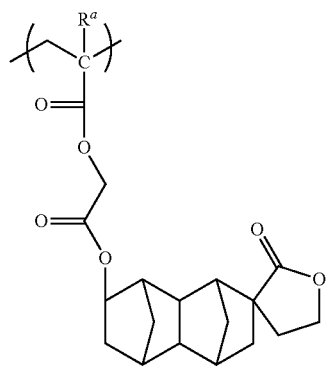
[Chemical Formula 70]
(a2-5-1)
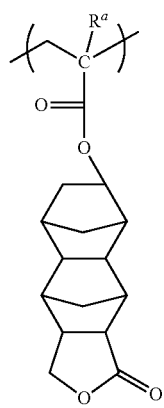
(a2-5-2)
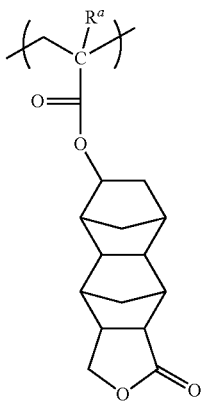
(a2-5-3)
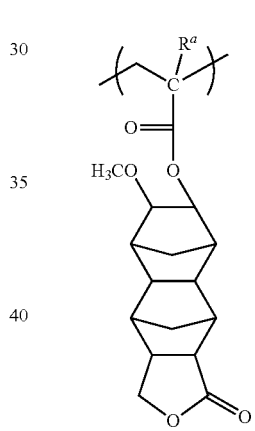
(a2-5-4)
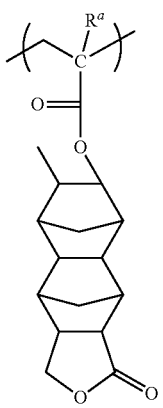

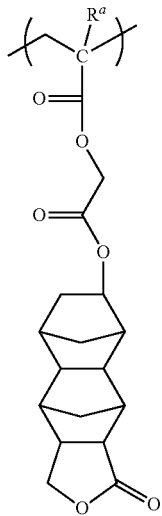

(a2-5-5)

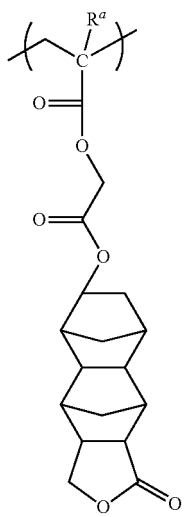

(a2-5-6)

The structural unit (a2$^L$) is preferably at least one structural unit selected from the group consisting of structural units represented by the general formulas (a2-1) to (a2-5), is more preferably at least one structural unit selected from the group consisting of structural units represented by the general formulas (a2-1) to (a2-3), and is still more preferably at least one structural unit selected from the group consisting of structural units represented by the general formulas (a2-1) and (a2-3).

Among these structural units, at least one structural unit selected from the group consisting of structural units represented by the above formulas (a2-1-1), (a2-1-2), (a2-2-1), (a2-2-7), (a2-2-12), (a2-2-14), (a2-3-1) and (a2-3-5).

In addition, as the structural unit (a2$^L$), the structural units represented by the following Formulae (a2-6) and (a2-7) are also preferable.

[Chemical Formula 71]

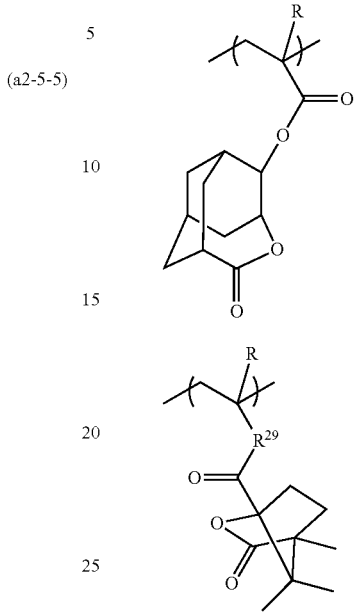

(a2-6)

(a2-7)

In the formula, R and R$^{29}$ are the same as above.

One kind or two or more kinds of the structural unit (a2) may be contained in the component (A1). For example, as the structural unit (a2), the structural unit (a2$^S$) may be used alone, the structural unit (a2$^L$) may be used alone, or the structural units (a2$^S$) and (a2$^L$) may be used in combination. Further, as the structural unit (a2$^S$) or the structural unit (a2), one type of structural unit may be used alone, or two or more types of structural units may be used in combination.

In the component (A1), the amount of the structural unit (a2) based on the combined total of all structural units constituting the component (A1) is preferably 1 to 80 mol %, more preferably 10 to 70 mol %, still more preferably 10 to 65 mol %, and most preferably 10 to 60 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units, and various lithography properties such as DOF and CDU and pattern shape can be improved.

(Structural Unit (a3))

The component (A1) may further have a structural unit (a3) containing a polar group, in addition to the structural units (a0), (a11), and (a12) or to the structural units (a0), (a11), (a12), and (a2). If the component (A1) has the structural unit (a3), the polarity of the component (A1) having undergone exposure is further improved. The improvement of polarity contributes to the improvement of resolution and the like, particularly in the case of alkali developing process.

Examples of the polar group include —OH, —COOH, —CN, —SO$_2$NH$_2$—, —CONH$_2$, and the like. The structural unit containing —COOH also includes a structural unit of (α-substituted) acrylic acid.

The structural unit (a3) is preferably a structural unit containing a hydrocarbon group in which a portion of hydrogen atoms has been substituted with a polar group. The hydrocarbon group may be an aliphatic hydrocarbon group or an aromatic hydrocarbon group. Among these, the hydrocarbon group is more preferably an aliphatic hydrocarbon group.

Examples of the aliphatic hydrocarbon group in the hydrocarbon group include a linear or branched hydrocarbon group (preferably an alkylene group) having 1 to 10 carbon atoms and an aliphatic cyclic group (monocyclic group or polycyclic group).

The aliphatic cyclic group (monocyclic group or polycyclic group) can be used by being appropriately selected from many aliphatic cyclic groups that have been proposed in the resin for resist compositions for the ArF excimer laser, for example. The aliphatic cyclic group preferably has 3 to 30 carbon atoms, more preferably has 5 to carbon atoms, even more preferably has 5 to 20 carbon atoms, particularly preferably has 6 to 15 carbon atoms, and most preferably has 6 to 12 carbon atoms. Specific examples thereof include groups in which two or more hydrogen atoms have been removed from a monocycloalkane; groups in which two or more hydrogen atoms have been removed from a polycycloalkane such as a bicycloalkane, a tricycloalkane, or a tetracycloalkane; and the like. More specifically, the examples include groups in which two or more hydrogen atoms have been removed from a monocycloalkane such as cyclopentane or cyclohexane; groups in which two or more hydrogen atoms have been removed from a polycycloalkane such as adamantane, norbornane, isobornane, tricyclodecane, or tetracyclodecane; and the like. The aliphatic cyclic group may or may not have a substituent. Examples of the substituent include an alkyl group having 1 to 5 carbon atoms, a fluorine atom, a fluorinated alkyl group having 1 to 5 carbon atoms, and the like.

The aromatic hydrocarbon group in the hydrocarbon group is a hydrocarbon group having at least one aromatic ring.

The aromatic ring is not particularly limited as long as it is a ring of cyclic conjugation having 4n+2 π electrons, and may be monocyclic or polycyclic. The aromatic ring preferably has 5 to 30 carbon atoms, more preferably has 5 to 20 carbon atoms, even more preferably has 6 to 15 carbon atoms, and particularly preferably has 6 to 12 carbon atoms. Here, the number of carbon atoms within substituents is not included in the number of carbon atoms of the aromatic hydrocarbon group. Specific examples of the aromatic ring include aromatic hydrocarbon rings such as benzene, naphthalene, anthracene, and phenanthrene; aromatic heterocyclic ringaromatic heterocyclic rings in which a portion of carbon atoms constituting the aromatic hydrocarbon ring has been substituted with a hetero atom; and the like. Examples of the hetero atom in the aromatic heterocyclic rings include an oxygen atom, a sulfur atom and a nitrogen atom. Specific examples of the aromatic heterocyclic ringaromatic heterocyclic ring include a pyridine ring, a thiophene ring, and the like.

Specific examples of the aromatic hydrocarbon group as the divalent hydrocarbon group include groups in which two hydrogen atoms have been removed from the aromatic hydrocarbon ring or the aromatic heterocyclic ringaromatic heterocyclic ring (an arylene group or a heteroarylene group); groups in which two hydrogen atoms have been removed from an aromatic compound (for example, phenyl, fluorene, or the like) containing two or more aromatic rings; groups in which one more hydrogen atom has been removed from an aromatic ring in groups (for example an arylalkyl group such as a benzyl group, a phenethyl group, a 1-naphthylmethyl group, a 2-naphthylmethyl group, a 1-naphthylethyl group, or a 2-naphthylethyl group and a heteroarylalkyl group) in which one hydrogen atom of the aromatic ring has been substituted with an alkylene group; and the like. The alkylene group substituting a hydrogen atom of the aromatic hydrocarbon ring or the aromatic heterocyclic ringaromatic heterocyclic ring preferably has 1 to 4 carbon atoms, more preferably has 1 to 2 carbon atoms, and particularly preferably has 1 carbon atom.

The aromatic hydrocarbon group may have a substituent. For example, a hydrogen atom bonded to an aromatic ring that the aromatic hydrocarbon group has may be substituted with a substituent. Examples of the substituent include an alkyl group, alkoxy group, halogen atom, halogenated alkyl group, hydroxyl group and oxygen atom (=O).

The alkyl group for the substituent is preferably an alkyl group of 1 to 5 carbon atoms, and is most preferably a methyl group, ethyl group, propyl group, n-butyl group or tert-butyl group.

Examples of the halogen atom for the substituent on the aromatic hydrocarbon group include a fluorine atom, chlorine atom, bromine atom and iodine atom, and a fluorine atom is preferred.

Examples of the halogenated alkyl group as the substituent include the groups in which a portion or all of hydrogen atoms of the above alkyl group have been substituted with halogen atoms.

As the structural unit (a3), the structural unit represented by the following general formula (a3-1) is preferable.

[Chemical Formula 72]

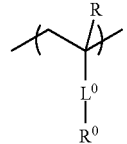

(a3-1)

In the above formulas, R represents a hydrogen atom, an alkyl group of 1 to 5 carbon atoms or a halogenated alkyl group of 1 to 5 carbon atoms, $L^0$ represents —C(=O)—O—, —C(=O)—NR″— (R″ represents a hydrogen atom or an alkyl group having 1 to 5 carbon atoms), or a single bond. $R^0$ represents —COOH or a hydrocarbon group having at least one kind of group selected from the group consisting of —OH, —COOH, —CN, —SO$_2$NH$_2$, and —CONH$_2$ as a substituent, and may have an oxygen atom or a sulfur atom in any position.

In the Formula (a3-1), the alkyl group represented by R is preferably a linear or branched alkyl group, and specific examples thereof include a methyl group, an ethyl group, a propyl group, an isopropyl group, an n-butyl group, an isobutyl group, a tert-butyl group, a pentyl group, an isopentyl group, a neopentyl group, and the like.

Examples of the halogenated alkyl group represented by R include groups in which a portion or all of hydrogen atoms of the alkyl group represented by R have been substituted with halogen atoms. Examples of the halogen atom include a fluorine atom, chlorine atom, bromine atom and iodine atom, and a fluorine atom is particularly desirable.

As R, a hydrogen atom, an alkyl group having 1 to 5 carbon atoms, or a fluorinated alkyl group having 1 to 5 carbon atoms is preferable, and a hydrogen atom or a methyl group is particularly preferable.

In the Formula (a3-1), $L^0$ represents —C(=O)—O—, —C(=O)—NR″— (R″ represents a hydrogen atom or an alkyl group having 1 to 5 carbon atoms), or a single bond. The alkyl group represented by R″ is the same as the alkyl group represented by R.

In the Formula (a3-1), $R^o$ represents a hydrocarbon group having at least one kind of group selected from the group consisting of —OH, —COOH, —CN, —SO$_2$NH$_2$, and —CONH$_2$ as a substituent, and may have an oxygen atom or a sulfur atom in any position.

The term "hydrocarbon group having a substituent" means that at least a portion of hydrogen atoms bonded to the hydrocarbon group has been substituted with a substituent.

The hydrocarbon group represented by $R^o$ may be an aliphatic hydrocarbon group or an aromatic hydrocarbon group.

Preferable examples of the aliphatic hydrocarbon group represented by $R^o$ include a linear or branched hydrocarbon group (preferably an alkylene group) having 1 to 10 carbon atoms and an aliphatic hydrocarbon group (a monocyclic group or a polycyclic group), and the description thereof is the same as above.

The aromatic hydrocarbon group represented by $R^o$ is a hydrocarbon group having an aromatic ring, and the description thereof is the same as above.

Here, $R^o$ may have an oxygen atom or a sulfur atom in any position. The term "may have an oxygen atom or a sulfur atom in any position" means that a portion of carbon atoms (including hydrocarbon group of the substituent portion) that respectively constitute a hydrocarbon group or a hydrocarbon group having a substituent may be substituted with an oxygen atom or a sulfur atom, and that a hydrogen atom bonded to a hydrocarbon group may be substituted with an oxygen atom or a sulfur atom.

$R^o$ having an oxygen atom (O) in any position will be exemplified below.

[Chemical Formula 73]

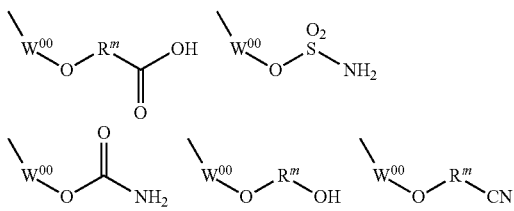

In the formula, $W^{oo}$ represents a hydrocarbon group, and $R^m$ represents an alkylene group having 1 to 5 carbon atoms.

In the formula, $W^{oo}$ represents a hydrocarbon group, and examples thereof include the same ones as $R^o$ in the Formula (a3-1). $W^{oo}$ is preferably an aliphatic hydrocarbon group, and more preferably an aliphatic cyclic group (a monocyclic group or a polycyclic group).

$R^m$ is preferably linear or branched, more preferably an alkylene group having 1 to 3 carbon atoms, and even more preferably a methylene group or an ethylene group.

More specifically, examples of preferable structural units among the structural unit (a3) include a structural unit derived from (α-substituted) acrylic acid, a structural unit represented by any of the following general formulae (a3-11) to (a3-13), and the like.

Examples of the structural unit derived from (α-substituted) acrylic acid include a structural unit in which $L^o$ in the Formula (a3-1) represents a single bond, and $R^o$ represents —COOH.

[Chemical Formula 74]

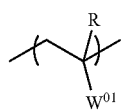 (a3-11)

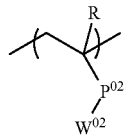 (a3-12)

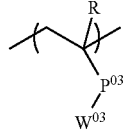 (a3-13)

In the above formulas, R represents a hydrogen atom, an alkyl group of 1 to 5 carbon atoms or a halogenated alkyl group of 1 to 5 carbon atoms, $W^{01}$ represents an aromatic hydrocarbon group having at least one kind of group selected from the group consisting of —OH, —COOH, —CN, —SO$_2$NH$_2$, and —CONH$_2$ as a substituent. Each of $P^{02}$ and $P^{03}$ represents —C(=O)—O— or —C(=O)—NR''— (R'' represents a hydrogen atom or an alkyl group having 1 to 5 carbon atoms). $W^{02}$ represents a cyclic hydrocarbon group having at least one kind of group selected from the group consisting of —OH, —COOH, —CN, —SO$_2$NH$_2$, and —CONH$_2$ as a substituent, and may have an oxygen atom or a sulfur atom in any position. $W^{03}$ represents a linear hydrocarbon group having at least one kind of group selected from the group consisting of —OH, —COOH, —CN, —SO$_2$NH$_2$, and —CONH$_2$ as a substituent.

[Structural Unit Represented by General Formula (a3-11)]

In the Formula (a3-11), description for R is the same as that for R in the Formula (a3-1).

Description for the aromatic hydrocarbon group represented by $W^{01}$ is the same as that for the aromatic hydrocarbon group represented by $R^o$ in the Formula (a3-1).

The aromatic hydrocarbon group represented by $W^{01}$ may have a substituent other than at least one kind selected from the group consisting of —OH, —COOH, —CN, —SO$_2$NH$_2$, and —CONH$_2$. As the substituent, a halogen atom is preferable, and a fluorine atom is particularly preferable.

Specific examples of preferable structural units represented by general formula (a3-11) will be shown below. In the formulas shown below, $R^\alpha$ represents a hydrogen atom, a methyl group or a trifluoromethyl group.

[Chemical Formula 75]

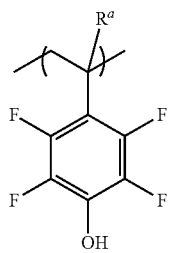 (a3-11-1)

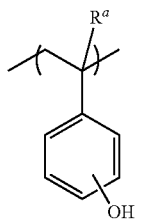 (a3-11-2)

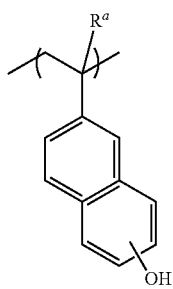 (a3-11-3)

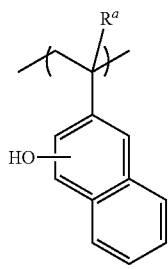 (a3-11-4)

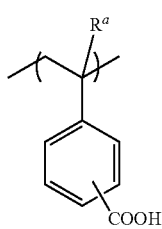 (a3-11-5)

[Structural Unit Represented by General Formula (a3-12)]

In the Formula (a3-12), description for R is the same as that for R in the Formula (a3-1).

$P^{02}$ represents —C(=O)—O— or —C(=O)—NR″ (R″ represents a hydrogen atom or an alkyl group having 1 to 5 carbon atoms), and is preferably —C(=O)—O—. The alkyl group represented by R″ is the same as the alkyl group represented by R.

Examples of the cyclic hydrocarbon group represented by $W^{02}$ respectively include the same ones as the aliphatic cyclic group (a monocyclic group or a polycyclic group) and the aromatic hydrocarbon group exemplified in the description for $R^0$ in the Formula (a3-1).

$W^{02}$ may have an oxygen atom or a sulfur atom in any position, and description for $W^{02}$ is the same as the description for $R^0$ in the Formula (a3-1).

Specific examples of preferable structural units represented by general formula (a3-12) will be shown below. In the formulas shown below, $R^\alpha$ represents a hydrogen atom, a methyl group or a trifluoromethyl group.

[Chemical Formula 76]

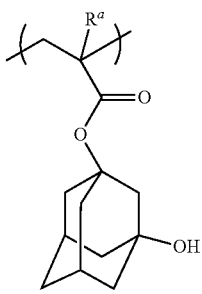 (a3-12-1)

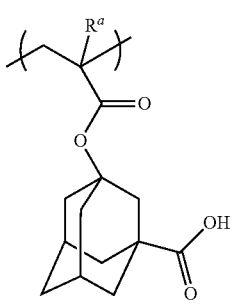 (a3-12-2)

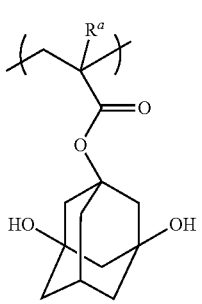 (a3-12-3)

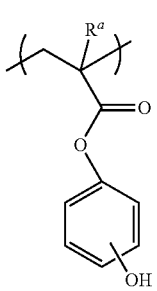 (a3-12-4)

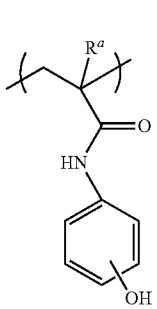 (a3-12-5)

(a3-12-6)
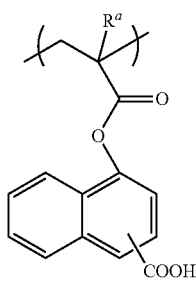
(a3-12-7)
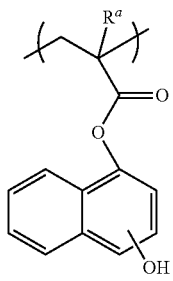
(a3-12-8)
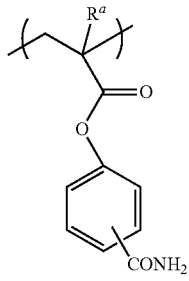
(a3-12-9)
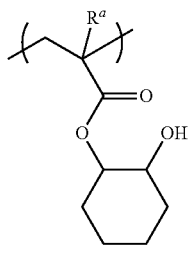
(a3-12-10)
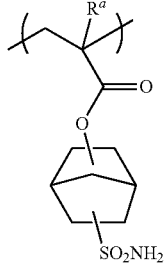
(a3-12-11)
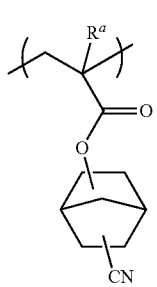
(a3-12-12)
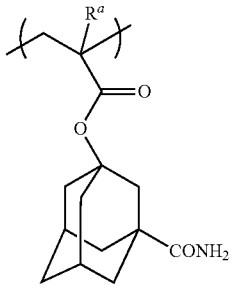
[Chemical Formula 77]
(a3-12-13)
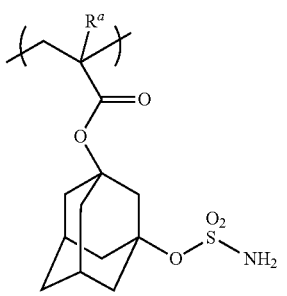
(a3-12-14)
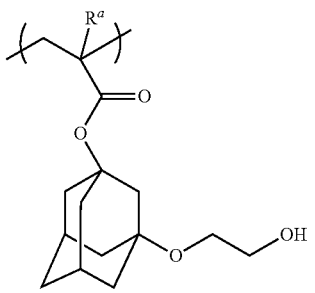
(a3-12-15)
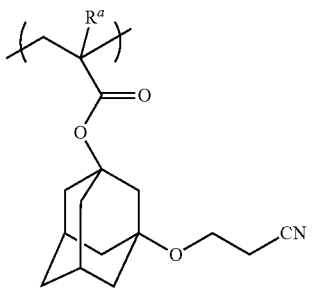
(a3-12-16)
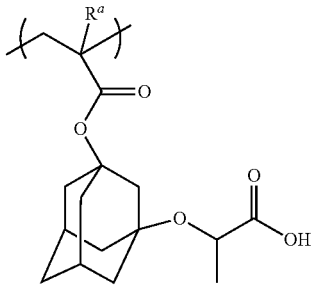

-continued (a3-12-17)

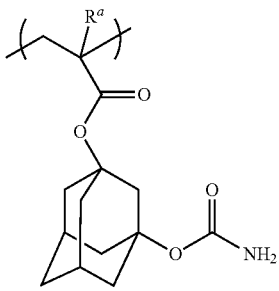

[Structural Unit Represented by General Formula (a3-13)]

In the Formula (a3-13), description for R is the same as that for R in the Formula (a3-1).

$P^{03}$ represents —C(=O)—O— or —C(=O)—NR"— (R" represents a hydrogen atom or an alkyl group having 1 to 5 carbon atoms), and is preferably —C(=O)—O—. The alkyl group represented by $R^1$ is the same as the alkyl group represented by R.

The linear hydrocarbon group represented by $W^{03}$ preferably has 1 to 10 carbon atoms, more preferably has 1 to 5 carbon atoms, and even more preferably has 1 to 3 carbon atoms.

The linear hydrocarbon group represented by $W^{03}$ may further have a substituent (a) other than —OH, —COOH, —CN, —SO$_2$NH$_2$, and —CONH$_2$. Examples of the substituent (a) include an alkyl group having 1 to 5 carbon atoms, an aliphatic cyclic group (a monocyclic group or a polycyclic group), a fluorine atom, a fluorinated alkyl group having 1 to 5 carbon atoms, and the like. The aliphatic cyclic group (a monocyclic group or a polycyclic group) in the substituent (a) preferably has 3 to 30 carbon atoms, more preferably has 5 to 30 carbon atoms, even more preferably has 5 to 20 carbon atoms, particularly preferably has 6 to 15 carbon atoms, and most preferably has 6 to 12 carbon atoms. Specific examples thereof include groups in which two or more hydrogen atoms have been removed from monocycloalkane; groups in which one or more hydrogen atoms have been removed from polycycloalkane such as bicycloalkane, tricycloalkane, and tetracycloalkane; and the like. More specifically, the examples include groups in which two or more hydrogen atoms have been removed from a monocycloalkane such as cyclopentane or cyclohexane; groups in which one or more hydrogen atoms have been removed from a polycycloalkane such as adamantane, norbornane, isobornane, tricyclodecane, or tetracyclodecane; and the like.

In addition, the linear hydrocarbon group represented by $W^{03}$ may have plural substituents (a), or the plural substituents (a) may be bonded to each other to form a ring, just like the structural unit represented by the following general formula (a3-13-a) for example.

[Chemical Formula 78]

(a3-13-a)

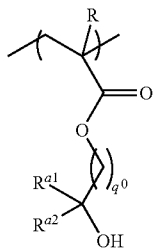

In the above formulas, R represents a hydrogen atom, an alkyl group of 1 to 5 carbon atoms or a halogenated alkyl group of 1 to 5 carbon atoms, each of $R^{1a}$ and $R^{a2}$ independently represents an alkyl group having 1 to 5 carbon atoms, an aliphatic cyclic group (a monocyclic group or a polycyclic group), a fluorine atom, or a fluorinated alkyl group having 1 to 5 carbon atoms. Here, $R^{a1}$ and $R^{a2}$ may be bonded to each other to form a ring. $q^0$ represents an integer of 1 to 4.

In the Formula (a3-13-a), description of for R is the same as that for R in the Formula (a3-1).

The aliphatic cyclic group (a monocyclic group or a polycyclic group) represented by $R^{a1}$ and $R^{a2}$ is the same as the aliphatic cyclic group (a monocyclic group or a polycyclic group) in the substituent (a).

In addition, $R^{a1}$ and $R^{a2}$ may be bonded to each other to form a ring. In this case, a cyclic group is formed by $R^{a1}$, $R^{a2}$, and carbon atoms to which both the $R^{a1}$ and $R^{a2}$ are bonded. The cyclic group may be a monocyclic group or a polycyclic group, and specific examples thereof include the groups in which one or more hydrogen atoms have been removed from a monocycloalkane or a polycycloalkane exemplified in the description for the aliphatic cyclic group (a monocyclic group or a polycyclic group) in the substituent (a).

$q^0$ is preferably 1 or 2, and more preferably 1.

Specific examples of preferable structural units represented by general formula (a3-13) will be shown below. In the formulas shown below, $R^\alpha$ represents a hydrogen atom, a methyl group or a trifluoromethyl group.

[Chemical Formula 79]

(a3-13-1)

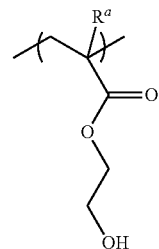

(a3-13-2)

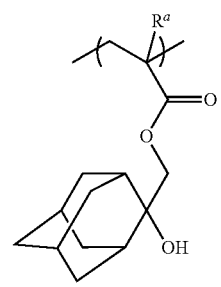

(a3-13-3)

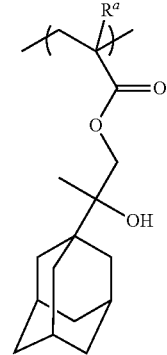

One kind or two or more kinds of the structural unit (a3) may be contained in the component (A1).

A proportion of the structural unit (a3) in the component (A1) is preferably 0 mol % to 85 mol %, and more preferably 0 mol % to 80 mol %, based on all structural units constituting the component (A1). If the proportion of the structural unit (a3) is equal to or more than the lower limit, the effect (effect of improving resolution, lithography properties, and the pattern shape) produced by adding the structural unit (a3) is sufficiently obtained. On the other hand, when the amount of the structural unit (a3) is not more than the upper limit of the above range, a good balance can be more easily achieved with the other structural units.

(Structural Unit (a-4))

If desired, the component (A1) may further have a structural unit (a-4) containing an acid non-dissociable cyclic group. If the component (A1) has the structural unit (a-4), dry etching resistance of the resist pattern formed is improved. Moreover, hydrophobicity of the component (A1) is improved.

The improvement of hydrophobicity contributes to the improvement of resolution, the resist pattern shape, and the like, particularly in the case of developing using an organic solvent.

The "acid non-dissociable cyclic group" in the structural unit (a-4) is a cyclic group which remains in the structural unit as is without being dissociated, even when an acid is generated upon exposure from the structural unit (a0) or an arbitrary acid-generator component (B) described later and acts.

Examples of the structural unit (a-4) include structural units in which the acid-dissociable group in the structural unit (a11) or (a12) has been substituted with an acid non-dissociable cyclic group. Among these, a structural unit (a41) which is derived from an acrylate ester in which a hydrogen atom bonded to a carbon atom on the α-position may be substituted with a substituent, and contains an acid non-dissociable aliphatic cyclic group, a structural unit (a42) which derived from styrene in which a hydrogen atom bonded to a carbon atom on the α-position may be substituted with a substituent, a structural unit (a43) which is derived from vinyl naphthalene in which a hydrogen atom bonded to a carbon atom on the α-position may be substituted with a substituent, and the like are preferable.

Examples of the acid non-dissociable aliphatic cyclic group in the structural unit (a41) include a monovalent aliphatic cyclic group in which a carbon atom bonded to an atom (for example, —O— in —C(=O)—O—) adjacent to the aliphatic cyclic group is not bonded to a substituent (an atom or a group other than a hydrogen atom), groups in which one hydrogen atom of a primary or secondary alkyl group has been substituted with a monovalent aliphatic cyclic group, and the like.

The monovalent aliphatic cyclic group is not particularly limited as long as it is acid non-dissociable, and various groups known to be used in a resin component of a resist composition for the ArF excimer laser, KrF excimer laser (preferably for ArF excimer laser), or the like in the related art can be used. The aliphatic cyclic group may be saturated or unsaturated, and is preferably saturated.

The aliphatic cyclic group may or may not have a substituent. Examples of the substituent include an alkyl group having 1 to 5 carbon atoms, an alkoxy group having 1 to 5 carbon atoms, a fluorine atom, a fluorinated alkyl group having 1 to 5 carbon atoms, an oxygen atom (=O), and the like.

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated.

The aliphatic cyclic group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

The aliphatic cyclic group may be monocyclic or polycyclic. As the monocyclic aliphatic cyclic group, groups in which one or more hydrogen atoms have been removed from monocycloalkane are preferable. The monocycloalkane preferably contains 3 to 6 carbon atoms, and specific examples include cyclobutane, cyclopentane and cyclohexane. As the polycyclic aliphatic cyclic group, groups in which one or more hydrogen atoms have been removed from polycycloalkane are preferable. The polycycloalkane preferably has 7 to 12 carbon atoms, and specific examples thereof include adamantane, norbornane, isobornane, tricyclodecane, tetracyclodecane, and the like. In addition, a portion of carbon atoms constituting a ring of these aliphatic cyclic groups may be substituted with an ether group (—O—).

The aliphatic cyclic group is preferably polycyclic since this produces the excellent effect described above. Particularly, the aliphatic cyclic group is preferably bicyclic to tetracyclic. Among these, at least one kind selected from a tricyclodecyl group, an adamantyl group, a tetracyclododecyl group, an isobornyl group, and a norbornyl group is preferable in respect that such a group can be easily obtained industrially.

Specific examples of the monovalent aliphatic cyclic group as the acid non-dissociable aliphatic cyclic group include a monovalent aliphatic cyclic group in which a substituent (an atom or a group other than a hydrogen atom) is not bonded to a carbon atom bonded to an atom (for examples, —O— in —C(=O)—O—) adjacent to the aliphatic cyclic group. Specifically, the examples include groups in which $R^{14}$ in the group represented by Formulae (p1-1) to (p1-8) exemplified in the description for the structural unit (a11) has been substituted with a hydrogen atom; groups in which $R^{14'}$ in the group represented by the group represented by Formula (m1-1) exemplified in the description for the structural unit (a12) has been substituted with a hydrogen atom; groups in which a hydrogen atom has been removed from the tertiary carbon atoms of cycloalkane which has tertiary carbon atoms formed of only carbon atoms constituting a ring skeleton (for example, a 1-adamantyl group); and the like.

Examples of the group in which one hydrogen atom of a primary or secondary alkyl group has been substituted with a monovalent aliphatic cyclic group include groups in which at least one of $R^{15}$ and $R^{16}$ in the group represented by Formulae (p2-1) to (p2-5) exemplified in the description for the structural unit (a11) has been substituted with a hydrogen atom; groups in which at least one of $R^{15'}$ and $R^{16'}$ in the group represented by (m2-1) to (m2-3) exemplified in the description for the structural unit (a12) has been substituted with a hydrogen atom; and the like.

Examples of the structural unit (a41) include structural units in which the acid-dissociable group in the structural unit (a11) or (a12) has been substituted with an acid non-dissociable aliphatic cyclic group. The structural unit (a41) is preferably a structural unit in which $X^p$ in the general formula (a11-01) has been substituted with an acid non-dissociable aliphatic cyclic group, that is, the structural unit represented by the following general formula (a4-0), and particularly preferably the structural units represented by the following general formulae (a4-1) to (a4-5).

[Chemical Formula 80]

(a4-0)
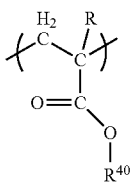

In the formula, R is the same as above, and $R^{40}$ represents acid non-dissociable aliphatic cyclic group.

[Chemical Formula 81]

(a4-1)
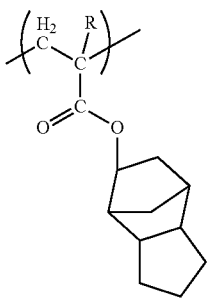

(a4-2)
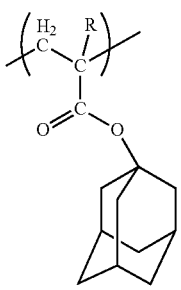

(a4-3)
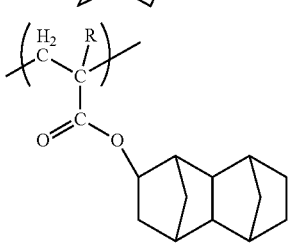

(a4-4)
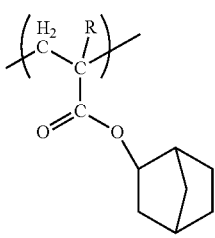

(a4-5)
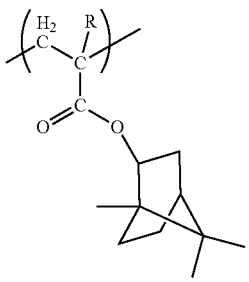

In the formulas, R is the same as defined above.

Specific examples of the structural unit (a42) include structural units in which px of $-(OX^c)_{px}$ bonded to a benzene ring in the general formula (U-3) is 0, Specific examples of the structural unit (a43) include structural units in which x of $-(OX^d)_x$ bonded to a benzene ring in the general formula (U-4) is 0.

One kind or two or more kinds of the structural unit (a-4) may be contained in the component (A1).

When the component (A1) contains the structural unit (a-4), a proportion of the structural unit (a-4) in the component (A1) is preferably 1 mol % to 30 mol %, more preferably 1 mol % to 20 mol %, and even more preferably 5 mol % to 20 mol %, based on the sum of all structural units constituting the component (A1). If the proportion is equal to or more than the lower limit, the effect produced by adding the structural unit (a-4) is sufficiently obtained, and if the proportion is equal to or less than the upper limit, the structural unit (a-4) can be balanced with other structural units.

The component (A1) may contain structural units other than the structural units (a0) to (a4), within a range that does not diminish the effects of the present invention.

Other structural units are not particularly limited as long as they are structural units not classified into the above structural units (a0) to (a4), and various structural units known to be used for a resin for a resist for the ArF excimer laser, KrF excimer laser, EB, EUV, and the like in the related art can be used.

In the present invention, the component (A1) is a copolymer having the structural units (a0), (a11), and (a12), and is more preferably a copolymer having the structural units (a0), (a11), (a12), and (a2).

Examples of such a copolymer include a copolymer including the structural units (a0), (a11), and (a12), a copolymer unit including the structural units (a0), (a11), (a12), and (a2), a copolymer including the structural units (a0), (a11), (a12), and (a3), a copolymer including the structural units (a0), (a11), (a12), (a2), and (a3), and the like.

The weight-average molecular weight (Mw) (the polystyrene equivalent value determined by gel permeation chromatography (GPC)) of the component (A1) is not particularly limited, but is preferably within a range from 1,000 to 50,000, more preferably from 1,500 to 30,000, and most preferably from 2,000 to 20,000. When the weight average molecular weight is not more than the upper limit of the above range, the polymeric compound (A1) exhibits satisfactory solubility in a resist solvent when used as a resist. On the other hand, when the weight average molecular weight is at least as large as the lower limit of the above range, the dry etching resistance and the cross-sectional shape of the resist pattern are improved.

Further, although there are no particular limitations on the dispersity (Mw/Mn) of the component (A1), the dispersity is preferably from 1.0 to 5.0, more preferably from 1.0 to 3.0, and most preferably from 1.0 to 2.5. Here, Mn represents the number-average molecular weight.

The component (A1) can be obtained, for example, by a conventional radical polymerization or the like of the monomers corresponding with each of the structural units, using a radical polymerization initiator such as azobisisobutyronitrile (AIBN).

As monomers from which the respective structural units are derived, commercially available monomers or monomers synthesized by known methods may be used.

In addition, as the monomer from which the structural unit (a0) is derived, a compound having a polymerizable group such as an ethylenic double bond and a group represented by the general formula (a0-1) or (a0-2) (for example, a compound represented by general formula: $CH_2=C(R)-Q^1-R^3-$ S⁺(R⁴)(R⁵)V⁻ or a compound represented by CH$_2$=C(R)-Q²-A⁻(M$^{m+}$)$_{1/m}$ may be used. Alternatively, a compound in which V⁻ of the above compound has been substituted with another anion or cation, or a compound in which (M$^{m+}$)$_{1/m}$ has been substituted with another cation (for example, H⁺, Na⁺, K⁺, NH$_4$⁺, or N⁺(CH$_3$)$_4$) may be used. In the case of the latter, after a polymer is obtained, salt exchange is performed on the polymer by using a salt of V⁻ and a counteranion thereof or a salt of (M$^{m+}$)$_{1/m}$ and a counteranion thereof (for example, Cl⁻), whereby the component (A1) can be obtained.

Moreover, a polymer having a polar group such as a hydroxyl group may be reacted with a compound containing a group represented by general formula —R³—S⁺(R⁴)(R⁵)V⁻ or -A-(M$^{m+}$)$_{1/m}$ so as to introduce a group represented by the general formula (a0-1) or (a0-2).

Furthermore, in the component (A1), by using a chain transfer agent such as HS—CH$_2$—CH$_2$—CH$_2$—C(CF$_3$)$_2$—OH, a —C(CF$_3$)$_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

In the component (A), one kind of the component (A1) may be used alone, or two or more kinds thereof may be used concurrently.

In the component (A), the amount of the component (A1) based on the total weight of the component (A) is preferably 25% by weight or more, more preferably 50% by weight or more, still more preferably 75% by weight or more, and may be even 100% by weight. If the proportion is 25% by weight or more, the pattern shape of a resist pattern formed by EUV exposure or EB exposure, a limit resolution performance, and the like are improved.

The component (A) may contain a base component (hereinafter, referred to as a component (A2)) which generates an acid upon exposure and exhibits changed solubility in a developing solution by the action of acid other than the component (A1), within a range that does not diminish the effects of the present invention. The component (A2) is not particularly limited, and components having been proposed in the related art can be used.

In the resist composition of the present invention, the amount of the component (A) can be appropriately adjusted depending on the thickness of the resist film to be formed, and the like.

<Optional Components>

[Basic Compound (D)]

The resist composition of the present invention preferably contains a basic compound (D) (hereinafter, referred to as a component (D)) as an arbitrary component.

In the present invention the component (D) acts as an acid diffusion control agent, that is, a quencher trapping an acid generated upon exposure from the component (A) or the component (B) (acid-generator component arbitrarily mixed in) described later. In addition, the "basic compound" in the present invention refers to a compound which is basic relative to the component (A) or component (B).

The component (D) in the present invention may be a basic compound (D1) (hereinafter, referred to as a "component (D1)") including a cation moiety and an anion moiety, or a basic compound (D2) (hereinafter, referred to as a "component (D2)") not corresponding to the component (D1).

{Component (D)}

The component (D1) is a basic compound including a cation moiety and an anion moiety. The basic compound traps an acid (strong acid) generated from the component (A) or the acid-generator component (B) by salt exchange.

More specific examples of the component (D1) include the compound (D11) represented by the following general formula (d11), the compound (D12) represented by the following general formula (d12), the compound (D13) represented by the following general formula (d13), and the like.

[Chemical Formula 82]

(d11)

(d12)

(d13)

In the formula, R$^{1c}$ represents a hydrocarbon group which may have a substituent. Z$^{2c}$ represents a hydrocarbon group having 1 to 30 carbon atoms that may have a substituent (here, a carbon atom adjacent to S does not have a fluorine atom as a substituent). R$^{3c}$ represents an organic group. Y³ represents a linear, branched, or cyclic alkylene group or arylene group, and R¹³ represents a hydrocarbon group containing a fluorine atom. Each M⁺ independently represents a sulfonium or iodonium cation.

(Compound (D11))

—Anion Moiety

In Formula (d11), R$^{1c}$ represents a hydrocarbon group which may have a substituent.

The hydrocarbon group which may have a substituent and is represented by R$^{1c}$ may be an aliphatic hydrocarbon group or an aromatic hydrocarbon group, and examples thereof include the same ones as X³ in Formula: X³-Q'- exemplified as a substituent that R⁴'' may have in general formula "R⁴''SO$_3$''''" in the description for the structural unit (a0).

Among these, as the hydrocarbon group which may have a substituent and is represented by R$^{1c}$, an aromatic hydrocarbon group which may have a substituent or an aliphatic cyclic group which may have a substituent is preferable, and a phenyl group or a naphthyl group which may have a substituent or a group in which one or more hydrogen atoms have been removed from a polycycloalkane such as adamantane, norbornane, isobornane, tricyclodecane, or tetracyclodecane is more preferable.

Moreover, as the hydrocarbon group which may have a substituent and is represented by R$^{1c}$, a linear or branched alkyl group or a fluorinated alkyl group is also preferable.

The linear or branched alkyl group represented by R$^{1c}$ preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl group, or a decyl group, a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, or a 4-methylpentyl group, and the like.

The fluorinated alkyl group represented by $R^{1c}$ may be chain-like or cyclic, but is preferably linear or branched.

The fluorinated alkyl group preferably has 1 to 11 carbon atoms, more preferably 1 to 8, and still more preferably 1 to 4. Specific examples thereof include groups in which a portion or all of hydrogen atoms constituting a linear alkyl group such as a methyl group, an ethyl group, a propyl group, a butyl group, a pentyl group, a hexyl group, a heptyl group, an octyl group, a nonyl group, or a decyl group have been substituted with fluorine atoms, and groups in which a portion or all of hydrogen atoms constituting a branched alkyl group such as a 1-methylethyl group, a 1-methylpropyl group, a 2-methylpropyl group, a 1-methylbutyl group, a 2-methylbutyl group, or a 3-methylbutyl group have been substituted with fluorine atoms.

In addition, the fluorinated alkyl group represented by $R^{1c}$ may contain an atom other than a fluorine atom. Examples of the atom other than fluorine include an oxygen atom, a carbon atom, a hydrogen atom, a sulfur atom and a nitrogen atom.

Among these, as the fluorinated alkyl group represented by $R^{1c}$, a group in which a portion or all of hydrogen atoms constituting a linear alkyl group have been substituted with fluorine atoms is preferable, and a group (perfluoroalkyl group) in which all hydrogen atoms constituting a linear alkyl group have been substituted with fluorine atoms is more preferable.

Preferable and specific examples of the anion moiety of the compound (D11) will be shown below.

[Chemical Formula 83]

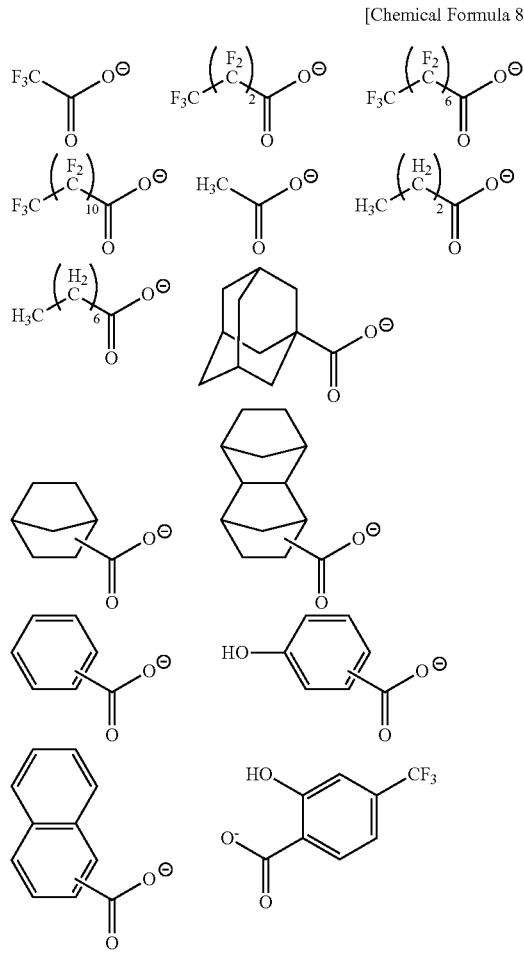

-continued

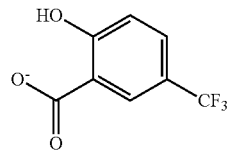

—Cation Moiety

In Formula (d11), $M^+$ represents an organic cation.

The organic cation represented by $M^+$ is not particularly limited, and for example, a photodecomposable base used for a quencher of a resist composition in the related art, or an organic cation known as a cation moiety of an onium acid generator of a resist composition can be used. Examples of such an organic cation include the cation represented by the following general formula (ca-1) or (ca-2). Among these, the cation represented by the general formula (ca-1) is preferable.

[Chemical Formula 84]

(ca-1)

(ca-2)

In the formula, each of $R^{1\prime\prime}$ to $R^{3\prime\prime}$ and $R^{5\prime\prime}$ and $R^{6\prime\prime}$ independently represents an aryl group, alkyl group, or alkenyl group which may have a substituent. Two of $R^{1\prime\prime}$ to $R^{3\prime\prime}$ in Formula (ca-1) may be bonded to each other to form a ring with a sulfur atom in the formula.

In the Formula (ca-1), examples of each of the aryl group which may have a substituent, alkyl group which may have a substituent, and alkenyl group which may have a substituent represented by $R^{1\prime\prime}$ to $R^{3\prime\prime}$ include the same ones as the aryl group, alkyl group, and alkenyl group exemplified in the description for $R^4$ and $R^5$ in the general formula (a0-1).

Examples of the substituent that the aryl group, alkyl group, or alkenyl group may have include the same ones as exemplified as substituents in the substituted alkylene group in the description for $R^3$ in the general formula (a0-1). Specific examples thereof include a halogen atom, an oxo group (=O), a cyano group, an alkyl group, an alkoxyalkyloxy group, an alkoxycarbonylalkyloxy group, —C(=O)—O—$R^{7\prime\prime}$, —O—C(=O)—$R^{8\prime\prime}$, —O—$R^{9\prime\prime}$, and aryl group, and the like. Each of $R^{7\prime\prime}$, $R^{8\prime\prime}$, and $R^{9\prime\prime}$ independently represents a hydrogen atom or a hydrocarbon group, and is preferably a hydrogen atom, a saturated hydrocarbon group, or an aliphatic unsaturated hydrocarbon group.

When each of $R^{1\prime\prime}$ to $R^{3\prime\prime}$ independently represents an aryl group, alkyl group, or alkenyl group which may have a substituent, specific examples of preferable cations among cations represented by Formula (ca-1) include cations represented by the following Formulae (ca-1) to (ca-1-34).

[Chemical Formula 85]
(ca-1-1) 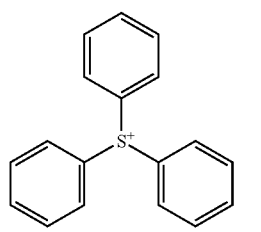
(ca-1-2) 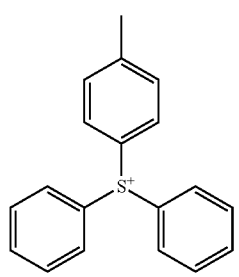
(ca-1-3) 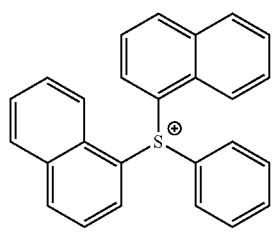
(ca-1-4) 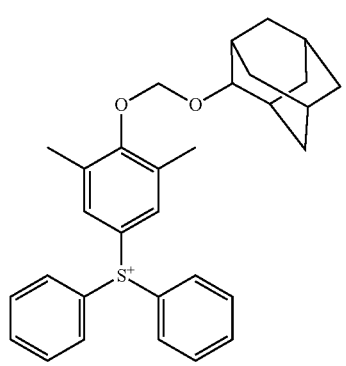
(ca-1-5) 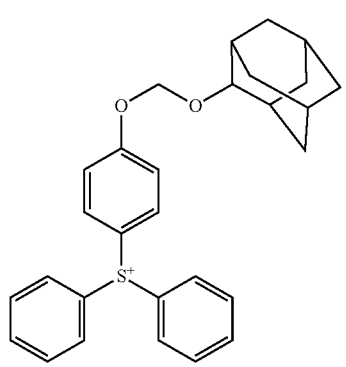
(ca-1-6) 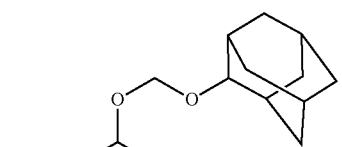
(ca-1-7) 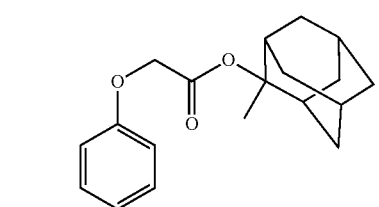
(ca-1-8) 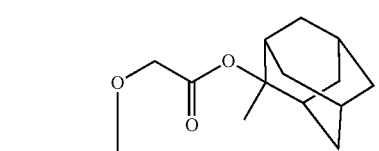
(ca-1-9) 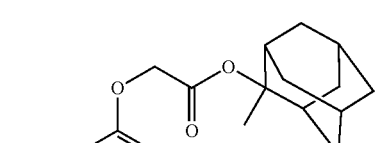

-continued
(ca-1-10)
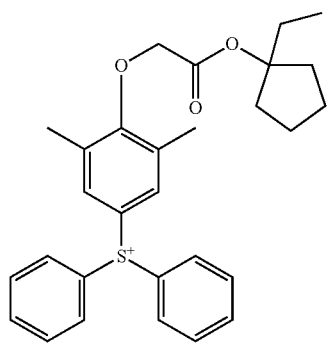
(ca-1-11)
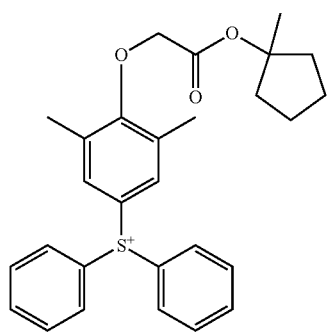
(ca-1-12)
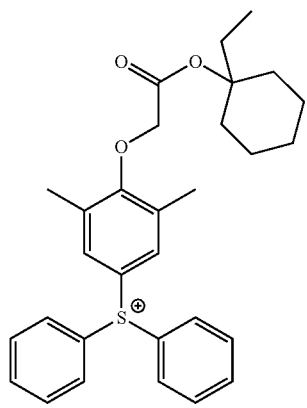
(ca-1-13)
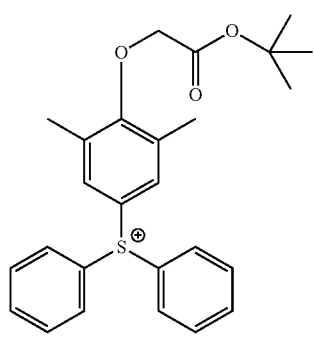
-continued
(ca-1-14)
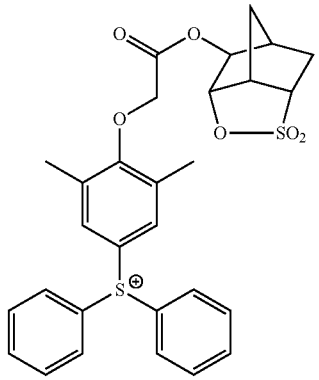
(ca-1-15)
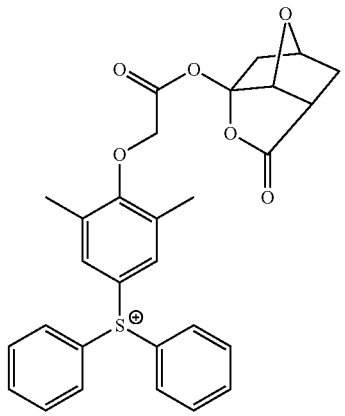
[Chemical Formula 86]
(ca-1-16)
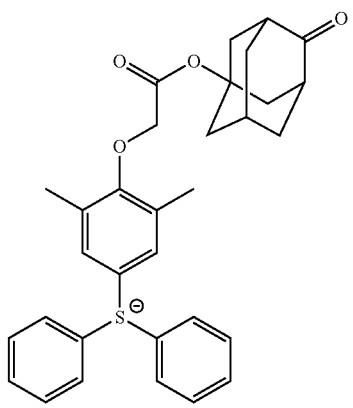
(ca-1-17)
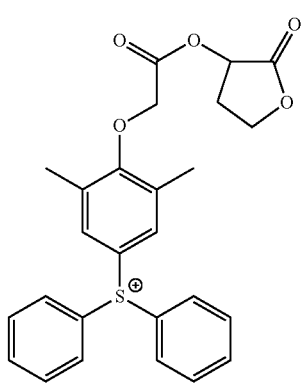

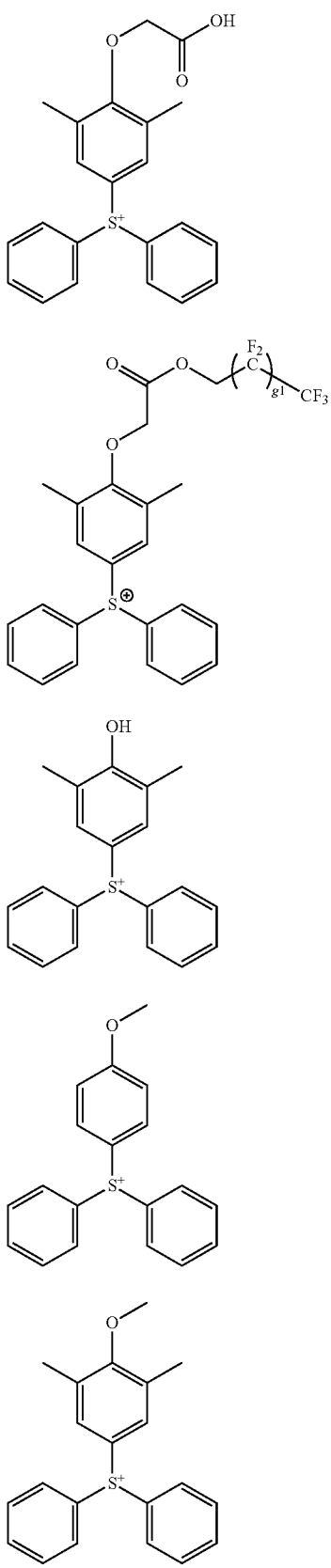
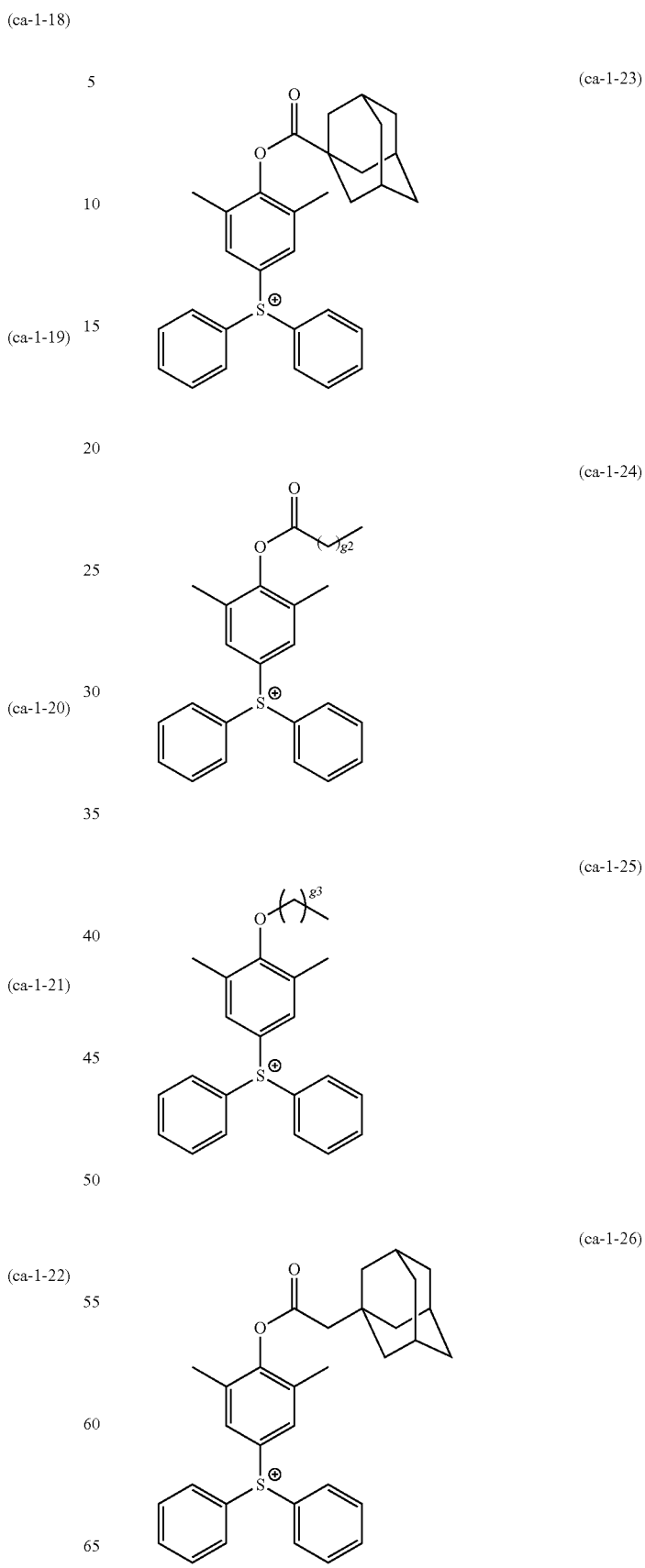

(ca-1-27)

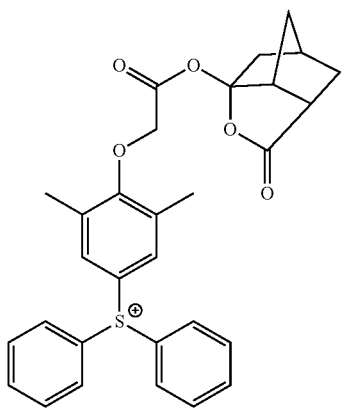

In the formula, g1, g2, and g3 represent a recurring number, g1 represents an integer of 1 to 5, g2 represents an integer of 0 to 20, and g3 represents an integer of 0 to 20.

[Chemical Formula 87]

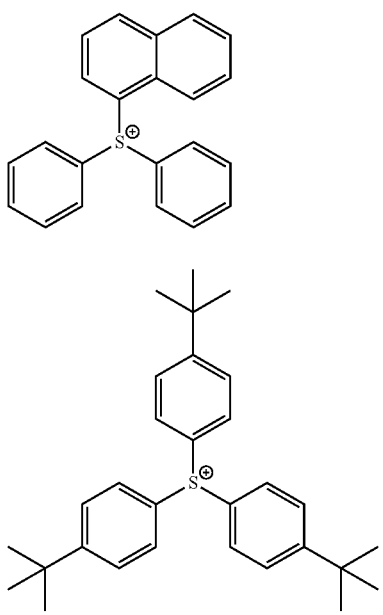

(ca-1-28)

(ca-1-29)

(ca-1-30)

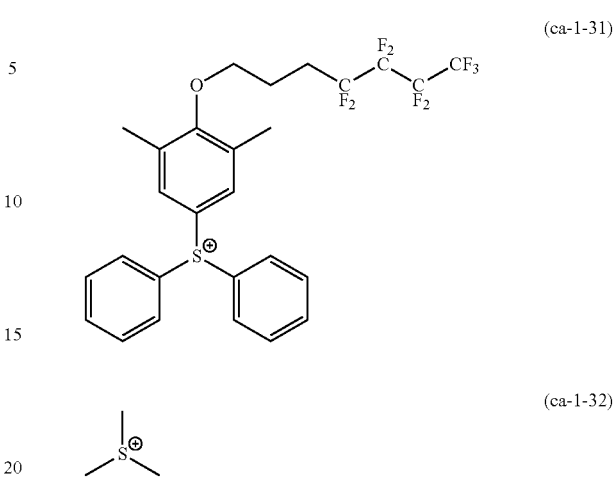

(ca-1-31)

(ca-1-32)

(ca-1-33)

(ca-1-34)

Two of $R^1{}''$ to $R^3{}''$ in Formula (ca-1) may be bonded to each other to form a ring with a sulfur atom in the formula. In this case, the ring may be saturated or unsaturated. In addition, the ring may be monocyclic or polycyclic. For example, when either or both of two groups forming the ring are a cyclic group (a cyclic alkyl or aryl group), if these groups are bonded to each other, a polycyclic ring (condensed ring) is formed.

Regarding the formed ring, a single ring containing a sulfur atom within the ring skeleton is preferably constituted with 3 to 10 members, and particularly preferably constituted with 5 to 7 members, including the sulfur atom.

The ring may have hetero atoms other than the sulfur atom to which $R^1{}''$ to $R^3{}''$ are bonded, as atoms constituting the ring skeleton. Examples of the hetero atoms include a sulfur atom, an oxygen atom, a nitrogen atom, and the like.

Specific examples of the formed ring include a thiophene ring, a thiazole ring, a benzothiophene ring, a thianthrene ring, a benzothiophene ring, dibenzothiophene ring, a 9H-thioxanthene ring, a thioxanthone ring, a thianthrene ring, a phenoxathiin ring, a tetrahydrothiophenium ring, a tetrahydrothiopyranium ring, and the like.

When two of $R^1{}''$ to $R^3{}''$ are bonded to each other to form a ring with a sulfur atom in the formula, specific examples of preferable cations among the cations represented by Formula (ca-1) include the cation moieties represented by the following Formulae (ca-2) to (ca-5).

[Chemical Formula 88]

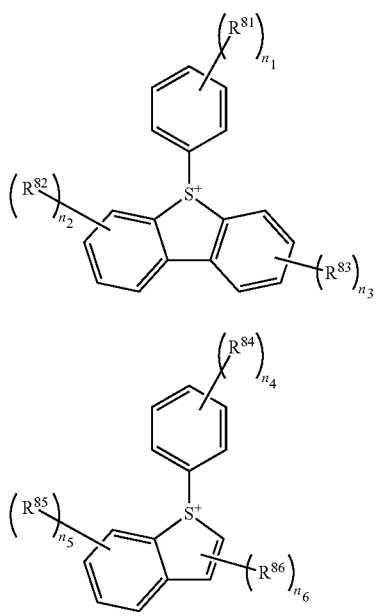

(ca-2)

(ca-3)

In the above formulas, each of $R^{81}$ to $R^{86}$ independently represents an alkyl group, acetyl group, alkoxy group, carboxyl group, hydroxyl group or hydroxyalkyl group, each of $n_1$ to $n_5$ independently represents an integer of 0 to 3, and $n_6$ represents an integer of 0 to 2.

[Chemical Formula 89]

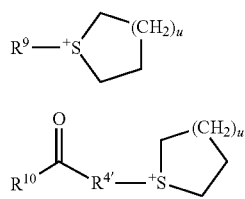

(ca-4)

(ca-5)

In the formula, u represents an integer of 1 to 3, $R^9$ represents a phenyl group, a naphthyl group, or an alkyl group which may have a substituent, $R^{10}$ represents a phenyl group, a naphthyl group, an alkyl group, an alkoxy group, or a hydroxyl group which may have a substituent, and $R^{4'}$ represents an alkylene group which may have a substituent.

In Formulae (ca-2) to (ca-3), the alkyl group represented by $R^{81}$ to $R^{86}$ is preferably an alkyl group having 1 to 5 carbon atoms. Among these, a linear or branched alkyl group is more preferable, and a methyl group, an ethyl group, a propyl group, an isopropyl group, an n-butyl group, or a tert-butyl group is particularly preferable.

The alkoxy group is preferably an alkoxy group of 1 to 5 carbon atoms, and among such groups, is more preferably a linear or branched alkoxy group, and most preferably a methoxy group or an ethoxy group.

The hydroxyalkyl group is preferably a group in which one or more of the hydrogen atoms within an aforementioned alkyl group have each been substituted with a hydroxyl group, and specific examples include a hydroxymethyl group, hydroxyethyl group and hydroxypropyl group.

When the subscripts $n_1$ to $n_6$ appended to $R^{81}$ to $R^{86}$ represent an integer of 2 or more, the corresponding plurality of $R^{81}$ to $R^{86}$ groups may be the same or different.

$n_1$ is preferably 0 to 2, more preferably 0 or 1, and still more preferably 0.

It is preferable that each of $n_2$ and $n_3$ independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

Examples of preferable cations represented by the Formula (ca-2) or (ca-3) include the following.

[Chemical Formula 90]

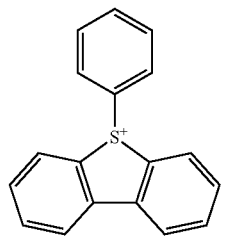

(ca-2-1)

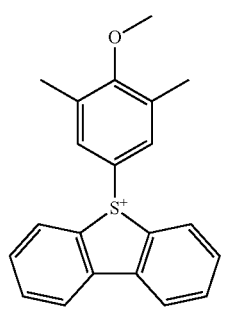

(ca-2-2)

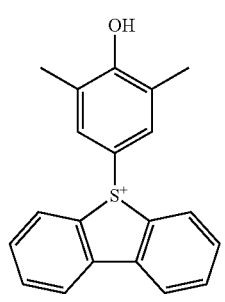

(ca-2-3)

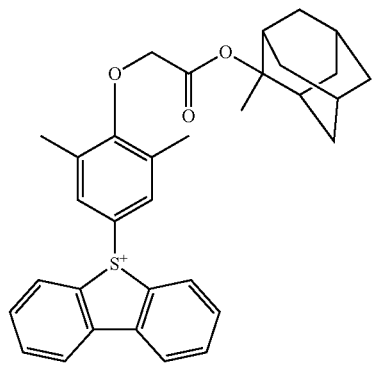

(ca-2-4)

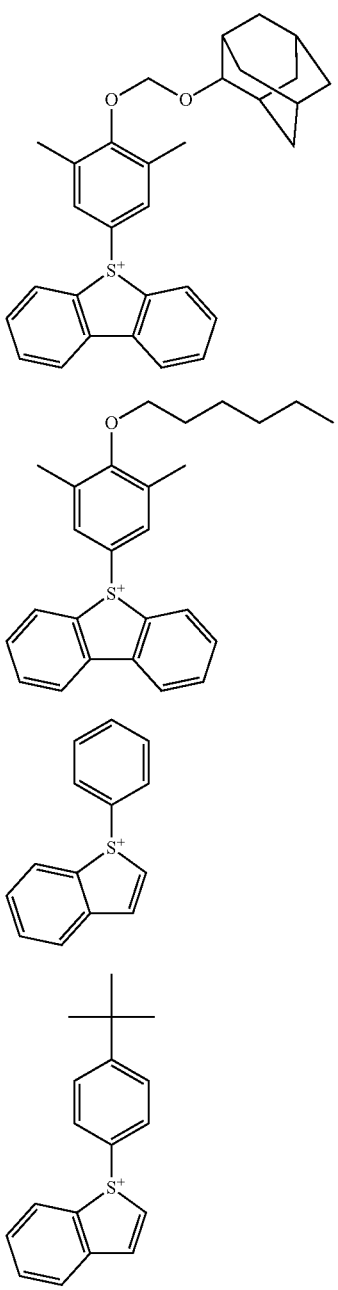

(ca-2-5)

(ca-2-6)

(ca-3-1)

(ca-3-2)

In Formulae (ca-4) and (ca-5), u represents an integer of 1 to 3, and is most preferably 1 or 2.

$R^9$ represents a phenyl group, a naphthyl group, or an alkyl group which may have a substituent.

Examples of the alkyl group represented by $R^9$ include the same ones as the alkyl group represented by $R^{1'''}$ to $R^{3'''}$ Examples of the substituent that the phenyl group, naphthyl group or alkyl group represented by $R^9$ may have include the same ones as exemplified as the substituent in the substituted alkylene group in the description for $R^3$ in the general formula (a0-1). The examples specifically include a halogen atom, an oxo group (=O), a cyano group, an alkyl group, an alkoxyalkyloxy group, an alkoxycarbonylalkyloxy group, —C(=O)—O—$R^{7'''}$, —O—C(=O)—$R^{8'''}$, —O—$R^{9'''}$, an aryl group and the like. Each of $R^{7'''}$, $R^{8'''}$, and $R^{9'''}$ independently represents a hydrogen atom or a hydrocarbon group, and is preferably a hydrogen atom, a saturated hydrocarbon group, or an aliphatic unsaturated hydrocarbon group.

$R^{10}$ represents a phenyl group, a naphthyl group, an alkyl group, an alkoxy group, or a hydroxyl group which may have a substituent. Examples of each of the alkyl group, alkoxy group, and alkyl group represented by $R^9$ include the same ones as the alkyl group represented by $R^{1'''}$ to $R^{3'''}$ Examples of the substituent that the phenyl group, naphthyl group, alkyl group, or alkoxy group represented by $R^{10}$ may have include the same ones as the substituent that the phenyl group, naphthyl group, or alkyl group represented by $R^9$ may have.

As the alkylene group represented by $R^{4''}$, a linear or branched alkylene group is preferable. The alkylene group preferably has 1 to 12 carbon atoms, more preferably has 1 to 5 carbon atoms, even more preferably has 1 to 3 carbon atoms, and particularly preferably has 1 or 2 carbon atoms.

Examples of the substituent that the alkylene group may have include the same ones (a halogen atom, an oxo group (=O), a cyano group, an alkyl group, an alkoxyalkyloxy group, an alkoxycarbonylalkyloxy group, —C(=O)—O—$R^{7'''}$, —O—C(=O)—$R^{8'''}$, —O—$R^{9'''}$, an aryl group, and the like) as exemplified in the description for $R^3$ as the substituent in the substituted alkylene group.

Examples of preferable cations represented by the Formula (ca-4) or (ca-5) include the following.

[Chemical Formula 91]

(ca-4-1)

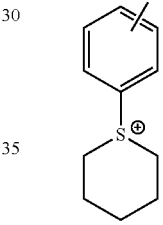

(ca-4-2)

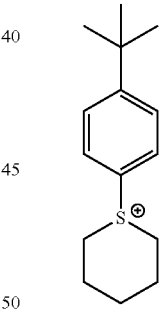

(ca-4-3)

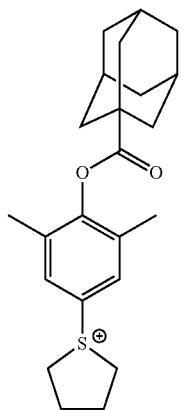

-continued

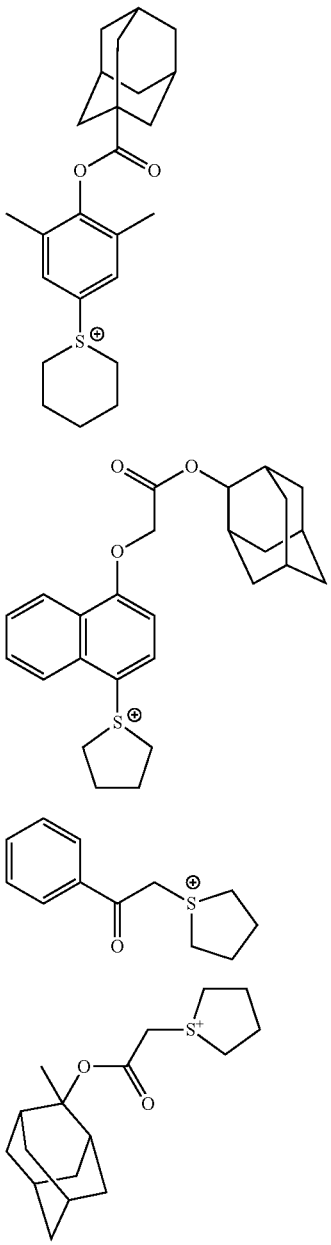

(ca-4-4)

(ca-4-5)

(ca-5-1)

(ca-5-2)

In Formula (ca-1), $R^d$ represents a substituent. Examples of the substituent include the same ones as the substituent exemplified as the substituent that the phenyl group, naphthyl group, or alkyl group represented by $R^9$ may have. The examples specifically include a halogen atom, an oxo group (=O), a cyano group, an alkyl group, an alkoxyalkyloxy group, an alkoxycarbonylalkyloxy group, —C(=O)—O—$R^{7'''}$, —O—C(=O)—$R^{8'''}$, —O—$R^{9'''}$, an aryl group, and the like. Each of $R^{7'''}$, $R^{8'''}$, and $R^{9'''}$ independently represents a hydrogen atom or a hydrocarbon group, and is preferably a hydrogen atom, a saturated hydrocarbon group, or an aliphatic unsaturated hydrocarbon group.

In the present invention, as the represents the organic cation represented by $M^+$, a cation having only one aromatic ring or having no aromatic ring just like $M^{m+}$ in the general formula (a0-2) is preferable.

Examples of the organic cation having only one aromatic ring or having no aromatic ring include the same ones as $M^{m+}$ in the general formula (a-2). Among these, the cation represented by the general formula (m-1) or (m-2) is preferable, the cation represented by the general formula (m-1) is more preferable, and the cation represented by the general formula (m-1), (m-12), (m-13), or (m-14) is particularly preferable.

One kind of the compound (D11) may be used alone, or two or more kinds thereof may be used in combination.

(Compound (D12))

—Anion Moiety

In Formula (d12), $R^{2c}$ represents a hydrocarbon group having 1 to 30 carbon atoms that may have a substituent.

The hydrocarbon group having 1 to 30 carbon atoms that may have a substituent and is represented by $R^{2c}$ may be an aliphatic hydrocarbon group or an aromatic hydrocarbon group, and examples thereof include the same ones as $R^{1c}$ in the Formula (d11).

Among these, the hydrocarbon group which may have a substituent and is represented by $R^{2c}$ is preferably an aliphatic cyclic group which may have a substituent, and is more preferably a group (which may have a substituent) in which one or more hydrogen atoms have been removed from adamantane, norbornane, isobornane, tricyclodecane, tetracyclodecane, or camphor.

Examples of the substituent that the hydrocarbon group represented by $R^{2c}$ may have include the same ones as exemplified as the substituent in $R^{4'''}$ in "$R^{4'''}SO_3^-$" exemplified in the description for $V^-$ in the general formula (a0-1). The examples specifically include a halogen atom, a hetero atom, an alkyl group, a group represented by Formula: $X^3$-Q'-[in the formula, Q' represents a divalent linking group containing an oxygen atom, and $X^3$ represents a hydrocarbon group having 3 to 30 carbon atoms that may have a substituent], and the like. Here, in $R^{2c}$, carbon adjacent to a S atom in $SO_3^-$ is not fluorinated. If $SO_3^-$ is not adjacent to a fluorine atom, the anion of the compound (D12) becomes an anion having suitably weak acidity, whereby quenching performance of the component (D) is improved.

Preferable and specific examples of the anion moiety of the compound (D12) will be shown below.

[Chemical Formula 92]

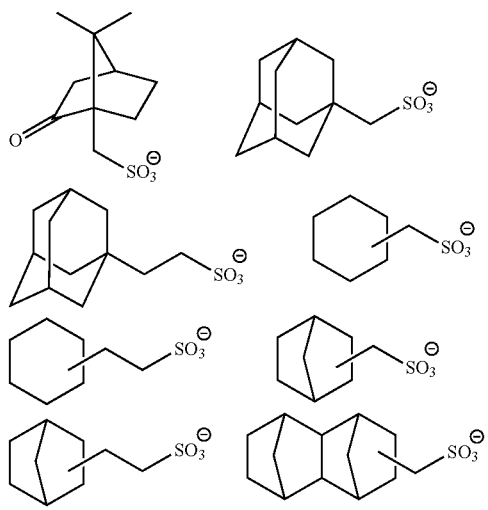

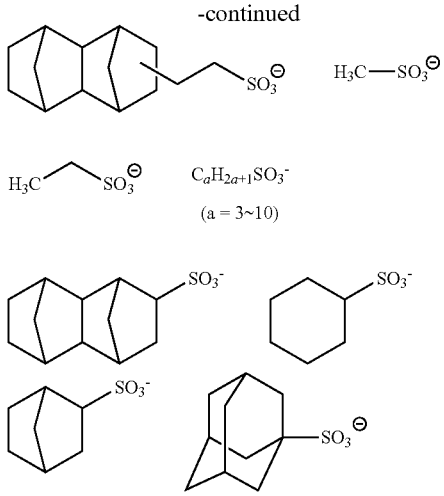

—Cation Moiety

In Formula (d12), $M^+$ is the same as $M^+$ in the Formula (d11).

One kind of the compound (D12) may be used alone, or two or more kinds thereof may be used in combination.

(Compound (D13))

—Anion Moiety

In Formula (d13), $R^{3c}$ represents an organic group.

The organic group represented by $R^{3c}$ is not particularly limited, but is preferably an alkyl group, an alkoxy group, —O—C(=O)—C($R^{C2}$)=CH$_2$ ($R^{C2}$ represents a hydrogen atom, an alkyl group having 1 to 5 carbon atoms, or a halogenated alkyl group having 1 to 5 carbon atoms), or —O—C(=O)—$R^{C3}$ ($R^{C3}$ represents a hydrocarbon group). The alkyl group represented by $R^{3c}$ is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, a neopentyl group, and the like. Part of the hydrogen atoms within the alkyl group for $R^2$ may each be substituted with a hydroxyl group or a cyano group or the like.

The alkoxy group represented by $R^{3c}$ is preferably an alkoxy group having 1 to 5 carbon atoms, and specific examples of the alkoxy group having 1 to 5 carbon atoms include a methoxy group, an ethoxy group, an n-propoxy group, an iso-propoxy group, an n-butoxy group, a tert-butoxy group, and the like. Among these, a methoxy group or an ethoxy group is particularly desirable.

In —O—C(=O)—C($R^{C2}$)=CH$_2$, $R^{C2}$ represents a hydrogen atom, an alkyl group having 1 to 5 carbon atoms, or a halogenated alkyl group having 1 to 5 carbon atoms.

The alkyl group of 1 to 5 carbon atoms for $R^{C2}$ is preferably a linear or branched alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group.

The halogenated alkyl group for $R^{C2}$ is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As $R^{C2}$, a hydrogen atom, an alkyl group of 1 to 3 carbon atoms or a fluorinated alkyl group of 1 to 3 carbon atoms is preferable, and a hydrogen atom or a methyl group is particularly desirable in terms of industrial availability.

In —O—C(=O)—$R^{C3}$, $R^{C3}$ represents a hydrocarbon group.

The hydrocarbon group for $R^{C3}$ may be either an aromatic hydrocarbon group or an aliphatic hydrocarbon group. Specific examples of the hydrocarbon represented by $R^{C3}$ include the same ones as $R^{1c}$ in the Formula (d11).

Among these, as the hydrocarbon group for $R^{C3}$, an alicyclic group (e.g., a group in which one or more hydrogen atoms have been removed from a cycloalkane such as cyclopentane, cyclohexane, adamantane, norbornane, isobornane, tricyclodecane or tetracyclododecane) or an aromatic group (e.g., a phenyl group or a naphthyl group) is preferable. When $R^{C3}$ is an alicyclic group, the resist composition can be satisfactorily dissolved in an organic solvent, thereby improving the lithography properties.

As $R^{3c}$, —O—C(=O)—C($R^{C2'}$)=CH$_2$ ($R^{C2'}$ represents a hydrogen atom or a methyl group) or —O—C(=O)—$R^{C3'}$ ($R^{C3'}$ represents an aliphatic cyclic group) is preferable.

In Formula (d13), $Y^3$ represents a linear, branched, or cyclic alkylene group or arylene group.

Examples of the linear or branched alkylene group represented by $Y^3$ include the same ones as the "linear or branched aliphatic hydrocarbon group" exemplified in the description for the divalent linking group represented by $Q^1$ in the Formula (a0-1).

Examples of the cyclic alkylene group represented by $Y^3$ include the same ones as the "cyclic aliphatic hydrocarbon group" exemplified in the description for the divalent linking group represented by $Q^1$ in the Formula (a0-1).

Examples of the arylene group represented by $Y^3$ include an arylene group in which two hydrogen atoms have been removed from the aromatic hydrocarbon ring exemplified in the description for the divalent linking group represented by $Q^1$ in Formula (a0-1).

Among these, as $Y^3$, an alkylene group is preferable, a linear or branched alkylene group is more preferable, and a methylene group or an ethylene group is still more preferable.

In Formula (d13), $R^{f3}$ represents a hydrocarbon group containing a fluorine atom.

The hydrocarbon group containing a fluorine atom and represented by $R^{f3}$ is preferably a fluorinated alkyl group, and more preferably the same ones as the fluorinated alkyl group exemplified in the description for $R^{1c}$.

Preferable and specific examples of the anion moiety of the compound (D13) will be shown below.

[Chemical Formula 93]

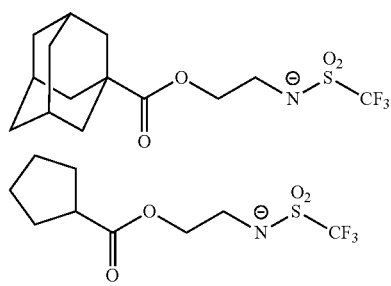

175
-continued
176
-continued
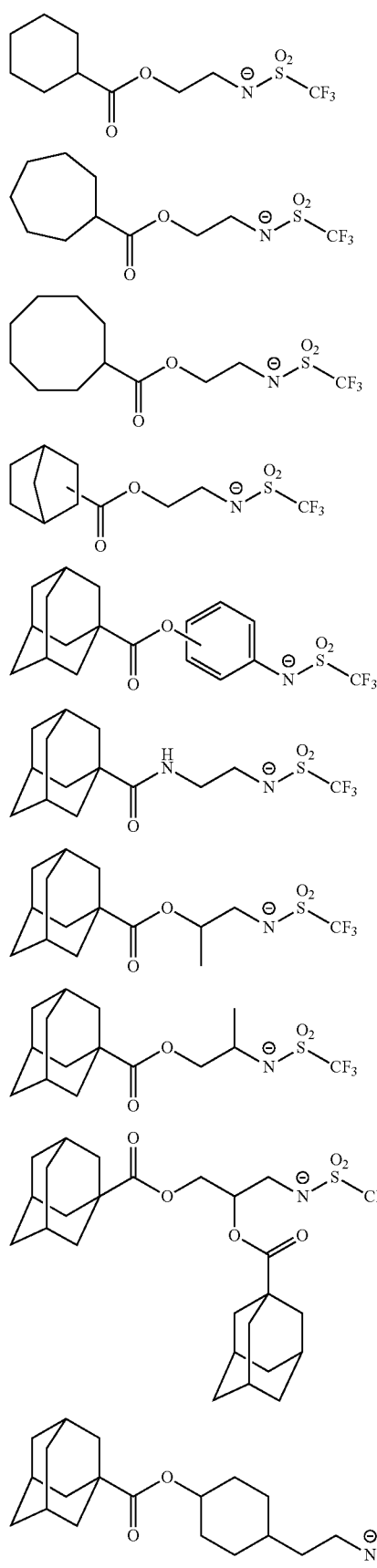
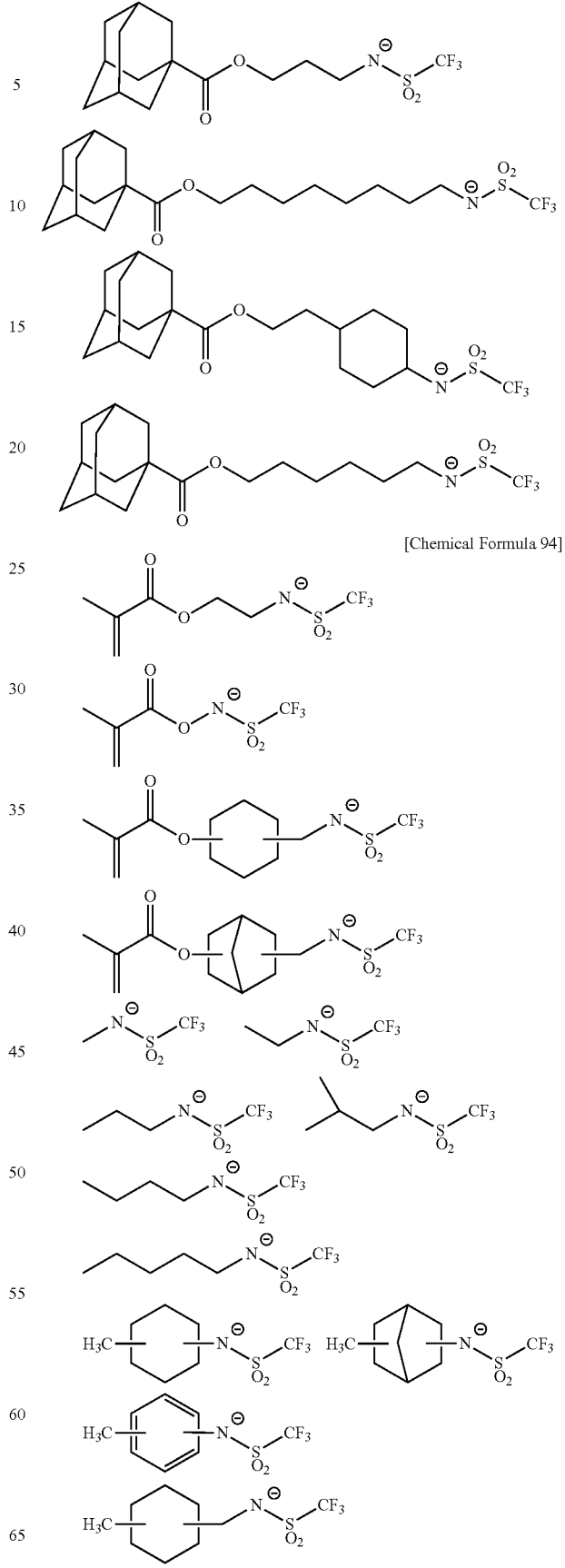
[Chemical Formula 94]

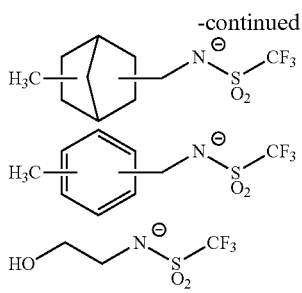

—Cation Moiety $M^+$ in Formula (d13) is the same as $M^+$ in the Formula (d11).

One kind of the compound (D13) may be used alone, or two or more kinds thereof may be used in combination.

As each of compounds (D11) to (D13), commercially available products may be used, or compounds synthesized by known production methods may be used.

The production method of the compounds (D11) and (D12) is not particularly limited, and the compounds can be produced by known methods.

The production method of the compound (D13) is not particularly limited. However, for example, when $R^{3c}$ in the Formula (d13) is a group having an oxygen atom on the terminal bonded to $Y^3$, the compound (i-1) represented by the following general formula (i-1) is reacted with the compound (i-2) represented by the following general formula (i-2) to obtain the compound (i-3) represented by the following general formula (i-3), and the compound (i-3) is reacted with $Z^-M^+$(i-4) having a desired cation $M^+$, whereby a target compound is produced.

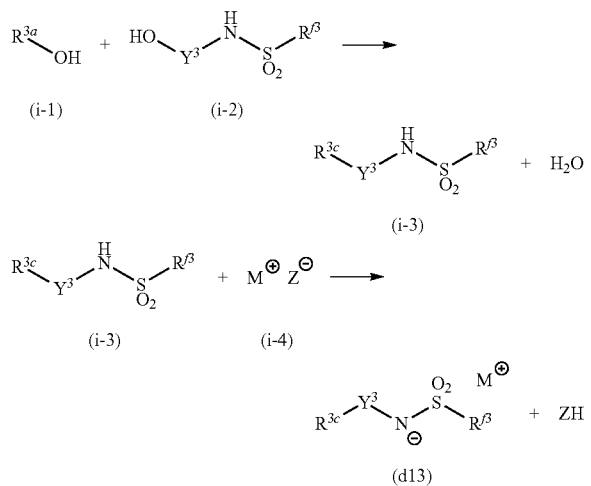

[Chemical Formula 95]

In the formula, each of $R^{3c}$, $Y^3$, $R^{f3}$, and $M^+$ is the same as $R^{3c}$, $Y^3$, $R^{f3}$, and $M^+$ in the general formula (d13). $R^{3a}$ is a group in which an oxygen atom on the terminal of $R^{3c}$ has been removed, and $Z^-$ represents a counteranion.

Firstly, the compound (i-1) is reacted with the compound (i-2), to thereby obtain the compound (i-3).

In Formula (i-1), $R^{3a}$ is a group in which an oxygen atom on the terminal of $R^{3c}$ has been removed. In Formula (i-2), $Y^3$ and $R^{f3}$ are the same as above.

As the compound (i-1) and the compound (i-2), commercially available compounds may be used, or the compounds may be synthesized.

The method for reacting the compound (i-1) with the compound (i-2) to obtain the compound (i-3) is not particularly limited, but can be performed, for example, by reacting the compound (i-1) with the compound (i-2) in an organic solvent in the presence of an appropriate acid catalyst, followed by washing and recovering the reaction mixture.

The acid catalyst used in the above reaction is not particularly limited, and examples thereof include toluenesulfonic acid and the like. The amount of the acid catalyst is preferably 0.05 to 5 moles, per 1 mole of the compound (i-2).

The organic solvent in the above reaction just needs to be able to dissolve the compounds (i-1) and (i-2) as raw materials, and specific examples thereof include toluene and the like. The amount of the solvent used in preferably 0.5 parts by weight to 100 parts by weight, and more preferably 0.5 parts by weight to 20 parts by weight, based on 1 part by weight of the compound (i-1). As a solvent, one type of solvent may be used alone, or two or more types of solvents may be used in combination.

Generally, the amount of the compound (i-2) used in the above reaction is preferably about 0.5 mol to 5 mol, and more preferably about 0.8 mol to 4 mol, based on 1 mol of the compound (i-1).

The reaction time depends on the reactivity of the compounds (i-1) and (i-2), the reaction temperature or the like. However, in general, the reaction time is preferably 1 to 80 hours, and more preferably 3 to 60 hours.

The reaction temperature in the above reaction is preferably 20 to 200° C., and more preferably 20 to 150° C.

Thereafter, the obtained compound (i-3) is reacted with the compound (i-4), thereby obtaining the compound (D13).

In formula (i-4), $M^+$ is the same as defined above, and $Z^-$ represents a counter anion.

The method of obtaining the compound (d1-3) by reacting the compound (i-3) with the compound (i-4) is not particularly limited. However, the method can be performed by, for example, dissolving the compound (i-3) in an appropriate organic solvent and water in the presence of an appropriate alkali metal hydroxide, and adding the compound (i-4) thereto, followed by stirring to causing a reaction.

The alkali metal hydroxide used in the above reaction is not particularly limited, and examples thereof include sodium hydroxide, potassium hydroxide and the like. The amount of the alkali metal hydroxide is preferably about 0.3 to 3 moles, per 1 mole of the compound (i-3).

Examples of the organic solvent in the above reaction include solvents such as dichloromethane, chloroform, and ethyl acetate, and the amount of the solvent used is preferably 0.5 parts by weight to 100 parts by weight, and more preferably 0.5 parts by weight to 20 parts by weight, based on the compound (i-3). As a solvent, one type of solvent may be used alone, or two or more types of solvents may be used in combination. Generally, the amount of the compound (i-4) used in the above reaction is preferably about 0.5 mole to 5 mol, and more preferably 0.8 mol to 4 mol, based on 1 mol of the compound (i-3).

The reaction time depends on the reactivity of the compounds (i-3) and (i-4), the reaction temperature or the like. However, in general, the reaction time is preferably 1 to 80 hours, and more preferably 3 to 60 hours.

The reaction temperature in the above reaction is preferably 20 to 200° C., and more preferably 20 to 150° C.

After the reaction ends, the compound (D13) in the reaction solution may be isolated and purified. The separation and purification can be conducted by a conventional method. For example, any one of concentration, solvent extraction, distillation, crystallization, recrystallization and chromatography can be used alone, or two or more of these methods may be used in combination.

The structure of the compound obtained in the above manner can be confirmed by general organic analysis methods such as $^1$H-nuclear magnetic resonance (NMR) spectrometry, $^{13}$C-NMR spectrometry, $^{19}$F-NMR spectrometry, infrared absorption (IR) spectrometry, mass spectrometry (MS), elementary analysis, and X-ray crystal diffractometry.

{Component (D2)}

The component (D2) is a basic compound not corresponding to the component (D1).

The component (D2) is not particularly limited as long as it is a compound which is basic relative to the component (A) or component (B), acts as an acid diffusion controller, that is, a quencher trapping an acid generated upon exposure from the component (A) or component (B), and does not correspond to the component (D1). Known compounds can be arbitrarily used as the component (D2). Examples include amines such as aliphatic amines and aromatic amines, and of these, an aliphatic amine, and particularly a secondary aliphatic amine or tertiary aliphatic amine, is preferable.

An aliphatic amine is an amine having one or more aliphatic groups, and the aliphatic groups preferably have 1 to 12 carbon atoms.

Examples of the aliphatic amine include amines (alkylamine or alkylalcoholamine) in which at least one hydrogen atom of ammonia NH$_3$ has been substituted with an alkyl group having 20 or less carbon atoms or a hydroxyalkyl group, cyclic amine, other aliphatic amines, and the like.

The alkyl group that the alkylamine has may be linear, branched, or cyclic.

When the alkyl group is a linear or branched group, the alkyl group preferably contains 2 to 20 carbon atoms, and more preferably 2 to 8 carbon atoms.

When the alkyl group is a cyclic group (namely, a cycloalkyl group), the cycloalkyl group preferably contains 3 to 30 carbon atoms, more preferably 3 to 20 carbon atoms, still more preferably 3 to 15 carbon atoms, still more preferably 4 to 12 carbon atoms, and most preferably 5 to 10 carbon atoms. The cycloalkyl group may be either monocyclic or polycyclic. Examples include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples of the monocycloalkane include cyclopentane and cyclohexane. Further, specific examples of the polycycloalkane include adamantane, norbornane, isobornane, tricyclodecane and tetracyclododecane.

Examples of the alkyl group in the hydroxyalkyl group that the alkylalcoholamine has include the same ones as exemplified as the alkyl group that the alkylamine has.

Specific examples of the alkylamine include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; and trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine.

Specific examples of the alkyl alcohol amine include diethanolamine, triethanolamine, diisopropanolamine, triisopropanolamine, di-n-octanolamine, tri-n-octanolamine, stearyldiethanolamine and lauryldiethanolamine.

Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine) or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples include 1,5-diazabicyclo[4.3.0]-5-nonene, 1,8-diazabicyclo[5.4.0]-7-undecene, hexamethylenetetramine and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyetoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethylamine, triethanolamine triacetate, and the like.

Examples of the aromatic amine include aniline, pyridine, 4-dimethylaminopyridine, pyrrole, indole, pyrazole, imidazole and derivatives thereof, as well as diphenylamine, triphenylamine, tribenzylamine, 2,6-diisopropylaniline and N-tert-butoxycarbonylpyrrolidine.

Any one kind of the component (D2) may be used alone, or two or more kinds thereof may be used in combination.

The resist composition of the present invention preferably contains the component (D1) as the component (D), since the component is excellent in lithography properties such as roughness. As the component (D1), any one kind among the compounds (D1) to (D13) may be used alone, or two or more kinds thereof may be used concurrently. Among these, the resist composition preferably contains the component (D12).

The content of the component (D1) is preferably 0.5 parts by weight to 10.0 parts by weight, more preferably 0.5 parts by weight to 8.0 parts by weight, even more preferably 1.0 parts by weight to 8.0 parts by weight, and particularly preferably 1.5 parts by weight to 5.5 parts by weight, based on 100 parts by weight of the component (A). If the content is equal to or more than the lower limit of the above range, lithography properties such as resolution, roughness, and exposure latitude are further improved. Furthermore, a favorable resist pattern shape can be obtained. On the other hand, when the amount of the component (C) is not more than the upper limit of the above range, sensitivity can be maintained at a satisfactory level, and throughput can be improved.

When the resist composition of the present invention contains the component (D2), the component (D2) is used generally in a range of from 0.01 parts by weight to 5.0 parts by weight, based on 100 parts by weight of the component (A). When the amount of the component (D2) is within the above-mentioned range, the shape of the resist pattern and the post exposure stability of the latent image formed by the patternwise exposure of the resist layer are improved.

[Component (A")]

The resist composition of the present invention may further contain a base component (A") (hereinafter, referred to as a component (A")) which does not correspond to the component (A) and exhibits changed solubility in a developing solution by the action of acid, within a range that does not diminish the effects of the present invention.

The component (A") may be a base component which exhibits changed solubility in a developing solution by the action of acid, or a base component which exhibits decreased solubility in a developing solution by the action of acid. However, when the component (A) is a component which exhibits increased solubility in a developing solution by the action of acid, the component (A") which exhibits increased solubility in a developing solution by the action of acid is used. When the component (A) is a component which exhibits decreased solubility in a developing solution by the action of acid, the component (A") which exhibits decreased solubility in a developing solution by the action of acid is used.

The component (A") is not particularly limited, and may be used by being arbitrarily selected from various base resins (for the ArF excimer laser or the KrF excimer laser (preferably for the ArF excimer laser), for example) known as the base component of the chemically amplified resist composition in the related art.

As the component (A"), a resin or a low-molecular weight compound may be used, or a resin and the compound may be used concurrently.

One kind of the component (A") may be used alone, or two or more kinds thereof may be used in combination.

[Component (B)]

The resist composition of the present invention may further contain the acid-generator component (B) (hereinafter, referred to as a component (B)), which does not correspond to the component (A) and generates an acid upon exposure, within a range that does not diminish the effect of the present invention.

There are no particular limitations on the component (B), and any of the known acid generators proposed for use in conventional chemically amplified resist compositions can be used. Examples of these acid generators are numerous, and include onium salt acid generators such as iodonium salts and sulfonium salts, oxime sulfonate acid generators, diazomethane acid generators such as bisalkyl or bisaryl sulfonyl diazomethanes and poly(bis-sulfonyl)diazomethanes, nitrobenzylsulfonate acid generators, iminosulfonate acid generators, and disulfone acid generators.

Examples of onium salt acid generators include compounds represented by a general formula (b-1) or (b-2) shown below.

[Chemical Formula 96]

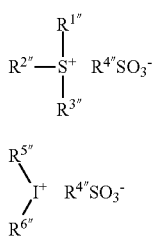

In the formula, each of $R^{1\prime\prime}$ to $R^{3\prime\prime}$ and $R^{5\prime\prime}$ and $R^{6\prime\prime}$ independently represents an aryl group, an alkyl group, or an alkenyl group which may have a substituent. Two of $R^{1\prime\prime}$ to $R^{3\prime\prime}$ in Formula (b-1) may be bonded to each other to form a ring with a sulfur atom in the formula. $R^{4\prime\prime}$ represents an alkyl group, a halogenated alkyl group, an aryl group, or an alkenyl group which may have a substituent.

Each of $R^{1\prime\prime}$ to $R^{3\prime\prime}$ in Formula (b-1) and $R^{5\prime\prime}$ and $R^{6\prime\prime}$ in Formula (b-2) is the same as $R^{1\prime\prime}$ to $R^{3\prime\prime}$ in Formula (ca-1) and $R^{5\prime\prime}$ and $R^{6\prime\prime}$ in Formula (ca-2) exemplified in the description for $M^+$, in the component (D1).

$R^{4\prime\prime}SO_3^-$ in Formulae (b-1) and (b-2) is the same as $R^{41}SO_3^-$ exemplified in the description for $V^-$ in general formula (a0-1), in the structural unit (a0).

In addition, as the onium salt acid generator, onium salt acid generators in which the anion moiety ($R^{4\prime\prime}SO_3^-$) in the general formula (b-1) or (b-2) has been substituted with the anion moiety represented by the general formula (b-3) or (b-4) can also be used (cation moiety is the same as in (b-1) or (b-2)).

In the present description, an oxime sulfonate acid generator is a compound having at least one group represented by a general formula (B-1) shown below, and has a feature of generating acid upon irradiation. Such oxime sulfonate acid generators are widely used for chemically amplified resist compositions, and any of these known compounds may be selected as appropriate.

[Chemical Formula 97]

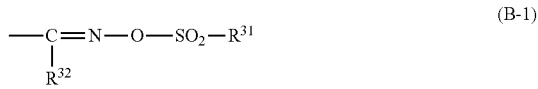

In the formula (B-1), each of $R^{31}$ and $R^{32}$ independently represents an organic group.

The organic group for $R^{31}$ and $R^{32}$ refers to a group containing a carbon atom, and may also include atoms other than the carbon atom (such as a hydrogen atom, oxygen atom, nitrogen atom, sulfur atom or halogen atom (such as a fluorine atom or chlorine atom) or the like).

The organic group for $R^{31}$ is preferably a linear, branched or cyclic alkyl group, or an aryl group. The alkyl group or aryl group may have a substituent. There are no particular limitations on the substituent, and examples include a fluorine atom or a linear, branched or cyclic alkyl group having 1 to 6 carbon atoms. The expression that the alkyl group or aryl group "may have a substituent" means that part or all of the hydrogen atoms of the alkyl group or aryl group may each be substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereafter sometimes referred to as a "halogenated alkyl group") is particularly desirable. A "partially halogenated alkyl group" refers to an alkyl group in which part of the hydrogen atoms are each substituted with a halogen atom, whereas a "completely halogenated alkyl group" refers to an alkyl group in which all of the hydrogen atoms are substituted with halogen atoms. Examples of the halogen atom include a fluorine atom, chlorine atom, bromine atom or iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. A "partially halogenated aryl group" refers to an aryl group in which part of the hydrogen atoms are each substituted with a halogen atom, whereas a "completely halogenated aryl group" refers to an aryl group in which all of hydrogen atoms are substituted with halogen atoms.

As the organic group for $R^{31}$, an alkyl group of 1 to 4 carbon atoms which has no substituent, or a fluorinated alkyl group of 1 to 4 carbon atoms is particularly desirable.

The organic group for $R^{32}$ is preferably a linear, branched or cyclic alkyl group, an aryl group, or a cyano group. Examples of the alkyl group and the aryl group for $R^{32}$ include the same alkyl groups and aryl groups as those described above for $R^{31}$.

As the organic group for $R^{32}$, a cyano group, an alkyl group of 1 to 8 carbon atoms having no substituent, or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 98]

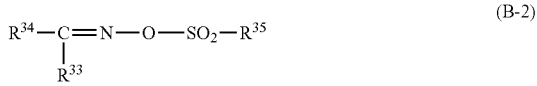
(B-2)

In the formula (B-2), $R^{33}$ represents a cyano group, an alkyl group having no substituent or a halogenated alkyl group, $R^{34}$ represents an aryl group, and $R^{35}$ represents an alkyl group having no substituent or a halogenated alkyl group.

[Chemical Formula 99]

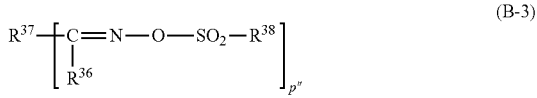
(B-3)

In the formula (B-3), $R^{36}$ represents a cyano group, an alkyl group having no substituent or a halogenated alkyl group, $R^{37}$ represents a divalent or trivalent aromatic hydrocarbon group, $R^{38}$ represents an alkyl group having no substituent or a halogenated alkyl group, and p" represents 2 or 3.

In the general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

$R^{33}$ is preferably a halogenated alkyl group, and more preferably a fluorinated alkyl group.

The fluorinated alkyl group for $R^{33}$ preferably has 50% or more of the alkyl group hydrogen atoms fluorinated, more preferably 70% or more fluorinated, and most preferably 90% or more fluorinated.

Examples of the aryl group for $R^{34}$ include groups in which one hydrogen atom has been removed from an aromatic hydrocarbon ring, such as a phenyl group, biphenylyl group, fluorenyl group, naphthyl group, anthryl group and phenanthryl group, and heteroaryl groups in which part of the carbon atoms that constitute the ring(s) of these groups are substituted with a hetero atom such as an oxygen atom, a sulfur atom or a nitrogen atom. Of these, a fluorenyl group is preferable.

The aryl group for $R^{34}$ may have a substituent such as an alkyl group, a halogenated alkyl group or an alkoxy group of 1 to 10 carbon atoms. The alkyl group or halogenated alkyl group as the substituent preferably contains 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably contains 1 to 10 carbon atoms, more preferably 1 to 8 carbon atoms, and most preferably 1 to 6 carbon atoms.

$R^{35}$ is preferably a halogenated alkyl group, and more preferably a fluorinated alkyl group.

In terms of enhancing the strength of the acid generated, the fluorinated alkyl group for $R^{35}$ preferably has 50% or more of the hydrogen atoms within the alkyl group fluorinated, more preferably 70% or more fluorinated, and still more preferably 90% or more fluorinated. A completely fluorinated alkyl group in which 100% of the hydrogen atoms have been substituted with fluorine atoms is particularly desirable.

In the general formula (B-3), examples of the alkyl group having no substituent and the halogenated alkyl group for $R^{36}$ include the same groups as those described above for the alkyl group having no substituent and the halogenated alkyl group for $R^{33}$.

Examples of the divalent or trivalent aromatic hydrocarbon group for $R^{37}$ include groups in which an additional one or two hydrogen atoms have been removed from the aryl group described above for $R^{34}$.

Examples of the alkyl group having no substituent or the halogenated alkyl group for $R^{38}$ include the same groups as those described above for the alkyl group having no substituent or the halogenated alkyl group for $R^{35}$.

p" is preferably 2.

Specific examples of suitable oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 9-208554 (Chemical Formulas 18 and 19 shown in paragraphs [0012] to [0014]) and oxime sulfonate acid generators disclosed in WO 2004/074242A2 (Examples 1 to 40 described on pages 65 to 86) may also be used favorably.

Furthermore, the following compounds may also be used as preferred examples.

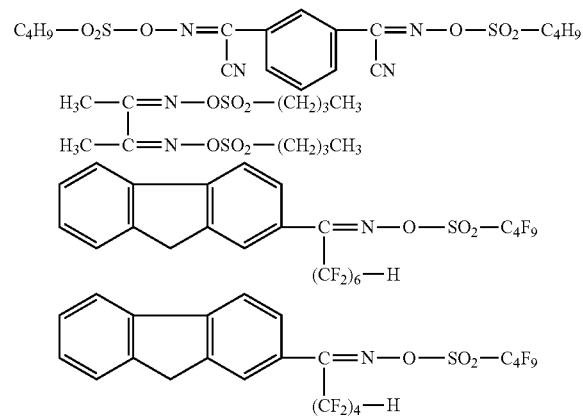

[Chemical Formula 100]

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, examples of poly(bis-sulfonyl)diazomethanes include those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethyl sulfonyl)propane, 1,6-bis(cyclohexylsulfonyldiazomethylsulfonyl)hexane, and 1,10-bis(cyclohexylsulfonyldiazomethylsulfonyl)decane.

As the component (B), one type of acid generator described above may be used alone, or two or more types may be used in combination.

The content of the component (B) in the resist composition of the present invention is preferably 0 part by weight to 60 parts by weight, more preferably 0 part by weight to 40 parts by weight, and even more preferably 0 part by weight to 10 parts by weight, based on 100 parts by weight of the component (A). If the content is 40 parts by weight or less, this is preferable because when the respective components of the resist composition are dissolved in an organic solvent, a uniform solution is obtained, and storage stability becomes excellent. Particularly, when the content is 10 parts by weight or less, deterioration of lithography properties caused by the OoB light can be inhibited, and high sensitivity can be realized, in balance.

[Component (E)]

For the purpose of preventing sensitivity deterioration, improving the resist pattern shape, the post exposure stability of the latent image formed by the pattern-wise exposure of the resist layer, or the like, the resist composition of the present invention can further contain, as an arbitrary component, at least one kind of compound (E) (hereinafter, referred to as a component (E)) selected from the group consisting of an organic carboxylic acid and a phosphorus oxo acid or a derivative thereof.

Examples of the organic carboxylic acids include acetic acid, malonic acid, citric acid, malic acid, succinic acid, benzoic acid, and salicylic acid.

Examples of the phosphorus oxo acids include phosphoric acid, phosphonic acid and phosphinic acid. Among these, phosphonic acid is particularly desirable.

Examples of the oxo acid derivatives include esters in which a hydrogen atom within an aforementioned oxo acid is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphate esters such as di-n-butyl phosphate and diphenyl phosphate.

Examples of phosphonic acid derivatives include phosphonate esters such as dimethyl phosphonate, di-n-butyl phosphonate, phenyl phosphonate, diphenyl phosphonate and dibenzyl phosphonate.

Examples of phosphinic acid derivatives include phosphinate esters and phenylphosphinic acid.

As the component (E), one type of compound may be used alone, or two or more types of compounds may be used in combination.

Generally, the component (E) is used in a range of from 0.01 parts by weight to 5.0 parts by weight based on 100 parts by weight of the component (A).

If desired, miscible additives, for example, additive resins for improving the performance of the resist film, surfactants for improving the applicability, dissolution inhibitors, plasticizers, stabilizers, colorants, halation prevention agents, and dyes can be added to the resist composition of the present invention.

The resist composition of the present invention can be produced by dissolving materials in an organic solvent (hereinafter, referred to as a component (S) in some cases).

The component (S) may be any organic solvent which can dissolve the respective components to give a uniform solution, and one or more kinds of any organic solvent can be appropriately selected from those which have been conventionally known as organic solvents for chemically amplified resists.

Examples of the component (S) include lactones such as γ-butyrolactone; ketones such as acetone, methyl ethyl ketone, cyclohexanone, methyl-n-pentyl ketone, methyl isopentyl ketone and 2-heptanone; polyhydric alcohol derivatives, including compounds having an ester bond such as ethylene glycol monoacetate, diethylene glycol monoacetate, propylene glycol monoacetate and dipropylene glycol monoacetate, and compounds having an ether bond, such as a monoalkyl ether (such as a monomethyl ether, monoethyl ether, monopropyl ether or monobutyl ether) or a monophenyl ether of any of the above polyhydric alcohols or compounds having an ester bond [among these derivatives, propylene glycol monomethyl ether acetate (PGMEA) and propylene glycol monomethyl ether (PGME) are preferred]; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene.

These organic solvents may be used individually, or as a mixed solvent containing two or more solvents.

Among these, propylene glycol monomethyl ether acetate (PGMEA), propylene glycol monomethyl ether (PGME), and EL are preferable.

Further, among the mixed solvents, a mixed solvent obtained by mixing PGMEA with a polar solvent is preferable. The mixing ratio (weight ratio) of the mixed solvent may be determined as appropriate, with due consideration of the compatibility of the PGMEA with the polar solvent, but is preferably within a range from 1:9 to 9:1, and more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably from 3:7 to 7:3. Furthermore, when a combination of PGME and cyclohexanone is mixed as the polar solvent, the PGMEA:(PGME+cyclohexanone) weight ratio is preferably from 1:9 to 9:1, more preferably from 2:8 to 8:2, and still more preferably from 3:7 to 7:3.

Further, as the component (S), a mixed solvent of PGMEA, EL or an aforementioned mixed solvent of PGMEA and a polar solvent, with γ-butyrolactone is also preferable. In this case, the mixing ratio (former:latter) of the mixed solvent is preferably from 70:30 to 95:5.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range from 1 to 20% by weight, and preferably from 2 to 15% by weight.

The resist composition of the present invention can form a high-resolution pattern with an excellent shape which exhibits a small degree of roughness and a high degree of rectangularity of a cross-sectional shape (a high degree of verticality of a side wall of the pattern). Moreover, a high degree of stability is maintained against the fluctuation of the PEB temperature, and the pattern size changes less even when the PEB temperature fluctuates. In addition, the resist composition of the present invention is also excellent in other lithography properties, for example, the exposure latitude at the time when a resist pattern is formed.

It is considered that this results from the synergistic action of the following points including: since the resist composition contains a polycyclic acid-decomposable group, heat resistance is improved compared to a case where the composition contains only a monocyclic acid-decomposable group; since the resist composition contains a monocyclic acid-decomposable group, roughness is reduced, and stability against the fluctuation of the PEB temperature is improved, compared to a case where the composition contains only a polycyclic acid-decomposable group; since the structural unit (a0) containing an acid-generating moiety is introduced into the resin component, acid-generating moieties are evenly distributed into a resist film; since the cation moiety that the structural unit (a0) has does not contain any aromatic ring or contains only one aromatic ring which absorbs light of a wavelength of the DUV region, particularly, light having a wavelength of 150 nm to 300 nm, the structural unit does not easily absorb exposure light compared to a low-molecular weight acid-generator component widely used in the related art, for example, a triphenylsulfonium salt, and the formed resist film exhibits a high degree of transparency with respect to the DUV light; since the structural unit (a0) is introduced into the resin component, diffusion of acid is inhibited.

Particularly, when the exposure light source is EUV, it is considered that since the cation moiety that the structural unit (a0) has does not contain any aromatic ring or contains only one aromatic ring, negative influences (deterioration of optical contrast, generation of acid in an unexposed portion, change in solubility in a developing solution accompanied by the generation of acid, and the like) resulting from the phenomenon that light of the DUV region included in the OoB light generated from the EUV light source enters an unexposed portion, or electrons are diffused (scattered) onto the surface of the resist film during EB exposure is also inhibited.

In addition, in EB lithography, depending on the condition of electron beam irradiation, such as acceleration voltage, electrons are diffused (scattered) onto the surface of the resist film, and this leads to the same problem as in the case of OoB light in the above EUV lithography in some cases. However, it is considered that, as described above, since the cation moiety that the structural unit (a0) has does not contain any aromatic ring or contains only one aromatic ring, negative influences resulting from the diffusion of electrons are inhibited.

Further, in the DUV region, the acid-generating moiety is decomposed due to the light absorption of the cation moiety. Accordingly, in the present invention, if the cation moiety of the acid-generating moiety in the structural unit (a0) does not contain any aromatic ring or contains only one aromatic ring, the above effects are obtained regardless of the number of the aromatic ring of the anion moiety.

Moreover, the fact that the resist composition contains a polycyclic acid-decomposable group also contributes to the reduction in outgas in the EUV or EB lithography.

Accordingly, the resist composition of the present invention is particularly useful for EUV or EB.

The words "for EUV or EB" means that formation of a resist pattern using the resist composition is performed using EUV (extreme ultraviolet radiation) or EB (electron beams) as an exposure light source (radiation source).

<<Method of Forming Resist Pattern>>

The method of forming a resist pattern of the present invention includes a step of forming a resist film on a substrate by using the resist composition of the present invention, a step of exposing the resist film, and a step of forming a resist pattern by developing the resist film.

The method for forming a resist pattern according to the present invention can be performed, for example, as follows.

First, the resist composition of the present invention is applied onto a substrate by using a spinner or the like, and baking treatment (post apply baking (PAB)) is performed under a temperature condition of, for example, 80° C. to 150° C. for 40 seconds to 120 seconds and preferably for 60 seconds to 90 seconds, thereby forming a resist film.

Thereafter, the resist film is exposed through a mask (mask pattern) in which a predetermined pattern has been formed, by using an exposure apparatus such as an ArF exposure apparatus, a KrF excimer laser exposure apparatus, an EB (electron beam) drawing apparatus, or an EUV exposure apparatus, or selectively exposed by drawing performed by direct irradiation of EB without using a mask pattern, and then baking (post exposure baking (PEB)) treatment is performed under a temperature condition of, for example, 80° C. to 150° C. for 40 seconds to 120 seconds and preferably for 60 seconds to 90 seconds.

Subsequently, the resulting resist film is subjected to developing treatment. In the case of alkali developing process, alkali developing treatment is performed using an alkali developing solution, for example, a 0.1% by weight to 10% by weight aqueous tetramethylammonium hydroxide (TMAH) solution. In the case of solvent developing process, developing treatment is performed using an organic solvent. As the organic solvent, any of the conventional organic solvents can be used which are capable of dissolving the component (A) (prior to exposure). Specific examples of the organic solvent include polar solvents such as ketone solvents, ester solvents, alcohol solvents, amide solvents and ether solvents, and hydrocarbon solvents. Among these, ester solvents are preferable. As an ester solvent, butyl acetate is preferable.

After the developing treatment, it is preferable to conduct a rinse treatment. In the case of an alkali developing process, it is preferable to conduct a water rinse using pure water. In the case of a solvent developing process, it is preferable to use a rinse liquid containing the aforementioned organic solvent.

Thereafter, drying is conducted. If desired, bake treatment (post bake) can be conducted following the developing.

A resist pattern can be obtained in this manner. The resist composition of the present invention is particularly suitably used as a method of forming a positive resist pattern by an alkali developing process.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is a method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition is highly useful for a KrF excimer laser, an ArF excimer laser, EVU, or EB, and particularly, for EUV or EB.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro (2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

As examples of the alkali developing solution for developing treatment in an alkali developing process, a 0.1 to 10% by weight aqueous solution of tetramethylammonium hydroxide (TMAH) can be given.

The organic solvent within the organic developing solution that is used in the solvent developing process may be selected appropriately from among any of the conventional solvents capable of dissolving the component (A) (the component (A) prior to exposure). Specific examples of organic solvents that may be used include polar solvents such as ketone-based solvents, ester-based solvents, alcohol-based solvents, amide-based solvents and ether-based solvents, and hydrocarbon solvents.

Conventional additives may be added to the organic developing solution as required. Examples of these additives include surfactants. There are no particular limitations on the surfactants, and ionic or nonionic fluorine-based and/or silicon-based surfactants can be used.

In those cases where a surfactant is added, the amount added of the surfactant, relative to the total weight of the organic developing solution, is typically within a range from 0.001 to 5% by weight, preferably from 0.005 to 2% by weight, and more preferably from 0.01 to 0.5% by weight.

The developing treatment can be performed using a conventional developing method. Examples of developing methods that may be used include methods in which the substrate is dipped in the developing solution for a predetermined period of time (dipping methods), methods in which the developing solution is placed and held on the surface of the substrate by surface tension for a predetermined period of time (puddle methods), methods in which the developing solution is sprayed onto the substrate surface (spray methods), and methods in which the substrate is spun at a constant rate, and a developing solution discharge nozzle is then scanned across the substrate at a constant rate while the developing solution is discharged from the nozzle (dynamic dispensing methods).

Examples of the organic solvent contained within the rinse liquid used for the rinse treatment performed following a solvent developing process include those organic solvents among the solvents described above for the organic solvent of the organic developing solution which exhibit poor dissolution of the resist pattern. Examples of typical solvents that may be used include one or more solvents selected from among hydrocarbon solvents, ketone-based solvents, ester-based solvents, alcohol-based solvents, amide-based solvents and ether-based solvents. Among these, at least one solvent selected from among hydrocarbon solvents, ketone-based solvents, ester-based solvents, alcohol-based solvents and amide-based solvents is preferred, at least one solvent selected from among alcohol-based solvents and ester-based solvents is more preferred, and an alcohol-based solvent is particularly desirable.

The rinse treatment (washing treatment) using a rinse liquid may be performed using a conventional rinse method. Examples of methods that may be used include methods in which the rinse liquid is discharged continuously onto the substrate while the substrate is spun at a constant rate (spin coating methods), methods in which the substrate is dipped in the rinse liquid for a predetermined period of time (dipping methods) and methods in which the rinse liquid is sprayed onto the substrate surface (spray methods).

EXAMPLES

A more detailed description of the present invention is presented below based on a series of examples, although the present invention is in no way limited by these examples.

In the present example, the compound indicated as (2a) in a chemical formula is described as a "compound (2a)", and compounds represented by other formulae are described in the same manner as above in some cases.

In the NMR analysis, the internal standard for $^1$H-NMR and $^{13}$C-NMR is tetramethylsilane (TMS). The internal standard for $^{19}$F-NMR is hexafluorobenzene (here, the peak of hexafluorobenzene is regarded as −160 ppm).

Polymer Synthesis Example 1

Synthesis of Copolymer 23

In a separable flask provided with a thermometer, a reflux tube, and a nitrogen feeding tube, 22.46 g (132.0 mmol) of a compound (2a), 17.31 g (66.0 mmol) of a compound (11c), 11.10 g (66.0 mmol) of a compound (12a), and 17.73 g (36.0 mmol) of a compound (0a) were dissolved in 147.76 g of a mixed solution of methyl ethyl ketone/cyclohexanone (MEK/CH). As a polymerization initiator, 27.30 mmol of dimethyl azobisisobutyrate (V-601) was added to and dissolved in the above solution. The resultant was added dropwise to 81.79 g of a MEK/CH mixed solution in a nitrogen atmosphere for 4 hours. Following completion of the dropwise addition, the reaction solution was stirred under heat for one hour, and the reaction solution was then cooled to room temperature. The obtained reaction polymer solution was added dropwise to a large amount of n-heptane to precipitate a polymer, and the precipitated white powder was separated by filtration, washed with methanol, followed by drying, thereby obtaining 76.28 g of a copolymer 23'.

Subsequently, 76.28 g of the copolymer 23' was put into an eggplant-shaped flask, and 15.10 g of the compound (c-1), 305 g of MEK, and 305 g of water were added thereto, followed by stirring for 30 minutes to perform salt exchange. Thereafter, the organic layer was extracted, and the extracted organic layer was washed with water, and the solvent was evaporated, thereby obtaining 64.84 g of a copolymer 23.

The weight average molecular weight (Mw) and the molecular weight dispersity (Mw/Mn) of the copolymer 23 measured by GPC were 12,600 and 1.75 respectively in terms of the polystyrene equivalent value. In addition, a compositional ratio of the copolymer (proportion (molar ratio) of the respective structural units in the structural formula) measured by carbon 13 nuclear magnetic resonance spectroscopy (600 MHz_$^{13}$C-NMR) was l/m/n/o=42.7/21.4/23.1/12.8.

Moreover, the compound (c-1) used for salt exchange was synthesized in the Cation synthesis example 1 described later.

[Chemical Formula 101]

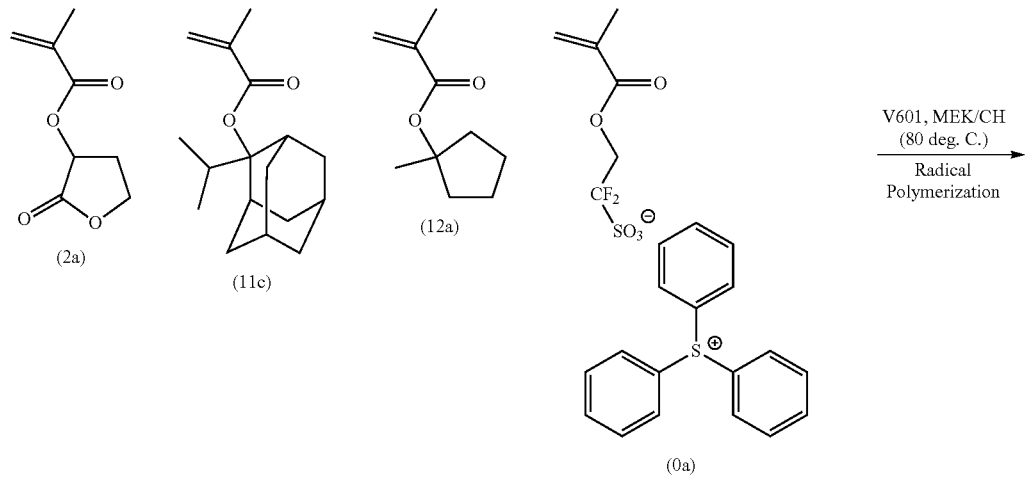

-continued

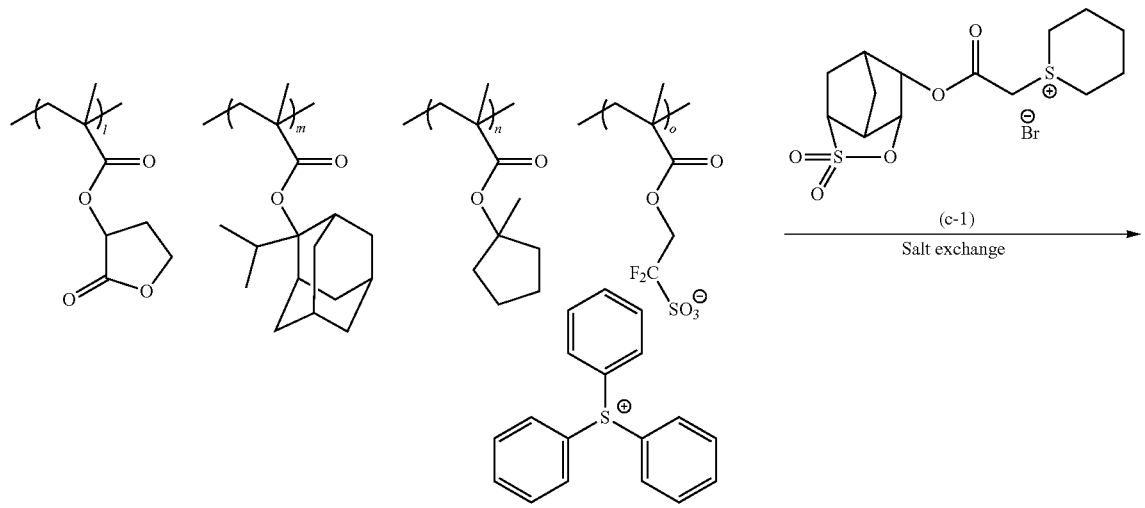

Copolymer 23'

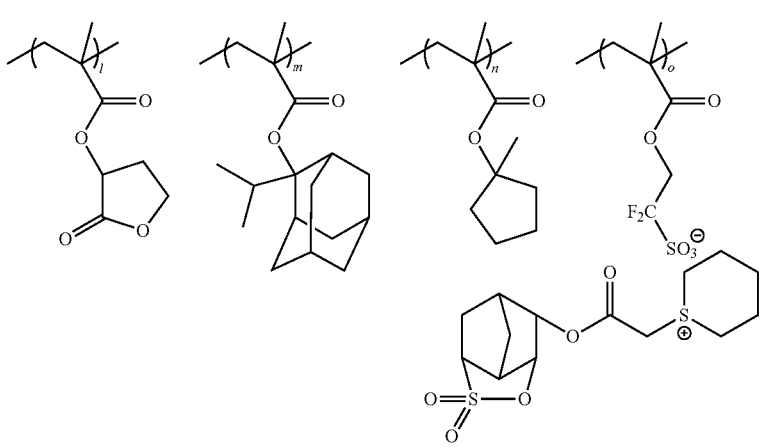

Copolymer 23

Cation Synthesis Example 1

Synthesis of Compound (c-1)

In a nitrogen atmosphere, 4.3 g of a compound (5) was dissolved in 21.6 g of acetonitrile, and 2.0 g of heptahydrothiophene was added dropwise thereto, followed by stirring for 12 hours at 25° C. Thereafter, the precipitated white powder was separated and collected by suction filtration, washed with 11.3 g of acetonitrile, and dried under reduced pressure, thereby obtaining 2.9 g of the compound (c-1).

NMR measurement was performed on this compound, and the structure thereof was identified from the following results.

$^1$H-NMR (400 MHz, DMSO-$d_6$+$D_2$O): δ (ppm)=5.1 (t, 2H, CH), 4.6 (t, 2H, CH), 4.3 (s, 1H, CH$_2$), 3.9 (m, 3H, CH), 3.6-3.8 (t, 2H, SCH$_2$), 3.4 (t, 2H, CH$_2$), 2.9 (m, 5H, CH), 2.4 (4H, CH), 2.0 (t, 2H, CH$_2$), 1.7-1.9 (m, 3H, CH$_2$CH$_2$), 1.2-1.4 (m, 4H, CH$_2$CH$_2$CH$_2$)

[Chemical Formula 102]

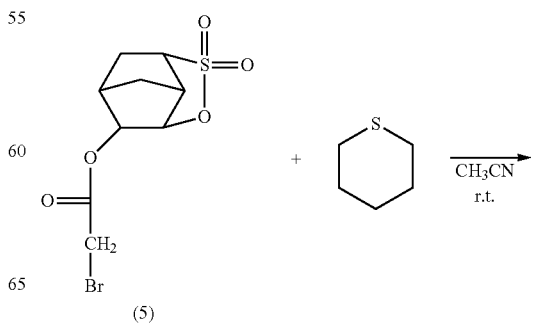

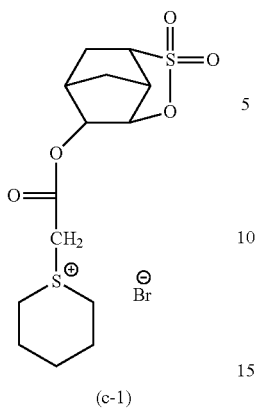

(c-1)

Polymer Synthesis Examples 2 to 51

Synthesis of Copolymers 1 to 22, 24 to 43, and 1' to 8'

Copolymers 1 to 22, 24 to 43, and 1' to 7' were obtained in the same manner as in the above "Polymer synthesis example 1", except that the following compounds were used as monomers in the content ratio (molar ratio) shown in Tables 1 to 6 in the step of synthesizing the copolymer 23' in the above "Polymer synthesis example 1", and a compound for salt exchange (one of the following compounds (c-2) to (c-7)) having a target cation was used instead of the compound (c-1) in the following step of salt exchange.

The copolymer 8' was synthesized in the same manner as the copolymer 23'.

[Chemical Formula 103]

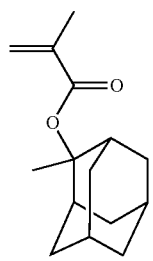

(11a)

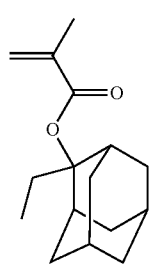

(11b)

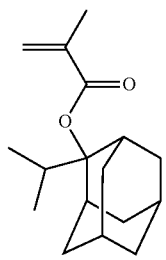

(11c)

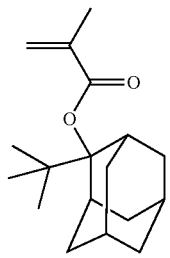

(11d)

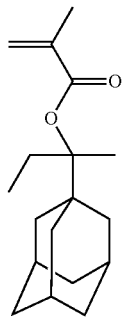

(11e)

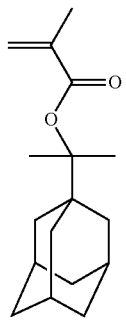

(11f)

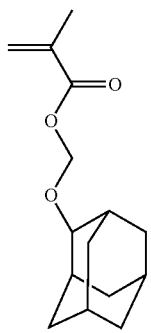

(11g)

-continued
(11h)
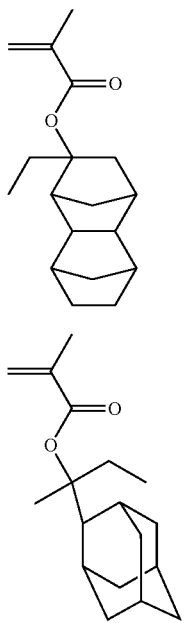
(11i)
[Chemical Formula 104]
(12e)
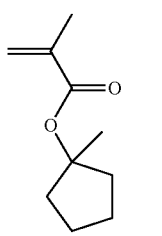
(12b)
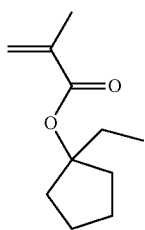
(12c)
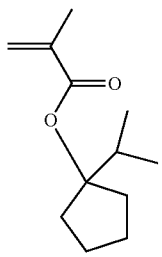
(12d)
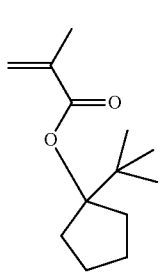
-continued
(12e)
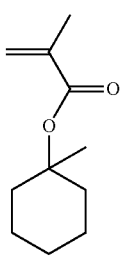
(12f)
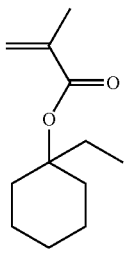
(12g)
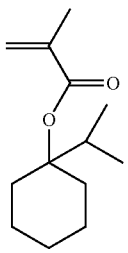
(12h)
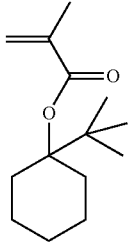
(12i)
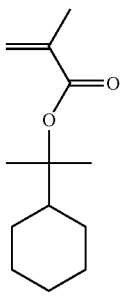
(12k)
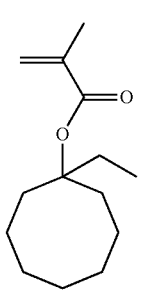

(13a)
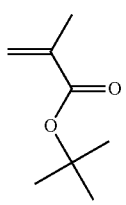
[Chemical Formula 105]
(2a)
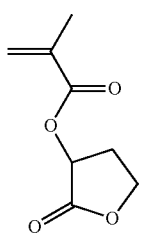
(2b)
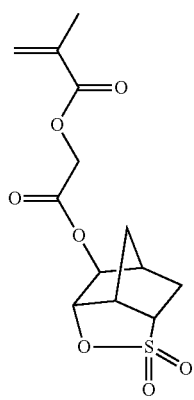
(2c)
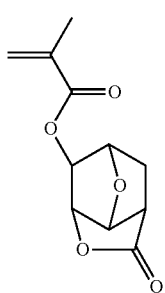
(2d)
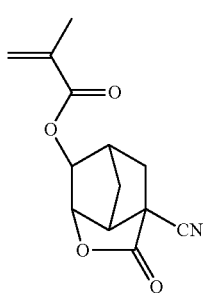
(2e)
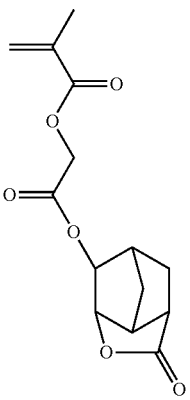
(3a)
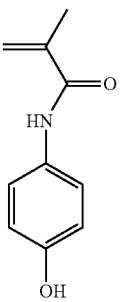
(3b)
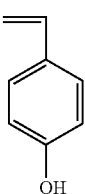
(3c)
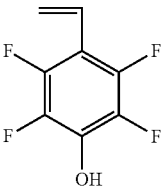
[Chemical Formula 106]
(0a)
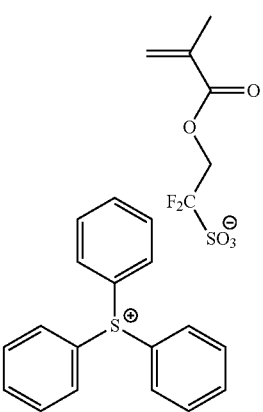

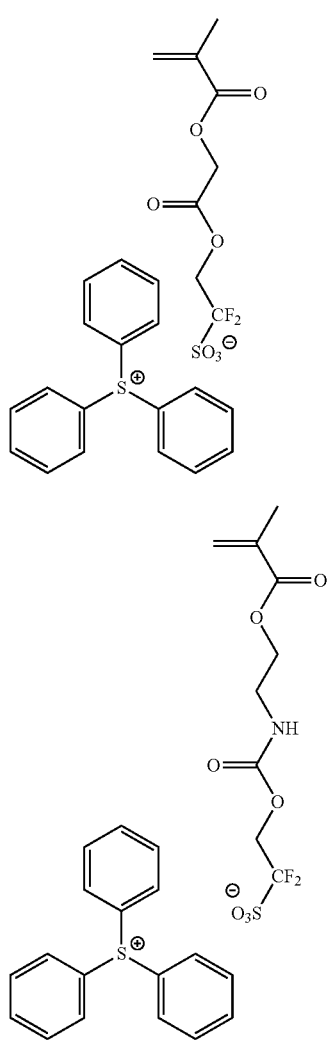
(0b)
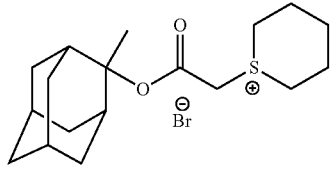
(c-2)
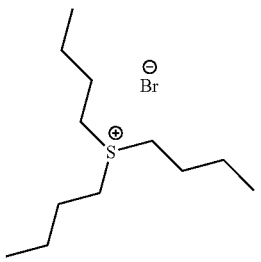
(c-3)
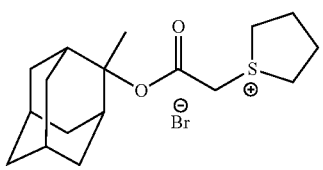
(c-4)
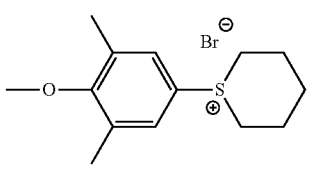
(c-5)
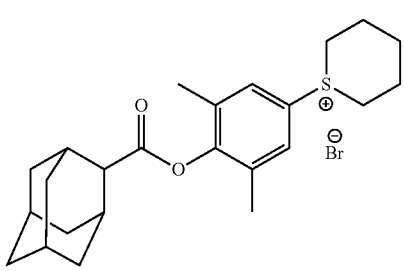
(c-6)
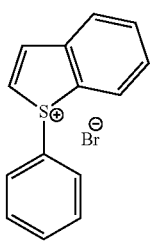
(c-7)
TABLE 1
| | | Monomer | | | | | | | | | | | | Salt exchange |
|---|---|---|---|---|---|---|---|---|---|---|---|---|---|---|
| | | 2a | 11c | 12a | 12b | 12c | 12d | 12e | 12f | 12g | 12h | 12i | 12k | 0a | |
| Copolymer | 1 | 44 | 22 | 22 | | | | | | | | | | 12 | c-2 |
| | 2 | 44 | 22 | | 22 | | | | | | | | | 12 | c-2 |
| | 3 | 44 | 22 | | | 22 | | | | | | | | 12 | c-2 |
| | 4 | 44 | 22 | | | | 22 | | | | | | | 12 | c-2 |
| | 5 | 44 | 22 | | | | | 22 | | | | | | 12 | c-2 |
| | 6 | 44 | 22 | | | | | | 22 | | | | | 12 | c-2 |
| | 7 | 44 | 22 | | | | | | | 22 | | | | 12 | c-2 |
| | 8 | 44 | 22 | | | | | | | | 22 | | | 12 | c-2 |
| | 9 | 44 | 22 | | | | | | | | | 22 | | 12 | c-2 |
| | 10 | 44 | 22 | | | | | | | | | | 22 | 12 | c-2 |
[Chemical Formula 107]

TABLE 2

| | | Monomer | | | | | | | | | Salt |
|---|---|---|---|---|---|---|---|---|---|---|---|
| | | 2a | 11a | 11b | 11d | 11e | 11f | 11g | 12a | 0a | exchange |
| Copolymer | 11 | 44 | 22 | | | | | | 22 | 12 | c-2 |
| | 12 | 44 | | 22 | | | | | 22 | 12 | c-2 |
| | 13 | 44 | | | 22 | | | | 22 | 12 | c-2 |
| | 14 | 44 | | | | 22 | | | 22 | 12 | c-2 |
| | 15 | 44 | | | | | 22 | | 22 | 12 | c-2 |
| | 16 | 44 | | | | | | 22 | 22 | 12 | c-2 |

TABLE 3

| | | Monomer | | | | | | | | | | | | Salt |
|---|---|---|---|---|---|---|---|---|---|---|---|---|---|---|
| | | 2a | 11g | 11e | 11a | 11b | 11f | 12i | 12e | 12c | 12g | 12f | 0a | exchange |
| Copolymer | 17 | 44 | 22 | | | | | 22 | | | | | 12 | c-2 |
| | 18 | 44 | | 22 | | | | | 22 | | | | 12 | c-2 |
| | 19 | 44 | | | 22 | | | | | 22 | | | 12 | c-2 |
| | 20 | 44 | | | | 22 | | | | | 22 | | 12 | c-2 |
| | 21 | 44 | | | | | 22 | | | | | 22 | 12 | c-2 |

TABLE 4

| | | Monomer | | | | | | Salt exchange |
|---|---|---|---|---|---|---|---|---|
| | | 2a | 11c | 12a | 0a | 0b | 0c | |
| Copolymer | 22 | 44 | 22 | 22 | 12 | | | c-3 |
| | 23 | 44 | 22 | 22 | 12 | | | c-1 |
| | 24 | 44 | 22 | 22 | 12 | | | c-4 |
| | 25 | 44 | 22 | 22 | 12 | | | c-5 |
| | 26 | 44 | 22 | 22 | 12 | | | c-6 |
| | 27 | 44 | 22 | 22 | 12 | 12 | | c-2 |
| | 28 | 44 | 22 | 22 | 12 | | 12 | c-2 |
| | 29 | 44 | 22 | 22 | 12 | 12 | | c-6 |
| | 30 | 44 | 22 | 22 | 12 | | 12 | c-6 |

TABLE 5

| | | Monomer | | | | | | | | | | | | | | Salt |
|---|---|---|---|---|---|---|---|---|---|---|---|---|---|---|---|---|
| | | 2a | 2b | 2c | 2d | 2e | 11c | 11h | 11i | 11b | 12a | 13a | 13b | 13c | 0a | exchange |
| Copolymer | 31 | | 44 | | | | 22 | | | | 22 | | | | 12 | c-2 |
| | 32 | 36 | 21 | | | | 16 | | | | 15 | | | | 12 | c-2 |
| | 33 | | | 36 | | | | 16 | | | 15 | 21 | | | 12 | c-2 |
| | 34 | | | | 36 | | | | 16 | | 15 | | 21 | | 12 | c-2 |
| | 35 | 29 | | | | 20 | | | | 12 | 12 | | | 15 | 12 | c-2 |

TABLE 6

| | | Monomer | | | | | Salt exchange |
|---|---|---|---|---|---|---|---|
| | | 2a | 2b | 11c | 12a | 0a | |
| Copolymer | 36 | 44 | | 11 | 33 | 12 | c-2 |
| | 37 | 44 | | 17 | 27 | 12 | c-2 |
| | 38 | 44 | | 27 | 17 | 12 | c-2 |
| | 39 | 44 | | 33 | 11 | 12 | c-2 |
| | 40 | | 44 | 17 | 27 | 12 | c-2 |
| | 41 | | 44 | 27 | 17 | 12 | c-2 |
| | 42 | 36 | 21 | 12 | 19 | 12 | c-2 |
| | 43 | 36 | 21 | 19 | 12 | 12 | c-2 |

For the obtained copolymers, the compositional ratio of the copolymer (proportion (molar ratio) of the respective structural units in the structural formula) was measured by carbon 13 nuclear magnetic resonance spectroscopy (600 MHz $^{13}$C-NMR). In addition, weight average molecular weight (Mw) and the molecular weight dispersity (Mw/Mn) in terms of the polystyrene equivalent value of the copolymer was obtained by GPC measurement. The results are shown below together with the structural formulae of the respective copolymers.

In addition, for the copolymers having the same structural formula, the compositional ratio of the copolymer, Mw, and Mw/Mn are shown below the same structural formula.

[Chemical Formula 108]

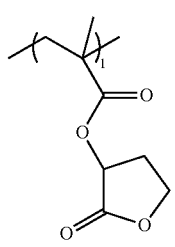 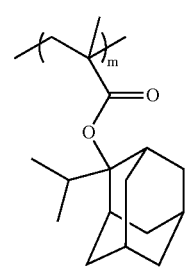

-continued
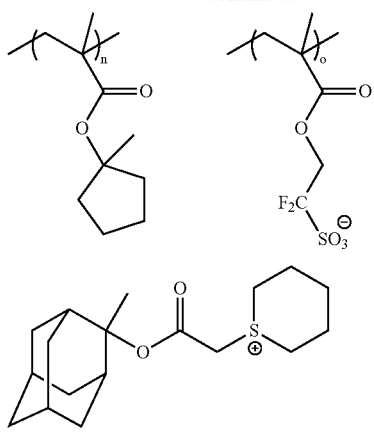
Copolymer 1: l/m/n/o = 43.5/22.1/21.8/12.6, Mw = 12100, Mw/Mn = 1.82
Copolymer 36: l/m/n/o = 43.5/11.7/32.4/12.4, Mw = 12200, Mw/Mn = 1.69
Copolymer 37: l/m/n/o = 44.2/17.5/26.8/11.5, Mw = 12600, Mw/Mn = 1.77
Copolymer 38: l/m/n/o = 43.8/27.4/16.7/12.1, Mw = 12400, Mw/Mn = 1.76
Copolymer 39: l/m/n/o = 42.9/33.4/11.2/12.5, Mw = 11400, Mw/Mn = 1.81
[Chemical Formula 109]
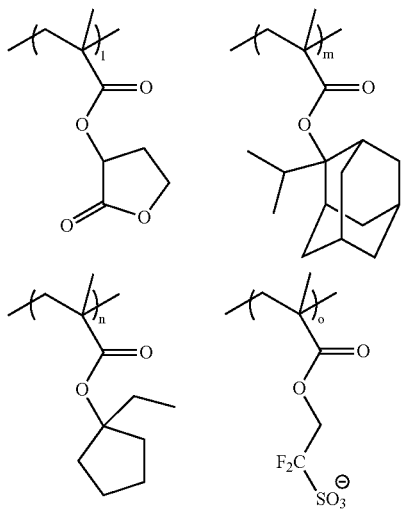
Copolymer 2: l/m/n/o = 44.4/21.8/21.7/11.9, Mw = 13000, Mw/Mn = 1.91
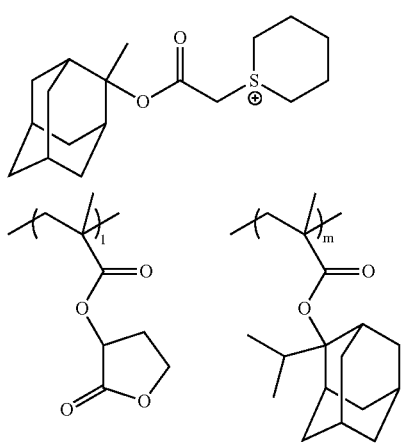
-continued
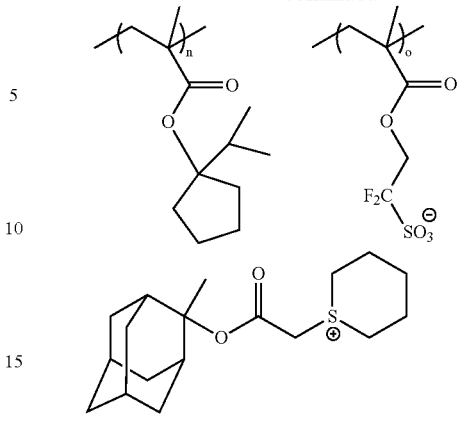
Copolymer 3: l/m/n/o = 43.2/22.4/21.9/12.5, Mw = 11200, Mw/Mn = 1.72
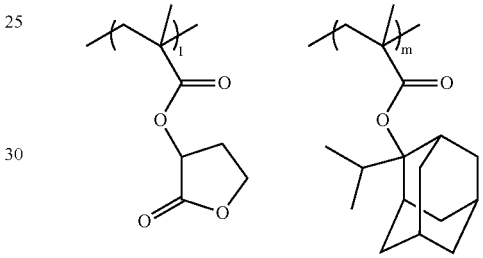
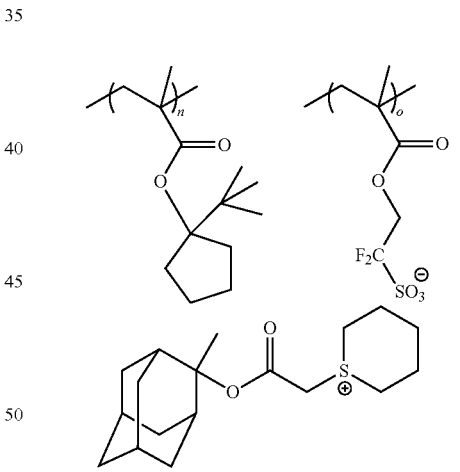
Copolymer 4: l/m/n/o = 44.1/22.3/22.5/11.1, Mw = 11500, Mw/Mn = 1.70
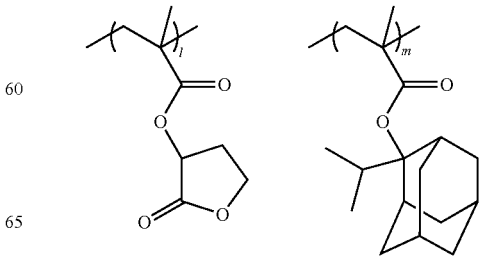

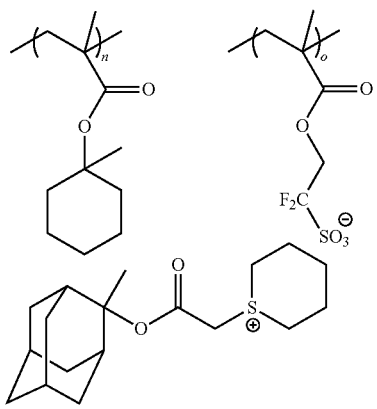
Copolymer 5: l/m/n/o = 44.5/21.6/22.0/11.1,
Mw = 12200, Mw/Mn = 1.82
[Chemical Formula 110]
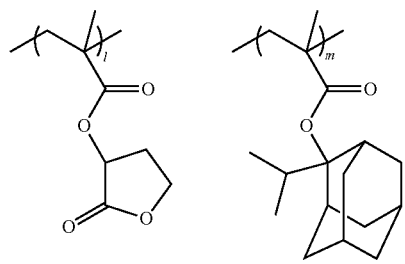
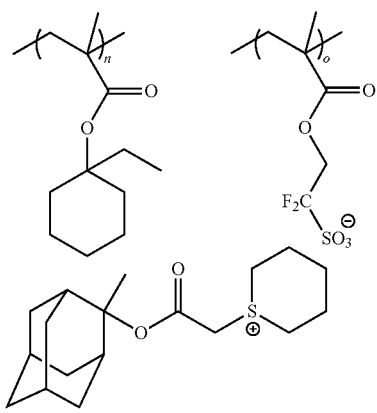
Copolymer 6: l/m/n/o = 44.2/22.1/21.5/12.3,
Mw = 12100, Mw/Mn = 1.85
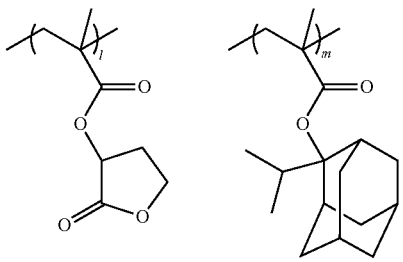
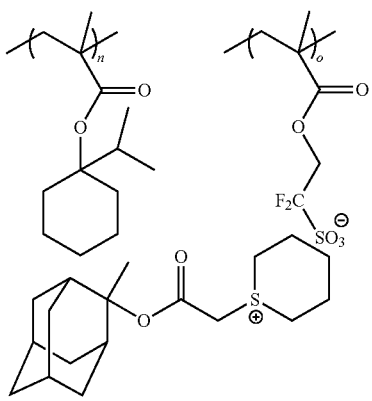
Copolymer 7: l/m/n/o = 43.7/21.7/21.9/12.7,
Mw = 11200, Mw/Mn = 1.72
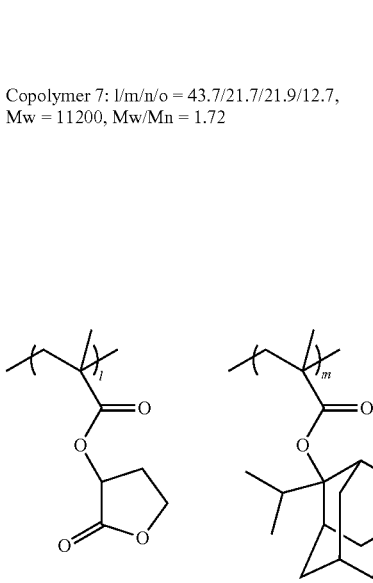

209
-continued
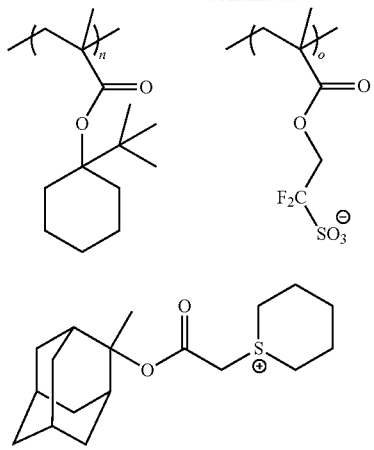
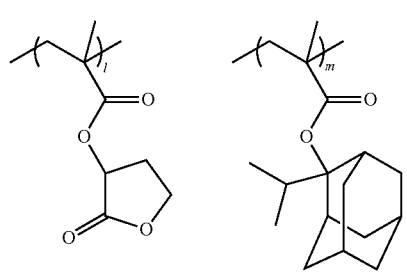
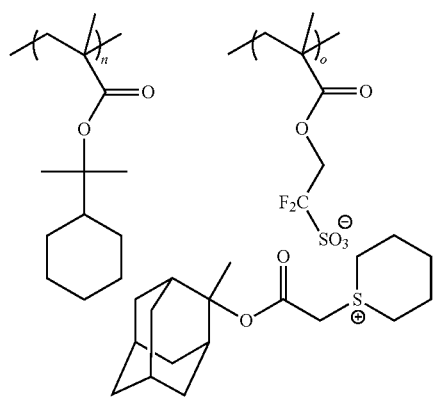
Copolymer 8: l/m/n/o = 43.5/21.9/22.3/12.3,
Mw = 12000, Mw/Mn = 1.77
Copolymer 9: l/m/n/o = 44.4/22.5/21.7/11.4,
Mw = 13100, Mw/Mn = 1.86
210
-continued
[Chemical Formula 111]
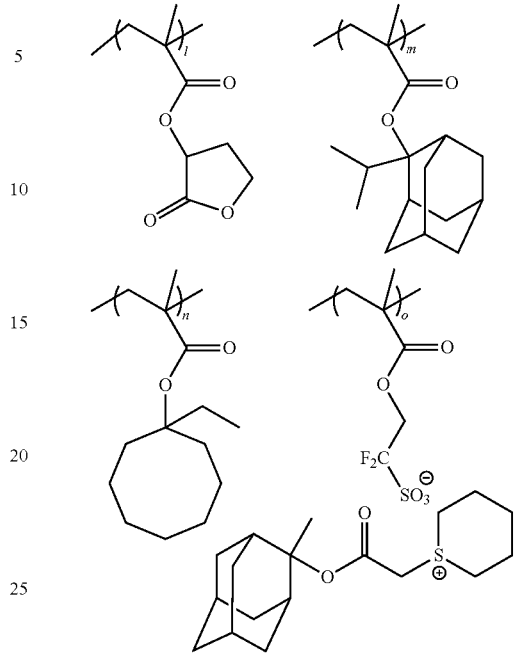
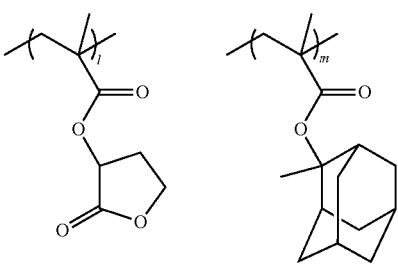

-continued
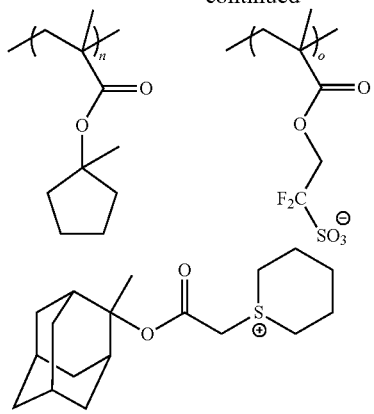
Copolymer 10: l/m/n/o = 44.0/21.6/22.2/12.2, Mw = 13600, Mw/Mn = 1.74
Copolymer 11: l/m/n/o = 43.9/22.6/22.4/11.1, Mw = 11100, Mw/Mn = 1.75
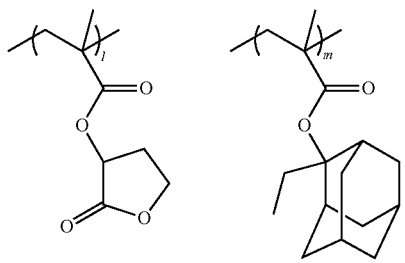
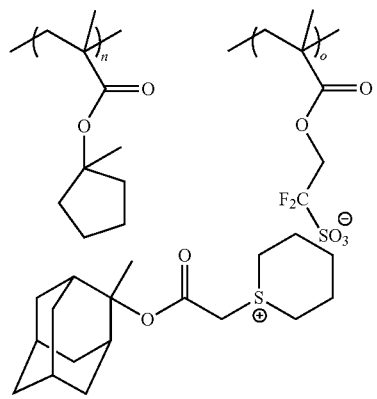
Copolymer 12: l/m/n/o = 43.4/22.1/21.8/12.7, Mw = 12600, Mw/Mn = 1.81
-continued
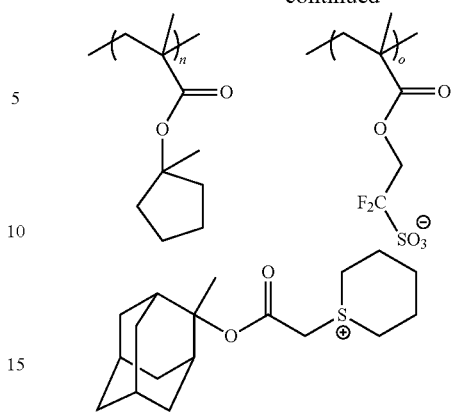
Copolymer 13: l/m/n/o = 43.6/21.8/21.7/12.9, Mw = 12500, Mw/Mn = 1.80
[Chemical Formula 112]
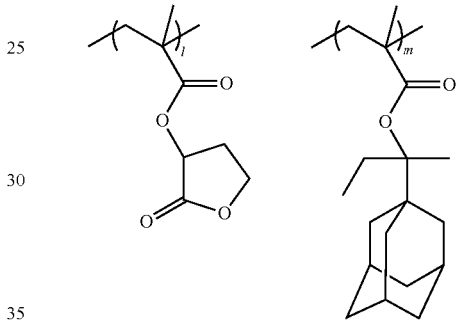
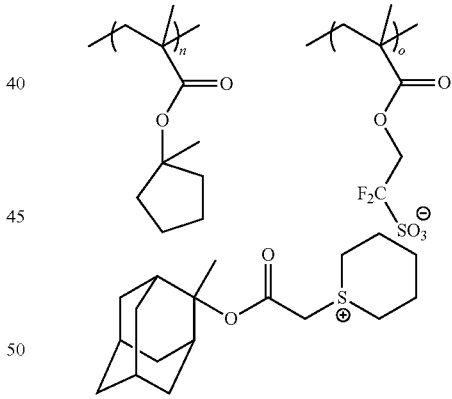
Copolymer 14: l/m/n/o = 43.3/22.0/21.6/13.1, Mw = 11300, Mw/Mn = 1.78
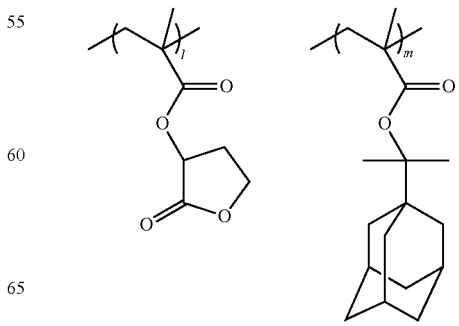

-continued
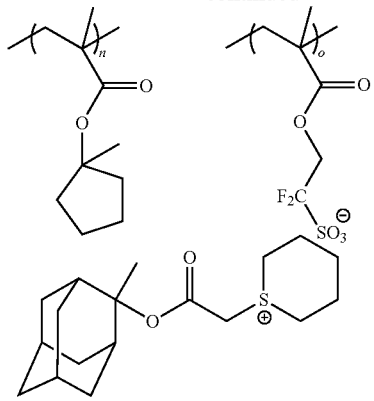
Copolymer 15: l/m/n/o = 44.1/21.3/22.2/12.4, Mw = 11900, Mw/Mn = 1.83
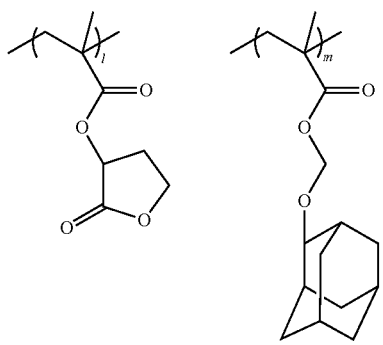
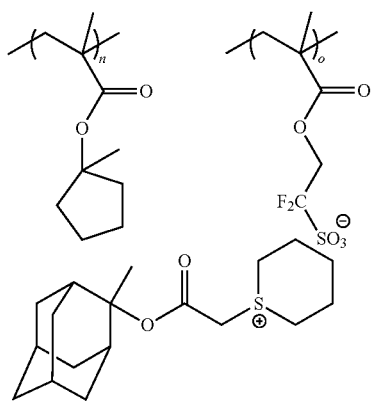
Copolymer 16: l/m/n/o = 43.5/21.7/21.4/13.4, Mw = 12400, Mw/Mn = 1.84
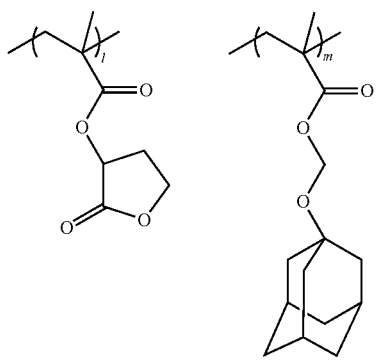
-continued
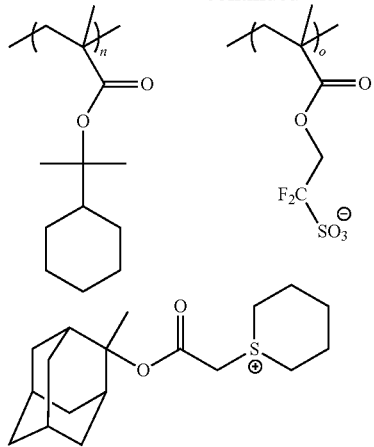
Copolymer 17: l/m/n/o = 44.4/22.6/21.9/11.1, Mw = 12200, Mw/Mn = 1.76
[Chemical Formula 113]
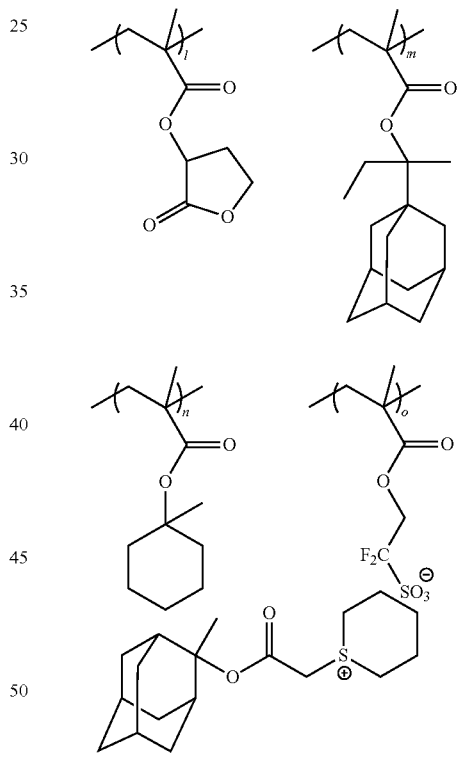
Copolymer 18: l/m/n/o = 42.9/22.6/22.2/12.3, Mw = 12800, Mw/Mn = 1.78
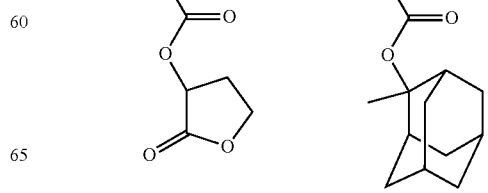

-continued
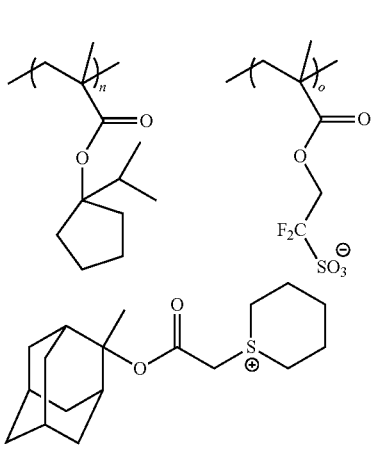
Copolymer 19: l/m/n/o = 43.5/20.9/22.0/13.6, Mw = 13100, Mw/Mn = 1.72
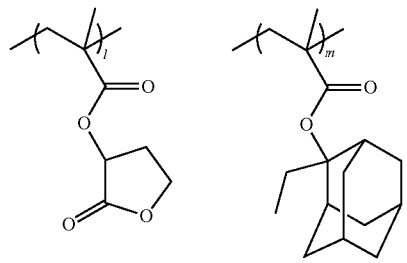
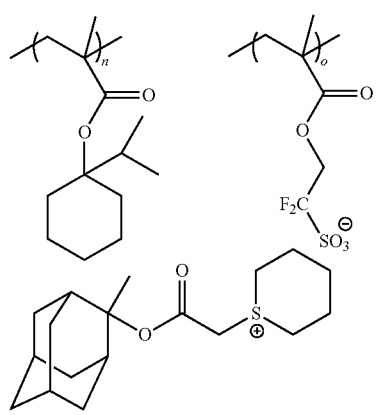
Copolymer 20: l/m/n/o = 44.9/21.9/22.3/10.9, Mw = 12200, Mw/Mn = 1.89
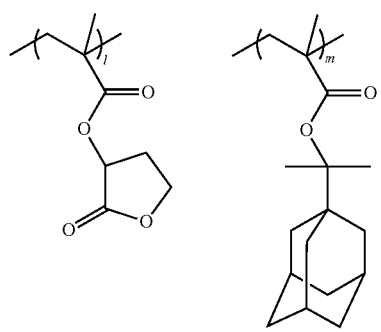
-continued
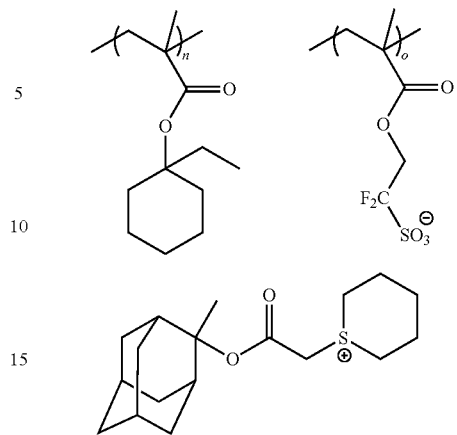
Copolymer 21: l/m/n/o = 43.8/22.5/21.3/12.4, Mw = 12100, Mw/Mn = 1.87
[Chemical Formula 114]
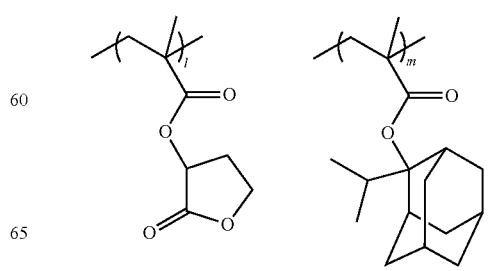
Copolymer 22: l/m/n/o = 43.3/23.3/21.7/11.8, Mw = 11500, Mw/Mn = 1.80

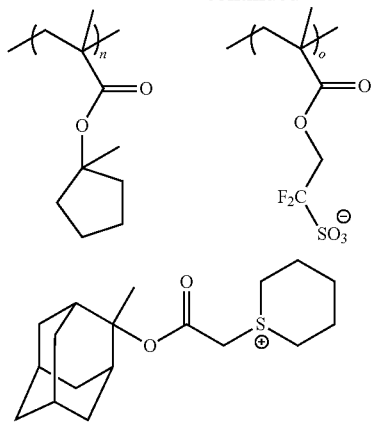
Copolymer 24: l/m/n/o = 43.3/22.5/22.2/12.0, Mw = 14000, Mw/Mn = 1.82
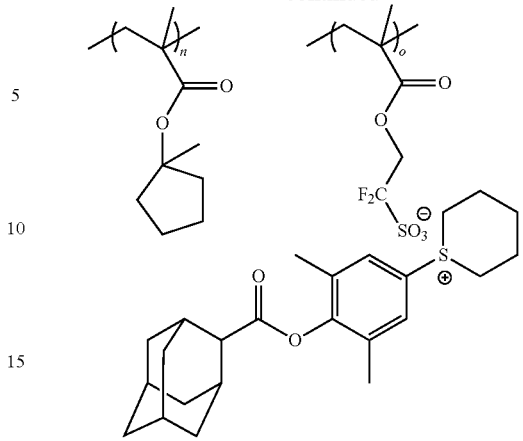
Copolymer 26: l/m/n/o = 42.7/21.5/22.8/13.0, Mw = 11600, Mw/Mn = 1.91
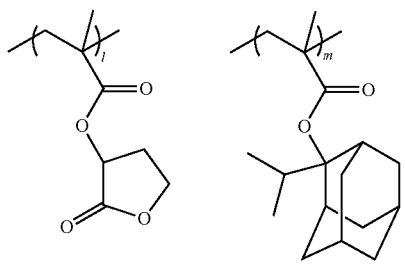
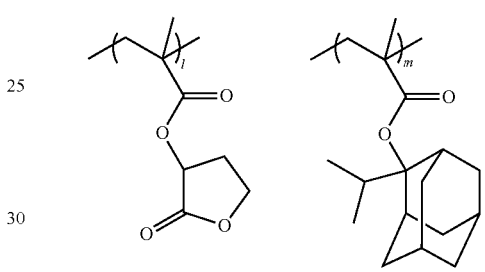
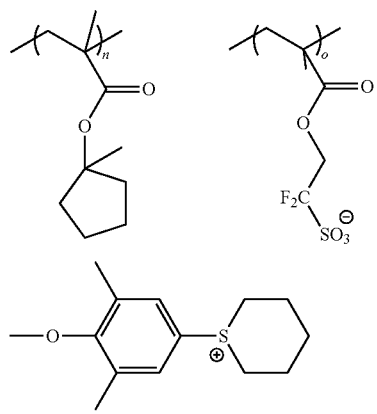
Copolymer 25: l/m/n/o = 43.1/21.9/22.4/12.6, Mw = 13400, Mw/Mn = 1.77
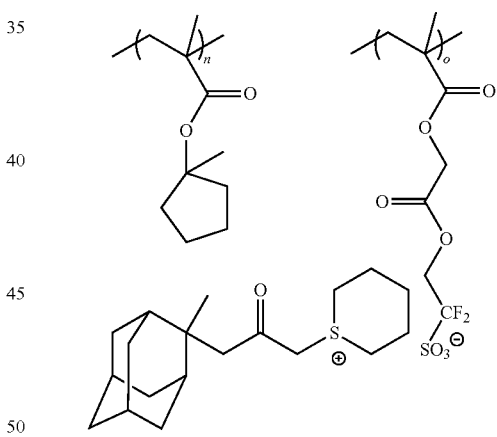
Copolymer 27: l/m/n/o = 44.6/22.1/21.3/12.0, Mw = 11500, Mw/Mn = 1.79
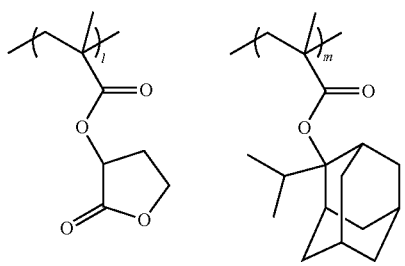
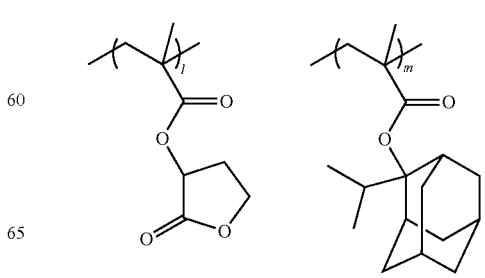

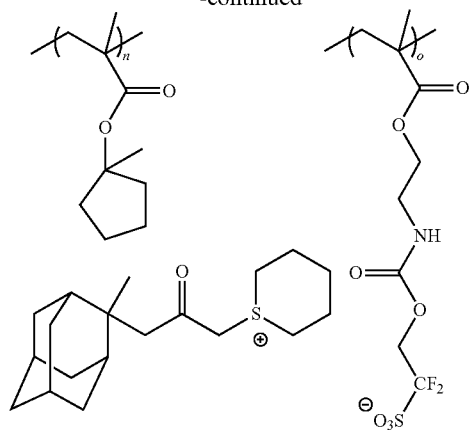
Copolymer 28: l/m/n/o = 41.9/22.8/21.6/13.7,
Mw = 11900, Mw/Mn = 1.86
[Chemical Formula 116]
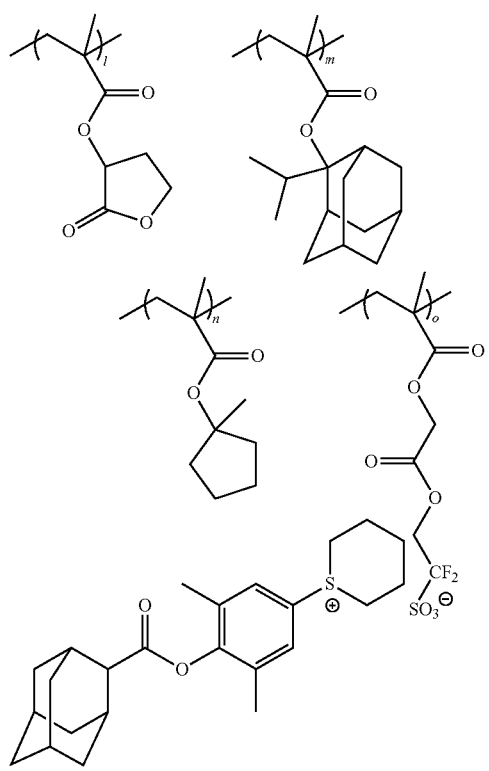
Copolymer 29: l/m/n/o = 44.2/20.8/22.2/12.8,
Mw = 12100, Mw/Mn = 1.83
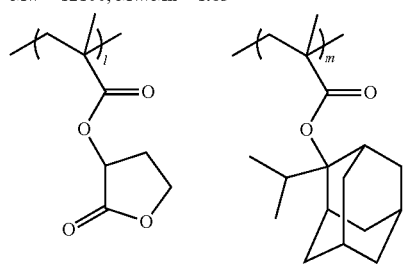
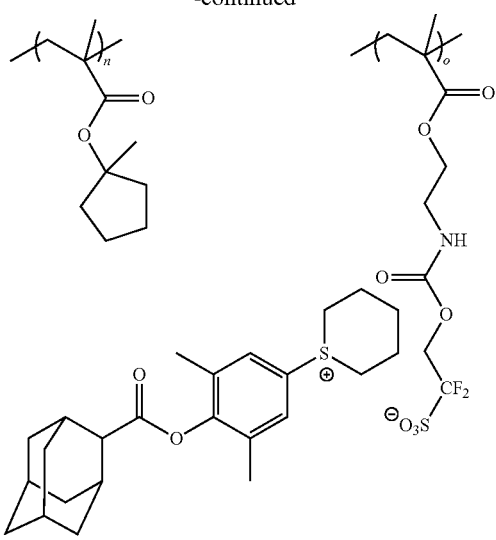
Copolymer 30: l/m/n/o = 45.1/21.6/21.4/11.9,
Mw = 13500, Mw/Mn = 1.82
[Chemical Formula 117]
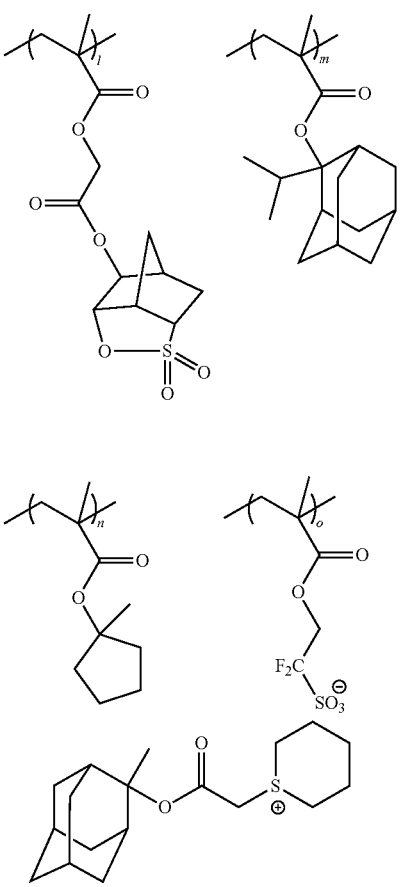
Copolymer 31: l/m/n/o = 43.1/23.0/22.1/11.8,
Mw = 13100, Mw/Mn = 1.85
Copolymer 40: l/m/n/o = 44.3/17.9/26.5/11.3,
Mw = 11800, Mw/Mn = 1.84
Copolymer 41: l/m/n/o = 43.2/27.6/17.1/12.1,
Mw = 11500, Mw/Mn = 1.79

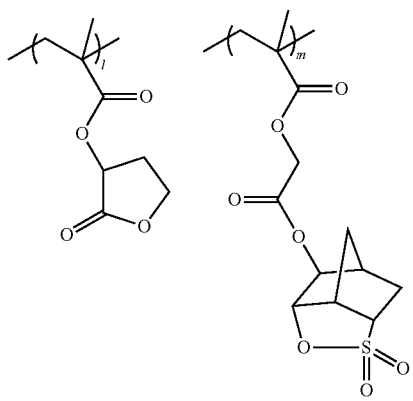
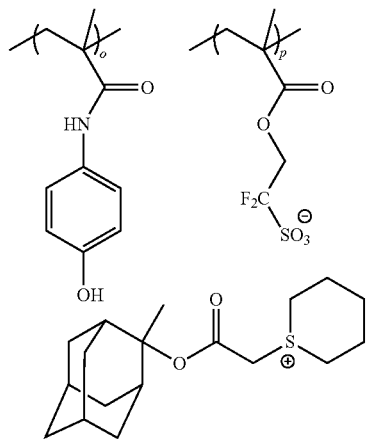
Copolymer 33: l/m/n/o/p = 36.3/15.5/15.1/21.1/12.0, Mw = 11700, Mw/Mn = 1.66
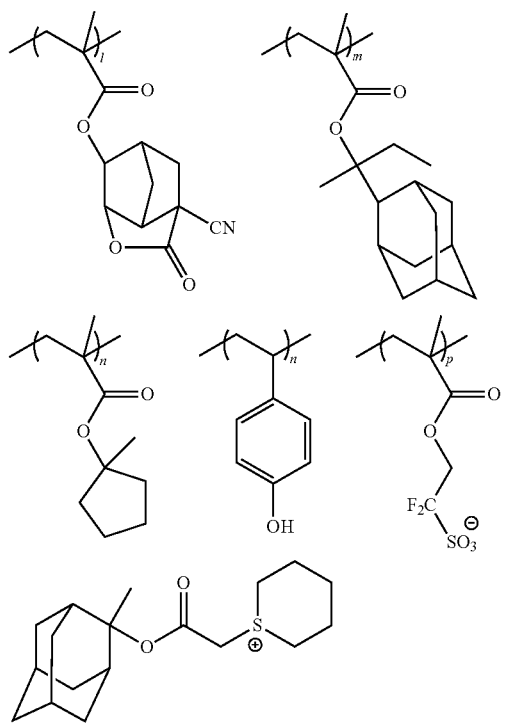
Copolymer 32: l/m/n/o/p = 35.7/20.8/16.2/15.5/11.8,
Mw = 12200, Mw/Mn = 1.75
Copolymer 42: l/m/n/o/p = 36.6/20.8/11.6/19.3/11.7,
Mw = 12000, Mw/Mn = 1.87
Copolymer 43: l/m/n/o/p = 36.3/21.4/18.4/12.2/11.7,
Mw = 12400, Mw/Mn = 1.88
Copolymer 34: l/m/n/o/p = 36.2/16.3/15.4/20.3/11.8,
Mw = 13500, Mw/Mn = 1.95
[Chemical Formula 118]
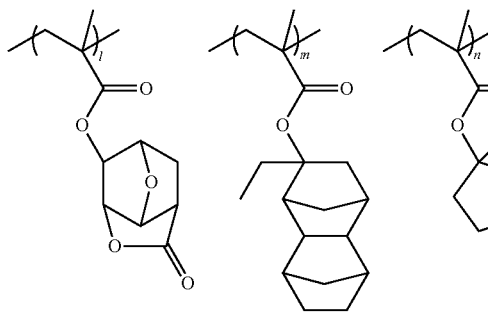
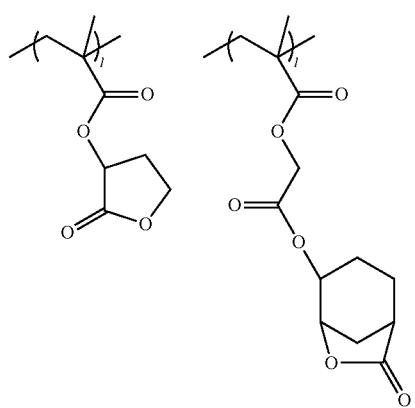

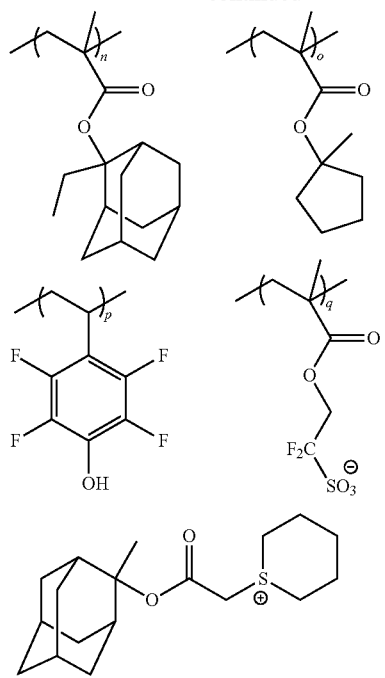
Copolymer 35: l/m/n/o/p/q = 28.4/20.1/11.8/11.4/15.4/12.9, Mw = 14100, Mw/Mn = 1.86
[Chemical Formula 119]
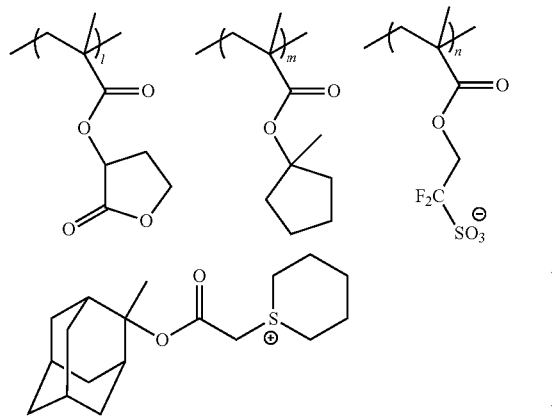
Copolymer 1': l/m/n = 45.1/43.6/11.3, Mw = 11500, Mw/Mn = 1.87
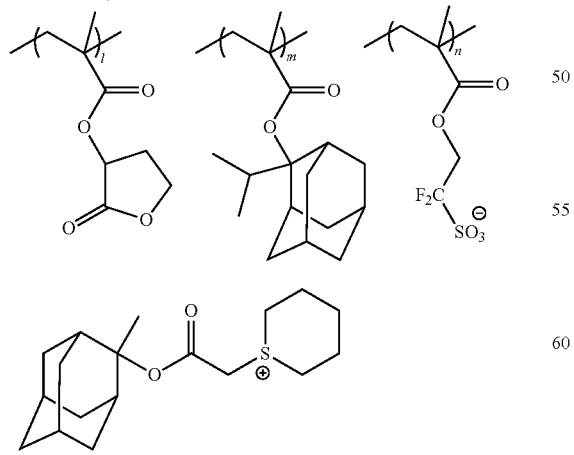
Copolymer 2': l/m/n = 44.3/44.2/11.5, Mw = 12100, Mw/Mn = 1.79
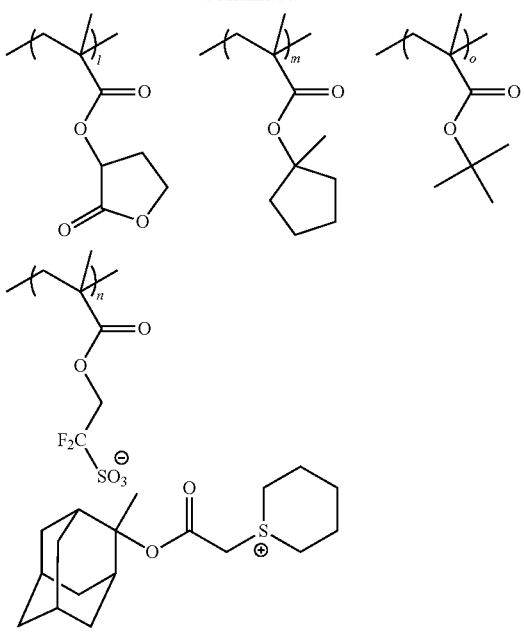
Copolymer 3': l/m/n/o = 43.8/21.6/22.0/12.6, Mw = 12600, Mw/Mn = 1.85
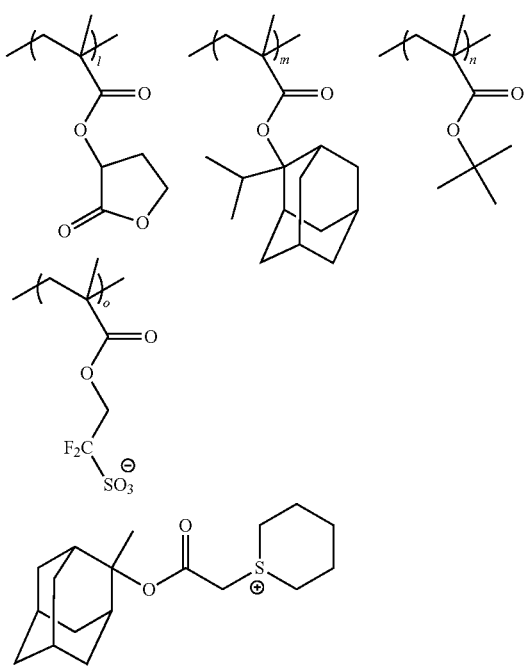
Copolymer 4': l/m/n/o = 43.6/22.1/21.9/12.4, Mw = 11800, Mw/Mn = 1.82
[Chemical Formula 120]
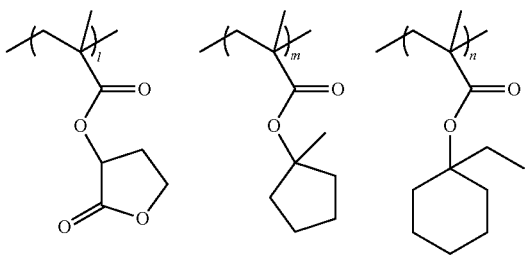

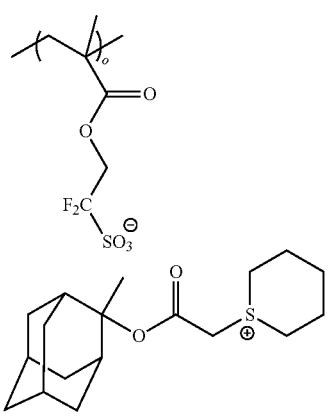

Copolymer 5′: l/m/n/o = 44.6/22.3/21.4/11.7,
Mw = 11400, Mw/Mn = 1.76

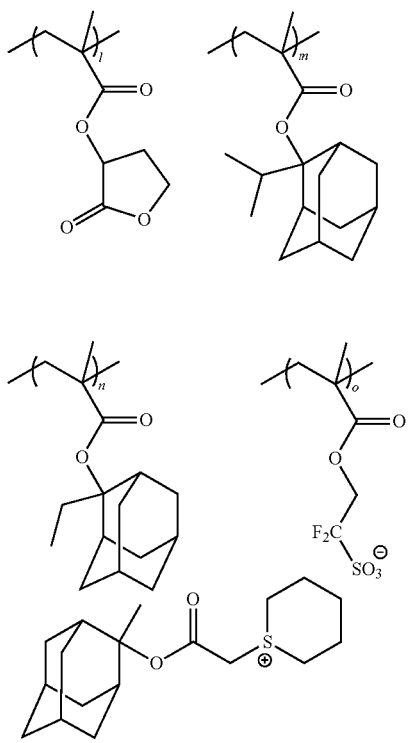

Copolymer 6′: l/m/n/o = 43.2/22.2/21.6/13.0,
Mw = 12300, Mw/Mn = 1.69

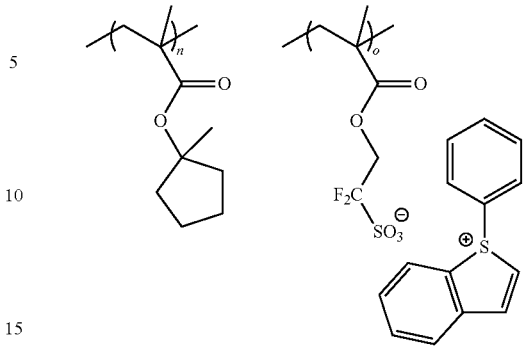

Copolymer 7′: l/m/n/o = 43.2/22.1/22.3/12.4,
Mw = 11200, Mw/Mn = 1.78

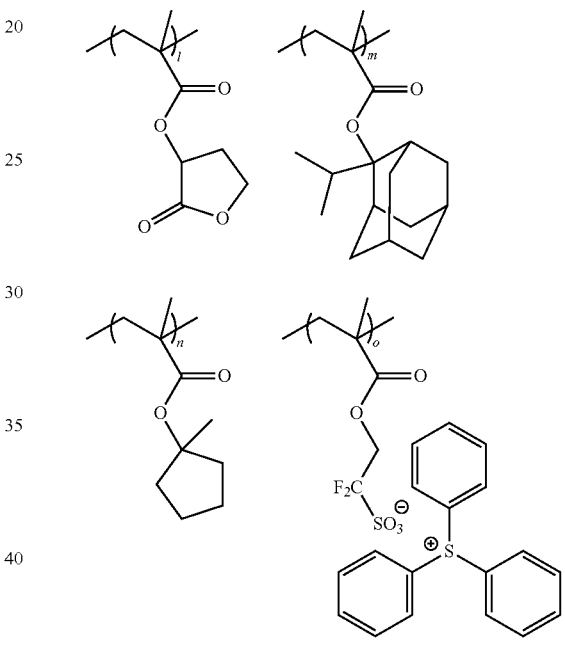

Copolymer 8′: l/m/n/o = 44.5/22.3/22.1/11.1,
Mw = 12900, Mw/Mn = 1.78

Examples 1 to 43 and Comparative Examples 1 to 8

The respective components shown in Tables 7 and 8 were mixed and dissolved to prepare resist compositions.

TABLE 7

|  | Component (A) | Component (D) | Component (S) |
| --- | --- | --- | --- |
| Example 1 | (A)-1 [100] | (D)-1 [2.0] | (S)-1 [5000] |
| Example 2 | (A)-2 [100] | (D)-1 [2.0] | (S)-1 [5000] |
| Example 3 | (A)-3 [100] | (D)-1 [2.0] | (S)-1 [5000] |
| Example 4 | (A)-4 [100] | (D)-1 [2.0] | (S)-1 [5000] |
| Example 5 | (A)-5 [100] | (D)-1 [2.0] | (S)-1 [5000] |
| Example 6 | (A)-6 [100] | (D)-1 [2.0] | (S)-1 [5000] |
| Example 7 | (A)-7 [100] | (D)-1 [2.0] | (S)-1 [5000] |
| Example 8 | (A)-8 [100] | (D)-1 [2.0] | (S)-1 [5000] |
| Example 9 | (A)-9 [100] | (D)-1 [2.0] | (S)-1 [5000] |
| Example 10 | (A)-10 [100] | (D)-1 [2.0] | (S)-1 [5000] |

TABLE 7-continued

|  | Component (A) | Component (D) | Component (S) |
|---|---|---|---|
| Example 11 | (A)-11 [100] | (D)-1 [2.0] | (S)-1 [5000] |
| Example 12 | (A)-12 [100] | (D)-1 [2.0] | (S)-1 [5000] |
| Example 13 | (A)-13 [100] | (D)-1 [2.0] | (S)-1 [5000] |
| Example 14 | (A)-14 [100] | (D)-1 [2.0] | (S)-1 [5000] |
| Example 15 | (A)-15 [100] | (D)-1 [2.0] | (S)-1 [5000] |
| Example 16 | (A)-16 [100] | (D)-1 [2.0] | (S)-1 [5000] |
| Example 17 | (A)-17 [100] | (D)-1 [2.0] | (S)-1 [5000] |
| Example 18 | (A)-18 [100] | (D)-1 [2.0] | (S)-1 [5000] |
| Example 19 | (A)-19 [100] | (D)-1 [2.0] | (S)-1 [5000] |
| Example 20 | (A)-20 [100] | (D)-1 [2.0] | (S)-1 [5000] |
| Example 21 | (A)-21 [100] | (D)-1 [2.0] | (S)-1 [5000] |
| Example 22 | (A)-22 [100] | (D)-1 [2.0] | (S)-1 [5000] |
| Example 23 | (A)-23 [100] | (D)-1 [2.0] | (S)-1 [5000] |
| Example 24 | (A)-24 [100] | (D)-1 [2.0] | (S)-1 [5000] |
| Example 25 | (A)-25 [100] | (D)-1 [2.0] | (S)-1 [5000] |
| Example 26 | (A)-26 [100] | (D)-1 [2.0] | (S)-1 [5000] |

TABLE 8

|  | Component (A) | Component (D) | Component (S) |
|---|---|---|---|
| Example 27 | (A)-27 [100] | (D)-1 [2.0] | (S)-1 [5000] |
| Example 28 | (A)-28 [100] | (D)-1 [2.0] | (S)-1 [5000] |
| Example 29 | (A)-29 [100] | (D)-1 [2.0] | (S)-1 [5000] |
| Example 30 | (A)-30 [100] | (D)-1 [2.0] | (S)-1 [5000] |
| Example 31 | (A)-31 [100] | (D)-1 [2.0] | (S)-1 [5000] |
| Example 32 | (A)-32 [100] | (D)-1 [2.0] | (S)-1 [5000] |
| Example 33 | (A)-33 [100] | (D)-1 [2.0] | (S)-1 [5000] |
| Example 34 | (A)-34 [100] | (D)-1 [2.0] | (S)-1 [5000] |
| Example 35 | (A)-35 [100] | (D)-1 [2.0] | (S)-1 [5000] |
| Example 36 | (A)-36 [100] | (D)-1 [2.0] | (S)-1 [5000] |
| Example 37 | (A)-37 [100] | (D)-1 [2.0] | (S)-1 [5000] |
| Example 38 | (A)-38 [100] | (D)-1 [2.0] | (S)-1 [5000] |
| Example 39 | (A)-39 [100] | (D)-1 [2.0] | (S)-1 [5000] |
| Example 40 | (A)-40 [100] | (D)-1 [2.0] | (S)-1 [5000] |
| Example 41 | (A)-41 [100] | (D)-1 [2.0] | (S)-1 [5000] |
| Example 42 | (A)-42 [100] | (D)-1 [2.0] | (S)-1 [5000] |
| Example 43 | (A)-43 [100] | (D)-1 [2.0] | (S)-1 [5000] |
| Comparative Example 1 | (A')-1 [100] | (D)-1 [2.0] | (S)-1 [5000] |
| Comparative Example 2 | (A')-2 [100] | (D)-1 [2.0] | (S)-1 [5000] |
| Comparative Example 3 | (A')-3 [100] | (D)-1 [2.0] | (S)-1 [5000] |
| Comparative Example 4 | (A')-4 [100] | (D)-1 [2.0] | (S)-1 [5000] |
| Comparative Example 5 | (A')-5 [100] | (D)-1 [2.0] | (S)-1 [5000] |
| Comparative Example 6 | (A')-6 [100] | (D)-1 [2.0] | (S)-1 [5000] |
| Comparative Example 7 | (A')-7 [100] | (D)-1 [2.0] | (S)-1 [5000] |
| Comparative Example 8 | (A')-8 [100] | (D)-1 [2.0] | (S)-1 [5000] |

In Tables 7 and 8, the numerical values in brackets [ ] indicate the amount (based on parts by weight) of the component mixed in, and the respective reference characters indicate the following.

(A)-1 to (A)-43: the copolymers 1 to 43 respectively (A')-1 to (A')-8: the copolymers 1' to 8' respectively (D)-1: the compound represented by the following structural formula (D)-1

(S)-1: mixed solvent of PGMEA/PGME/cyclohexanone=1500/1000/2500 (weight ratio)

[Chemical Formula 121]

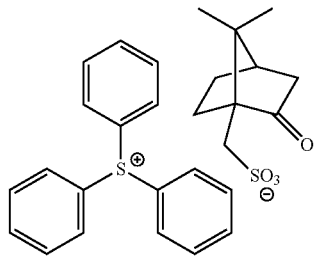

(D)-1

By using the obtained resist composition, the following evaluation was performed.

[Formation of Resist Pattern]

The resist composition of each example was evenly applied with a spinner onto an 8 inch silicon substrate having been treated with hexamethyldisilazane for 36 seconds at 90° C., and baking treatment (PAB) was performed for 60 seconds at the PAB temperature shown in Tables 9 and 10, thereby forming a resist film (film thickness 60 nm). On the resist film, drawing (exposure) was performed at an acceleration voltage of 50 kV by using an electron beam drawing machine HL800D (VSB) (manufactured by Hitachi, Ltd.), baking treatment (PEB) was performed for 60 seconds at the PEB temperature shown in Tables 9 and 10, and developing was performed for 60 seconds at 23° C. by using a 2.38% by weight aqueous tetramethylammonium hydroxide (TMAH) solution (trade name: NMD-3, manufactured by Tokyo Ohka Kogyo Co., Ltd.).

As a result, a line and space pattern (hereafter also referred to as an "LS pattern") having a line width of 100 nm and a pitch of 200 nm was formed in each of the examples.

In addition, although it is considered that a higher acceleration voltage is more useful for forming a fine pattern, in the present evaluation, in order to reproduce a quasi-state where the OoB light is formed, an exposure condition of an acceleration voltage 50 kV (which was relatively low) was employed.

[Evaluation of Resolution]

A critical resolution (nm) in an optimum exposure dose EOP ($\mu C/cm^2$) in which an LS pattern having a line width of 100 nm and a pitch of 200 nm is formed in the above "Formation of Resist Pattern" was determined using a scanning electron microscope S-9220 (manufactured by Hitachi High-Technologies Corporation). The results are shown in Tables 9 and 10.

[Evaluation of Line Edge Roughness]

For the LS pattern formed in the above "Formation of Resist Pattern" and having a line width of 100 nm and a pitch of 200 nm, 3σ as an index showing LER was measured. The "3σ" is a value (unit: nm) of 3 times (3s) a standard deviation (a) obtained from a result of measuring line width in 400 sites in the longitudinal direction of the line at an acceleration voltage of 800 V by using a scanning electron microscope S-9220 (manufactured by Hitachi High-Technologies Corporation). The smaller the value of 3s, the smaller the roughness of the side wall of a line, and this means that an LS pattern having a more uniform width has been obtained. The results are shown in Tables 9 and 10.

[Evaluation of Exposure Latitude (10% EL)]

In the above "Formation of Resist Pattern", an exposure dose at the time when a line of an LS pattern is formed within a range of a target size (line width of 100 nm)±10% (90 nm to 110 nm) was measured, and an exposure latitude (unit: %) was measured by the following formula. In the formula, E1 represents an exposure dose ($\mu C/cm^2$) at the time when an LS pattern having a line width of 90 nm is formed, and E2 represents an exposure dose (μC/cm$^2$) at the time when an LS pattern having a line width of 110 nm is formed. The larger value of the exposure latitude shows that the degree of change in the pattern size accompanied by the fluctuation of the exposure dose is small. The results are shown in Tables 9 and 10 as "10% EL".

Exposure latitude (%)=(|E1−E2|/Eop)×100

[Evaluation of Thermal Stability]

From a line width W1 of the LS pattern that was formed in the same procedure as in the above "Formation of Resist Pattern", except that the PEB temperature was lowered by 5° C. (T1 (° C.)), and from a line width W2 of the LS pattern that was formed in the same procedure as in the above "Formation of Resist Pattern", except that the PEB temperature was increased by 5° C. (T2 (° C.)), a change in size (unit: nm/° C.) was obtained by the following formula. The smaller the value of the change in size, the smaller the change in pattern size accompanied by the fluctuation of the PEB temperature, and this shows that the pattern is excellent in thermal stability. The results are shown in Tables 9 and 10 as "PEBs (nm/° C.)".

Change in size=|W1−W2|/|T1−T2|

In addition, from the above results, a pattern showing the change in size of less than 0.40 nm/° C. was evaluated to be S, a pattern showing the change in size of 0.40 nm/° C. or more and less than 0.50 nm/° C. was evaluated to be A, and a pattern showing the change in size of 0.50 nm/° C. or more was evaluated to be B. The results are shown in Tables 9 and 10 as "PEBs (evaluation)".

[Evaluation of Cross-Sectional Shape]

By using a scanning electron microscope SU8000 (manufactured by Hitachi High-Technologies Corporation), a cross-sectional shape of the LS pattern having a line width of 100 nm and a pitch of 200 nm that was formed in the "Formation of Resist Pattern" as an acceleration voltage of 5 kV was observed. A pattern in which the cross-section of the line is a rectangle was evaluated to be A, a pattern in which the cross-section of the line is a tapered shape was evaluated to be B, and a pattern in which thickness loss was markedly observed was evaluated to be C. The results are shown in Tables 9 and 10.

TABLE 9

|  | PAB/PEB (° C.) | Eop (μC/cm$^2$) | LER (nm) | 10% EL (nm) | Resolution (nm) | PEBs (nm/° C.) | PEBs (evaluation) | Cross-sectional shape |
| --- | --- | --- | --- | --- | --- | --- | --- | --- |
| Example 1 | 130/100 | 67.5 | 6.0 | 22.4 | 50 | 0.34 | S | A |
| Example 2 | 130/100 | 64.6 | 6.2 | 21.5 | 50 | 0.36 | S | A |
| Example 3 | 130/100 | 62.2 | 6.2 | 24.4 | 50 | 0.35 | S | A |
| Example 4 | 130/100 | 61.7 | 6.3 | 23.9 | 50 | 0.37 | S | A |
| Example 5 | 130/100 | 66.7 | 6.8 | 21.4 | 50 | 0.36 | S | A |
| Example 6 | 130/100 | 63.4 | 6.1 | 20.5 | 50 | 0.42 | A | A |
| Example 7 | 130/100 | 62.5 | 5.8 | 24.3 | 50 | 0.45 | A | A |
| Example 8 | 130/100 | 63.1 | 6.0 | 25.5 | 50 | 0.45 | A | A |
| Example 9 | 130/100 | 67.7 | 6.7 | 22.2 | 50 | 0.41 | A | A |
| Example 10 | 130/100 | 58.1 | 5.9 | 20.8 | 50 | 0.43 | A | A |
| Example 11 | 130/100 | 70.3 | 6.3 | 26.4 | 50 | 0.39 | S | A |
| Example 12 | 130/100 | 68.7 | 6.6 | 24.4 | 50 | 0.41 | A | A |
| Example 13 | 130/100 | 62.4 | 6.7 | 25.1 | 50 | 0.45 | A | A |
| Example 14 | 130/100 | 63.5 | 6.5 | 22.9 | 50 | 0.43 | A | A |
| Example 15 | 130/100 | 60.6 | 6.9 | 23.1 | 50 | 0.48 | A | A |
| Example 16 | 130/100 | 57.4 | 6.6 | 25.0 | 50 | 0.46 | A | A |
| Example 17 | 130/100 | 68.9 | 6.7 | 24.0 | 50 | 0.44 | A | A |
| Example 18 | 130/100 | 66.6 | 6.5 | 25.3 | 50 | 0.40 | A | A |
| Example 19 | 130/100 | 58.8 | 7.1 | 22.6 | 50 | 0.46 | A | A |
| Example 20 | 130/100 | 67.2 | 7.3 | 19.8 | 50 | 0.49 | A | A |
| Example 21 | 130/100 | 63.5 | 6.9 | 21.0 | 50 | 0.40 | A | A |
| Example 22 | 130/100 | 59.3 | 6.9 | 22.4 | 50 | 0.37 | S | A |
| Example 23 | 130/100 | 60.2 | 7.1 | 23.3 | 50 | 0.39 | S | A |
| Example 24 | 130/100 | 66.4 | 7.0 | 22.7 | 50 | 0.36 | S | A |
| Example 25 | 130/100 | 60.8 | 6.7 | 23.5 | 50 | 0.39 | S | A |
| Example 26 | 130/100 | 57.5 | 6.5 | 24.5 | 50 | 0.41 | A | A |

TABLE 10

|  | PAB/PEB (° C.) | Eop (μC/cm$^2$) | LER (nm) | 10% EL (nm) | Resolution (nm) | PEBs (nm/° C.) | PEBs (evaluation) | Cross-sectional shape |
| --- | --- | --- | --- | --- | --- | --- | --- | --- |
| Example 27 | 130/100 | 64.2 | 6.8 | 23.0 | 50 | 0.44 | A | A |
| Example 28 | 130/100 | 60.9 | 6.5 | 24.1 | 50 | 0.46 | A | A |
| Example 29 | 130/100 | 61.4 | 6.9 | 24.2 | 50 | 0.42 | A | A |
| Example 30 | 130/100 | 56.6 | 6.8 | 23.6 | 50 | 0.44 | A | A |
| Example 31 | 130/100 | 65.8 | 6.1 | 25.4 | 50 | 0.43 | A | A |
| Example 32 | 130/100 | 64.4 | 6.2 | 25.6 | 50 | 0.42 | A | A |
| Example 33 | 130/100 | 62.5 | 6.4 | 24.3 | 50 | 0.40 | A | A |
| Example 34 | 130/100 | 55.7 | 6.7 | 25.1 | 50 | 0.39 | S | A |
| Example 35 | 130/100 | 67.8 | 6.0 | 24.5 | 50 | 0.43 | A | A |
| Example 36 | 130/100 | 68.3 | 6.4 | 23.9 | 50 | 0.36 | S | A |
| Example 37 | 130/100 | 68.0 | 6.2 | 24.0 | 50 | 0.37 | S | A |
| Example 38 | 130/100 | 66.3 | 5.6 | 27.1 | 50 | 0.41 | A | A |
| Example 39 | 130/100 | 65.6 | 6.0 | 24.9 | 50 | 0.42 | A | A |

TABLE 10-continued

|  | PAB/PEB (° C.) | Eop (μC/cm²) | LER (nm) | 10% EL (nm) | Resolution (nm) | PEBs (nm/° C.) | PEBs (evaluation) | Cross-sectional shape |
|---|---|---|---|---|---|---|---|---|
| Example 40 | 130/100 | 67.9 | 5.6 | 22.8 | 50 | 0.39 | S | A |
| Example 41 | 130/100 | 65.3 | 6.0 | 26.3 | 50 | 0.43 | A | A |
| Example 42 | 130/100 | 65.9 | 6.3 | 25.2 | 50 | 0.39 | S | A |
| Example 43 | 130/100 | 64.0 | 5.9 | 26.7 | 50 | 0.40 | A | A |
| Comparative Example 1 | 130/100 | 66.0 | 8.3 | 15.1 | 60 | 0.33 | S | C |
| Comparative Example 2 | 130/100 | 70.1 | 9.7 | 14.6 | 60 | 0.71 | B | B |
| Comparative Example 3 | 130/100 | 56.4 | 8.8 | 13.7 | 60 | 0.42 | A | C |
| Comparative Example 4 | 130/100 | 58.8 | 8.9 | 15.5 | 60 | 0.68 | B | B |
| Comparative Example 5 | 130/100 | 63.7 | 8.6 | 14.0 | 60 | 0.40 | A | C |
| Comparative Example 6 | 130/100 | 54.9 | 9.2 | 15.1 | 70 | 0.75 | B | B |
| Comparative Example 7 | 130/110 | 50.2 | 8.1 | 16.3 | 60 | 0.43 | A | B |
| Comparative Example 8 | 130/110 | 48.9 | 8.9 | 13.2 | 60 | 0.45 | A | B |

As shown in the above results, the resist compositions of Examples 1 to 43 had a high degree of PEB stability, and the shape of the resist pattern thereof formed was also excellent since roughness thereof was small, and the cross-sectional shape thereof exhibited a high degree of rectangularity. In addition, EL was also great, and the resolution was excellent. Particularly, roughness was excellent when the copolymerization ratio (molar ratio) between the structural unit (a11) and the structural unit (a12) was in a range of 35:65 to 65:35.

On the other hand, Comparative Examples 1 and 5 respectively using (A')-1 and (A')-5 that contained one or two kinds of monocyclic acid-decomposable group and did not contain a polycyclic acid-decomposable group exhibited a large degree of roughness, and the cross-sectional shape thereof was poor since thickness loss was markedly observed. Moreover, EL was also small.

Comparative Examples 2 and 6 respectively using (A')-2 and (A')-6 that contained one or two kinds of polycyclic acid-decomposable group and did not contain a monocyclic acid-decomposable group exhibited poor PEB stability and a large degree of roughness, and the cross-sectional shape thereof was a tapered shape. Moreover, EL was also small.

Comparative Example 3 using (A')-3 that contained monocyclic and chain-like acid-decomposable groups and did not contain a polycyclic acid-decomposable group exhibited a large degree of roughness and the cross-sectional shape thereof was poor since thickness loss was markedly observed. Moreover, EL was also small.

Comparative Example 4 using (A')-4 that contained polycyclic and chain-like acid-decomposable groups and did not contain a monocyclic acid-decomposable group exhibited poor PEB stability and a large degree of roughness, and the cross-sectional shape thereof was a tapered shape. Moreover, EL was also small.

Comparative Examples 6 and 7 respectively using (A')-6 and (A')-7 in which the cation moiety of the structural unit generating an acid upon exposure was a sulfonium ion having two or three aromatic rings exhibited a large degree of roughness, and the cross-sectional shape thereof was poor since thickness loss was markedly observed. Moreover, EL was also small. Particularly, Comparative Example 6 had poor resolution.

While preferred examples of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition comprising: a base component (A) which generates an acid upon exposure and exhibits changed solubility in a developing solution by the action of acid and an organic solvent,
   wherein the base component (A) contains a copolymer (A1) having a structural unit (a0) containing a group represented by general formula (a0-2), an acid-generating moiety which generates an acid upon exposure, a structural unit (a11) containing an acid-decomposable group which exhibits increased polarity by the action of acid and contains a polycyclic group, and a structural unit (a12) containing an acid-decomposable group which exhibits increased polarity by the action of acid and contains a monocyclic group,

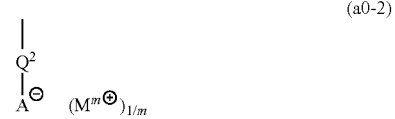

(a0-2)

wherein $Q^2$ represents a single bond or a divalent linking group; $A^-$ represents an organic group containing an anion; $M^{m+}$ represents an m-valent organic cation; and m represents an integer of 1 to 3, provided that $M^{m+}$ has only one aromatic ring or has no aromatic ring.

2. The resist composition according to claim 1, wherein in the copolymer (A1), a copolymerization ratio in the molar ratio between the structural unit (a11) and the structural unit (a12) is 99:1 to 1:99.

3. The resist composition according to claim 1, wherein the copolymer (A1) further contains a structural unit (a2) containing a —$SO_2$-containing cyclic group or a lactone-containing cyclic group.

4. The resist composition according to claim 1, wherein $M^{m+}$ in the Formula (a0-2) has no aromatic ring.

5. A method of forming a resist pattern comprising:
forming a resist film on a substrate by using the resist composition according to claim 1;
exposing the resist film; and
developing the resist film to form a resist pattern.

* * * * *

UNITED STATES PATENT AND TRADEMARK OFFICE
CERTIFICATE OF CORRECTION

| | |
|---|---|
| PATENT NO. | : 8,883,396 B2 |
| APPLICATION NO. | : 13/664651 |
| DATED | : November 11, 2014 |
| INVENTOR(S) | : Masahito Yahagi et al. |

It is certified that error appears in the above-identified patent and that said Letters Patent is hereby corrected as shown below:

In the Specification

At Column 9, Line 50, Before "electrons" delete "it".
At Column 18, Line 43, Change "can by" to --can be--.
At Column 19, Line 60, Change "then" to --than--.
At Column 22, Lines 16-17 (Approx.), Change "hetero aryl alkyl" to --heteroarylalkyl--.
At Column 26, Line 17 (Approx.), Change "Y'–," to --$Y^5$–,--.
At Column 26, Line 25, Change "Y'''" to --$Y^5$--.
At Column 36, Line 33, Change "Z'''" to --$Z^5$--.
At Column 38, Line 5, Change "(A)" to --(a0)--.
At Column 38, Line 15 (Approx.), Change "(all)" to --(a11)--.
At Column 43, Line 47, Before "carbon" insert --15--.
At Column 60, Line 24, Before "carbon" insert --5--.
At Column 67, Line 7, Change "$Y^{22}$ [$Y^{21}$" to --$Y^{22}$–, –[$Y^{21}$--.
At Column 67, Line 33, Before "carbon" insert --5--.
At Column 88, Line 25, Change "(all)" to --(a11)--.
At Column 88, Line 48, Before "carbon" insert --5--.
At Column 91, Line 32, Before "carbon" insert --15--.
At Column 108, Line 35, Change "$R^{15'}$-" to --$R^{15'}$--.
At Column 111, Line 11, Change "$R^{2''}$" to --$R^{12''}$--.
At Column 113, Line 12, Change "(all)" to --(a11)--.
At Column 116, Line 54, Before "carbon" insert --5--.
At Column 117, Line 11 (Approx.), Change "O." to --0.--.
At Column 123, Line 37, Change "–$R^3$)–" to -- –$R^{30}$– --.
At Column 140, Line 35, Change "(a2)," to --(a$2^L$),--.
At Column 141, Line 13, Before "carbon" insert --30--.
At Column 149, Line 20, Change "$R^{1'}$" to --$R^n$--.
At Column 151, Line 14, Change "(a-4))" to --(a4))--.
At Column 151, Line 16, Change "(a-4)" to --(a4)--.

Signed and Sealed this
Eighth Day of September, 2015

Michelle K. Lee
*Director of the United States Patent and Trademark Office*

At Column 151, Line 17, Change "(a-4)" to --(a4)--.
At Column 151, Line 26, Change "(a-4)" to --(a4)--.
At Column 151, Line 30, Change "(a-4)" to --(a4)--.
At Column 152, Line 39, Change "(all)" to --(a11)--.
At Column 152, Line 53, Change "(all)" to --(a11)--.
At Column 154, Line 3, Change "0," to --0.--.
At Column 154, Line 7, Change "(a-4)" to --(a4)--.
At Column 154, Line 10, Change "(a-4)" to --(a4)--.
At Column 154, Line 10, Change "(a-4)" to --(a4)--.
At Column 154, Line 16, Change "(a-4)" to --(a4)--.
At Column 154, Line 17, Change "(a-4)" to --(a4)--.
At Column 155, Line 65, Change "(D)}" to --(D1)}--.
At Column 156, Line 44, Change "SO$_3$''" to --SO$_3^-$--.
At Column 158, Line 67, Change "(ca-1)" to --(ca-1-1)--.
At Column 169, Line 56, Change "R$^{3''}$'" to --R$^{3''}$.--.
At Column 170, Line 5, Change "R$^{3''}$'" to --R$^{3''}$.--.
At Column 171, Line 51 (Approx.), Change "(ca-1)" to --(ca-4-1)--.
At Column 171, Line 64, After "as" delete "the represents".
At Column 172, Line 3, Change "(a-2)." to --(a0-2).--.
At Column 172, Line 7, Change "(m-1)," to --(m-11),--.
At Column 172, Line 30 (Approx.), Change "SO$_3$''" to --SO$_3^-$--.
At Column 173, Line 15-20 (Approx.), After " " insert -- 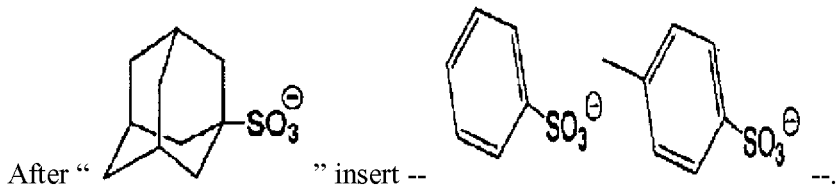 --.

At Column 180, Line 18, Change "tris {" to --tris{--.
At Column 180, Line 19, Change "tris {" to --tris{--.
At Column 180, Line 19, Change "methoxyetoxyethoxymethoxy" to --methoxyethoxymethoxy--.
At Column 180, Line 35, Change "(D1)" to --(D11)--.
At Column 182, Line 2, Change "R$^{41}$SO$_3^-$" to --R$^{4''}$SO$_3^-$--.
At Column 184, Line 38, Change "]acetonitrile," to --] acetonitrile,--.
At Column 184, Line 39, Change "]acetonitrile," to --] acetonitrile,--.
At Column 185, Lines 48-49 Change "cyclohexylsulfonyldiazomethyl sulfonyl" to --cyclohexylsulfonyldiazomethylsulfonyl--.
At Column 197, Line 28 (Approx.), Change "(12e)" to --(12a)--.

CERTIFICATE OF CORRECTION (continued)
U.S. Pat. No. 8,883,396 B2

At Column 205, Line 48-57 (Approx.),

Change "
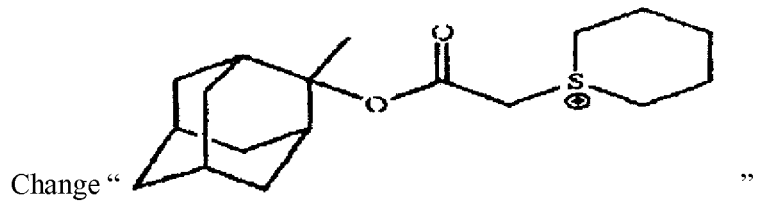
"

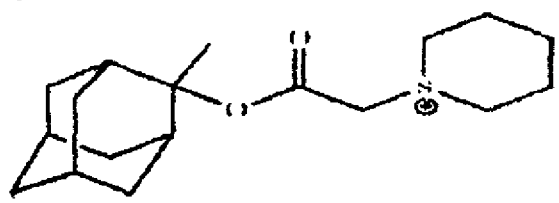

to -- Copolymer 2: l/m/n/o=44.4/21.8/21.7/11.9, Mw=13000, Mw/Mn=1.91 --.

At Column 211, Lines 19-20 (Approx.),

Delete " Copolymer 10: l/m/n/o = 44.0/21.6/22.2/12.2, Mw = 13600, Mw/Mn = 1.74 " and insert the same on Col. 210, line 30, after the structure.

At Column 224, Lines 5-10 (Approx.),

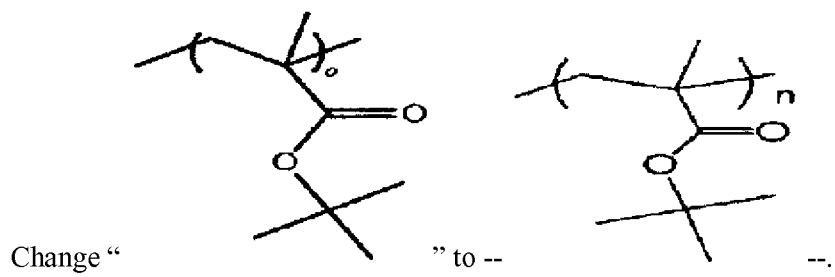

Change " " to -- --.

At Column 224, Lines 11-19 (Approx.),

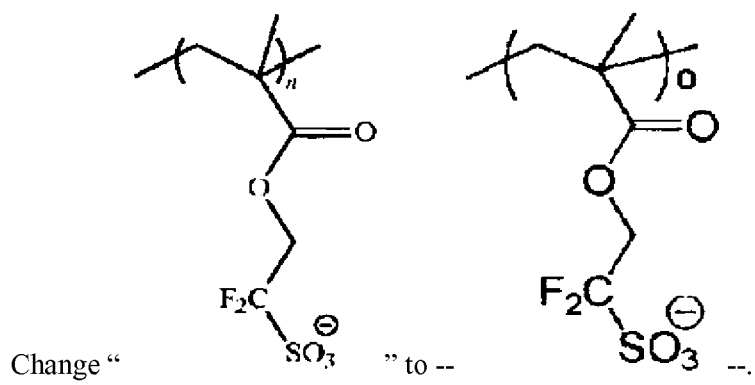

Change " " to -- --.

At Column 228, Line 53, Change "(a)" to --(σ)--.